(12) United States Patent
Nakazawa et al.

(10) Patent No.: US 10,734,529 B2
(45) Date of Patent: Aug. 4, 2020

(54) SEMICONDUCTOR DEVICE AND DISPLAY DEVICE INCLUDING THE SEMICONDUCTOR DEVICE

(71) Applicant: SEMICONDUCTOR ENERGY LABORATORY CO., LTD., Atsugi-shi, Kanagawa-ken (JP)

(72) Inventors: Yasutaka Nakazawa, Tochigi (JP); Junichi Koezuka, Tochigi (JP); Takashi Hamochi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/071,770

(22) PCT Filed: Jan. 17, 2017

(86) PCT No.: PCT/IB2017/050230
§ 371 (c)(1),
(2) Date: Jul. 20, 2018

(87) PCT Pub. No.: WO2017/130073
PCT Pub. Date: Aug. 3, 2017

(65) Prior Publication Data
US 2019/0035935 A1 Jan. 31, 2019

(30) Foreign Application Priority Data
Jan. 29, 2016 (JP) .................................. 2016-015730

(51) Int. Cl.
*H01L 29/786* (2006.01)
*H01L 27/146* (2006.01)
(Continued)

(52) U.S. Cl.
CPC .... *H01L 29/7869* (2013.01); *H01L 21/76843* (2013.01); *H01L 21/76856* (2013.01);
(Continued)

(58) Field of Classification Search
CPC ........... H01L 29/7869; H01L 29/66969; H01L 29/78648; H01L 29/78696;
(Continued)

(56) References Cited

U.S. PATENT DOCUMENTS 9,331,207 B2 * 5/2016 Yamazaki ............. H01L 29/201
9,515,093 B2 12/2016 Xun et al.
(Continued)

FOREIGN PATENT DOCUMENTS

CN   104779254 A    7/2015
CN   106256017 A   12/2016
(Continued)

OTHER PUBLICATIONS

International Search Report (Application No. PCT/IB2017/050230) dated May 9, 2017.
(Continued)

*Primary Examiner* — Dao H Nguyen
(74) *Attorney, Agent, or Firm* — Fish & Richardson P.C.

(57) ABSTRACT

A semiconductor device including an oxide semiconductor film that includes a transistor with excellent electrical characteristics is provided. It is a semiconductor device including a transistor. The transistor includes a gate electrode, a first insulating film, an oxide semiconductor film, a source electrode, a drain electrode, and a second insulating film. The source electrode and the drain electrode each include a first conductive film, a second conductive film over and in contact with the first conductive film, and a third conductive film over and in contact with the second conductive film. The second conductive film contains copper, the first con-
(Continued)

ductive film and the third conductive film include a material that inhibits diffusion of copper, and an end portion of the second conductive film includes a region containing copper and silicon.

18 Claims, 60 Drawing Sheets

(51) Int. Cl.
*H01L 27/108* (2006.01)
*H01L 29/66* (2006.01)
*H01L 27/15* (2006.01)
*H01L 29/45* (2006.01)
*H01L 27/12* (2006.01)
*H01L 21/768* (2006.01)
*H01L 29/417* (2006.01)
*H01L 27/088* (2006.01)
*H01L 21/8258* (2006.01)
*H01L 27/06* (2006.01)

(52) U.S. Cl.
CPC .... *H01L 27/10811* (2013.01); *H01L 27/1207* (2013.01); *H01L 27/1225* (2013.01); *H01L 27/146* (2013.01); *H01L 27/15* (2013.01); *H01L 29/41733* (2013.01); *H01L 29/45* (2013.01); *H01L 29/66969* (2013.01); *H01L 29/78618* (2013.01); *H01L 29/78648* (2013.01); *H01L 29/78696* (2013.01); *H01L 21/8258* (2013.01); *H01L 27/0629* (2013.01); *H01L 27/0688* (2013.01); *H01L 27/088* (2013.01)

(58) Field of Classification Search
CPC ......... H01L 29/78618; H01L 29/78606; H01L 29/45; H01L 29/41733; H01L 27/146; H01L 27/10811; H01L 27/15; H01L 27/1207; H01L 27/1225; H01L 27/088; H01L 27/0629; H01L 27/0688; H01L 21/76843; H01L 21/76856; H01L 21/8258; H01L 21/8234

USPC ........ 257/43, 57, 59, 72, 347, 762, E27.111, 257/E27.131, E29.068, E29.117, E29.147, 257/E29.151, E33.053, E21.001, E21.151, 257/E21.162, E21.414; 438/689, 158, 438/151, 104, 34, 30

See application file for complete search history.

(56) References Cited

U.S. PATENT DOCUMENTS

| | | | |
|---|---|---|---|
| 9,768,315 | B2 | 9/2017 | Koezuka et al. |
| 2009/0134521 | A1 | 5/2009 | Liu et al. |
| 2013/0168671 | A1 | 7/2013 | Koike et al. |
| 2013/0207111 | A1* | 8/2013 | Yamazaki ......... H01L 29/78681 257/57 |
| 2015/0200212 | A1* | 7/2015 | Xun .................... H01L 27/1225 257/43 |
| 2015/0303309 | A1 | 10/2015 | Koezuka et al. |
| 2017/0053940 | A1 | 2/2017 | Xun et al. |
| 2017/0338352 | A1 | 11/2017 | Yamazaki |

FOREIGN PATENT DOCUMENTS

| | | |
|---|---|---|
| JP | 2007-096055 A | 4/2007 |
| JP | 2012-222171 A | 11/2012 |
| JP | 2013-179290 A | 9/2013 |
| JP | 2015-133479 A | 7/2015 |
| JP | 2015-213165 A | 11/2015 |
| KR | 2013-0092463 A | 8/2013 |
| KR | 2015-0083693 A | 7/2015 |
| KR | 2016-0145031 A | 12/2016 |
| TW | 201338174 | 9/2013 |
| TW | 201545359 | 12/2015 |
| WO | WO-2012/002573 | 1/2012 |
| WO | WO-2012/141089 | 10/2012 |
| WO | WO-2015/159183 | 10/2015 |

OTHER PUBLICATIONS

Written Opinion (Application No. PCT/IB2017/050230) dated May 9, 2017.

* cited by examiner

100A

100A

100A

200
SEMICONDUCTOR DEVICE AND DISPLAY DEVICE INCLUDING THE SEMICONDUCTOR DEVICE

CROSS REFERENCE TO RELATED APPLICATIONS

This application is a U.S. National Phase Application under 35 U.S.C. § 371 of International Application PCT/IB2017/050230, filed on Jan. 17, 2017, which claims the benefit of a foreign priority application filed in Japan as Application No. 2016-015730 on Jan. 29, 2016, both of which are incorporated by reference.

TECHNICAL FIELD

One embodiment of the present invention relates to a semiconductor device including an oxide semiconductor film, and a display device including the semiconductor device.

Note that one embodiment of the present invention is not limited to the foregoing technical field. The technical field of one embodiment of the invention disclosed in this specification and the like relates to an object, a method, or a manufacturing method. Another embodiment of the present invention relates to a process, a machine, manufacture, or a composition of matter (composition of matter). Thus, more specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

Note that in this specification and the like, a semiconductor device refers to every device that can function by utilizing semiconductor characteristics. A semiconductor element such as a transistor, a semiconductor circuit, an arithmetic device, and a memory device are embodiments of semiconductor devices. An imaging device, a display device, a liquid crystal display device, a light-emitting device, an electro-optical device, a power generation device (including a thin film solar cell, an organic thin film solar cell, and the like), and an electronic device may include a semiconductor device.

BACKGROUND ART

Attention has been focused on a technique of forming a transistor (also referred to as a thin film transistor (TFT) or a field-effect transistor (FET)) using a semiconductor film formed over a substrate. The transistor is applied to a wide range of electronic devices such as an integrated circuit (IC) and an image device (display device). As semiconductor films applicable to the transistors, silicon-based semiconductor materials are widely known, but oxide semiconductors have been attracting attention as alternative materials.

For example, a technique of fabricating a transistor using an In—Ga—Zn-based oxide as an oxide semiconductor is disclosed (see Patent Document 1, for example).

Conventionally, aluminum has been widely used as a material used for a wiring, a signal line, and the like, but, development using copper (Cu) is extensively conducted to further reduce the resistance. However, copper (Cu) is disadvantageous in that adhesion thereof to a film used as a base is poor and that the characteristics of a transistor easily deteriorate due to diffusion of Cu into a semiconductor film of the transistor.

Furthermore, a Cu—Mn alloy is disclosed as a material for an ohmic electrode formed over an oxide semiconductor film containing indium (see Patent Document 2, for example).

PRIOR ART DOCUMENT

Patent Document

[Patent Document 1] Japanese Published Patent Application No. 2007-96055
[Patent Document 2] PCT International Publication No. 2012/002573

SUMMARY OF THE INVENTION

Problems to be Solved by the Invention

According to the structure disclosed in Patent Document 2, a Cu—Mn alloy film is deposited on an oxide semiconductor film, and then, heat treatment is performed on the Cu—Mn alloy film to form a Mn oxide at the joint interface between the oxide semiconductor film and the Cu—Mn alloy film. The Mn oxide is formed in such a manner that Mn in the Cu—Mn alloy film diffuses toward the oxide semiconductor film and is preferentially bonded to oxygen contained in the oxide semiconductor film. A region of the oxide semiconductor film which is reduced by Mn becomes oxygen vacancy, so that the region has a high carrier density and thus has high conductivity. Furthermore, Mn diffuses toward the oxide semiconductor film and thus the Cu—Mn alloy becomes pure Cu, whereby an ohmic electrode with low electric resistance is obtained.

However, in the foregoing structure, an influence of Cu that diffuses from the ohmic electrode after the ohmic electrode is formed is not considered. For example, after an electrode including a Cu—Mn alloy film is formed over an oxide semiconductor film, heat treatment is performed, whereby a Mn oxide is formed at the joint interface between the oxide semiconductor film and the Cu—Mn alloy film. Because of formation of the Mn oxide, even if the amount of Cu which can diffuse into the oxide semiconductor film from the Cu—Mn alloy film in contact with the oxide semiconductor film can be reduced, Cu is reattached from a side surface of the Cu—Mn alloy film and a side surface or a surface of a pure Cu film obtained by release of Mn from the Cu—Mn alloy film to the surface of the oxide semiconductor film.

In the case where a bottom-gate structure is used for a transistor using an oxide semiconductor film, part of a surface of the oxide semiconductor film serves as what is called a back-channel side, and there have been the following problems when Cu is reattached to the back-channel side: the electrical characteristics (e.g., on-state current, field-effect mobility, and frequency characteristics) of the transistor deteriorate, and the transistor characteristics deteriorate in a gate BT stress test, which is a reliability test of a transistor.

In view of the foregoing problems, an object of one embodiment of the present invention is to provide a novel semiconductor device using a conductive film containing copper for a transistor using an oxide semiconductor film. Another object of one embodiment of the present invention is to provide a semiconductor device including a transistor having excellent electrical characteristics (e.g., on-state current, field-effect mobility, and frequency characteristics) with the use of a conductive film containing copper for a transistor using an oxide semiconductor film. Another object of one embodiment of the present invention is to provide a semiconductor device including a transistor in which a change in the electrical characteristics is suppressed, with the use of a conductive film containing copper for a transistor using an oxide semiconductor film. Another object of one embodiment of the present invention is to provide a semiconductor device including a reliable transistor, with the use of a conductive film containing copper for a transistor using an oxide semiconductor film. Another object of one embodiment of the present invention is to provide a semiconductor device whose manufacturing cost is reduced, with the use of a conductive film containing copper for a transistor using an oxide semiconductor film. Another object of one embodiment of the present invention is to provide a semiconductor device with high productivity with the use of a conductive film containing copper for a transistor using an oxide semiconductor film. Another object of one embodiment of the present invention is to provide a novel semiconductor device. Another object of one embodiment of the present invention is to provide a method for manufacturing the novel semiconductor device.

Note that the description of the aforementioned objects does not disturb the existence of other objects. Note that one embodiment of the present invention does not need to achieve all the objects. Other objects are apparent from and can be derived from the description of the specification and the like.

Means for Solving the Problems

One embodiment of the present invention is a semiconductor device which includes a transistor and in which the transistor includes a gate electrode, a first insulating film over the gate electrode, an oxide semiconductor film including a region which overlaps with the gate electrode with the first insulating film therebetween, a source electrode electrically connected to the oxide semiconductor film, a drain electrode electrically connected to the oxide semiconductor film, and a second insulating film over the oxide semiconductor film, the source electrode, and the drain electrode; the source electrode and the drain electrode each contain copper; and an end portion of the source electrode and an end portion of the drain electrode each include a region containing copper and silicon.

Another embodiment of the present invention is a semiconductor device which includes a transistor and in which the transistor includes a gate electrode, a first insulating film over the gate electrode, an oxide semiconductor film including a region which overlaps with the gate electrode with the first insulating film therebetween, a source electrode electrically connected to the oxide semiconductor film, a drain electrode electrically connected to the oxide semiconductor film, a second insulating film over the oxide semiconductor film, the source electrode, and the drain electrode; the source electrode and the drain electrode each contain copper; and an end portion of the source electrode and an end portion of the drain electrode each include a region including a compound containing copper and silicon.

In each of the above structures, the end portion of the source electrode and the end portion of the drain electrode each preferably include a region in contact with the second insulating film.

Another embodiment of the present invention is a semiconductor device which includes a transistor and in which the transistor includes a gate electrode, a first insulating film over the gate electrode, an oxide semiconductor film including a region which overlaps with the gate electrode with the first insulating film therebetween, a source electrode electrically connected to the oxide semiconductor film, a drain electrode electrically connected to the oxide semiconductor film, a second insulating film over the oxide semiconductor film, the source electrode, and the drain electrode; the source electrode and the drain electrode each include a first conductive film, a second conductive film over and in contact with the first conductive film, and a third conductive film over and in contact with the second conductive film; the second conductive film contains copper; the first conductive film and the third conductive film include a material that inhibits diffusion of copper; and an end portion of the second conductive film includes a region containing copper and silicon.

Another embodiment of the present invention is a semiconductor device which includes a transistor and in which the transistor includes a gate electrode, a first insulating film over the gate electrode, an oxide semiconductor film including a region which overlaps with the gate electrode with the first insulating film therebetween, a source electrode electrically connected to the oxide semiconductor film, a drain electrode electrically connected to the oxide semiconductor film, a second insulating film over the oxide semiconductor film, the source electrode, and the drain electrode; the source electrode and the drain electrode each include a first conductive film, a second conductive film over and in contact with the first conductive film, and a third conductive film over and in contact with the second conductive film; the second conductive film contains copper; the first conductive film and the third conductive film include a material that inhibits diffusion of copper; and an end portion of the second conductive film includes a region including a compound containing copper and silicon.

In each of the above structures, the end portion of the second conductive film preferably includes a region in contact with the second insulating film.

In each of the above structures, the first conductive film and the third conductive film preferably contain at least one of titanium, tungsten, tantalum, and molybdenum. Furthermore, it is preferable that the first conductive film and the third conductive film include an oxide and the oxide contain at least one of In and Zn.

In each of the above structures, the oxide semiconductor film preferably contains In, Zn, and M (M represents Al, Ga, Y, or Sn). Furthermore, it is preferable that the oxide semiconductor film include a crystal part and the crystal part have c-axis alignment.

Another embodiment of the present invention is a display device including the semiconductor device of any of the above embodiments and a display element. Another embodiment of the present invention is a display module including the display device of the above embodiment and a touch sensor. Another embodiment of the present invention is an electronic device including the semiconductor device of any of the above embodiments, the display device of the above embodiment or the display module of the above embodiment, and at least one of an operation key and a battery.

Effect of the Invention

According to one embodiment of the present invention, a novel semiconductor device in which a conductive film containing copper is used for a transistor using an oxide semiconductor film can be provided. According to another embodiment of the present invention, a semiconductor device including a transistor having excellent electrical characteristics (e.g., on-state current, field-effect mobility, and frequency characteristics) can be provided using a conductive film containing copper for a transistor using an oxide semiconductor film. According to another embodiment of the present invention, a semiconductor device including a transistor in which a change in the electrical characteristics is suppressed can be provided using a conductive film containing copper for a transistor using an oxide semiconductor film. According to another embodiment of the present invention, a semiconductor device including a reliable transistor can be provided using a conductive film containing copper for a transistor using an oxide semiconductor film. According to another embodiment of the present invention, a semiconductor device whose manufacturing cost is reduced can be provided using a conductive film containing copper for a transistor using an oxide semiconductor film. According to another embodiment of the present invention, a semiconductor device with high productivity can be provided using a conductive film containing copper for a transistor using an oxide semiconductor film. According to another embodiment of the present invention, a novel semiconductor device can be provided. According to another embodiment of the present invention, a method for manufacturing the novel semiconductor device can be provided.

Note that the description of these effects does not disturb the existence of other effects. Note that one embodiment of the present invention does not need to have all the effects. Other effects are apparent from and can be derived from the description of the specification, the drawings, the claims, and the like.

MODE FOR CARRYING OUT THE INVENTION

Figure 1A:
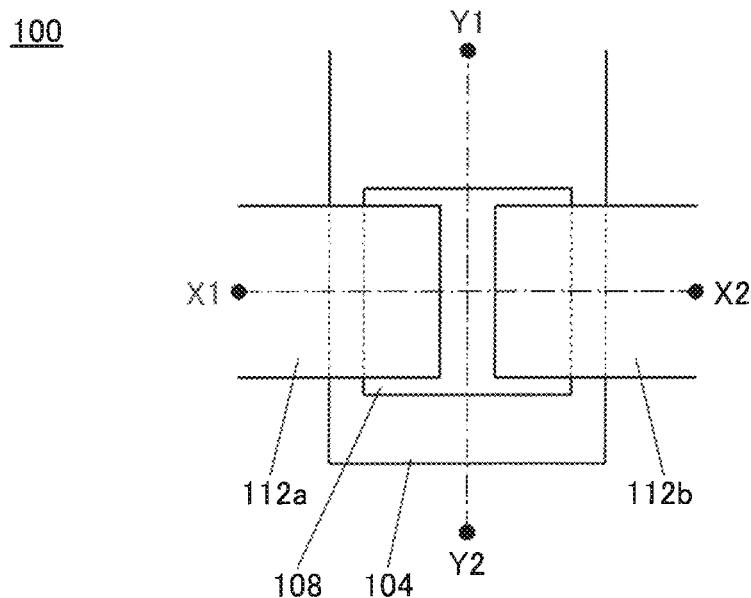
FIG. 1A is a top view and FIGS. 1B and 1C are cross-sectional views illustrating one embodiment of a semiconductor device.

Embodiments of the present invention are explained in detail below using the drawings. Note that the present invention is not limited to description below, and modes and details thereof can be variously modified without departing from the purpose and the scope of the present invention. Thus, the present invention should not be interpreted as being limited to the description of the embodiments described below.

Note that the position, the size, the range, or the like of each structure illustrated in drawings and the like does not represent the actual position, size, range, or the like in some cases for easy understanding. Therefore, the disclosed invention is not necessarily limited to the position, the size, the range, or the like disclosed in the drawings and the like.

The ordinal numbers such as first and second in this specification and the like are used for convenience and do not denote the order of steps or the stacking order of layers in some cases. Therefore, for example, description can be made even when first is replaced with second or third, as appropriate. In addition, the ordinal numbers in this specification and the like are not necessarily the same as those which specify one embodiment of the present invention.

Note that in this specification, terms for describing arrangement, such as "over" and "under", are used for convenience in describing a positional relation between components with reference to drawings. Furthermore, the positional relation between components is changed as appropriate in accordance with a direction in which each component is described. Thus, there is no limitation to terms described in this specification, and description can be made in other words appropriately depending on the situation.

In describing structures of the invention with reference to the drawings in this specification and the like, common reference numerals are used for the same portions in different drawings.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" described in this specification and the like can be put into an "insulator" in some cases. Similarly, an "insulator" described in this specification and the like can be put into a "semiconductor" in some cases. Alternatively, an "insulator" described in this specification and the like can be put into a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" described in this specification and the like can be put into a "conductor" in some cases. Similarly, a "conductor" described in this specification and the like can be put into a "semiconductor" in some cases.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when a transistor of different polarity is employed or a direction of current is changed in circuit operation, for example. Therefore, the terms source and drain can be switched in this specification and the like.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. Note that in one transistor, channel widths in all regions do not necessarily have the same value. In other words, a channel width of one transistor is not fixed to one value in some cases. Thus, in this specification and the like, a channel width is any one of values, the maximum value, the minimum value, or the average value in a region where a channel is formed.

Note that in this specification and the like, "electrically connected" includes the case of connection through an "object having any electric function". Here, there is no particular limitation on an "object having any electric function" as long as electric signals can be transmitted and received between components that are connected. Examples of an "object having any electric function" include a switching element such as a transistor, a resistor, an inductor, a capacitor, and elements with a variety of functions as well as an electrode and a wiring.

A voltage usually refers to a potential difference between a given potential and a reference potential (e.g., a ground potential (GND) or a source potential). Accordingly, a voltage can also be called a potential.

Note that in this specification and the like, a silicon oxynitride film refers to a film in which the content of oxygen is higher than that of nitrogen, and preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the content of nitrogen is higher than that of oxygen, and preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Alternatively, for example, the term "insulating film" can be changed into the term "insulating layer" in some cases.

In this specification and the like, "parallel" refers to the state where two straight lines are arranged to form an angle of greater than or equal to −10° and less than or equal to 10°. Accordingly, "parallel" also includes the case where the angle is greater than or equal to −5° and less than or equal to 5°. In addition, "substantially parallel" refers to the state where two straight lines are arranged to form an angle of greater than or equal to −30° and less than or equal to 30°. In addition, "perpendicular" refers to the state where two straight lines are arranged to form an angle of greater than or equal to 80° and less than or equal to 100°. Accordingly, "perpendicular" also includes the case where the angle is greater than or equal to 85° and less than or equal to 95°. In addition, "substantially perpendicular" refers to the state where two straight lines are arranged to form an angle of greater than or equal to 60° and less than or equal to 120°.

In this specification and the like, a trigonal or rhombohedral crystal is indicated as a hexagonal crystal system.

Embodiment 1

In this embodiment, a semiconductor device of one embodiment of the present invention and a method of manufacturing the semiconductor device are described below using FIG. 1 to FIG. 20.

<1-1. Structure Example 1 of Semiconductor Device>

Figure 1B:
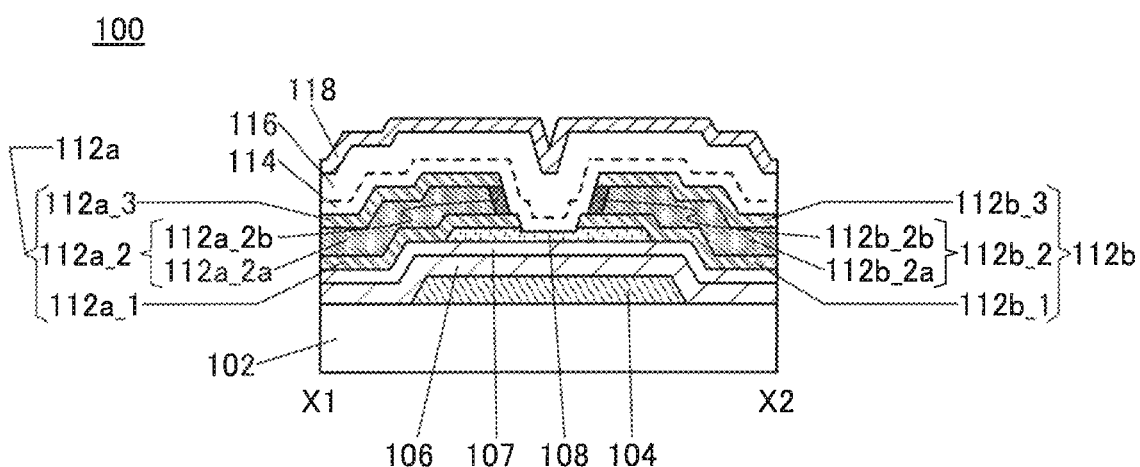
Figure 1C:
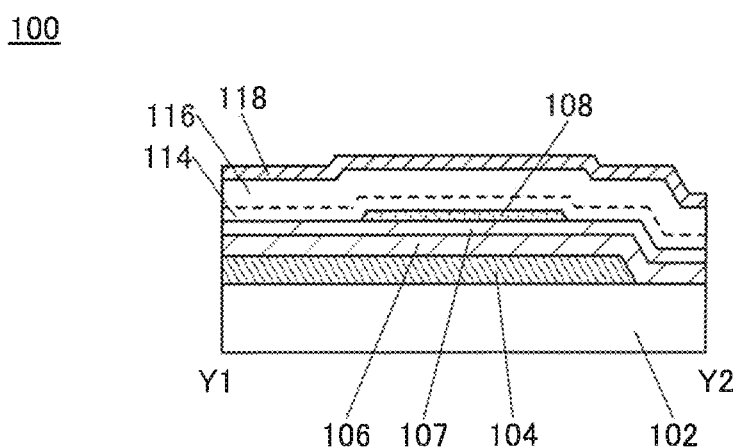

FIG. 1(A) is a top view of a transistor 100 that is a semiconductor device of one embodiment of the present invention. FIG. 1(B) corresponds to a cross-sectional view taken along dashed-dotted line X1-X2 in FIG. 1(A), and FIG. 1(C) corresponds to a cross-sectional view taken along dashed-dotted line Y1-Y2 in FIG. 1(A). Note that some components (a substrate 102, an insulating film, and the like) of the transistor 100 are not illustrated in FIG. 1(A) for clarification.

In some cases, the direction of dashed-dotted line X1-X2 in FIG. 1(A) is referred to as the channel length direction of the transistor 100, and the direction of dashed-dotted line Y1-Y2 in FIG. 1(A) is referred to as the channel width direction of the transistor 100.

The transistor 100 includes a conductive film 104 that functions as a gate electrode over a substrate 102; an insulating film 106 over the substrate 102 and the conductive film 104; an insulating film 107 over the insulating film 106; an oxide semiconductor film 108 over the insulating film 107; conductive films 112a and 112b which function as a pair of electrodes electrically connected to the oxide semiconductor film 108; insulating films 114 and 116 over the oxide semiconductor film 108 and the conductive films 112a and 112b; and an insulating film 118 over the insulating film 116.

The oxide semiconductor film 108 preferably contains indium (In), zinc (Zn), and M (M represents aluminum (Al), gallium (Ga), yttrium (Y), or tin (Sn)).

In the transistor 100, the insulating films 106 and 107 have a function of a gate insulating film of the transistor 100. In addition, in the transistor 100, one of the conductive films 112a and 112b functioning as a pair of electrodes has a function of a source electrode, and the other has a function of a drain electrode.

The conductive film 112a includes a conductive film 112a_1, a conductive film 112a_2 over and in contact with the conductive film 112a_1, and a conductive film 112a_3 over and in contact with the conductive film 112a_2, and the conductive film 112b includes a conductive film 112b_1, a conductive film 112b_2 over and in contact with the conductive film 112b_1, and a conductive film 112b_3 over and in contact with the conductive film 112b_2. Further, the conductive film 112a_2 includes a region 112a_2a and a region 112a_2b. Further, the conductive film 112b_2 includes a region 112b_2a and a region 112b_2b.

The conductive film 112a_2 and the conductive film 112b_2 each contain copper; the region 112a_2b and the region 112b_2b each contain copper and silicon; and the conductive film 112a_1, the conductive film 112a_3, the conductive film 112b_1, and the conductive film 112b_3 each contain a material that inhibits diffusion of copper. The region 112a_2b is located at the end portion of the conductive film 112a_2 and includes a region in contact with the insulating film 114; and the region 112b_2b is located at the end portion of the conductive film 112b_2 and includes a region in contact with the insulating film 114. The end portion of the conductive film 112a_1 includes a region located outward from the end portion of the conductive film 112a_2, and the end portion of the conductive film 112b_1 includes a region located outward from the end portion of the conductive film 112b_2. The conductive film 112a_3 covers the top surface of the conductive film 112a_2, and the conductive film 112b_3 covers the top surface of the conductive film 112b_2. Thus, the conductive film 112a_2a is covered with the conductive film 112a_1, the region 112a_2b, and the conductive film 112a_3, and the conductive film 112b_2a is covered with the conductive film 112b_1, the region 112b_2b, and the conductive film 112b_3.

As the region 112a_2b and the region 112b_2b, copper silicide (copper silicide) is preferably formed. Copper silicide, which has a bond between copper and silicon, is more stable than copper and has a function of inhibiting copper from diffusing to the outside. In the case where the insulating film 114 contains silicon, when the regions 112a_2b and 112b_2b contain copper and silicon, an effect of increasing adhesion between the conductive films 112a_2 and 112b_2 and the insulating film 114 is achieved.

The regions 112a_2b and 112b_2b may contain copper, silicon, and nitrogen, and copper silicide nitride (copper silicide nitride) may be formed. When the regions 112a_2b and 112b_2b contains copper silicide nitride, diffusion of copper to the outside can be inhibited.

When the conductive film 112a and the conductive film 112b includes the conductive film 112a_2 and the conductive film 112b_2 each containing copper, respectively, the resistance of the conductive films 112a and 112b can be reduced. Furthermore, when the conductive films 112a and 112b have the foregoing structure, diffusion of a copper element to the outside of the conductive films 112a and 112b, in particular, to the oxide semiconductor film 108, can be inhibited. Thus, a semiconductor device including a transistor having excellent electrical characteristics can be provided.

<1-2. Structure Example 2 of Semiconductor Device>

Next, structure examples different from that of the transistor 100 illustrated in FIGS. 1(A), (B), and (C) are described using FIG. 2 to FIG. 11. Note that in FIG. 2 to FIG. 11 below, a portion having a function similar to that of the transistor 100 is shown by the same hatching and not particularly denoted by a reference numeral in some cases.

Figure 2A:
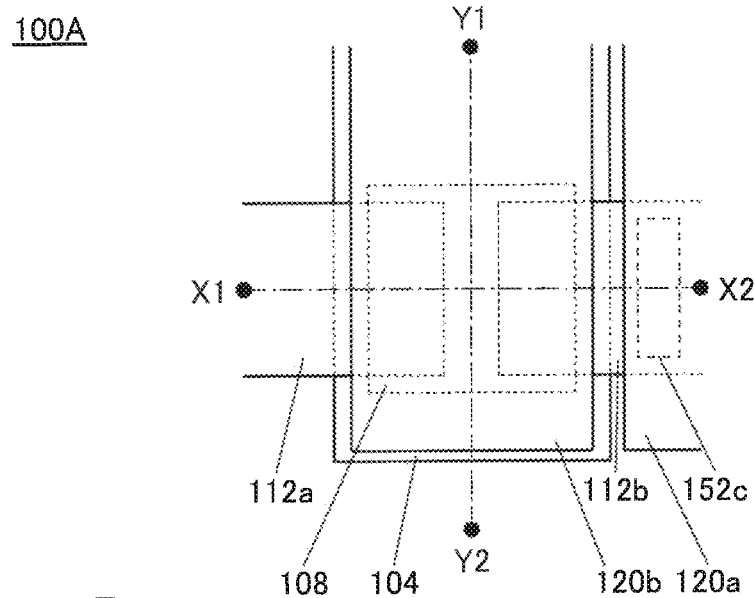
FIG. 2A is a top view and FIGS. 2B and 2C are cross-sectional views illustrating one embodiment of a semiconductor device.
Figure 2B:
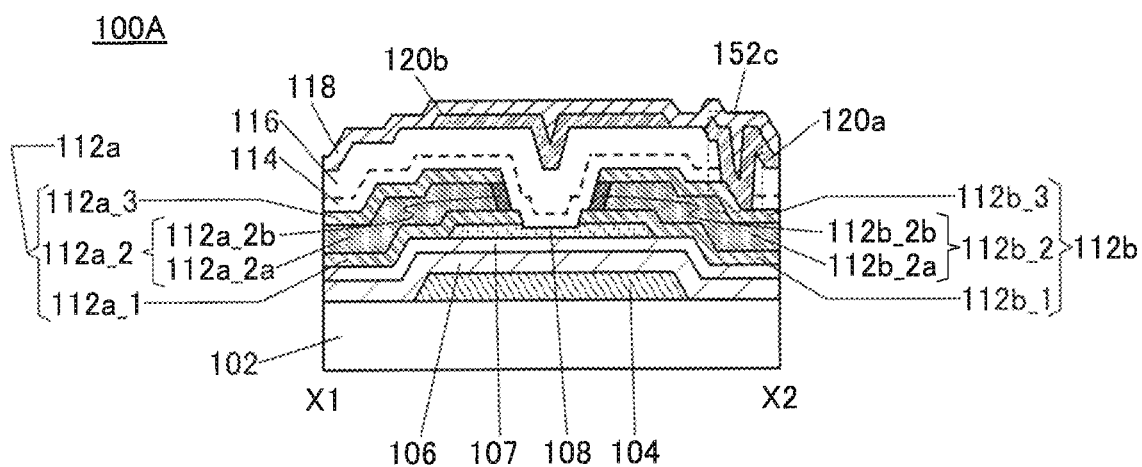
Figure 2C:
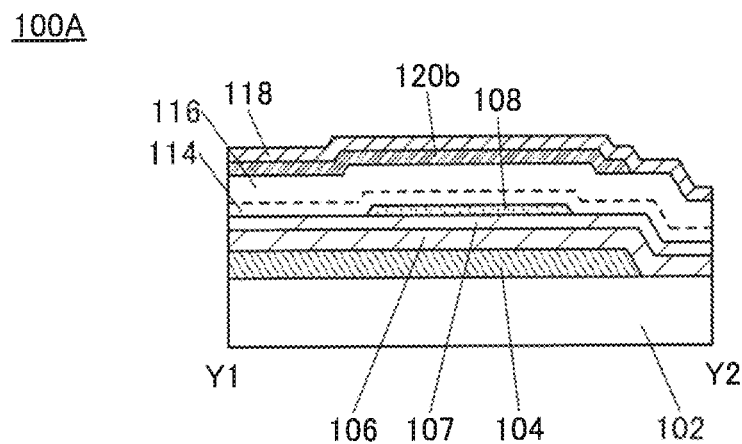

FIG. 2(A) is a top view of a transistor 100A that is a semiconductor device of one embodiment of the present invention, FIG. 2(B) corresponds to a cross-sectional view taken along a dashed dotted line X1-X2 shown in FIG. 2(A), and FIG. 2(C) corresponds to a cross-sectional view taken along a dashed dotted line Y1-Y2 in FIG. 2(A).

The transistor 100A includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive films 112a and 112b functioning as a pair of electrodes and electrically connected to the oxide semiconductor film 108, the insulating film 114 and the insulating film 116 over the oxide semiconductor film 108 and the conductive films 112a and 112b, a conductive film 120a provided over the insulating film 116 and electrically connected to one of the conductive films 112a and 112b (the conductive film 112b in FIG. 2B) through an opening 152c provided in the insulating films 114 and 116, a conductive film 120b provided over the insulating film 116 and functioning as a second gate electrode, and an insulating film 118 over the insulating film 116 and the conductive films 120a and 120b.

In the transistor 100A, the insulating films 106 and 107 have a function of a first gate insulating film of the transistor 100A, the insulating films 114 and 116 have a function of a second gate insulating film of the transistor 100A, and the insulating film 118 has a function of a protective insulating film of the transistor 100A. Note that in this specification and the like, in some cases, the insulating films 106 and 107 are referred to as a first gate insulating film, and the insulating films 114 and 116 are referred to as a second gate insulating film. In the transistor 100A, one of the conductive films 112a and 112b functioning as a pair of electrodes has a function of a source electrode, and the other has a function of a drain electrode. The conductive film 120a has a function of a pixel electrode used for a display device.

<<S-Channel Structure>>

The oxide semiconductor film 108 in the transistor 100A illustrated in FIG. 2 is sandwiched between the conductive films 104 and 120b such that the first gate insulating film and the second gate insulating film are provided between the oxide semiconductor film 108 and the conductive films 104 and 120b. The length in the channel length direction and the length in the channel width direction of the conductive film 104 are longer than the length in the channel length direction and the length in the channel width direction of the oxide semiconductor film 108, respectively. In addition, the length in the channel length direction and the length in the channel width direction of the conductive film 120b are longer than the length in the channel length direction and the length in the channel width direction of the oxide semiconductor film 108, respectively. Therefore, the oxide semiconductor film 108 is entirely covered with the conductive films 104 and 120b such that the first gate insulating film and the second gate insulating film are provided between the oxide semiconductor film 108 and the conductive films 104 and 120b.

In other words, in the channel width direction of the transistor 100A, the conductive films 104 and 120b surround the oxide semiconductor film 108 such that the first gate insulating film and the second gate insulating film are provided between the oxide semiconductor film 108 and the conductive films 104 and 120b.

With such a structure, the oxide semiconductor film 108 included in the transistor 100A can be electrically surrounded by electric fields of the conductive films 104 and 120b. A device structure of a transistor, like that of the transistor 100A, in which electric fields of the conductive films 104 and 120b electrically surround an oxide semiconductor film where a channel region is formed can be referred to as a surrounded channel (s-channel) structure.

Since the transistor 100A has an s-channel structure, an electric field for inducing a channel can be effectively applied to the oxide semiconductor film 108 from the conductive films 104 and 120b. Accordingly, the current drive capability of the transistor 100A is increased, so that high on-state current characteristics can be obtained. Since the on-state current can be high, the transistor 100A can be miniaturized. Furthermore, since the transistor 100A has a structure in which the oxide semiconductor film 108 is surrounded by the conductive films 104 and 120b, the mechanical strength of the transistor 100A can be increased.

With the foregoing structure, carriers flow in a further wide range of the oxide semiconductor film 108, that is, a region on the first gate insulating film side of the oxide semiconductor film 108 and a region on the second gate insulating film side of the oxide semiconductor film 108.

Therefore, the amount of carriers that transfer in the transistor 100A is increased. As a result, the on-state current of the transistor 100A is increased, and the field-effect mobility of the transistor 100A is also increased to, specifically, higher than or equal to 10 cm$^2$/V·s. Note that here, the field-effect mobility is not an approximate value of the mobility as the physical property of the oxide semiconductor film but is an index of the current drive capability of the transistor in a saturation region and the apparent field-effect mobility.

Figure 3A:
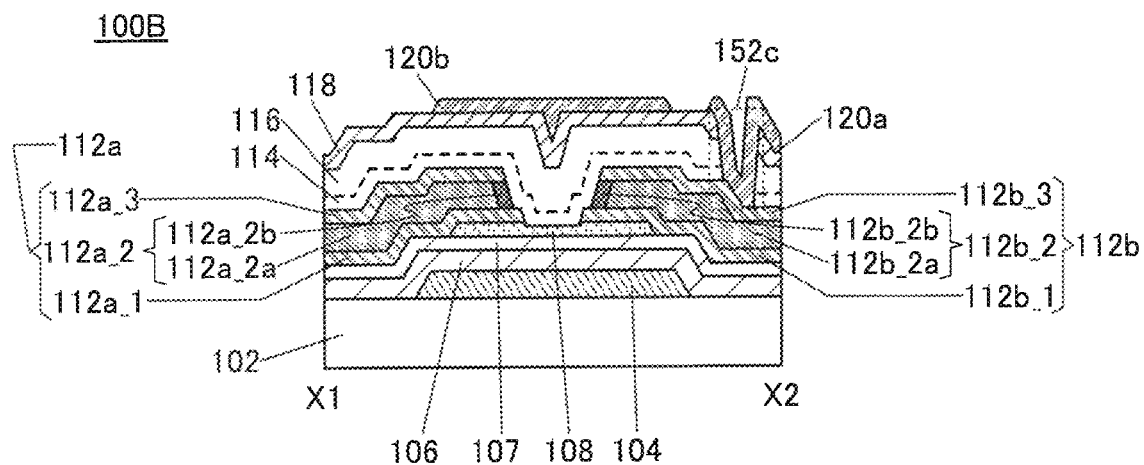
FIGS. 3A-3C are cross-sectional views illustrating one embodiment of a semiconductor device.
Figure 3B:
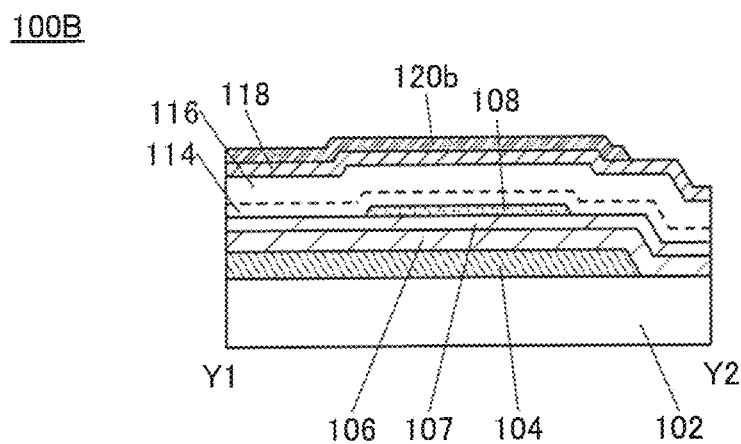

As in a transistor 100B illustrated in FIGS. 3(A) and (B), the conductive films 120a and 120b may be provided over the insulating film 118. In that case, the conductive film 120a and one of the conductive films 112a and 112b are electrically connected through the opening 152c provided in the insulating films 114, 116, and 118. Note that the top view of the transistor 100B is similar to that of the transistor 100A illustrated in FIG. 2(A), FIG. 3(A) corresponds to a cross-sectional view taken along the dashed dotted line X1-X2 in FIG. 2(A), and FIG. 3(B) corresponds to a cross-sectional view taken along the dashed dotted line Y1-Y2 in FIG. 2(A). In addition, the other portions of the structure of the transistor 100B are similar to those of the transistor 100A; thus, the structure of the transistor 100A can be referred to.

Figure 3C:
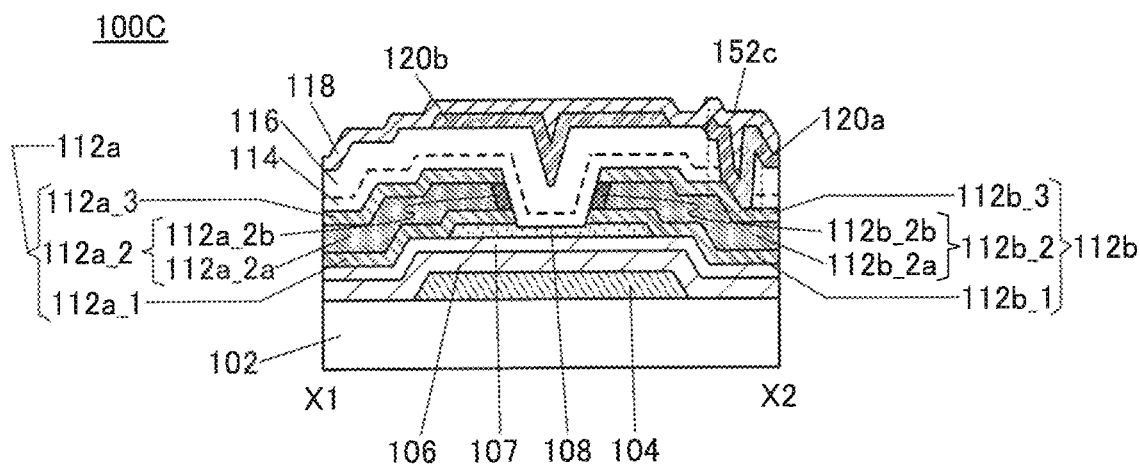

As in the transistor 100C illustrated in FIG. 3(C), the conductive films 112a and 112b may include a region where the end portion of the conductive film 112a_1 and the end portion of the conductive film 112a_2 are aligned with each other and a region where the end portion of the conductive film 112b_1 and the end portion of the conductive film 112b_2 are aligned with each other.

Figure 4A:
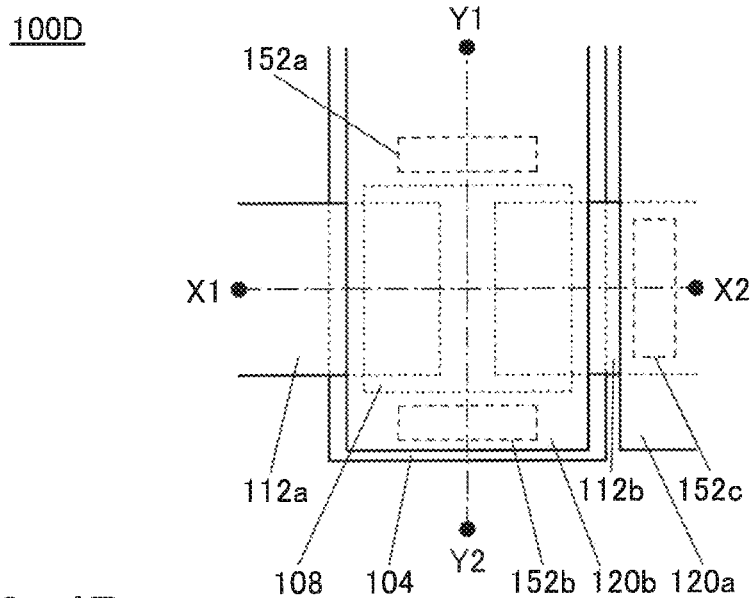
FIG. 4A is a top view and FIGS. 4B and 4C are cross-sectional views illustrating one embodiment of a semiconductor device.
Figure 4B:
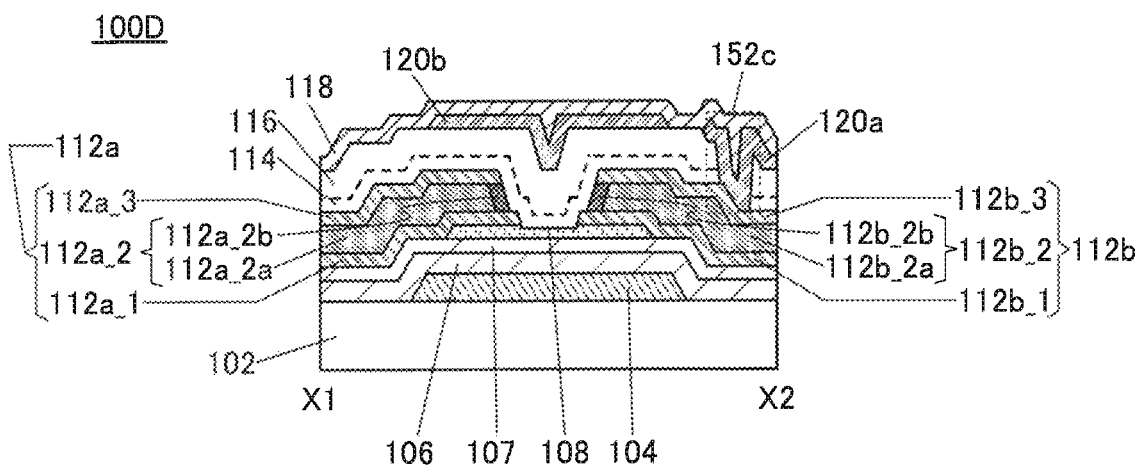
Figure 4C:
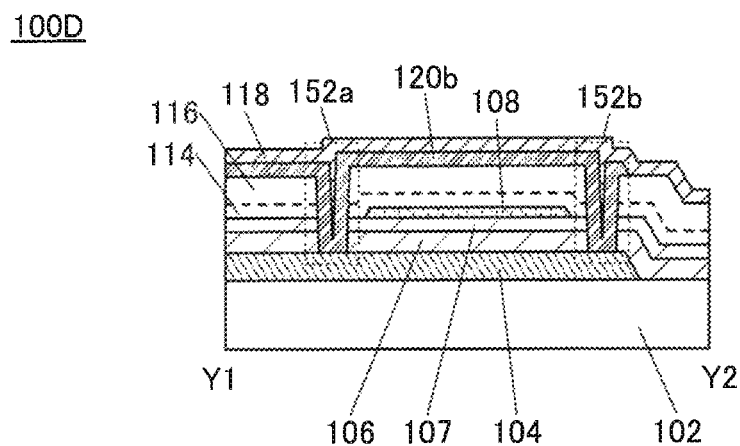

As in a transistor 100D illustrated in FIGS. 4(A), (B), and (C), the conductive film 120b functioning as the second gate electrode may be connected to the conductive film 104 functioning as a first gate electrode through openings 152a and 152b provided in the first gate insulating film (the insulating films 106 and 107) and the second gate insulating film (the insulating films 114, and 116). Note that FIG. 4(A) is a top view of the transistor 100D that is a semiconductor device of one embodiment of the present invention. FIG. 4(B) corresponds to a cross-sectional view taken along dashed-dotted line X1-X2 in FIG. 4(A), and FIG. 4(C) corresponds to a cross-sectional view taken along dashed-dotted line Y1-Y2 in FIG. 4(A). In addition, the other portions of the structure of the transistor 100D are similar to those of the transistor 100A; thus, the structure of the transistor 100A can be referred to.

In the transistor 100D, since the conductive film 104 and the conductive film 120b are connected through the openings 152a and 152b provided in the first gate insulating film and the second gate insulating film, a side surface of the oxide semiconductor film 108 in the channel width direction faces the conductive film 120b with the first gate insulating film and the second gate insulating film therebetween. In addition, the conductive films 104 and 120b are supplied with the same potential. Accordingly, the oxide semiconductor film 108 included in the transistor 100D can be electrically surrounded by electric fields of the conductive films 104 and 120b effectively. Note that only one of the openings 152a and 152b may be provided.

Figure 5A:
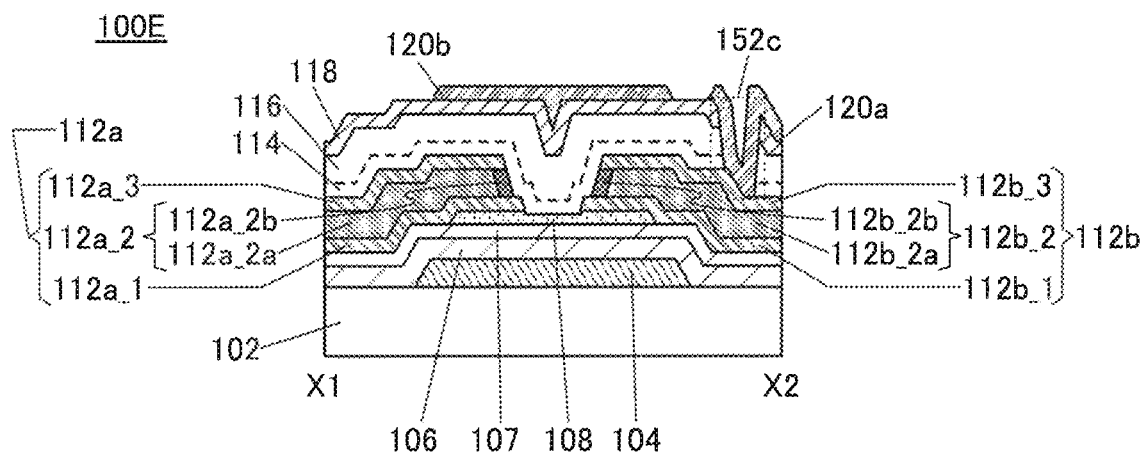
FIGS. 5A and 5B are cross-sectional views illustrating one embodiment of a semiconductor device.
Figure 5B:
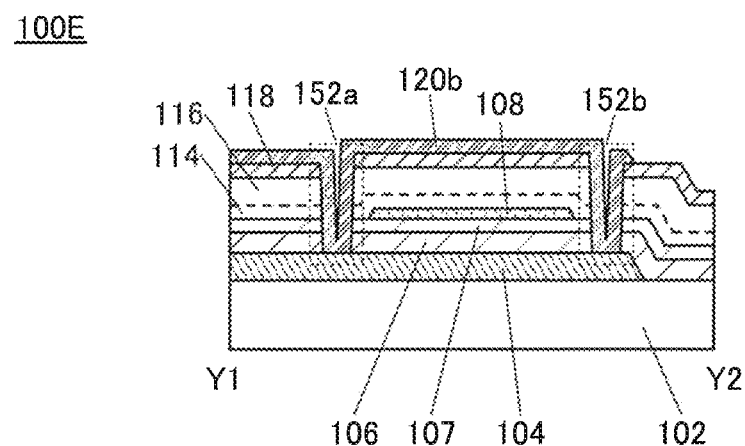

As in a transistor 100E illustrated in FIGS. 5(A) and (B), the conductive films 120a and 120b may be provided over the insulating film 118. In that case, the conductive film 120a and one of the conductive films 112a and 112b are electrically connected through the opening 152c provided in the insulating films 114, 116, and 118, and the conductive film 120b functioning as the second gate electrode and the conductive film 104 functioning as a first gate electrode are electrically connected through the openings 152a and 152b provided in the insulating films 106, 107, 114, 116, and 118. Note that the top view of the transistor 100E is similar to that of the transistor 100D in FIG. 4(A), FIG. 5(A) corresponds to a cross-sectional view taken along the dashed dotted line X1-X2 in FIG. 4(A), and FIG. 5(B) corresponds to a cross-sectional view taken along the dashed dotted line Y1-Y2 in FIG. 4(A). In addition, the other portions of the structure of the transistor 100E are similar to those of the transistor 100D; thus, the structure of the transistor 100D can be referred to.

Figure 6A:
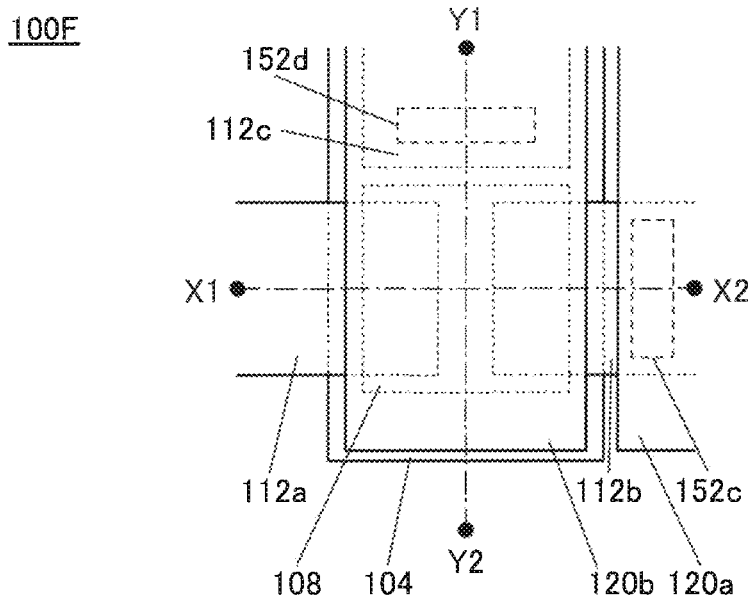
FIG. 6A is a top view and FIGS. 6B and 6C are cross-sectional views illustrating one embodiment of a semiconductor device.
Figure 6B:
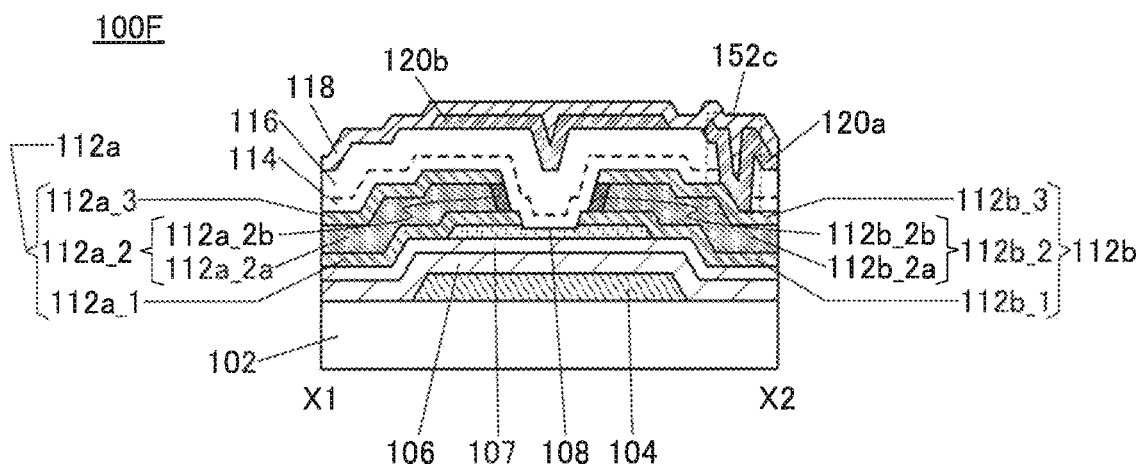
Figure 6C:
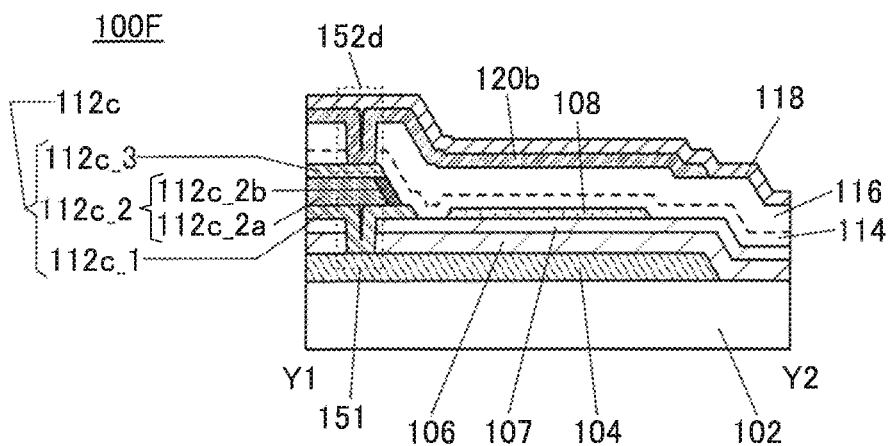

As in a transistor 100F illustrated in FIGS. 6(A), (B), and (C), the conductive film 120b functioning as the second gate electrode may be connected to the conductive film 104 functioning as a first gate electrode, through a conductive film 112c functioning as a connecting electrode. Note that FIG. 6(A) is a top view of the transistor 100F that is a semiconductor device of one embodiment of the present invention. FIG. 6(B) corresponds to a cross-sectional view taken along dashed-dotted line X1-X2 in FIG. 6(A), and FIG. 6(C) corresponds to a cross-sectional view taken along dashed-dotted line Y1-Y2 in FIG. 6(A).

The transistor 100F illustrated in FIGS. 6(A), (B), and (C) is different from the transistor 100A in that the conductive film 112c provided over the insulating film 107 and electrically connected to the conductive film 104 through an opening 151 provided in the first gate insulating film (the insulating films 106 and 107) is included and the conductive film 120b is provided over the insulating film 116 and electrically connected to the conductive film 112c in the opening 152d provided in the second gate insulating film (the insulating films 114 and 116).

In the transistor 100F, the conductive film 104 and the conductive film 120b are electrically connected through the conductive film 112c, one of side surfaces in the channel width direction of the oxide semiconductor film 108 faces the conductive film 112c with the first gate insulating film and the second gate insulating film therebetween. In addition, the conductive films 104 and 120b are supplied with the same potential. Accordingly, the oxide semiconductor film 108 included in the transistor 100F can be electrically surrounded by electric fields of the conductive films 104 and 120b effectively.

In contrast, for example, in the case where the conductive films 104 and 120b are not connected to each other as in the transistor 100A and the transistor 100B, it is possible to supply different potentials to the conductive films 104 and 120b.

In addition, one or both of the length in the channel length direction and the length in the channel width direction of the conductive film 120b are not necessarily longer than the length in the channel length direction and/or the length in the channel width direction of the oxide semiconductor film 108.

The conductive film 112c can be formed in the same process as that of the conductive films 112a and 112b. In that case, the conductive film 112c includes a conductive film 112c_1, a conductive film 112c_2 over and in contact with the conductive film 112c_1, and a conductive film 112c_3 over and in contact with the conductive film 112c_2. The conductive film 112c_2 includes a region 112c_2a and a region 112c_2b.

The conductive film 112c_2 contains copper, the region 112c_2b contains copper and silicon, and the conductive films 112c_1 and 112c_3 each include a material that inhibits diffusion of copper. The region 112c_2b is located at the end portion of the conductive film 112c_2 and includes a region in contact with the insulating film 114. The end portion of the conductive film 112c_1 includes a region located outward from the end portion of the conductive film 112c_2. The conductive film 112c_3 covers the top surface of the conductive film 112c_2. Accordingly, the conductive film 112c_2a is covered with the conductive film 112c_1, the region 112c_2b, and the conductive film 112c_3.

The region 112c_2b can be formed with the same materials and in the same process as those of the regions 112a_2b and 112b_2b.

With the foregoing structure, the resistance of the conductive film 112c can be reduced. Furthermore, diffusion of a copper element to the outside of the conductive film 112c, in particular, to the oxide semiconductor film 108, can be inhibited.

Note that the other portions of the structure of the transistor 100F are similar to those of the transistor 100A; thus, the structure of the transistor 100A can be referred to.

<1-3. Structure Example 3 of Semiconductor Device>

Figure 7A:
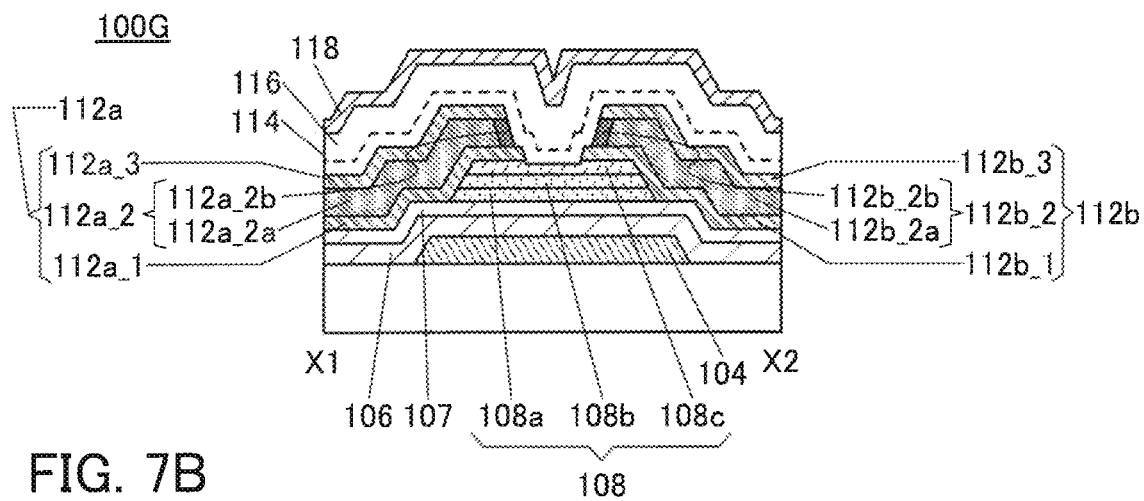
FIGS. 7A and 7B are cross-sectional views illustrating one embodiment of a semiconductor device.
Figure 7B:
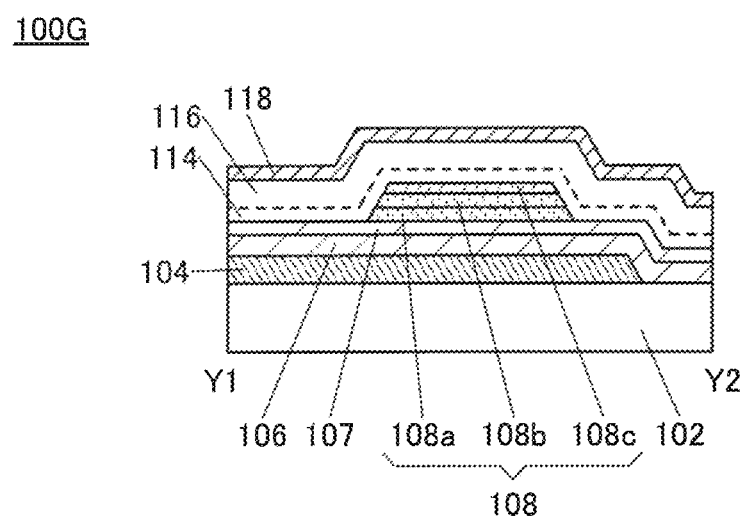

FIGS. 7(A) and (B) are cross-sectional views of a transistor 100G that is a semiconductor device of one embodiment of the present invention, the top view of the transistor 100G is similar to that of the transistor 100 in FIG. 1(A), FIG. 7(A) corresponds to a cross-sectional view taken along dashed-dotted line X1-X2 in FIG. 1(A), and FIG. 7(B) corresponds to a cross-sectional view taken along dashed-dotted line Y1-Y2 in FIG. 1(A).

The transistor 100G is different from the transistor 100 in that the oxide semiconductor film 108 includes an oxide semiconductor film 108a on the conductive film 104 side, an oxide semiconductor film 108b over the oxide semiconductor film 108a, and an oxide semiconductor film 108c over the oxide semiconductor film 108b. That is, the oxide semiconductor film 108 has a three-layer structure. The other portions of the structure of the transistor 100G are similar to those of the transistor 100 and have similar effects. The portions different from those in the transistor 100 are described below.

The oxide semiconductor films 108a, 108b, and 108c each contain In, Zn, and M (M is Al, Ga, Y, or Sn).

For example, the oxide semiconductor film 108b preferably includes a region where the atomic proportion of In is larger than the atomic proportion of M. Furthermore, the oxide semiconductor films 108a and 108c preferably include a region where the atomic proportion of In is smaller than that in the oxide semiconductor film 108b.

When the oxide semiconductor film 108b includes the region where the atomic proportion of In is larger than the atomic proportion of M, the field-effect mobility of the transistor 100G can be increased. Specifically, the field-effect mobility of the transistor 100G can exceed 10 cm$^2$/Vs, more preferably, the field-effect mobility of the transistor 100G can exceed 30 cm$^2$/Vs.

For example, when the transistor with high field-effect mobility is used for a gate driver that generates a gate signal (in particular, a demultiplexer connected to an output terminal of a shift register included in a gate driver), a semiconductor device or a display device whose frame is narrow (also referred to as a narrow frame) can be provided.

On the other hand, when the oxide semiconductor film 108b includes the region where the atomic proportion of In is larger than the atomic proportion of M, the electrical characteristics of the transistor 100G are easily changed in light irradiation. However, in the semiconductor device of one embodiment of the present invention, the oxide semiconductor film 108c is formed over the oxide semiconductor film 108b. The oxide semiconductor film 108c includes the region where the atomic proportion of In is smaller than that in the oxide semiconductor film 108b and thus has larger Eg than the oxide semiconductor film 108b. For this reason, the oxide semiconductor film 108 that is a layered structure of the oxide semiconductor film 108b and the oxide semiconductor film 108c can have increased resistance to a negative bias stress test with light.

Impurities such as hydrogen or moisture entering the oxide semiconductor film 108, in particular, a channel region of the oxide semiconductor film 108b, affect the transistor characteristics and thus cause a problem. Therefore, it is preferable that the amount of impurities such as hydrogen or moisture in the channel region of the oxide semiconductor film 108b be as small as possible. Furthermore, oxygen vacancies formed in the channel region of the oxide semiconductor film 108b affect the transistor characteristics and thus cause a problem. For example, when oxygen vacancies are formed in the channel region of the oxide semiconductor film 108b, the oxygen vacancies are bonded to hydrogen to serve as a carrier supply source. The carrier supply source generated in the channel region of the oxide semiconductor film 108b causes a change in the electrical characteristics, typically, a shift in the threshold voltage, of the transistor 100G including the oxide semiconductor film 108b. Therefore, it is preferable that the amount of oxygen vacancies in the channel region of the oxide semiconductor film 108b be as small as possible.

Thus, in one embodiment of the present invention, insulating films in contact with the oxide semiconductor film 108, specifically, the insulating films 114 and 116 formed above the oxide semiconductor film 108, contain excess oxygen. Oxygen or excess oxygen is transferred from the insulating films 114 and 116 to the oxide semiconductor film 108, whereby the oxygen vacancies in the oxide semiconductor film can be reduced.

Figure 8A:
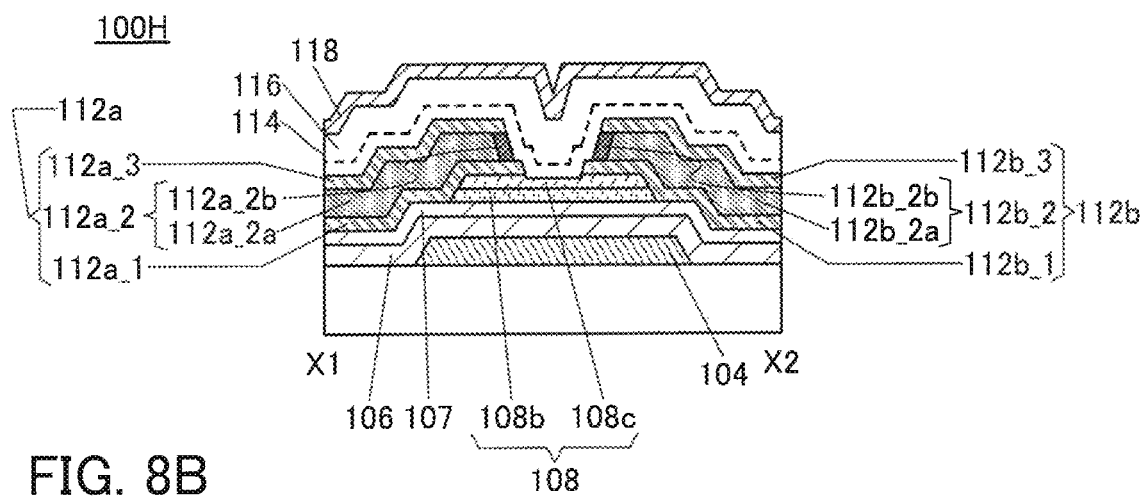
FIGS. 8A and 8B are cross-sectional views illustrating one embodiment of a semiconductor device.
Figure 8B:
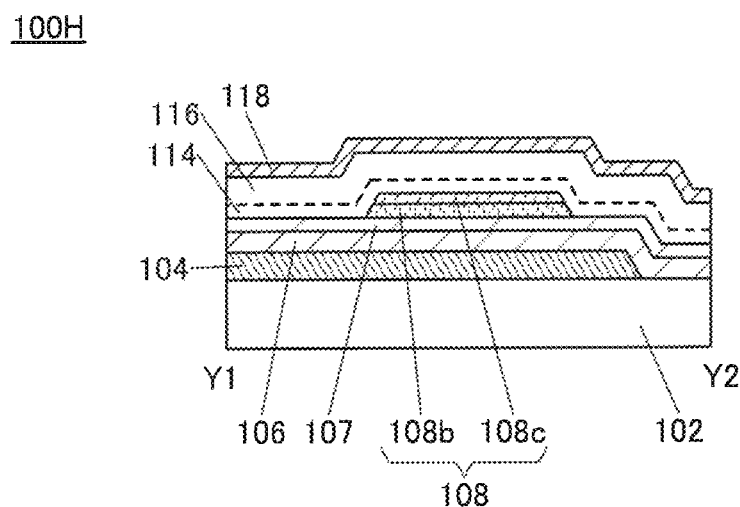

As in a transistor 100H illustrated in FIGS. 8(A) and (B), the oxide semiconductor film 108 may have a two-layer structure with the oxide semiconductor film 108b and the oxide semiconductor film 108c. Note that a top view of the transistor 100H is similar to that of the transistor 100 illustrated in FIG. 1(A), FIG. 8(A) corresponds to a cross-sectional view taken along the dashed dotted line X1-X2 in FIG. 1(A), and FIG. 8(B) corresponds to a cross-sectional view taken along the dashed dotted line Y1-Y2 in FIG. 1(A). The other portions of the structure of the transistor 100H are similar to those of the transistor 100G; thus, the structure of the transistor 100G can be referred to.

Figure 9A:
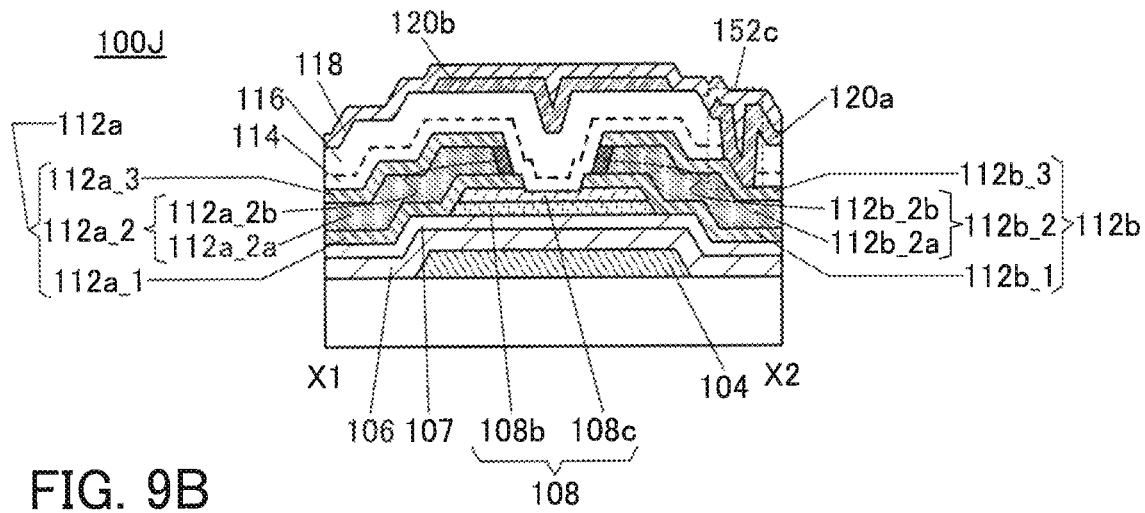
FIGS. 9A-9C are cross-sectional views illustrating one embodiment of a semiconductor device.
Figure 9B:
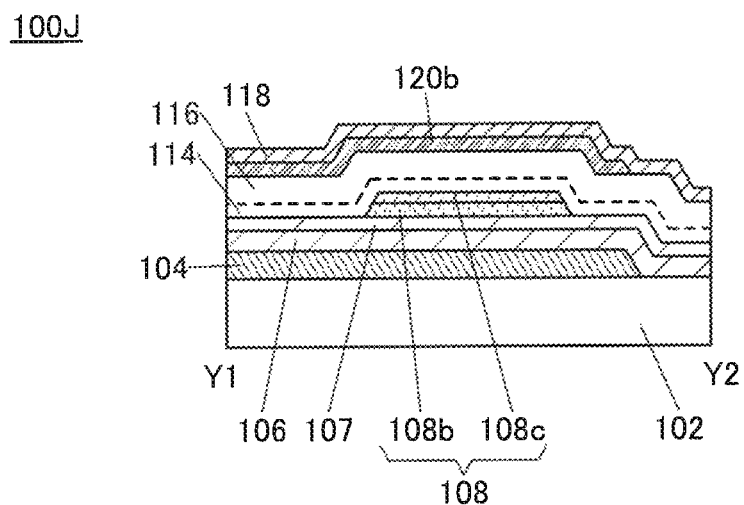

As in a transistor 100J illustrated in FIGS. 9(A) and (B), the conductive film 120b functioning as the second gate electrode may be included, and the oxide semiconductor film 108 may include the oxide semiconductor film 108b and the oxide semiconductor film 108c. Note that a top view of the transistor 100J is similar to that of the transistor 100A illustrated in FIG. 2(A), FIG. 9(A) corresponds to a cross-sectional view taken along the dashed dotted line X1-X2 in FIG. 2(A), and FIG. 9(B) corresponds to a cross-sectional view taken along the dashed dotted line Y1-Y2 in FIG. 2(A). The other portions of the structure of the transistor 100J are similar to those of the transistor 100A; thus, the structure of the transistor 100A can be referred to.

Figure 9C:
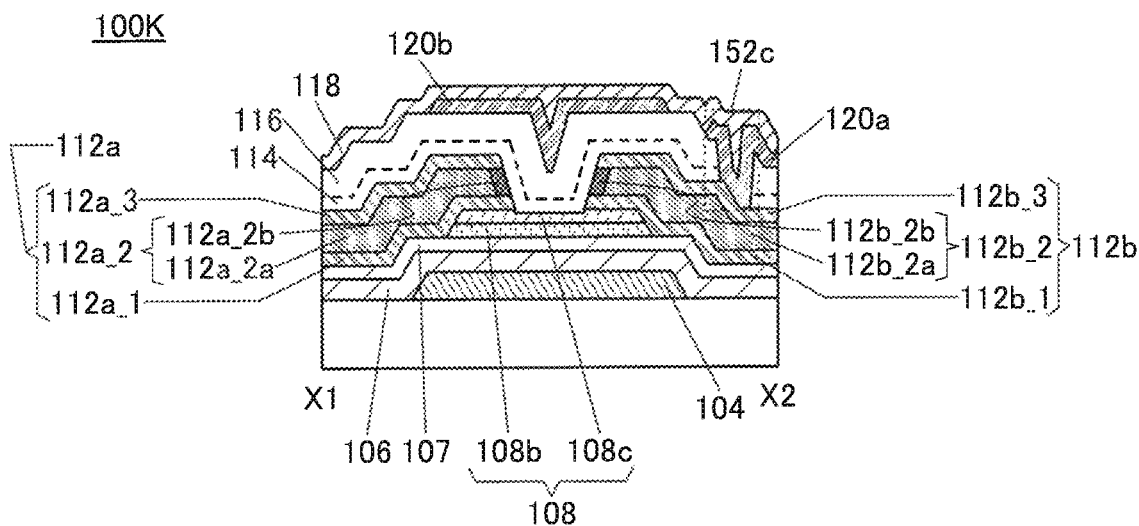

As in a transistor 100K illustrated in FIG. 9(C), the conductive films 112a and 112b may include a region where the end portion of the conductive film 112a_1 and the end portion of the conductive film 112a_2 are aligned with each other and a region where the end portion of the conductive film 112b_1 and the end portion of the conductive film 112b_2 are aligned with each other.

Figure 10A:
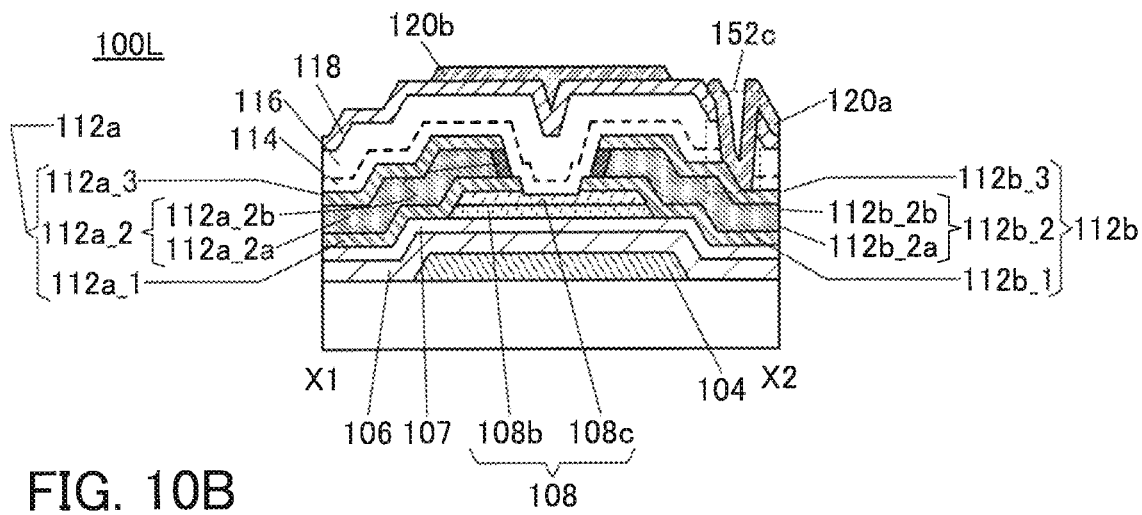
FIGS. 10A-10C are cross-sectional views illustrating one embodiment of a semiconductor device.
Figure 10B:
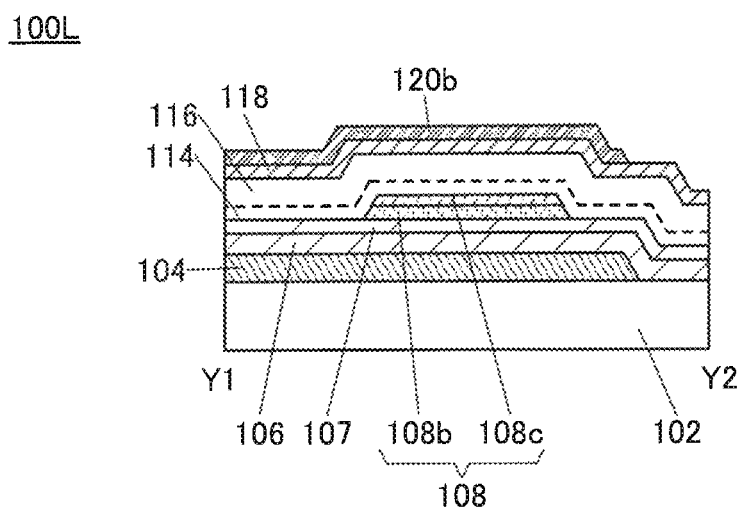

As in a transistor 100L illustrated in FIGS. 10(A) and (B), the conductive films 120a and 120b may be provided over the insulating film 118. As in the transistor 100M illustrated in FIG. 10(C), the conductive films 112a and 112b may include a region where the end portion of the conductive film 112a_1 and the end portion of the conductive film 112a_2 are aligned with each other and a region where the end portion of the conductive film 112b_1 and the end portion of the conductive film 112b_2 are aligned with each other.

As in the transistors 100J, 100K, 100L, and 100M, with an s-channel structure, carriers flow in a further wide range of the oxide semiconductor film 108, that is, a region on the first gate insulating film side of the oxide semiconductor film 108b and a region on the second gate insulating film side of the oxide semiconductor film 108b. Therefore, the amount of carriers that transfer in these transistors is increased. As a result, the on-state current and the field-effect mobility of the transistors are increased.

Figure 11A:
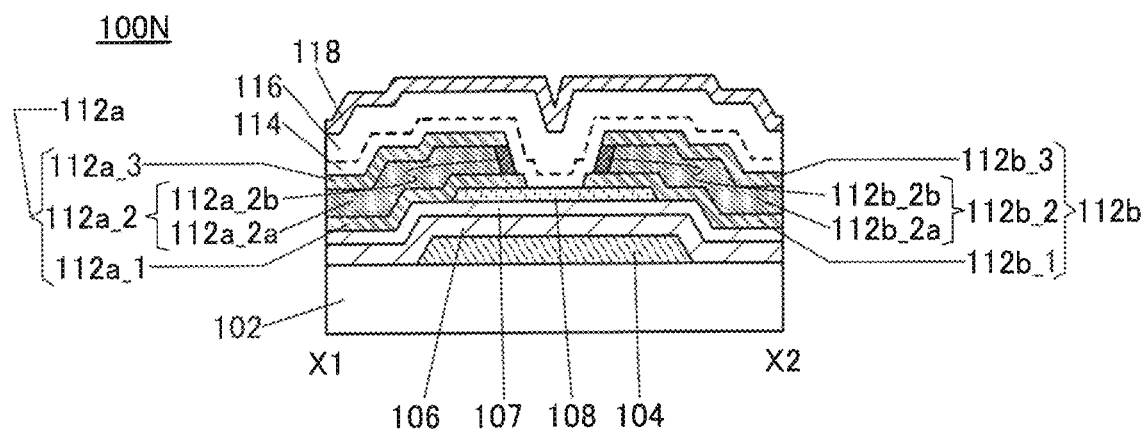
FIGS. 11A and 11B are cross-sectional views illustrating one embodiment of a semiconductor device.
Figure 11B:
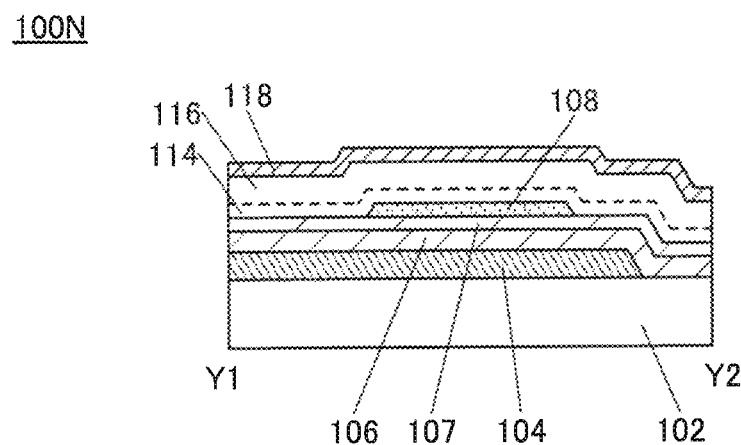

The drawings illustrate an example in which the oxide semiconductor film 108 in the transistor 100 is reduced in thickness in a region which is not covered with the conductive films 112a and 112b, in other words, part of the oxide semiconductor film has a depressed portion. However, one embodiment of the present invention is not limited thereto, and the oxide semiconductor film in a region which is not covered with the conductive films 112a and 112b is not necessarily reduced in thickness and does not necessarily have a depressed region. FIGS. 11(A) and (B) illustrate an example of this case. FIGS. 11(A) and (B) are cross-sectional views illustrating an example of the semiconductor device. Note that FIGS. 11(A) and (B) are cross-sectional views of the transistor 100N having a structure in which the oxide semiconductor film 108 of the aforementioned transistor 100 does not have a depressed portion.

<1-4. Structure Example 4 of Semiconductor Device>

Figure 12A:
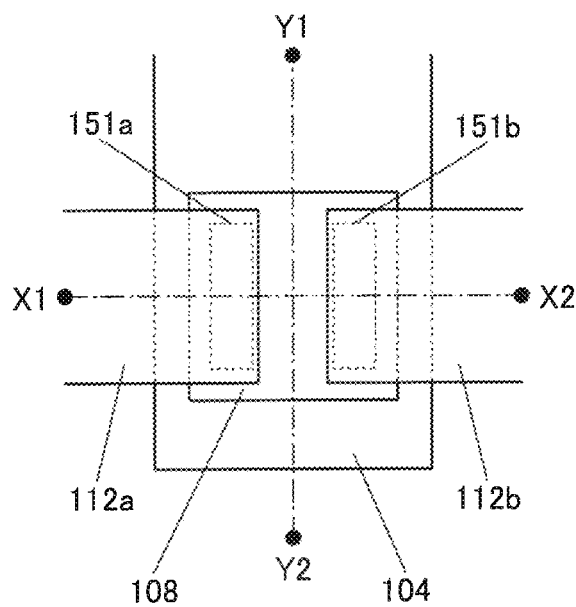
FIG. 12A is a top view and FIGS. 12B and 12C are cross-sectional views illustrating one embodiment of a semiconductor device.
Figure 12B:
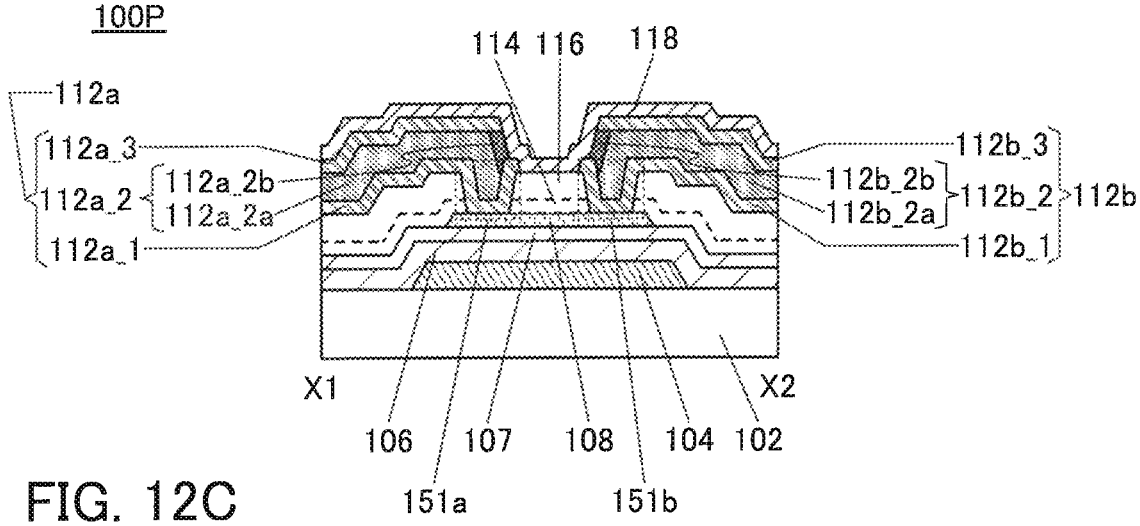
Figure 12C:
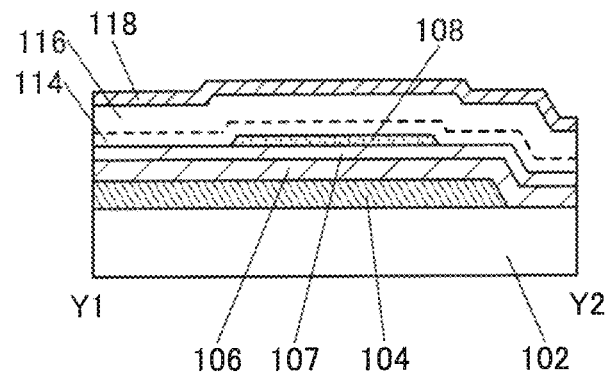

FIG. 12(A) is a top view of a transistor 100P, FIG. 12(B) corresponds to a cross-sectional view taken along dashed-dotted line X1-X2 in FIG. 12(A), and FIG. 12(C) corresponds to a cross-sectional view taken along dashed-dotted line Y1-Y2 in FIG. 12(A).

The transistor 100P illustrated in FIG. 12 includes the conductive film 104 over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a electrically connected to the oxide semiconductor film 108 through an opening 151a provided in the insulating films 114 and 116, and the conductive film 112b electrically connected to the oxide semiconductor film 108 through an opening 151b provided in the insulating films 114 and 116. In addition, the insulating film 118 is provided over the transistor 100P, more specifically, over the conductive films 112a and 112b and the insulating film 116.

Note that in the transistor 100P, the insulating films 106 and 107 have a function of a gate insulating film of the transistor 100P, the insulating films 114 and 116 have a function of a protective insulating film of the oxide semiconductor film 108, and the insulating film 118 has a function of a protective insulating film of the transistor 100P. Furthermore, in the transistor 100P, the conductive film 104 has a function of a gate electrode, the conductive film 112a has a function of a source electrode, and the conductive film 112b has a function of a drain electrode.

Although the transistor 100 illustrated in FIG. 1 has a channel-etched structure, the transistor 100P illustrated in FIGS. 12(A), (B), and (C) has a channel-protective structure. A channel-protective transistor can also be suitably used as a semiconductor device of one embodiment of the present invention. The other portions of the structure of the transistor 100P are similar to those of the transistor 100; thus, the structure of the transistor 100 can be referred to.

Figure 13A:
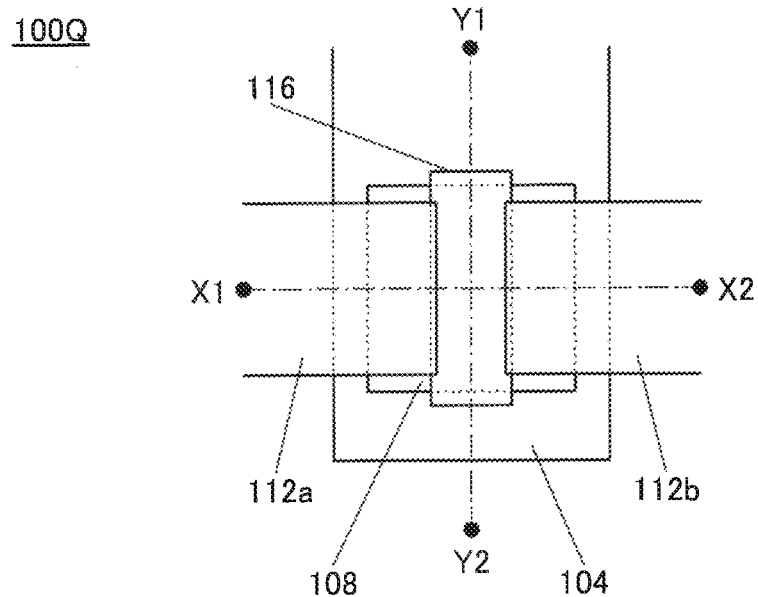
FIG. 13A is a top view and FIGS. 13B and 13C are cross-sectional views illustrating one embodiment of a semiconductor device.
Figure 13B:
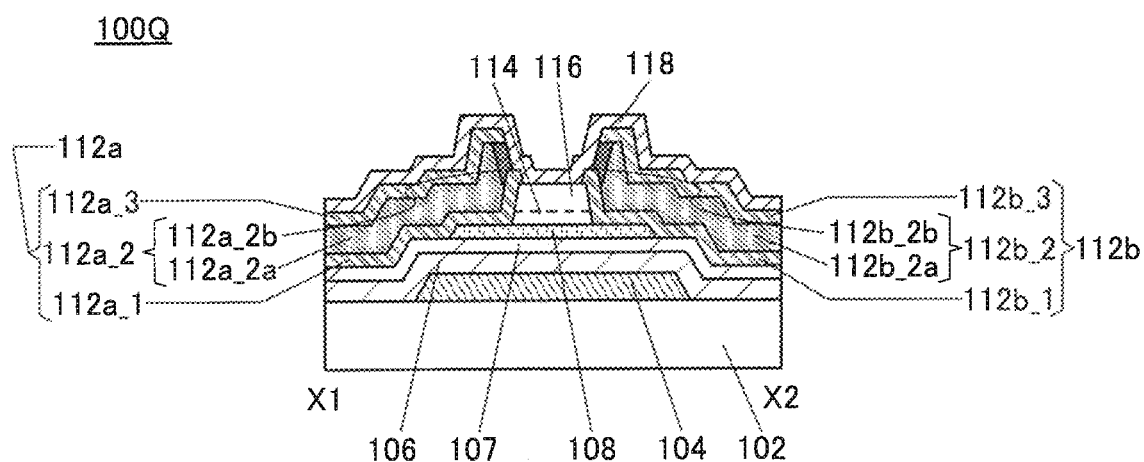
Figure 13C:
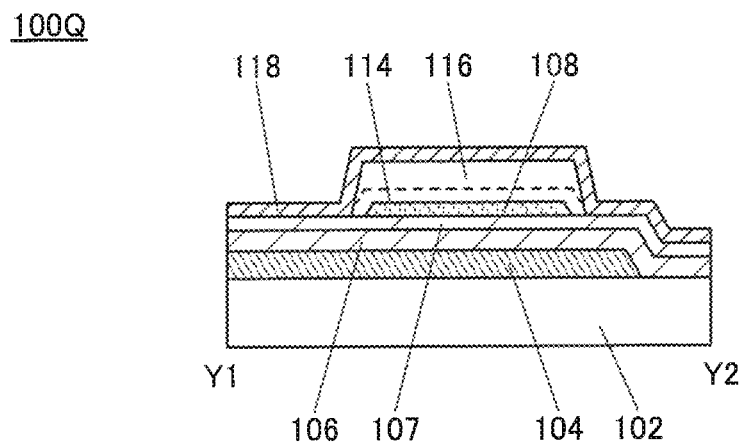

FIG. 13(A) is a top view of a transistor 100Q, FIG. 13(B) corresponds to a cross-sectional view taken along dashed-dotted line X1-X2 in FIG. 13(A), and FIG. 13(C) corresponds to a cross-sectional view taken along dashed-dotted line Y1-Y2 in FIG. 13(A).

The transistor 100Q illustrated in FIG. 13 is different from the transistor 100P illustrated in FIGS. 12(A), (B), and (C) in the shapes of the insulating films 114 and 116. Specifically, the insulating films 114 and 116 of the transistor 100Q are provided to have an island shape over a channel region of the oxide semiconductor film 108. The other portions of the structure are similar to those of the transistor 100P.

The above structures of the transistors relating to this embodiment can be freely combined with each other.

<1-5. Components of Semiconductor Device>

Components included in the semiconductor device of this embodiment are described in detail below.

<<Substrate>>

There is no particular limitation on the property of a material and the like of the substrate 102 as long as it has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon or silicon carbide, a compound semiconductor substrate of silicon germanium or the like, an SOI substrate, or the like can be used, or these substrates over which a semiconductor element is provided may be used as the substrate 102.

Note that in the case where a glass substrate is used as the substrate 102, a large-area substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like is used, whereby a large-sized display device can be manufactured.

Alternatively, a flexible substrate may be used as the substrate 102, and the transistor 100 may be formed directly on the flexible substrate. Alternatively, a separation layer may be provided between the substrate 102 and the transistor 100. The separation layer can be used when part or the whole of a semiconductor device formed thereover is separated from the substrate 102 and transferred onto another substrate. In such a case, the transistor 100 can be transferred to a substrate having low heat resistance or a flexible substrate as well.

<<Conductive Film>>

The conductive film 104 functioning as the first gate electrode, the conductive film 112a functioning as the source electrode, the conductive film 112b functioning as the drain electrode, the conductive film 112c functioning as the connecting electrode, the conductive film 120b functioning as the second gate electrode, and the conductive film 120a functioning as the pixel electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing the metal elements as its components; an alloy containing a combination of the metal elements; or the like.

Furthermore, Cu is preferably used for the conductive films 104, 112a, 112b, 112c, 120a, and 120b. A Cu—X alloy film (X is Mn, Ni, Cr, Fe, Co, Mo, Ta, or Ti) may be used. The use of a Cu—X alloy film results in lower manufacturing cost because the film can be processed by a wet etching process.

Note that Cu or the Cu—X alloy film can be suitably used for the conductive film 112a_2 of the conductive film 112a, the conductive film 112b_2 of the conductive film 112b, and the conductive film 112c_2 of the conductive film 112c. A Cu—Mn alloy film is particularly preferable as the Cu—X alloy film. Note that one embodiment of the present invention is not limited thereto as long as the conductive films 112a_2, 112b_2, and 112c_2 contain at least copper.

The regions 112a_2b, 112b_2b, and 112c_2b preferably contain Cu and Si, and preferably contain copper silicide. When the regions 112a_2b, 112b_2b, and 112c_2b contain copper silicide nitride, diffusion of copper to the outside can be inhibited. Copper silicide is formed by depositing Cu or a Cu-containing alloy and then making it react with, for example, a silane gas. After the reaction with the silane gas, reaction with plasma containing, for example, nitrogen may be performed to form copper silicide nitride containing Cu, Si, and N. Note that in the case where a surface of copper or a copper-containing alloy is covered with an oxide film, reduction treatment for removing the oxide film is preferably performed using hydrogen, ammonia, or the like before the reaction.

The conductive films 112a_1 and 112a_3 of the conductive film 112a, the conductive films 112b_1 and 112b_3 of the conductive film 112b, and the conductive films 112c_1 and 112c_3 of the conductive film 112c preferably contain any one or more selected from, in particular, titanium, tungsten, tantalum, and molybdenum among the above metal elements. When the conductive films 112a_1, 112a_3, 112b_1, 112b_3, 112c_1, and 112c_3 contain any one or more selected from titanium, tungsten, tantalum, and molybdenum, diffusion of copper contained in the conductive films 112a_2, 112b_2, and 112c_2 to the outside can be inhibited. That is, the conductive films 112a_1, 112a_3, 112b_1, 112b_3, 112c_1, and 112c_3 have a function of what is called a barrier metal.

For the conductive films 112a_1, 112a_3, 112b_1, 112b_3, 112c_1, and 112c_3, what is called a tantalum nitride film, which contains nitrogen and tantalum, is suitably used. The tantalum nitride film has conductivity and a high barrier property against copper or hydrogen. Furthermore, the tantalum nitride film releases little hydrogen from itself; thus, it can be most suitably used as the conductive film in contact with the oxide semiconductor film 108.

Oxide conductors such as an oxide containing indium and tin, an oxide containing tungsten and indium, an oxide containing tungsten, indium, and zinc, an oxide containing titanium and indium, an oxide containing titanium, indium, and tin, an oxide containing indium and zinc, an oxide containing silicon, indium, and tin, and an oxide containing indium, gallium, and zinc may be used for the conductive films 104, 112a_1, 112a_3, 112b_1, 112b_3, 112c_1, 112c_3, 120a, and 120b. When the conductive films 112a_1, 112a_3, 112b_1, 112b_3, 112c_1, and 112c_3 include an oxide containing at least one of In and Zn, diffusion of copper contained in the conductive films 112a_2, 112b_2, and 112c_2 to the outside can be inhibited.

In particular, the oxide conductors can be suitably used for the conductive film 120a. The conductive film 120a and the oxide semiconductor film 108 (the oxide semiconductor films 108b and 108c) favorably include the same metal element. With the structure, the manufacturing cost can be reduced.

Here, an oxide conductor is described. In this specification and the like, an oxide conductor may be referred to as OC (Oxide Conductor). As for an oxide conductor, for example, oxygen vacancies are formed in an oxide semiconductor and hydrogen is added to the oxygen vacancies to form a donor level in the vicinity of the conduction band. As a result, the oxide semiconductor has increased conductivity to be a conductor. The oxide semiconductor having become a conductor can be referred to as an oxide conductor. An oxide semiconductor generally has a visible light transmitting property because of its large energy gap. Meanwhile, an oxide conductor is an oxide semiconductor having a donor level in the vicinity of the conduction band. Therefore, the influence of absorption due to the donor level is small in an oxide conductor, and it has a visible light transmitting property comparable to that of an oxide semiconductor.

<<Insulating Films Functioning as First Gate Insulating Film>>

As the insulating films 106 and 107 functioning as the first gate insulating film of the transistor 100, an insulating layer including at least one of the following films formed by a plasma enhanced chemical vapor deposition (PECVD: (Plasma Enhanced Chemical Vapor Deposition)) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of the layered structure of the insulating films 106 and 107, an insulating film of a single layer selected from the materials or an insulating film of three or more layers may be used.

Furthermore, the insulating film 106 has a function of a blocking film that inhibits penetration of oxygen. For example, in the case where excess oxygen is supplied to the insulating films 107, 114, 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and more preferably includes a region containing oxygen whose amount is in excess of that satisfying the stoichiometric composition (oxygen-excess region). In other words, the insulating film 107 is an insulating film capable of releasing oxygen. Note that in order to provide the oxygen-excess region in the insulating film 107, the insulating film 107 is formed in an oxygen atmosphere, for example. Alternatively, the formed insulating film 107 is subjected to heat treatment in an oxygen atmosphere.

Furthermore, in the case where hafnium oxide is used for the insulating film 107, the following effect is attained. Hafnium oxide has a higher dielectric constant than silicon oxide and silicon oxynitride. Therefore, the insulating film 107 using hafnium oxide can have a larger thickness than the insulating film 107 using silicon oxide; thus, leakage current due to tunnel current can be low. That is, a transistor with low off-state current can be obtained. Moreover, hafnium oxide with a crystal structure has a higher dielectric constant than hafnium oxide with an amorphous structure. Therefore, it is preferable to use hafnium oxide with a crystal structure in order to obtain a transistor with low off-state current. Examples of the crystal structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

As the oxide semiconductor film 108, the materials described above can be used.

In the case where the oxide semiconductor film 108b is In-M-Zn oxide, it is preferable that the atomic ratio of metal elements of a sputtering target used for depositing the In-M-Zn oxide satisfy In>M. The atomic ratio of metal elements of such a sputtering target is, for example, In:M:Zn=2:1:3, In:M:Zn=3:1:2, or In:M:Zn=4:2:4.1.

In the case where the oxide semiconductor films 108a and 108c are In-M-Zn oxide, it is preferable that the atomic ratio of metal elements of a sputtering target used for depositing the In-M-Zn oxide satisfy In≤M. The atomic ratio of metal elements of such a sputtering target is, for example, In:M:Zn=1:1:1, In:M:Zn=1:1:1.2, In:M:Zn=1:3:2, In:M:Zn=1:3:4, or In:M:Zn=1:3:6.

In the case where the oxide semiconductor film 108 (108a, 108b, and 108c) are each In-M-Zn oxide, it is preferable to use a target including polycrystalline In-M-Zn oxide as the sputtering target. The use of the target including polycrystalline In-M-Zn oxide facilitates formation of the oxide semiconductor films 108a, 108b, and 108c having crystallinity. Note that the atomic ratio in each of the oxide semiconductor films 108a, 108b, and 108c which are formed varies from the above atomic ratio of metal elements contained in the sputtering target within a range of ±40%. For example, when a sputtering target of the oxide semiconductor film 108b with an atomic ratio of In:Ga:Zn=4:2:4.1 is used, the atomic ratio of the formed oxide semiconductor film 108b may be In:Ga:Zn=4:2:3 or in the neighborhood thereof.

The energy gap of the oxide semiconductor film 108 is 2 eV or more, preferably 2.5 eV or more, more preferably 3 eV or more. With the use of an oxide semiconductor having such a wide energy gap, the off-state current of the transistor 100 can be reduced. In particular, an oxide semiconductor film having an energy gap of 2 eV or more, preferably 2 eV or more and 3.0 eV or less, is suitably used as the oxide semiconductor film 108b, and an oxide semiconductor film having an energy gap of 2.5 eV or more and 3.5 eV or less is suitably used as the oxide semiconductor films 108a and 108c. Furthermore, the oxide semiconductor films 108a and 108c preferably have a higher energy gap than the oxide semiconductor film 108b.

The thickness of each of the oxide semiconductor films 108a, 108b, and 108c is more than or equal to 3 nm and less than or equal to 200 nm, preferably more than or equal to 3 nm and less than or equal to 100 nm, and more preferably more than or equal to 3 nm and less than or equal to 50 nm.

An oxide semiconductor film with low carrier density is used as the oxide semiconductor films 108a and 108c. For example, the carrier density of the oxide semiconductor films 108a and 108c is lower than or equal to $1\times10^{17}$ cm$^{-3}$, preferably lower than or equal to $1\times10^{15}$ cm$^{-3}$, more preferably lower than or equal to $1\times10^{13}$ cm$^{-3}$, and still more preferably lower than or equal to $1\times10^{11}$ cm$^{-3}$.

Note that without limitation to the above, a material with an appropriate composition can be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio between a metal element and oxygen, the interatomic distance, the density, and the like of the oxide semiconductor film 108 be set appropriately.

Note that it is preferable to use, as the oxide semiconductor film 108, an oxide semiconductor film in which the impurity concentration is low and the density of defect states is low, in which case the transistor having more excellent electrical characteristics can be manufactured. Here, the state in which impurity concentration is low and the density of defect states is low (the amount of oxygen vacancies is small) is referred to as highly purified intrinsic or substantially highly purified intrinsic. A highly purified intrinsic or substantially highly purified intrinsic oxide semiconductor film has few carrier generation sources; thus, the carrier density can be low. Thus, a transistor in which a channel region is formed in the oxide semiconductor film rarely has electrical characteristics in which the threshold voltage is negative (also referred to as normally on). Furthermore, the highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; an element with a channel width of $1\times10^6$ μm and a channel length L of 10 μm can have a characteristic that the off-state current is less than or equal to the measurement limit of a semiconductor parameter analyzer, i.e., less than or equal to $1\times10^{-13}$ A, at voltage (drain voltage) between a source electrode and a drain electrode of from 1 V to 10 V.

Accordingly, the transistor in which the channel region is formed in the highly purified intrinsic or substantially highly purified intrinsic oxide semiconductor film can be a transistor in which a variation in electrical characteristics is small and reliability is high. Note that charge trapped by the trap states in the oxide semiconductor film takes a long time to disappear and may behave like fixed charge. Thus, the transistor whose channel region is formed in the oxide semiconductor film having a high density of trap states has unstable electrical characteristics in some cases. As the impurity, hydrogen, nitrogen, alkali metal, alkaline earth metal, or the like is given.

Hydrogen contained in the oxide semiconductor film reacts with oxygen bonded to a metal atom to be water, and an oxygen vacancy is formed in a lattice from which oxygen is released (or a portion from which oxygen is released). Entry of hydrogen into the oxygen vacancy generates an electron that is a carrier in some cases. Furthermore, in some cases, part of hydrogen is bonded to oxygen bonded to a metal atom to generate an electron that is a carrier. Thus, a transistor using an oxide semiconductor film that contains hydrogen is likely to have normally-on characteristics. Accordingly, it is preferable that hydrogen be reduced as much as possible in the oxide semiconductor film 108. Specifically, in the oxide semiconductor film 108, the hydrogen concentration measured by SIMS analysis is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than or equal to $5\times10^{18}$ atoms/cm$^3$, preferably lower than or equal to $1\times10^{18}$ atoms/cm$^3$, more preferably lower than or equal to $5\times10^{17}$ atoms/cm$^3$, and still more preferably lower than or equal to $1\times10^{16}$ atoms/cm$^3$.

The oxide semiconductor film 108b preferably includes a region where the hydrogen concentration is lower than that in the oxide semiconductor film 108c. When the oxide semiconductor film 108b includes a region where the hydrogen concentration is lower than that in the oxide semiconductor film 108c, a semiconductor device can be reliable.

When silicon or carbon that is one of Group 14 elements is contained in the oxide semiconductor film 108b, oxygen vacancies are increased in the oxide semiconductor film 108b, and it becomes n-type. Thus, the concentration of silicon or carbon in the oxide semiconductor film 108b or the concentration of silicon or carbon (the concentration measured by SIMS analysis) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In the oxide semiconductor film 108b, the concentration of alkali metal or alkaline earth metal that is measured by SIMS analysis is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 108b.

When nitrogen is contained in the oxide semiconductor film 108b, it easily becomes n-type because electrons that are carriers are generated to increase the carrier density. As a result, a transistor using an oxide semiconductor film that contains nitrogen is likely to have normally-on characteristics. Thus, in the oxide semiconductor film, the amount of nitrogen is preferably reduced as much as possible; for example, the nitrogen concentration measured by SIMS analysis is preferably lower than or equal to $5\times10^{18}$ atoms/cm$^3$.

The oxide semiconductor film 108b and the oxide semiconductor film 108c may each have a non-single-crystal structure. Examples of the non-single-crystal structure include a CAAC-OS (C Axis Aligned Crystalline Oxide Semiconductor) described later, a polycrystalline structure, a microcrystalline structure, and an amorphous structure. Among the non-single crystal structures, the amorphous structure has the highest density of defect states, whereas the CAAC-OS has the lowest density of defect states.

<<Insulating Films Functioning as Second Gate Insulating Film>>

The insulating films 114 and 116 function as a second gate insulating film of the transistor 100. Furthermore, the insulating films 114 and 116 have a function of supplying oxygen to the oxide semiconductor film 108. That is, the insulating films 114 and 116 contain oxygen. Furthermore, the insulating film 114 is an insulating film that is permeable to oxygen. Note that the insulating film 114 also functions as a film that relieves damage to the oxide semiconductor film 108 at the time of forming the insulating film 116 later.

Silicon oxide, silicon oxynitride, or the like with a thickness greater than or equal to 5 nm and less than or equal to 150 nm, preferably greater than or equal to 5 nm and less than or equal to 50 nm, can be used for the insulating film 114.

It is preferable that the number of defects in the insulating film 114 be small and typically, the spin density of a signal that appears at g=2.001 due to a dangling bond of silicon be lower than or equal to $3\times10^{17}$ spins/cm$^3$ by ESR measurement. This is because when the density of defects in the insulating film 114 is high, oxygen is bonded to the defects and the amount of oxygen that penetrates the insulating film 114 is decreased.

Note that in the insulating film 114, not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an oxide insulating film that is permeable to oxygen is formed as the insulating film 114, oxygen released from the insulating film 116 provided over the insulating film 114 can be moved to the oxide semiconductor film 108 through the insulating film 114.

The insulating film 114 can be formed using an oxide insulating film having a low density of states due to nitrogen oxide. Note that the density of states due to the nitrogen oxide can be formed between the energy of the valence band maximum (Ev_os) of the oxide semiconductor film and the energy of the conduction band minimum (Ec_os) of the oxide semiconductor film. A silicon oxynitride film that releases a small amount of nitrogen oxide, an aluminum oxynitride film that releases a small amount of nitrogen oxide, or the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1\times10^{18}$ molecules/cm$^3$ and less than or equal to $5\times10^{19}$ molecules/cm$^3$. Note that the amount of released ammonia corresponds to the released amount by heat treatment with which the surface temperature of the film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulating film 114, for example. The level is positioned in the energy gap of the oxide semiconductor film 108. Therefore, when nitrogen oxide diffuses to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Furthermore, nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the interface between the insulating film 114 and the oxide semiconductor film 108.

By using the above oxide insulating film as the insulating film 114, the shift in the threshold voltage of the transistor can be reduced, which reduces a change in the electrical characteristics of the transistor.

Note that in a spectrum of the insulating film 114 that is measured by ESR at 100 K or lower, by heat treatment of a manufacturing process of the transistor, typically heat treatment at higher than or equal to 300° C. and lower than 350° C., a first signal at a g-factor of greater than or equal to 2.037 and less than or equal to 2.039, a second signal at a g-factor of greater than or equal to 2.001 and less than or equal to 2.003, and a third signal at a g-factor of greater than or equal to 1.964 and less than or equal to 1.966 are observed. Note that the split width of the first signal and the second signal and the split width of the second signal and the third signal that are obtained by ESR measurement with an X-band are approximately 5 mT. The sum of the spin densities of the first signal at a g-factor of greater than or equal to 2.037 and less than or equal to 2.039, the second signal at a g-factor of greater than or equal to 2.001 and less than or equal to 2.003, and the third signal at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

Note that in the ESR spectrum at 100 K or lower, the sum of the spin densities of the first signal at a g-factor of greater than or equal to 2.037 and less than or equal to 2.039, the second signal at a g-factor of greater than or equal to 2.001 and less than or equal to 2.003, and the third signal at a g-factor of greater than or equal to 1.964 and less than or equal to 1.966 corresponds to that of signals attributed to nitrogen oxide (NO$_x$; x is greater than 0 and less than or equal to 2, preferably greater than or equal to 1 and less than or equal to 2). Typical examples of the nitrogen oxide include nitrogen monoxide and nitrogen dioxide. That is, the lower the sum of the spin densities of the first signal at a g-factor of greater than or equal to 2.037 and less than or equal to 2.039, the second signal at a g-factor of greater than or equal to 2.001 and less than or equal to 2.003, and the third signal at a g-factor of greater than or equal to 1.964 and less than or equal to 1.966 is, the lower the content of nitrogen oxide in the oxide insulating film is.

The nitrogen concentration of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. with the use of silane and dinitrogen monoxide, whereby a dense and very hard film can be formed.

The insulating film 116 is formed using an oxide insulating film that contains oxygen whose amount is in excess of that satisfying the stoichiometric composition. Part of oxygen is released by heating from the oxide insulating film containing oxygen whose amount is in excess of that satisfying the stoichiometric composition. The oxide insulating film containing oxygen whose amount is in excess of that satisfying the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$, in TDS analysis. Note that the film surface temperature in the TDS is preferably higher than or equal to 100° C. and lower than or equal to 700° C., or higher than or equal to 100° C. and lower than or equal to 500° C.

Silicon oxide, silicon oxynitride, or the like with a thickness greater than or equal to 30 nm and less than or equal to 500 nm, or preferably greater than or equal to 50 nm and less than or equal to 400 nm, can be used for the insulating film 116.

Furthermore, it is preferable that the number of defects in the insulating film 116 be small, and typically, the spin density of a signal that appears at g=2.001 due to a dangling bond of silicon be lower than $1.5\times10^{18}$ spins/cm$^3$, more preferably lower than or equal to $1\times10^{18}$ spins/cm$^3$ by ESR measurement. Note that the insulating film 116 is provided more apart from the oxide semiconductor film 108 than the insulating film 114 is, and thus may have higher density of defects than the insulating film 114.

The insulating films 114 and 116 can be formed using insulating films formed of the same kinds of materials; thus, a boundary between the insulating film 114 and the insulating film 116 cannot be clearly observed in some cases. Thus, in this embodiment, the boundary between the insulating film 114 and the insulating film 116 is shown by a dashed line. Note that although a two-layer structure of the insulating film 114 and the insulating film 116 is described in this embodiment, the present invention is not limited thereto, and for example, a single-layer structure of the insulating film 114 or a layered structure of three or more layers may be employed.

<<Insulating Film Functioning as Protective Insulating Film>>

The insulating film 118 functions as a protective insulating film of the transistor 100.

The insulating film 118 contains one or both of hydrogen and nitrogen. Alternatively, the insulating film 118 contains nitrogen and silicon. Furthermore, the insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen contained in the insulating films 114 and 116, and entry of hydrogen, water, or the like into the oxide semiconductor film 108 from the outside by providing the insulating film 118.

A nitride insulating film can be used as the insulating film 118, for example. For the nitride insulating film, silicon nitride, silicon nitride oxide, aluminum nitride, aluminum nitride oxide, or the like can be used.

Note that although the variety of films such as the conductive films, the insulating films, and the oxide semiconductor film that are described above can be formed by a sputtering method or a PECVD method, such films may be formed by another method, e.g., a thermal CVD (Chemical Vapor Deposition) method. Examples of a thermal CVD method include an MOCVD (Metal Organic Chemical Vapor Deposition) method and an ALD (Atomic Layer Deposition) method.

A thermal CVD method has an advantage that no defect due to plasma damage is generated since it does not utilize plasma to form a film.

Deposition by a thermal CVD method may be performed in such a manner that a source gas and an oxidizer are supplied to a chamber at a time, the pressure in the chamber is set to an atmospheric pressure or a reduced pressure, and they are made to react with each other in the vicinity of the substrate or over the substrate to be deposited on the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated.

The variety of films such as the conductive films, the insulating films, the oxide semiconductor film, and the metal oxide film in the above embodiment can be formed by a thermal CVD method such as an MOCVD method or an ALD method, and in the case where an In—Ga—ZnO film is formed, for example, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Furthermore, without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using ALD, two kinds of gases, ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)), are used. Note that the chemical formula of tetrakis(dimethylamide)hafnium is $Hf[N(CH_3)_2]_4$. Furthermore, as other material liquids, tetrakis(ethylmethylamide)hafnium and the like are given.

For example, in the case where an aluminum oxide film is formed by a deposition apparatus using ALD, two kinds of gases, $H_2O$ as an oxidizer and a source gas which is obtained by vaporizing liquid containing a solvent and an aluminum precursor compound (e.g., trimethylaluminum (TMA)), are used. Note that the chemical formula of trimethylaluminum is $Al(CH_3)_3$. Furthermore, as other material liquids, tris(dimethylamide)aluminum, triisobutylaluminum, aluminum tris(2,2,6,6-tetramethyl-3,5-heptanedionate), and the like are given.

For example, in the case where a silicon oxide film is formed by a deposition apparatus using ALD, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

For example, in the case where a tungsten film is formed by a deposition apparatus using ALD, a $WF_6$ gas and a $B_2H_6$ gas are introduced sequentially and repeatedly to form an initial tungsten film, and then a tungsten film is formed using a $WF_6$ gas and an $H_2$ gas. Note that an $SiH_4$ gas may be used instead of a $B_2H_6$ gas.

For example, in the case where an oxide semiconductor film, e.g., an In—Ga—ZnO film is formed by a deposition apparatus using ALD, an $In(CH_3)_3$ gas and an $O_3$ gas are introduced sequentially and repeatedly to form an In—O layer, then a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an In—Ga—O layer, an In—Zn—O layer, or a Ga—Zn—O layer may be formed by using these gases. Note that an $H_2O$ gas which is obtained by bubbling with an inert gas such as Ar may be used instead of an $O_3$ gas, but it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. A $Zn(CH_3)_2$ gas may be used.

<1-6. Manufacturing Method 1 of Transistor>

Figure 14A:
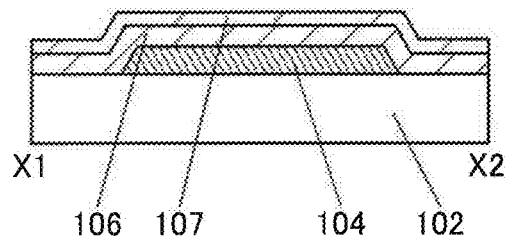
FIGS. 14A-14F are cross-sectional views illustrating an example of a manufacturing process of a semiconductor device.
Figure 14B:
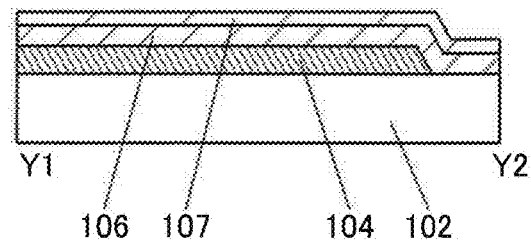

Next, a method for manufacturing the transistor 100J that is a semiconductor device of one embodiment of the present invention is described with reference to FIG. 14 to FIG. 17. Note that FIG. 14 to FIG. 17 are cross-sectional views illustrating a method for manufacturing the semiconductor device. FIGS. 14(A), (C), and (E), FIGS. 15(A), (C), and (E), FIGS. 16(A), (C), and (E), and FIGS. 17(A), (C), and (E) are cross-sectional views in the channel length direction shown by X1-X2, and FIGS. 14(B), (D), and (F), FIGS. 15(B), (D), and (F), FIGS. 16(B), (D), and (F), and FIGS. 17(B), (D), and (F) are cross-sectional views in the channel width direction shown by Y1-Y2.

<<Step of Forming First Gate Electrode and First Gate Insulating Film>>

First, a conductive film is formed over the substrate 102 and processed through a lithography process and an etching process, whereby the conductive film 104 that functions as the first gate electrode is formed. Then, the insulating films 106 and 107 serving as the first gate insulating film are formed over the conductive film 104 (see FIGS. 14(A) and 14(B)).

In this embodiment, a glass substrate is used as the substrate 102, and as the conductive film 104 serving as the first gate electrode, a 10-nm-thick titanium film, a 100-nm-thick copper film, and a 50-nm-thick tantalum nitride film are each formed by a sputtering method.

As the insulating film 106, a 400-nm-thick silicon nitride film is formed by a PECVD method, and as the insulating film 107, a 15-nm-thick silicon oxynitride film is formed by a PECVD method. Note that the insulating film 106 can have a layered structure of silicon nitride films. Specifically, the insulating film 106 can have a three-layer structure of a first silicon nitride film, a second silicon nitride film, and a third silicon nitride film. An example of the three-layer structure can be formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

For example, in the case where a conductive film containing copper (Cu) is used as the conductive film 104, the use of the three-layer structure of silicon nitride films for the insulating film 106 provides the following effect.

The first silicon nitride film can inhibit diffusion of a copper (Cu) element from the conductive film 104. The second silicon nitride film has a function of releasing hydrogen and can improve withstand voltage of the insulating film that serves as a gate insulating film. The third silicon nitride film releases a small amount of hydrogen and can inhibit diffusion of hydrogen released from the second silicon nitride film.

The insulating film 107 is preferably formed of an insulating film containing oxygen to improve the characteristics of an interface with the oxide semiconductor film 108 (more specifically the oxide semiconductor film 108b) formed later. Oxygen may be added to the insulating film 107 after the insulating film 107 is formed. As the oxygen to be added to the insulating film 107, an oxygen radical, an oxygen atom, an oxygen atomic ion, an oxygen molecular ion, and the like are given. Methods for adding oxygen include an ion doping method, an ion implantation method, a plasma treatment method, and the like.

<<Step of Forming Oxide Semiconductor Film>>

Figure 14C:
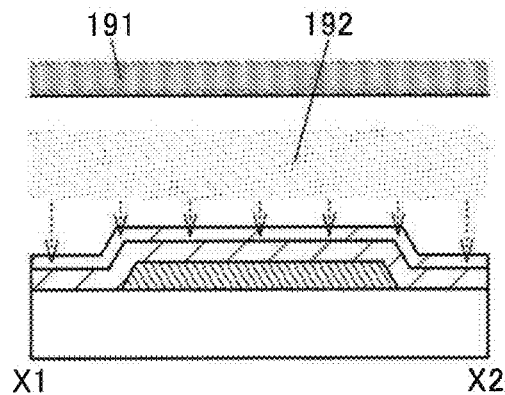
Figure 14D:
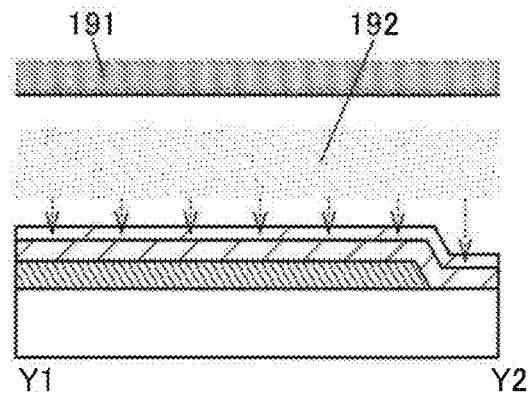

Next, the oxide semiconductor film 108b and the oxide semiconductor film 108c are formed over the insulating film 107 (see FIGS. 14(C) and (D)).

Note that FIGS. 14(C) and (D) are schematic cross-sectional views of an inner portion of a deposition apparatus when an oxide semiconductor film to be the oxide semiconductor film 108 is formed over the insulating film 107. In FIGS. 14(C) and (D), a sputtering apparatus is used as the deposition apparatus, and a target 191 placed inside the sputtering apparatus and plasma 192 formed under the target 191 are schematically illustrated.

When the oxide semiconductor film is formed, plasma is discharged in an atmosphere containing a first oxygen gas. At this time, oxygen is added to the insulating film 107 over which the oxide semiconductor film is to be formed. When the oxide semiconductor film is formed, an inert gas (e.g., a helium gas, an argon gas, or a xenon gas) as well as the first oxygen gas may be mixed.

The first oxygen gas is contained at least when the oxide semiconductor film is formed. The proportion of the first oxygen gas in a deposition gas for forming the oxide semiconductor film is higher than 0% and lower than or equal to 100%, preferably higher than or equal to 10% and lower than or equal to 100%, more preferably higher than or equal to 30% and lower than or equal to 100%.

Note that in FIGS. 14(C) and (D), oxygen or excess oxygen to be added to the insulating film 107 is schematically shown by arrows of broken lines.

Note that the oxide semiconductor films 108b and 108c may be formed at the same substrate temperature or different substrate temperatures. Note that the substrate temperatures for the oxide semiconductor films 108b and 108c are preferably the same, in which case the manufacturing cost can be reduced.

The oxide semiconductor film 108 is formed at a substrate temperature higher than or equal to room temperature and lower than 340° C., preferably higher than or equal to room temperature and lower than or equal to 300° C., more preferably higher than or equal to 100° C. and lower than or equal to 250° C., still more preferably higher than or equal to 100° C. and lower than or equal to 200° C., for example. The oxide semiconductor film 108 is formed while being heated, so that the crystallinity of the oxide semiconductor film 108 can be increased. On the other hand, in the case where a large-sized glass substrate (e.g., the 6th generation to the 10th generation) is used as the substrate 102 and the oxide semiconductor film 108 is formed at a substrate temperature higher than or equal to 150° C. and lower than 340° C., the substrate 102 might be changed in shape (distorted or warped). In the case where a large-sized glass substrate is used, the change in the shape of the glass substrate can be suppressed by forming the oxide semiconductor film 108 at a substrate temperature higher than or equal to 100° C. and lower than 150° C.

In addition, increasing the purity of a sputtering gas is necessary. For example, as an oxygen gas or an argon gas used as a sputtering gas, a gas which is highly purified to have a dew point of −40° C. or lower, preferably −80° C. or lower, more preferably −100° C. or lower, still more preferably −120° C. or lower is used, whereby entry of moisture or the like into the oxide semiconductor film can be prevented as much as possible.

When the oxide semiconductor film is formed by a sputtering method, a chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide semiconductor film are removed as much as possible. Alternatively, a turbo molecular pump and a cold trap are preferably combined so as to prevent a backflow of a gas, especially a gas containing carbon or hydrogen from an exhaust system to the inside of the chamber.

The oxide semiconductor film to be the oxide semiconductor film 108b is formed, and subsequently, the oxide semiconductor film to be the oxide semiconductor film 108c is formed. Note that when these oxide semiconductor films are formed, plasma is discharged in an atmosphere containing a second oxygen gas.

Note that the proportion of the first oxygen gas for forming the oxide semiconductor film to be the oxide semiconductor film 108b may be the same as or different from the proportion of the second oxygen gas for forming the oxide semiconductor film to be the oxide semiconductor film 108c.

In this embodiment, the oxide semiconductor film to be the oxide semiconductor film 108b is formed by a sputtering method using an In—Ga—Zn metal oxide target (In:Ga:Zn=4:2:4.1 [atomic ratio]), and successively, the oxide semiconductor film to be the oxide semiconductor film 108c is formed in a vacuum by a sputtering method using an In—Ga—Zn metal oxide target (In:Ga:Zn=1:1:1.2 [atomic ratio]). The substrate temperature when the oxide semiconductor films are formed is set to 170° C. As the deposition gas for forming the oxide semiconductor film to be the oxide semiconductor film 108b, an oxygen gas at a flow rate of 15 sccm and an argon gas at a flow rate of 35 sccm are used. As the deposition gas for forming the oxide semiconductor film to be the oxide semiconductor film 108c, an oxygen gas at a flow rate of 25 sccm and an argon gas at a flow rate of 25 sccm are used.

Figure 14E:
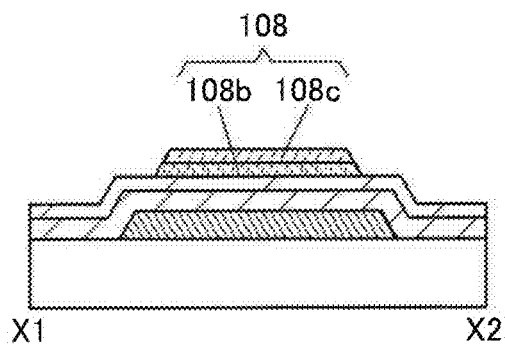
Figure 14F:
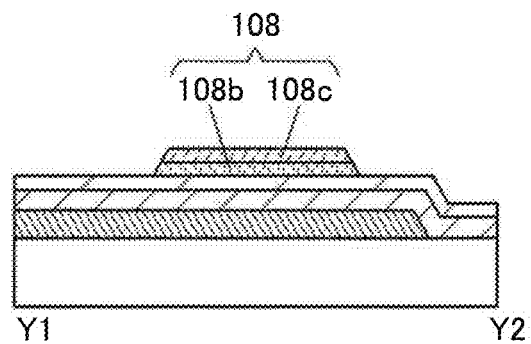

Next, the formed oxide semiconductor films are processed into desired shapes, so that the island-shaped oxide semiconductor films 108b and 108c are formed (see FIGS. 14(E) and (F)). Note that in this embodiment, the oxide semiconductor film 108 is composed of the oxide semiconductor films 108b and 108c (see FIGS. 14(E) and (F)).

Furthermore, heat treatment (hereinafter referred to as first heat treatment) is favorably performed after the oxide semiconductor film 108 is formed. By the first heat treatment, hydrogen, water, and the like contained in the oxide semiconductor film 108 can be reduced. Note that the heat treatment for the purpose of reducing hydrogen, water, and the like may be performed before the oxide semiconductor film 108 is processed into an island shape. Note that the first heat treatment is one kind of treatment for increasing the purity of the oxide semiconductor film.

The first heat treatment can be performed at a temperature of, for example, higher than or equal to 150° C. and lower than the strain point of the substrate, preferably higher than or equal to 200° C. and lower than or equal to 450° C., more preferably higher than or equal to 250° C. and lower than or equal to 350° C.

Moreover, an electric furnace, an RTA (Rapid Thermal Anneal) apparatus, or the like can be used for the first heat treatment. With the use of an RTA apparatus, the heat treatment can be performed at a temperature higher than or equal to the strain point of the substrate if the heating time is short. Therefore, the heating time can be shortened. The first heat treatment may be performed under an atmosphere of nitrogen, oxygen, ultra-dry air (air with a water content of 20 ppm or less, preferably 1 ppm or less, preferably 10 ppb or less), or a rare gas (e.g., argon, helium). Note that the nitrogen, oxygen, ultra-dry air, or rare gas preferably does not contain hydrogen, water, and the like. Furthermore, after heat treatment performed under a nitrogen or rare gas atmosphere, heating may be performed in an oxygen or ultra-dry air atmosphere. As a result, hydrogen, water, and the like in the oxide semiconductor film can be released and oxygen can be supplied to the oxide semiconductor film at the same time. Consequently, oxygen vacancies in the oxide semiconductor film can be reduced.

<<Step of Forming Source Electrode and Drain Electrode>>

Figure 15A:
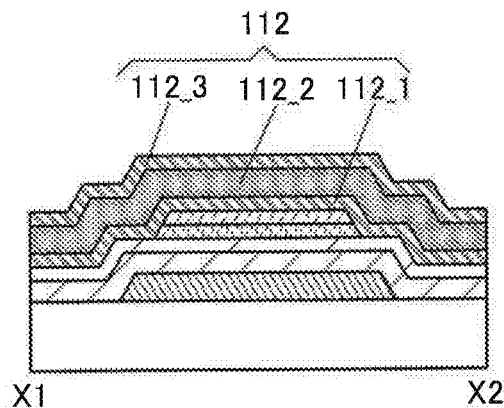
FIGS. 15A-15F are cross-sectional views illustrating an example of a manufacturing process of a semiconductor device.
Figure 15B:
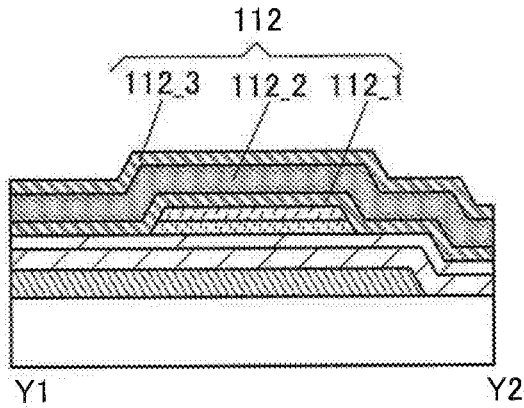
Figure 15C:
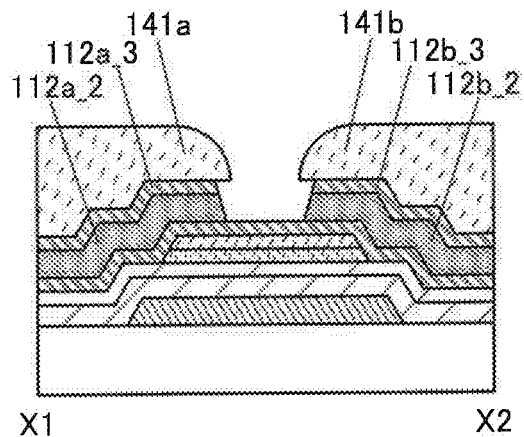
Figure 15D:
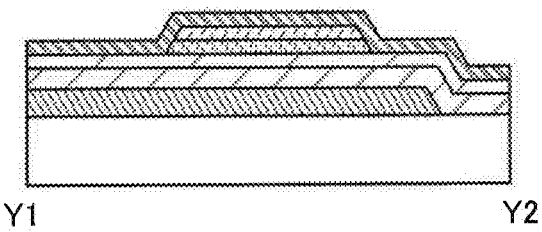

Next, a conductive film 112 to be a source electrode and a drain electrode is formed on the insulating film 107 and the oxide semiconductor film 108 by a sputtering method (see FIGS. 15(A) and (B)).

In this embodiment, conductive films 1121, 1122, and 1123 are stacked to form the conductive film 112. A laminated film in which a 50-nm-thick tungsten film as the conductive film 112_1, a 200-nm-thick copper film as the conductive film 112_2, and a 5-nm-thick tungsten film as the conductive film 112_3 are stacked in this order is formed as the conductive film 112_1 by a sputtering method. Note that in this embodiment, the conductive film 112_1 and the conductive film 112_3 are formed using the same material; however, there is no limitation thereto. For example, a laminated film in which a 50-nm-thick tungsten film as the conductive film 112_1, a 200-nm-thick copper film as the conductive film 112_2, and a 50-nm-thick titanium film as the conductive film 112_3 are formed in this order may be used. The conductive film 112 has a layered structure of three layers; however, there is no limitation thereto. For example, the conductive film 112 may have a layered structure of two layers or a layered structure of four or more layers.

Then, masks 141a and 141b are formed in desired regions over the conductive film 112_3. Subsequently, the conductive films 112_2 and 112_3 are processed using the masks 141a and 141b, whereby the island-shaped conductive films 112a_2, 112b_2, 112a_3, and 112b_3 separated from each other are formed (see FIGS. 15(C) and (D)).

Note that in this embodiment, the conductive films 112_2 and 112_3 are processed with a wet etching apparatus. Note that the method for processing the conductive film 112 is not limited thereto, and a dry etching apparatus may be used, for example. Note that the manufacturing cost can be reduced when the conductive film 112 is processed with a wet etching apparatus compared with when the conductive film 112 is processed with a dry etching apparatus.

Next, the end portions of the conductive films 112a_2 and 112b_2 are silicified, whereby the regions 112a_2a and 112b_2a containing copper and the regions 112a_2b and 112b_2b containing copper silicide are formed.

Figure 15E:
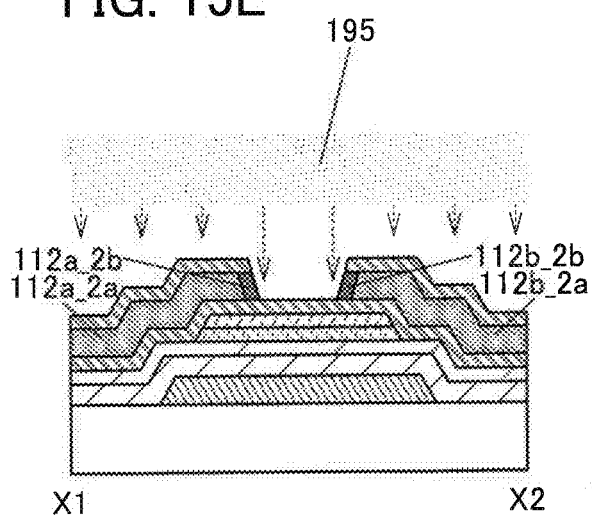
Figure 15F:
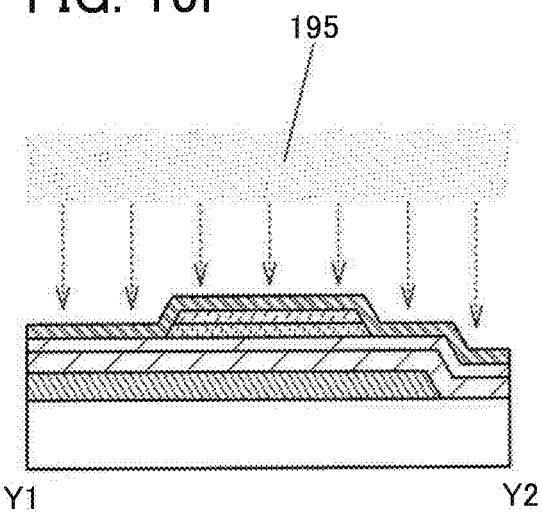

FIGS. 15(E) and (F) are schematic cross-sectional views of the inner portion of a plasma apparatus when the end portions of the conductive films 112a_2 and 112b_2 are silicified. In FIGS. 15(E) and (F), a PECVD apparatus is used as the plasma apparatus and plasma 195 generated inside the PECVD apparatus is schematically illustrated.

Copper exposed at the end portions of the conductive films 112a_2 and 112b_2 easily forms an oxide film on the surface. For this reason, as pretreatment before silicification of copper, plasma is discharged in an atmosphere containing a reducing gas (e.g., a hydrogen gas or an ammonia gas) so that the oxide film that covers the surface of copper is removed. At that time, the oxide film that covers the copper surface is reduced and the copper is exposed at the end portions of the conductive films 112a_2 and 112b_2. Note that the reduction method for removing the oxide film is not limited to plasma treatment. For example, the reduction may be performed by exposing the surface of copper to an atmosphere containing a reducing gas (e.g., a hydrogen gas or an ammonia gas) and performing heat treatment. The substrate temperature when the plasma treatment and heat treatment are performed is preferably higher than or equal to 300° C., more preferably higher than or equal to 350° C. The substrate temperature when the oxide film covering the copper surface is removed is 350° C. in this embodiment.

Subsequently, by performing exposure to an atmosphere containing a silane gas to make copper and the silane gas reach with each other, copper silicide containing copper and silicon is formed at the end portions of the conductive films 112a_2 and 112b_2, so that the regions 112a_2b and 112b_2b are formed. In the conductive films 112a_2 and 112b_2, regions where copper silicide is not formed are the regions 112a_2a and 112b_2a. The substrate temperature during the formation of copper silicide is preferably higher than or equal to 200° C. and lower than or equal to 400° C., more preferably higher than or equal to 220° C. and lower than or equal to 350° C. In this embodiment, the substrate temperature during the formation of copper silicide is 220° C., and a silane gas at a flow rate of 300 sccm and a nitrogen gas at a flow rate of 500 sccm are used.

The substrate temperature during the removal of the oxide film on the copper surface and the substrate temperature during the formation of copper silicide are preferably the same because the removal of the oxide film and the formation of copper silicide can be performed in the same apparatus or the same chamber. In that case, the substrate temperature during the formation of copper silicide is preferably set to 350° C.

Note that the gas for forming copper silicide contains at least silicon, and a gas containing silicon accounts for greater than 0% and less than or equal to 100%, preferably greater than or equal to 10% and less than or equal to 100%, more preferably greater than or equal to 30% and less than or equal to 100% of the whole gas for forming copper silicide.

Note that in FIGS. 15(E) and (F), silicon or silane that is added to the conductive films 112a_2 and 112b_2 is schematically shown by arrows of broken lines.

Note that after copper silicide is formed, plasma may be discharged in an atmosphere of a gas containing nitrogen to form copper silicide nitride containing copper, silicon, and nitrogen in the conductive films 112a_2 and 112b_2. The substrate may be exposed to an atmosphere of a gas containing nitrogen and heat treatment is performed to form copper silicide nitride containing copper, silicon, and nitrogen in the conductive films 112a_2 and 112b_2.

Then, masks 142a and 142b are formed over part of the conductive film 112_1 and desired regions of the conductive films 112a_2, 112b_2, 112a_3, and 112b_3. Subsequently, the conductive film 112_1 is processed using the masks 142a and 142b, whereby the island-shaped conductive films 112a_1 and 112b_1 separated from each other are formed. When the process is performed, the conductive film 112a that includes the conductive film 112a_1, the conductive film 112a_2 including the regions 112a_2a and 112a_2b, and the conductive film 1123 and the conductive film 112b that includes the conductive film 112b_1, the conductive film 112b_2 including the regions 112b_2a and 112b_2b, and the conductive film 112b_3 are formed (see FIGS. 16(A) and (B)).

Note that in this embodiment, the conductive film 112_1 is processed with a dry etching apparatus. Note that the method for processing the conductive film 112_1 is not limited thereto, and a wet etching apparatus may be used, for example. Note that a finer pattern can be formed when a dry etching apparatus is used for processing the conductive film 112_1 than when a wet etching apparatus is used for processing the conductive film 112_1.

After the conductive films 112a and 112b are formed, a surface (on the back channel side) of the oxide semiconductor film 108 (more specifically, the oxide semiconductor film 108b) may be cleaned. An example of the cleaning method is cleaning using a chemical solution such as phosphoric acid. The cleaning using a chemical solution such as phosphoric acid can remove impurities (e.g., elements included in the conductive films 112a and 112b) attached to the surface of the oxide semiconductor film 108b. Note that the cleaning is not necessarily performed; in some cases, the cleaning does not need to be performed.

In the step of forming the conductive films 112a and 112b and/or the cleaning step, the thickness of a region of the oxide semiconductor film 108 which is not covered with the conductive films 112a and 112b might be reduced.

<<Step of Forming Second Gate Insulating Film>>

Figure 16A:
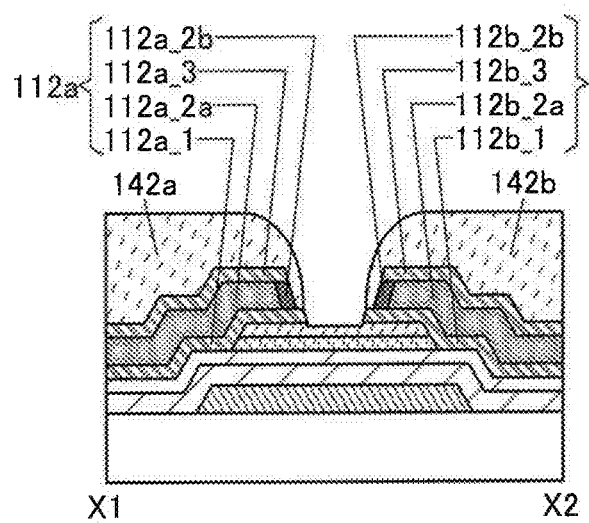
FIGS. 16A-16F are cross-sectional views illustrating an example of a manufacturing process of a semiconductor device.
Figure 16B:
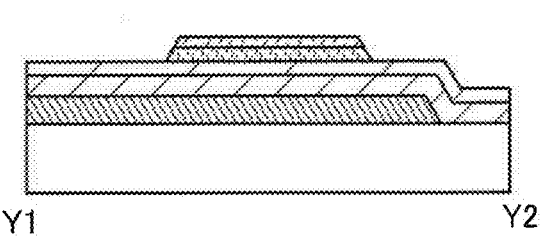
Figure 16C:
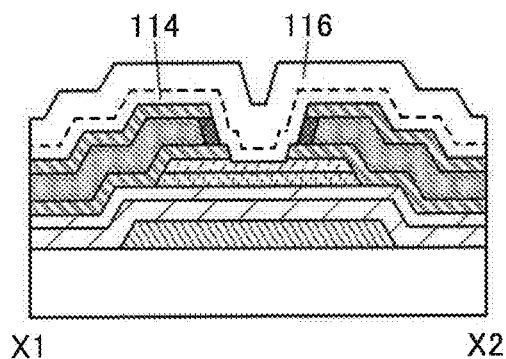
Figure 16D:
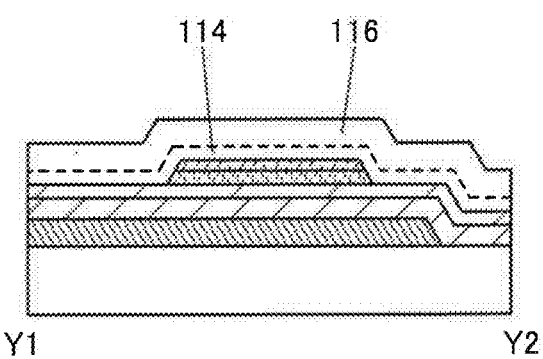
Figure 16E:
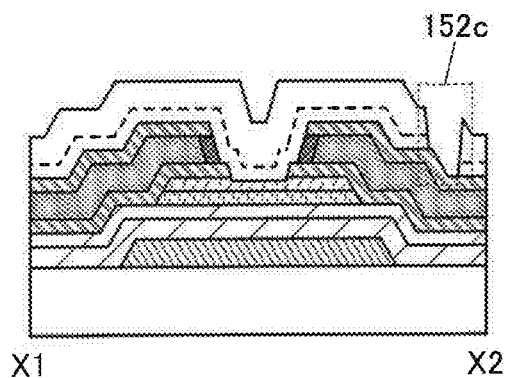
Figure 16F:
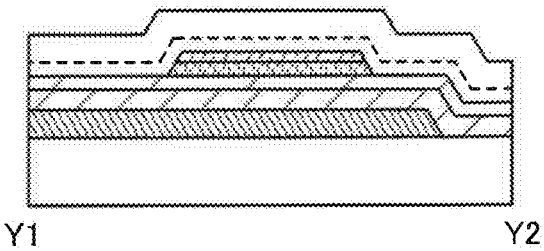

Next, the insulating films 114 and 116 are formed over the oxide semiconductor film 108 and the conductive films 112a and 112b (see FIGS. 16(C) and (D)).

Note that after the insulating film 114 is formed, the insulating film 116 is preferably formed successively without exposure to the air. After the insulating film 114 is formed, the insulating film 116 is formed successively without exposure to the air with at least one of the flow rate of a source gas, the pressure, high-frequency power, and the substrate temperature adjusted, whereby the concentration of impurities attributed to the atmospheric component at the interface between the insulating films 114 and 116 can be reduced, and oxygen in the insulating films 114 and 116 can be transferred to the oxide semiconductor film 108; accordingly, the amount of oxygen vacancies in the oxide semiconductor film 108 can be reduced.

For example, as the insulating film 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small amount of defects can be formed as the insulating film 114 by a PECVD method under the conditions where the flow rate of the oxidizing gas is more than 20 times and less than 100 times, preferably more than or equal to 40 times and less than or equal to 80 times, that of the deposition gas, and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the conditions where the substrate placed in the treatment chamber of the PECVD apparatus that is vacuum-evacuated is held at a temperature of higher than or equal to 180° C. and lower than or equal to 350° C., the pressure in the treatment chamber into which a source gas introduced is higher than or equal to 100 Pa and lower than or equal to 250 Pa, more preferably higher than or equal to 100 Pa and lower than or equal to 200 Pa, and a high-frequency power of greater than or equal to 0.17 W/cm$^2$ and less than or equal to 0.5 W/cm$^2$, more preferably greater than or equal to 0.25 W/cm$^2$ and less than or equal to 0.35 W/cm$^2$ is supplied to an electrode provided in the treatment chamber.

As the formation conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at the above substrate temperature, the cohesion between silicon and oxygen is weak, and accordingly, part of oxygen in the film is released by heat treatment in a later step. Thus, it is possible to form an oxide insulating film which contains more oxygen than that satisfying the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film with less defects in which the spin density of a signal which appears at g=2.001 due to a dangling bond of silicon is lower than $6 \times 10^{17}$ spins/cm$^3$, preferably lower than or equal to $3 \times 10^{17}$ spins/cm$^3$, more preferably lower than or equal to $1.5 \times 10^{17}$ spins/cm$^3$ by ESR measurement. As a result, the reliability of the transistor 100 can be improved.

Heat treatment (hereinafter referred to as second heat treatment) is preferably performed after the insulating films 114 and 116 are formed. The second heat treatment can reduce nitrogen oxide contained in the insulating films 114 and 116. Alternatively, by the second heat treatment, part of oxygen contained in the insulating films 114 and 116 can be transferred to the oxide semiconductor film 108, so that the amount of oxygen vacancies in the oxide semiconductor film 108 can be reduced.

The temperature of the second heat treatment is typically lower than 400° C., preferably lower than 375° C., more preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, more preferably less than or equal to 10 ppb), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

Next, a mask is formed over the insulating film 116 through a lithography process, and the opening 152c is formed in desired regions of the insulating films 114 and 116. Note that the opening 152c is formed to reach the conductive film 112b (see FIGS. 16(E) and 16(F)).

<<Step of Forming Second Gate Electrode>>

Figure 17A:
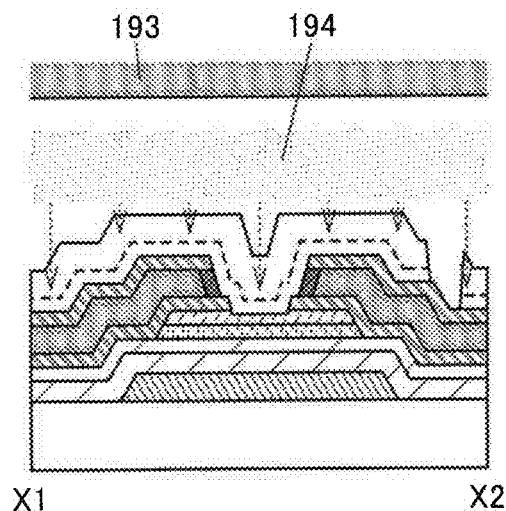
FIGS. 17A-17F are cross-sectional views illustrating an example of a manufacturing process of a semiconductor device.
Figure 17B:
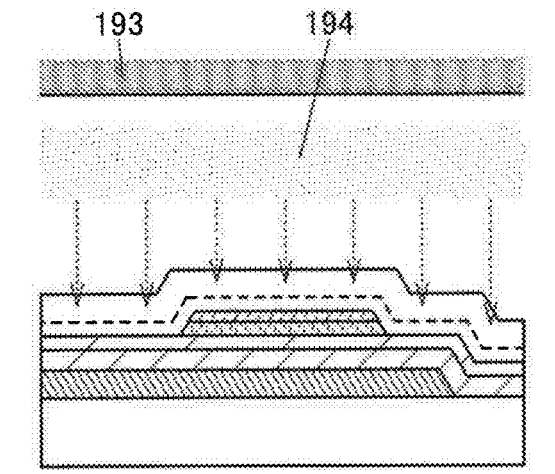

Next, the conductive films 120a and 120b are formed over the insulating film 116 to cover the opening 152c (see FIGS. 17(A), (B), (C), and (D)).

FIGS. 17(A) and (B) are schematic cross-sectional views of the inner portion of the deposition apparatus when the conductive films 120a and 120b are formed over the insulating film 116. In FIGS. 17(A) and (B), a sputtering apparatus is used as the deposition apparatus, and a target 193 placed inside the sputtering apparatus and plasma 194 formed under the target 193 are schematically illustrated.

First, when the conductive films 120a and 120b are formed, plasma is discharged in an atmosphere containing a third oxygen gas. At this time, oxygen is added to the insulating film 116 over which the conductive films 120a and 120b are formed. When the conductive films 120a and 120b are formed, an inert gas (e.g., a helium gas, an argon gas, or a xenon gas) as well as the third oxygen gas may be mixed. For example, it is preferable to use the argon gas and the third oxygen gas with a flow rate higher than that of the argon gas. When the flow rate of the third oxygen gas is set higher, oxygen can be favorably added to the insulating film 116. As an example of the conditions for forming the conductive films 120a and 120b, the proportion of the fourth oxygen gas in a whole deposition gas is higher than or equal to 50% and lower than or equal to 100%, preferably higher than or equal to 80% and lower than or equal to 100%.

Note that in FIGS. 17(A) and (B), oxygen or excess oxygen added to the insulating film 116 is schematically illustrated by arrows of broken lines.

The substrate temperature during formation of the conductive films 120a and 120b is higher than or equal to room temperature and lower than 340° C., preferably higher than or equal to room temperature and lower than or equal to 300° C., more preferably higher than or equal to 100° C. and lower than or equal to 250° C., more preferably higher than or equal to 100° C. and lower than or equal to 200° C. The conductive films 120a and 120b are formed while being heated, so that the crystallinity of the conductive films 120a and 120b can be increased. On the other hand, in the case where a large-sized glass substrate (e.g., the 6th generation to the 10th generation) is used as the substrate 102 and the substrate temperature during formation of the conductive films 120a and 120b is set to higher than or equal to 150° C. and lower than 340° C., the substrate 102 might be changed in shape (distorted or warped). Therefore, in the case where a large-sized glass substrate is used, the change in the shape of the glass substrate can be suppressed by setting the substrate temperature during formation of the conductive films 120a and 120b to higher than or equal to 100° C. and lower than 150° C.

In this embodiment, the conductive films 120a and 120b are formed by a sputtering method using an In—Ga—Zn metal oxide target (In:Ga:Zn=4:2:4.1 [atomic ratio]). The substrate temperature during formation of the conductive films 120a and 120b is set to 170° C. As the deposition gas for forming the conductive films 120a and 120b, an oxygen gas at a flow rate of 100 sccm is used.

Note that as the conductive films 120a and 120b, the above-described oxide semiconductor film (In:Ga:Zn=1:1:1 [atomic ratio], In:Ga:Zn=1:3:2 [atomic ratio], In:Ga:Zn=1:3:4 [atomic ratio], In:Ga:Zn=1:3:6 [atomic ratio], In:Ga:Zn=3:1:2 [atomic ratio], In:Ga:Zn=4:2:3 [atomic ratio], or In:Ga:Zn=5:1:6 [atomic ratio], for example) may be used.

Note that although this embodiment describes, as an example, a method in which oxygen is added to the insulating film 116 when the conductive films 120a and 120b are formed, there is no limitation thereto. For example, oxygen may be further added to the insulating film 116 after the conductive films 120a and 120b are formed.

As a method for adding oxygen to the insulating film 116, for example, a 5-nm-thick ITSO film is formed using a target of an oxide containing indium, tin, and silicon (also referred to as ITSO) ($In_2O_3$:$SnO_2$:$SiO_2$=85:10:5 [weight %]) as an oxide conductive film.

In that case, the thickness of the oxide conductive film is preferably greater than or equal to 1 nm and less than or equal to 20 nm or greater than or equal to 2 nm and less than or equal to 10 nm, in which case oxygen is suitably transmitted and release of oxygen can be inhibited. Then, oxygen is added to the insulating film 116 through the oxide conductive film. As the method for adding oxygen, an ion doping method, an ion implantation method, a plasma treatment method, and the like are given. Furthermore, a bias voltage is applied to the substrate side when oxygen is added, whereby oxygen can be effectively added to the insulating film 116. An ashing apparatus is used, for example, and the power density of the bias voltage applied to the substrate side of the ashing apparatus is set to greater than or equal to 1 W/cm$^2$ and less than or equal to 5 W/cm$^2$ as the bias voltage. Furthermore, the substrate temperature at which oxygen is added is higher than or equal to room temperature and lower than or equal to 300° C., preferably higher than or equal to 100° C. and lower than or equal to 250° C., whereby oxygen can be added efficiently to the insulating film 116.

Figure 17C:
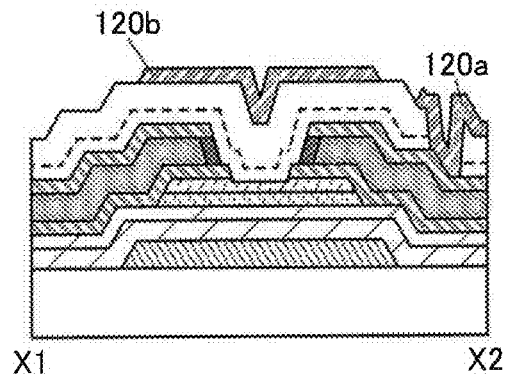
Figure 17D:
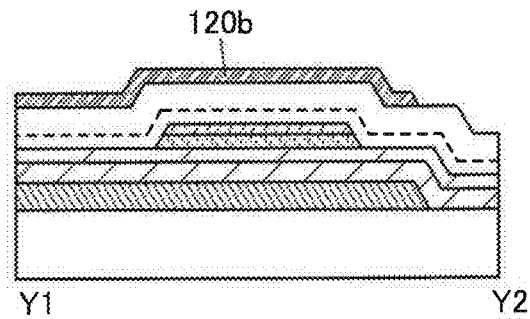

Next, the formed conductive film is processed into a desired shape, so that the island-shaped conductive films 120a and 120b are formed (see FIGS. 17(C) and (D)).

<<Step of Forming Protective Insulating Film>>

Figure 17E:
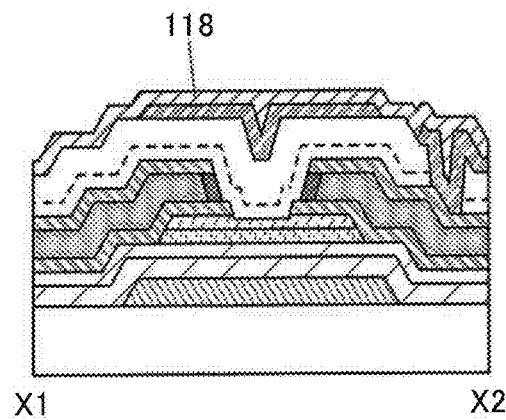
Figure 17F:
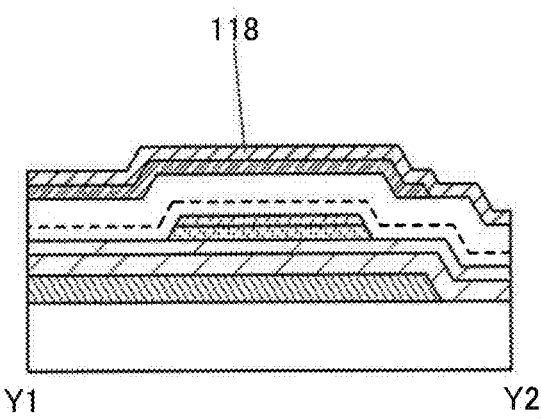

Then, the insulating film 118 is formed over the insulating film 116 and the conductive films 120a and 120b (see FIGS. 17(E) and (F)).

The insulating film 118 contains one or both of hydrogen and nitrogen. As the insulating film 118, a silicon nitride film is suitably used, for example. Furthermore, the insulating film 118 can be formed by a sputtering method or a PECVD method, for example. In the case where the insulating film 118 is formed by a PECVD method, for example, the substrate temperature is lower than 400° C., preferably lower than 375° C., more preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

After the insulating film 118 is formed, heat treatment similar to the first heat treatment or the second heat treatment described above (hereinafter referred to as third heat treatment) may be performed. The heat treatment at a temperature of lower than 400° C., preferably lower than 375° C., more preferably higher than or equal to 180° C. and lower than or equal to 350° C. is thus performed after the addition of oxygen to the insulating film 116 when the insulating film 118 is formed, whereby oxygen or excess oxygen in the insulating film 116 can be transferred to the oxide semiconductor film 108 (particularly, the oxide semiconductor film 108b) and compensate for oxygen vacancies in the oxide semiconductor film 108.

Furthermore, the insulating film 106 is provided under the insulating film 107, and the insulating film 118 is provided over the insulating films 114 and 116. When the insulating films 106 and 118 are formed using a material having low oxygen permeability, e.g., silicon nitride, oxygen contained in the insulating films 107, 114, and 116 can be confined to the oxide semiconductor film 108 side; thus, oxygen can be favorably transferred to the oxide semiconductor film 108.

The insulating film 118 contains one or both of hydrogen and nitrogen. Thus, when the insulating film 118 is formed, one or both of hydrogen and nitrogen are added to the conductive films 120a and 120b in contact with the insulating film 118, so that the conductive films 120a and 120b have a high carrier density and can function as oxide conductive films.

Furthermore, in the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen that are contained in the deposition gas containing silicon and a triple bond of nitrogen. As a result, the bond between silicon and nitrogen is promoted, and a dense silicon nitride film having few bonds between silicon and hydrogen and few defects can be formed. On the other hand, when the amount of ammonia with respect to nitrogen is large, decomposition of the deposition gas containing silicon and nitrogen are not promoted, so that a sparse silicon nitride film in which bonds between silicon and hydrogen remain and defects are increased is formed. Therefore, in the source gas, the flow rate of nitrogen is preferably set to 5 times or more and 50 times or less or 10 times or more and 50 times or less that of ammonia.

In this embodiment, with the use of a PECVD apparatus, a 100-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Through the above process, the transistor 100J illustrated in FIGS. 9(A) and (B) can be manufactured.

Furthermore, in the entire manufacturing process of the transistor 100J, the substrate temperature is preferably lower than 400° C., more preferably lower than 375° C., and still more preferably higher than or equal to 180° C. and lower than or equal to 350° C. because the change in shape of the substrate (distortion or warp) can be significantly reduced even when a large-sized substrate is used. Note that as a step in which the substrate temperature is increased in the manufacturing process of the transistor 100J, typically, the following are given: the substrate temperature in the formation of the insulating films 106 and 107 (lower than 400° C., preferably higher than or equal to 250° C. and lower than or equal to 350° C.), the substrate temperature in the formation of the oxide semiconductor film 108 (higher than or equal to room temperature and lower than 340° C., preferably higher than or equal to 100° C. and lower than or equal to 200° C., more preferably higher than or equal to 100° C. and lower than 150° C.), the substrate temperature in the formation of the insulating films 116 and 118 (lower than 400° C., preferably lower than 375° C., more preferably higher than or equal to 180° C. and lower than or equal to 350° C.), the first heat treatment or the second heat treatment after the addition of oxygen (lower than 400° C., preferably lower than 375° C., more preferably higher than or equal to 180° C. and lower than or equal to 350° C.), and the like.

<1-7. Manufacturing Method 2 of Transistor>

Figure 18A:
FIGS. 18A-18F are cross-sectional views illustrating an example of a manufacturing process of a semiconductor device.
Figure 18B:
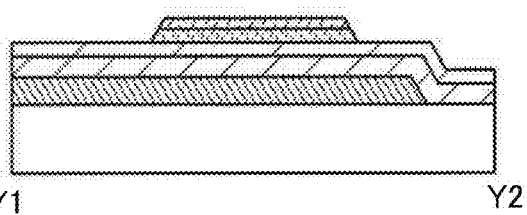

Next, a method for manufacturing the transistor 100M that is a semiconductor device of one embodiment of the present invention is described with reference to FIG. 18 to FIG. 20. Note that FIG. 18 to FIG. 20 are cross-sectional views illustrating a method for manufacturing the semiconductor device; FIGS. 18(A), (C), and (E), FIGS. 19(A) and (C), and FIG. 20(A) are cross-sectional views in the channel length direction shown by X1-X2, and FIGS. 18(B), (D), and (F), FIGS. 19(B) and (D), and FIG. 20(B) are cross-sectional views in the channel width direction shown by Y1-Y2.

Methods for forming the conductive film 104, the insulating films 106 and 107, the oxide semiconductor film 108, the conductive film 112_1, the conductive film 112a_2 (the regions 112a_2a and 112a_2b), the conductive film 112b_2 (the regions 112b_2a and 112b_2b), the conductive film 112a_3, and the conductive film 112b_3 are the same as those of the method for forming the transistor 100J; thus, FIG. 14 and FIG. 15 can be referred to.

Note that in this embodiment, a laminated film in which a 50-nm-thick tungsten film as the conductive film 112_1 used in the conductive film 112, a 200-nm-thick copper film as the conductive film 112_2, and a 50-nm-thick titanium film as the conductive film 112_3 are stacked in this order is used.

Next, the conductive film 112_1 is processed using the conductive films 112a_2, 112b_2, and 112_3 as masks, whereby the island-shaped conductive films 112a_1 and 112b_1 separated from each other are formed. When the process is performed, the conductive film 112a that includes the conductive film 112a_1, the conductive film 112a_2 (the regions 112a_2a and 112a_2b), and the conductive film 112a_3 and the conductive film 112b that includes the conductive film 112b_1, the conductive film 112b_2 (the regions 112b_2a and 112b_2b), and the conductive film 112b_3 are formed (see FIGS. 18(A) and (B)).

As a method for forming the conductive films 112a and 112b, a method similar to that for the transistor 100J can be used.

Figure 18C:
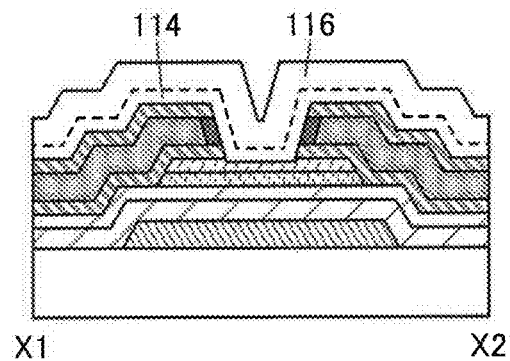
Figure 18D:
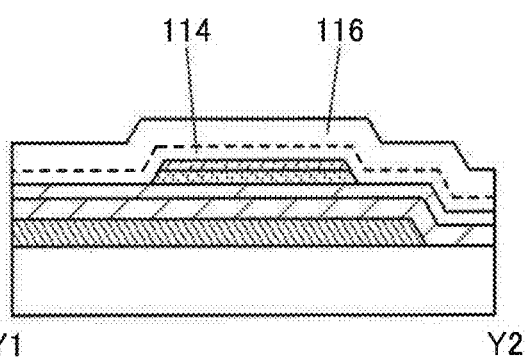
Figure 18E:
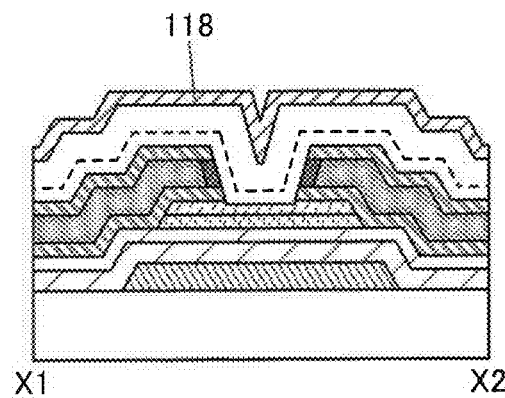
Figure 18F:
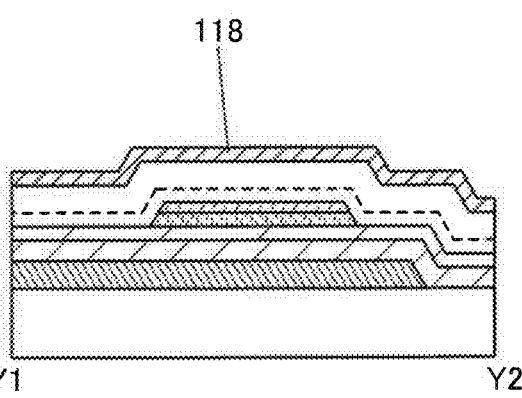

Next, the insulating films 114 and 116 and the insulating film 118 are formed over the oxide semiconductor film 108 and the conductive films 112a and 112b (see FIGS. 18(C), (D), (E), and (F)). As methods for forming the insulating films 114, 116, and 118, methods similar to those for the transistor 100J can be used.

After the insulating film 118 is formed, heat treatment similar to the first heat treatment or the second heat treatment described above (hereinafter referred to as third heat treatment) may be performed. The heat treatment at a temperature of lower than 400° C., preferably lower than 375° C., more preferably higher than or equal to 180° C. and lower than or equal to 350° C. is thus performed after the addition of oxygen to the insulating film 116 when the insulating film 118 is formed, whereby oxygen or excess oxygen in the insulating film 116 can be transferred to the oxide semiconductor film 108 (particularly, the oxide semiconductor film 108b) and compensate for oxygen vacancies in the oxide semiconductor film 108.

Here, oxygen transferred to the oxide semiconductor film 108 is described using FIG. 20. FIG. 20 is a model diagram illustrating oxygen transferred to the oxide semiconductor film 108 due to the substrate temperature at the time of forming the insulating film 118 (typically, lower than 375° C.) or the second heat treatment after the formation of the insulating film 118 (typically, lower than 375° C.). Note that in FIG. 20, oxygen (oxygen radicals, oxygen atoms, or oxygen molecules) shown in the oxide semiconductor film 108 is illustrated by arrows of broken lines.

In the oxide semiconductor film 108 in FIG. 20, oxygen vacancies are compensated for by oxygen transferred from insulating films that are close to the oxide semiconductor film 108 (here, the insulating films 107 and 114). Specifically, in the semiconductor device of one embodiment of the present invention, the insulating film 107 includes an excess oxygen region because an oxygen gas is used at the time of forming the oxide semiconductor film 108b by sputtering and oxygen is added to the insulating film 107. Furthermore, the insulating film 116 includes an excess oxygen region because an oxygen gas is used at the time of forming the oxide conductive film by sputtering and oxygen is added to the insulating film 116. Thus, in the oxide semiconductor film 108 between the insulating films including the excess oxygen regions, oxygen vacancies can be favorably compensated for.

Then, a mask is formed over the insulating film 118 through a lithography process, and the opening 152c is formed in a desired region in the insulating films 114, 116, and 118. Note that the opening 152c is formed to reach the conductive film 112b (see FIGS. 19(A) and (B)).

Figure 19A:
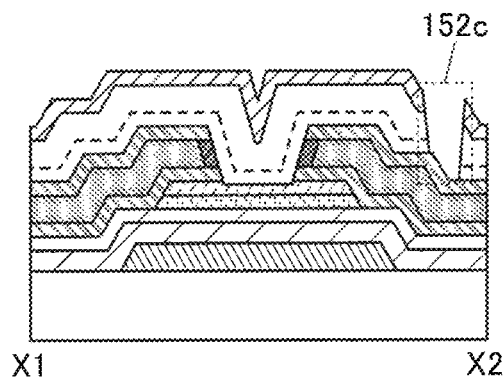
FIGS. 19A-19D are cross-sectional views illustrating an example of a manufacturing process of a semiconductor device.
Figure 19B:
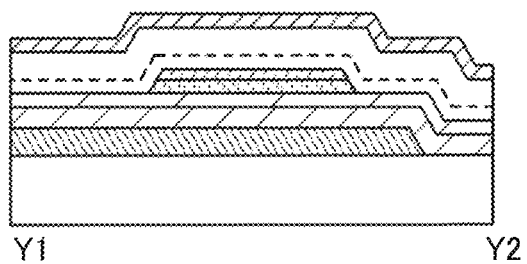
Figure 19C:
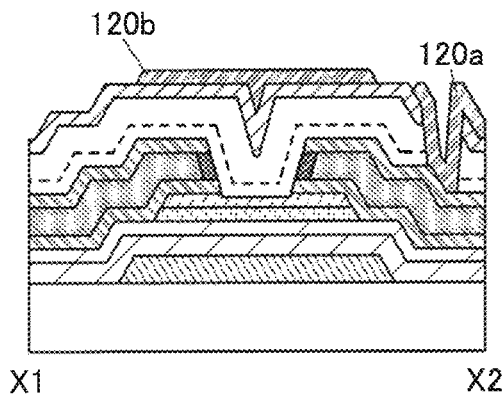
Figure 19D:
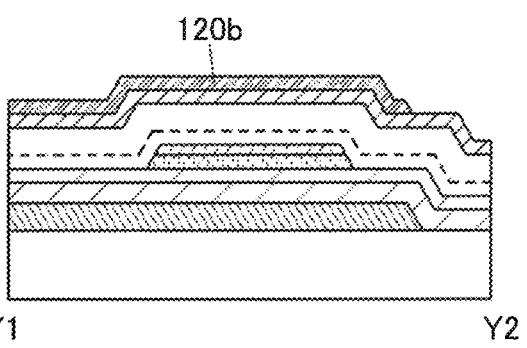
Figure 20A:
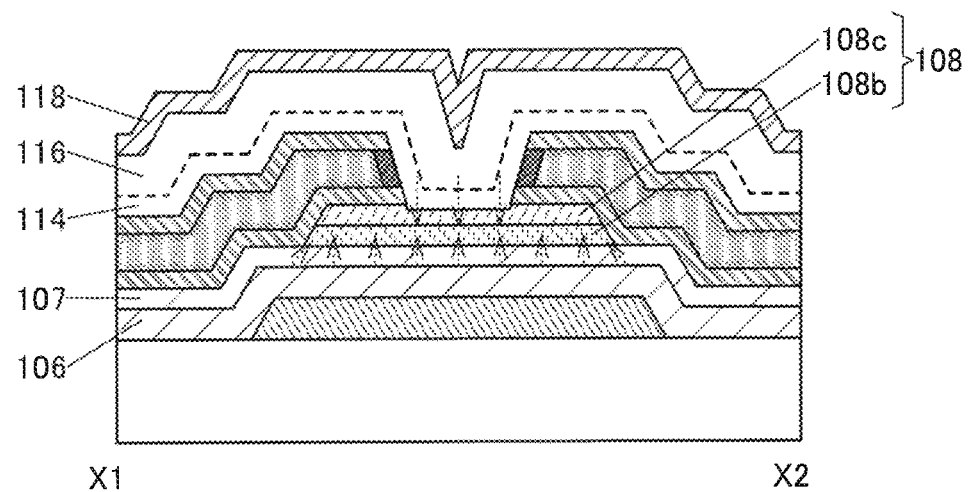
FIGS. 20A and 20B are cross-sectional views illustrating an example of a manufacturing process of a semiconductor device.
Figure 20B:
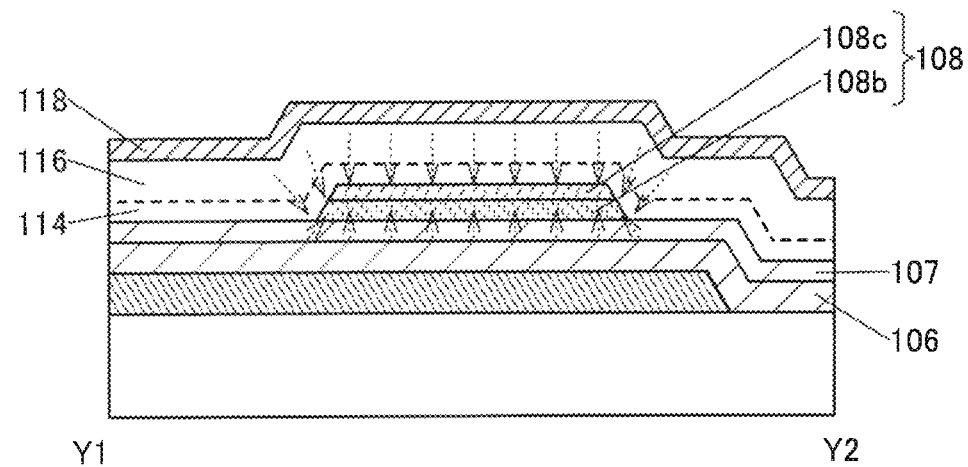

Next, the conductive films 120a and 120b are formed over the insulating film 116 to cover the opening 152c (see FIGS. 19(C) and (D)). For the conductive films 120a and 120b, a method similar to that for the transistor 100J can be used.

Figure 10C:
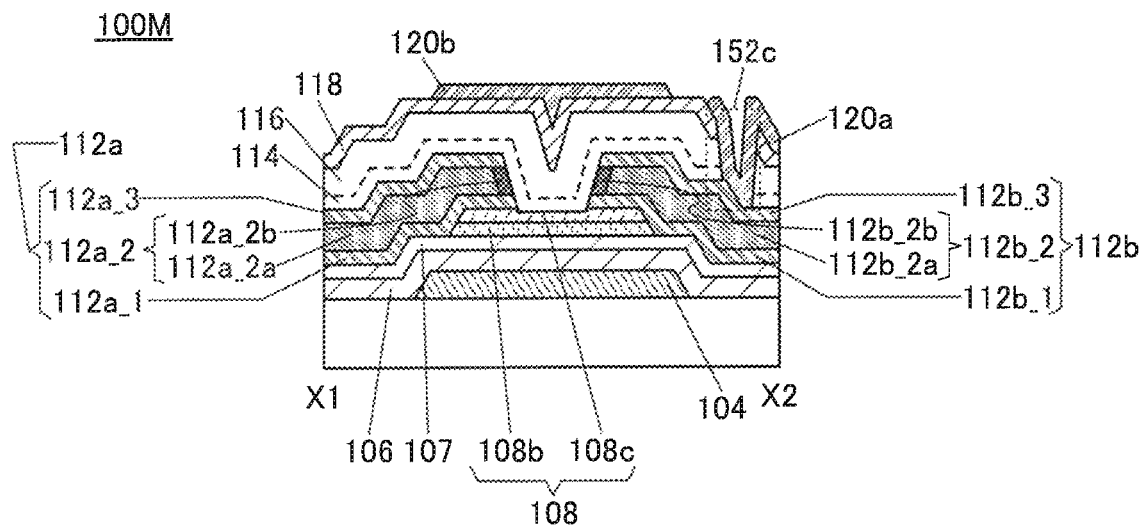

Through the above process, the transistor 100M illustrated in FIG. 10(C) can be manufactured.

The structure and method described above in this embodiment can be used in combination with the other structures and methods described in the other embodiments, as appropriate.

Embodiment 2

In this embodiment, the composition of an oxide semiconductor, the structure of an oxide semiconductor, and the like that can be used in one embodiment of the present invention are described with reference to FIG. 21 to FIG. 28.

<2-1. Composition of Oxide Semiconductor>

First, the composition of an oxide semiconductor is described.

An oxide semiconductor preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. Note that the element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that a plurality of the above elements may be combined as the element M, in some cases.

First, preferred ranges of the atomic ratio of indium, the element M, and zinc contained in an oxide semiconductor of one embodiment of the present invention are described with reference to FIG. 21(A), FIG. 21(B), and FIG. 21(C). Note that the proportion of oxygen atoms is not shown in FIG. 21. Furthermore, the terms of the atomic ratio of indium, the element M, and zinc contained in the oxide semiconductor are denoted by [In], [M], and [Zn], respectively.

Figure 21A:
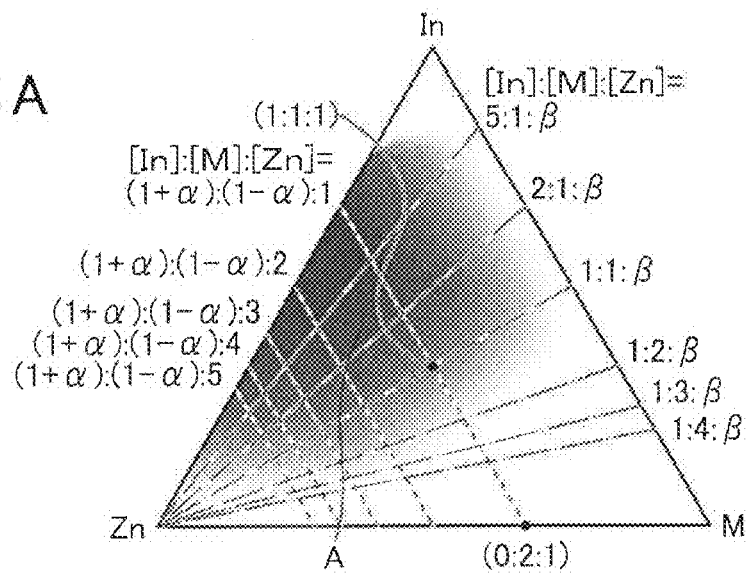
FIGS. 21A-21C are diagrams illustrating an atomic ratio range of an oxide semiconductor of one embodiment of the present invention.
Figure 21B:
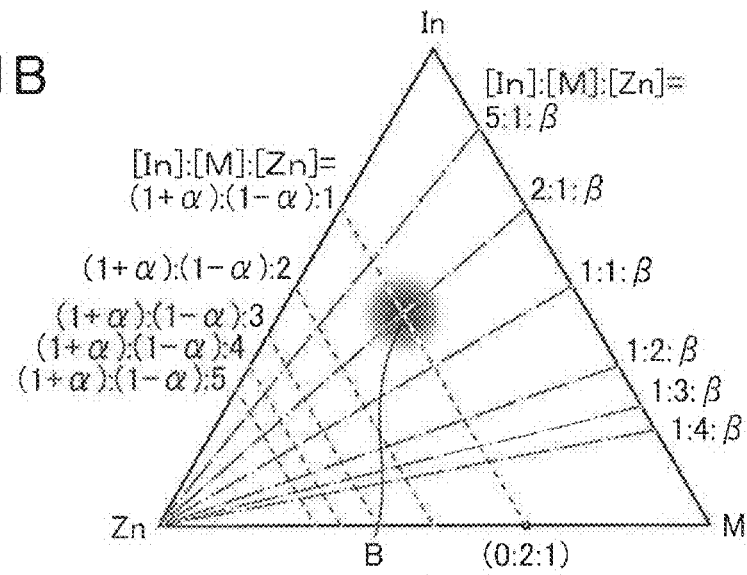
Figure 21C:
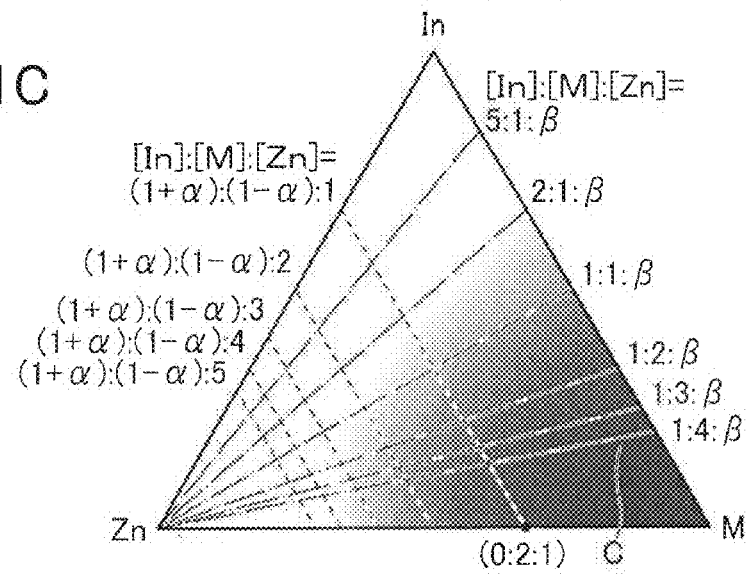

In FIG. 21(A), FIG. 21(B), and FIG. 21(C), broken lines indicate a line where the atomic ratio [In]:[M]:[Zn]=$(1+\alpha)$:$(1-\alpha)$:1, $(-1\leq\alpha\leq 1)$, a line where the atomic ratio [In]:[M]:[Zn]=$(1+\alpha)$:$(1-\alpha)$:2, a line where the atomic ratio [In]:[M]:[Zn]=$(1+\alpha)$:$(1-\alpha)$:3, a line where the atomic ratio [In]:[M]:[Zn]=$(1+\alpha)$:$(1-\alpha)$:4, and a line where the atomic ratio [In]:[M]:[Zn]=$(1+\alpha)$:$(1-\alpha)$:5.

Furthermore, dashed-dotted lines indicate a line where the atomic ratio [In]:[M]:[Zn]=1:1:$\beta$ ($\beta\geq 0$), a line where the atomic ratio [In]:[M]:[Zn]=1:2:$\beta$, a line where the atomic ratio [In]:[M]:[Zn]=1:3:$\beta$, a line where the atomic ratio [In]:[M]:[Zn]=1:4:$\beta$, a line where the atomic ratio [In]:[M]:[Zn]=2:1:$\beta$, and a line where the atomic ratio [In]:[M]:[Zn]=5:1:$\beta$.

Furthermore, a dashed double-dotted line indicates a line where the atomic ratio [In]:[M]:[Zn]=$(1+\gamma)$:2:$(1-\gamma)$ $(-1\leq\gamma\leq 1)$. Furthermore, the oxide semiconductor shown in FIG. 21 with an atomic ratio of [In]:[M]:[Zn]=0:2:1 or a neighborhood thereof is likely to have a spinel crystal structure.

FIG. 21(A) and FIG. 21(B) show examples of the preferred ranges of the atomic ratio of indium, the element M, and zinc contained in an oxide semiconductor of one embodiment of the present invention.

Figure 22:
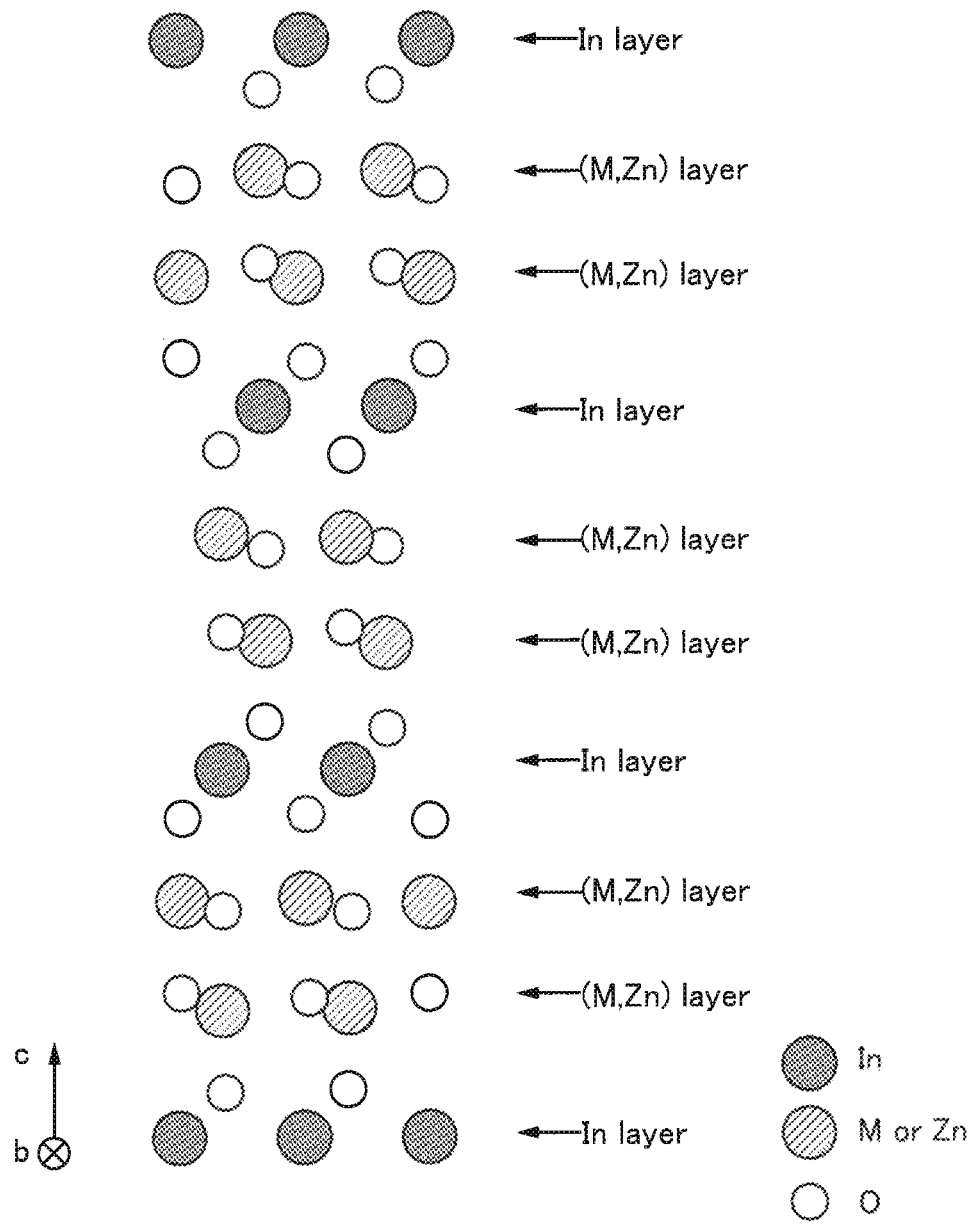
FIG. 22 is a diagram illustrating a crystal of InMZnO4.

FIG. 22 shows the crystal structure of $InMZnO_4$ in which [In]:[M]:[Zn]=1:1:1 as an example. Furthermore, FIG. 22 shows the crystal structure of $InMZnO_4$ observed from a direction parallel to a b-axis. Note that a metal element in a layer containing M, Zn, and oxygen (hereinafter, referred to as an (M,Zn) layer) in FIG. 22 represents the element M or zinc. In that case, the proportion of the element M is the same as that of zinc. The element M and zinc can be replaced with each other and are arranged randomly.

$InMZnO_4$ has a layered crystal structure (also referred to as a layered structure) and includes one layer that contains indium and oxygen (hereinafter, In layer) for every two (M,Zn) layers that contain the element M, zinc, and oxygen, as shown in FIG. 22.

Furthermore, indium and the element M can be replaced with each other. Therefore, the element M in the (M,Zn) layer can be replaced with indium, and the layer can also be referred to as an (In,M,Zn) layer. In that case, a layered structure that contains two (In,M,Zn) layers with respect to one In layer is obtained.

An oxide semiconductor whose atomic ratio [In]:[M]:[Zn]=1:1:2 has a layered structure that contains three (M,Zn) layers with respect to one In layer. That is, when [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, it might have a plurality of kinds of layered structures where the number of (M,Zn) layers with respect to one In layer is an integer. For example, in the case of [In]:[M]:[Zn]=1:1:1.5, layered structures in which a layered structure including two (M,Zn) layers with respect to one In layer and a layered structure including three (M,Zn) layers with respect to one In layer are mixed can be obtained in some cases.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

Furthermore, a plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary (also referred to as a grain boundary) might be formed between different crystal structures.

In addition, when the indium content is increased, the carrier mobility (electron mobility) of the oxide semiconductor can be increased. This is because in an oxide semiconductor containing indium, the element M, and zinc, the s orbital of heavy metal mainly contributes to carrier transfer, and when the indium content is increased, overlaps of the s orbitals are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn] =0:1:0 and an atomic ratio in the neighborhood thereof (e.g., a region C in FIG. 21(C)), insulation performance becomes better.

Accordingly, an oxide semiconductor of one embodiment of the present invention preferably has an atomic ratio represented by a region A in FIG. 21(A) that is likely to have a layered structure with high carrier mobility and a few grain boundaries.

Furthermore, a region B in FIG. 21(B) represents [In]: [M]:[Zn]=4:2:3 to 4:1 and the neighborhood thereof. The neighborhood includes an atomic ratio of [In]:[M]:[Zn]=5: 3:4, for example. An oxide semiconductor with an atomic ratio represented by the region B is an excellent oxide semiconductor that has particularly high crystallinity and high carrier mobility.

Note that conditions where an oxide semiconductor forms a layered structure are not uniquely determined by an atomic ratio. There is a difference in the degree of difficulty in forming a layered structure among atomic ratios. In contrast, even with the same atomic ratio, whether a layered structure is formed or not depends on a formation condition. Therefore, the illustrated regions represent an atomic ratio with which an oxide semiconductor has a layered structure, and boundaries of the region A to the region C are not clear.

<2-2. Structure in which Oxide Semiconductor is Used for Transistor>

Next, the case in which the above oxide semiconductor is used for a transistor is described.

Note that when the above oxide semiconductor is used for a transistor, carrier scattering or the like at a grain boundary can be reduced; thus, the transistor can have high field-effect mobility. In addition, the transistor with high reliability can be obtained.

Furthermore, an oxide semiconductor with low carrier density is preferably used for the transistor. For example, the carrier density of an oxide semiconductor is lower than $8\times10^{11}/cm^3$, preferably lower than $1\times10^{11}/cm^3$, more preferably lower than $1\times10^{10}/cm^3$, and greater than or equal to $1\times10^{-9}/cm^3$.

Note that a highly purified intrinsic or substantially highly purified intrinsic oxide semiconductor has few carrier generation sources and thus can have a low carrier density. Furthermore, a highly purified intrinsic or substantially highly purified intrinsic oxide semiconductor has a low density of defect states and accordingly has a low density of trap states in some cases.

Furthermore, charge trapped by the trap states in the oxide semiconductor takes a long time to disappear and may behave like fixed charge. Thus, the transistor whose channel region is formed in the oxide semiconductor having a high density of trap states has unstable electrical characteristics in some cases.

Thus, in order to stabilize electrical characteristics of the transistor, a reduction in concentration of impurities in the oxide semiconductor is effective. Furthermore, in order to reduce the concentration of impurities in the oxide semiconductor, the concentration of impurities in a film adjacent thereto is preferably reduced. Impurities include hydrogen, nitrogen, alkali metal, alkaline earth metal, iron, nickel, silicon, and the like.

Here, the influence of impurities in the oxide semiconductor is described.

When silicon or carbon that is one of Group 14 elements is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS: Secondary Ion Mass Spectrometry)) is set to lower than or equal to $2\times10^{18}$ atoms/cm$^3$, preferably lower than or equal to $2\times10^{17}$ atoms/cm$^3$.

Furthermore, when the oxide semiconductor contains alkali metal or alkaline earth metal, defect states are formed and carriers are generated, in some cases. Thus, a transistor including an oxide semiconductor that contains alkali metal or alkaline earth metal is likely to have normally-on characteristics. Therefore, it is preferable to reduce the concentration of alkali metal or alkaline earth metal in the oxide semiconductor. Specifically, the concentration of alkali metal or alkaline earth metal in the oxide semiconductor obtained by SIMS is set to lower than or equal to $1\times10^{18}$ atoms/cm$^3$, and preferably lower than or equal to $2\times10^{16}$ atoms/cm$^3$.

Furthermore, when the oxide semiconductor contains nitrogen, it easily becomes n-type because electrons that are carriers are generated to increase the carrier density. As a result, a transistor whose semiconductor includes an oxide semiconductor that contains nitrogen is likely to have normally-on characteristics. For this reason, nitrogen in the oxide semiconductor is preferably reduced as much as possible; the nitrogen concentration in the oxide semiconductor measured by SIMS is set, for example, lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, and still more preferably lower than or equal to $5\times10^{17}$ atoms/cm$^3$.

Furthermore, hydrogen contained in an oxide semiconductor reacts with oxygen bonded to a metal atom to be water, and thus an oxygen vacancy is formed in some cases. Entry of hydrogen into the oxygen vacancy generates an electron that is a carrier in some cases. Furthermore, in some cases, part of hydrogen is bonded to oxygen bonded to a metal atom to generate an electron that is a carrier. Thus, a transistor including an oxide semiconductor that contains hydrogen is likely to have normally-on characteristics. Accordingly, it is preferable that hydrogen in the oxide semiconductor be reduced as much as possible. Specifically, the hydrogen concentration in the oxide semiconductor measured by SIMS is set lower than $1\times10^{20}$ atoms/cm$^3$, preferably lower than $1\times10^{19}$ atoms/cm$^3$, more preferably lower than $5\times10^{18}$ atoms/cm$^3$, and still more preferably lower than $1\times10^{18}$ atoms/cm$^3$.

When an oxide semiconductor with sufficiently reduced impurities is used for a channel formation region in a transistor, stable electrical characteristics can be provided.

<2-3. Layered Structure of Oxide Semiconductor>

Next, the case where the oxide semiconductor has a two-layer structure or a three-layer structure is described. A band diagram of insulators that are in contact with a layered structure of an oxide semiconductor S1, an oxide semiconductor S2, and an oxide semiconductor S3 and a band diagram of insulators that are in contact with a layered structure of the oxide semiconductor S2 and the oxide semiconductor S3 are described with reference to FIG. 23.

Figure 23A:
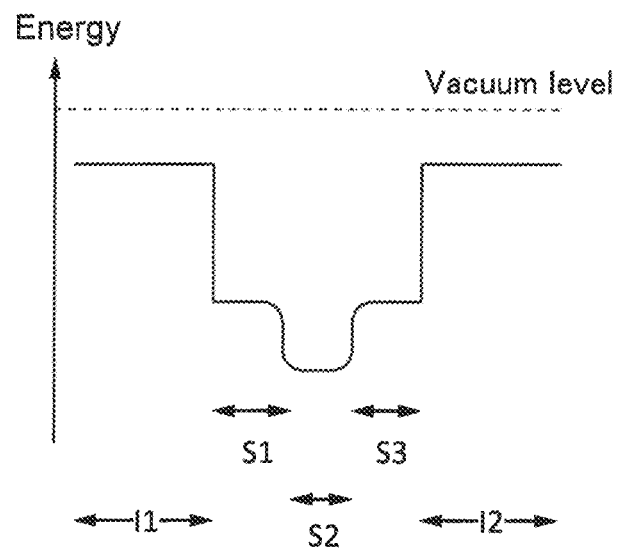
FIGS. 23A and 23B are band diagrams of a layered structure of an oxide semiconductor.
Figure 23B:
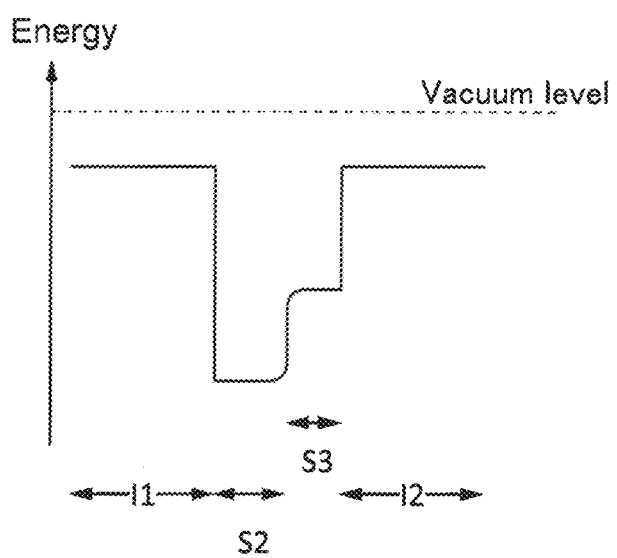

FIG. 23(A) is an example of a band diagram of a layered structure including an insulator I1, the oxide semiconductor S1, the oxide semiconductor S2, the oxide semiconductor S3, and an insulator I2 in a film thickness direction. Furthermore, FIG. 23(B) is an example of a band diagram of a layered structure including the insulator I1, the oxide semiconductor S2, the oxide semiconductor S3, and the insulator I2 in a film thickness direction. Note that for easy understanding, the band diagrams show the energy level of the conduction band minimum (Ec) of the insulator I1, the oxide semiconductor S1, the oxide semiconductor S2, the oxide semiconductor S3, and the insulator I2.

The energy level of the conduction band minimum of the oxide semiconductor S1 and the oxide semiconductor S3 is closer to the vacuum level than that of the oxide semiconductor S2; typically, a difference in energy level between the conduction band minimum of the oxide semiconductor S2 and the conduction band minimum of the oxide semiconductor S1 and the oxide semiconductor S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of the oxide semiconductors S1 and S3, and the difference between the electron affinity of the oxide semiconductor S1 and the oxide semiconductor S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 23(A) and 23(B), the energy level of the conduction band minimum of the oxide semiconductor S1, the oxide semiconductor S2, and the oxide semiconductor S3 gradually changes. In other words, the energy level of the conduction band minimum continuously changes or is continuously connected. In order to obtain such a band diagram, the density of defect states in a mixed layer formed at an interface between the oxide semiconductor S1 and the oxide semiconductor S2 or an interface between the oxide semiconductor S2 and the oxide semiconductor S3 is preferably decreased.

Specifically, when the oxide semiconductor S1 and the oxide semiconductor S2 or the oxide semiconductor S2 and the oxide semiconductor S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as the oxide semiconductor S1 and the oxide semiconductor S3.

At this time, the oxide semiconductor S2 becomes a main carrier path. Since the density of defect states at the interface between the oxide semiconductor S1 and the oxide semiconductor S2 and the interface between the oxide semiconductor S2 and the oxide semiconductor S3 can be decreased, the influence of interface scattering on carrier conduction is small, and high on-state current can be obtained.

When an electron is trapped in a trap state, the trapped electron behaves like fixed charge; thus, the threshold voltage of the transistor is shifted in a positive direction. By providing the oxide semiconductor S1 and the oxide semiconductor S3, the trap state can be apart from the oxide semiconductor S2. This structure can prevent the positive shift of the threshold voltage of the transistor.

A material whose conductivity is sufficiently lower than that of the oxide semiconductor S2 is used for the oxide semiconductor S1 and the oxide semiconductor S3. In that case, the oxide semiconductor S2, the interface between the oxide semiconductor S2 and the oxide semiconductor S1, and the interface between the oxide semiconductor S2 and the oxide semiconductor S3 mainly function as a channel region. For example, an oxide semiconductor with high insulation performance and the atomic ratio represented by the region C in FIG. 21(C) can be used as the oxide semiconductor S1 and the oxide semiconductor S3. Note that the region C in FIG. 21(C) represents the atomic ratio of [In]:[M]:[Zn]=0:1:0 or the neighborhood thereof.

In the case where an oxide semiconductor with the atomic ratio represented by the region A is used as the oxide semiconductor S2, it is particularly preferable to use, as the oxide semiconductor S1 and the oxide semiconductor S3, an oxide semiconductor with [M]/[In] of greater than or equal to 1, preferably greater than or equal to 2. In addition, it is suitable to use, as the oxide semiconductor S3, an oxide semiconductor with sufficiently high insulation performance and [M]/([Zn]+[In]) of greater than or equal to 1.

<2-4. Structure of Oxide Semiconductor>

The structure of an oxide semiconductor is described below.

An oxide semiconductor is classified into a single-crystal oxide semiconductor and a non-single-crystal oxide semiconductor. Non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS: amorphous-like oxide semiconductor), and an amorphous oxide semiconductor.

From another perspective, an oxide semiconductor is classified into an amorphous oxide semiconductor and a crystalline oxide semiconductor. Crystalline oxide semiconductors include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

That is, a stable oxide semiconductor cannot be called a completely amorphous (completely amorphous) oxide semiconductor. Moreover, an oxide semiconductor that is not isotropic (e.g., with a periodic structure in a microscopic region) cannot be called a completely amorphous oxide semiconductor. In contrast, an a-like OS, which is not isotropic, has an unstable structure that contains a void (also referred to as a void). Because of its instability, an a-like OS is close to an amorphous oxide semiconductor in terms of physical properties.

<<CAAC-OS>>

First, a CAAC-OS is described.

A CAAC-OS is one kind of oxide semiconductors having a plurality of c-axis aligned crystal parts (also referred to as pellets).

Figure 24A:
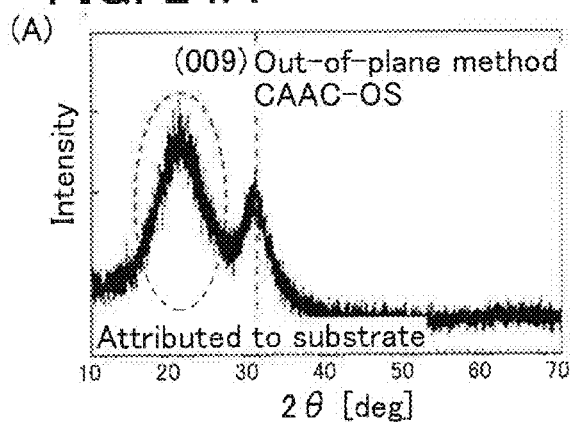
FIGS. 24A-24C are diagrams illustrating structural analysis of a CAAC-OS and a single crystal oxide semiconductor by XRD and FIGS. 24D and 24E are diagrams showing a selected-area electron diffraction pattern of a CAAC-OS.

The case where a CAAC-OS is analyzed by X-ray diffraction (XRD: X-Ray Diffraction) is described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 24(A). This peak is derived from the (009) plane of the $InGaZnO_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface. Note that a peak sometimes appears at 2θ of around 36° in addition to the peak at 2θ of around 31°. The peak at 2v of around 36° is attributed to a crystal structure classified into the space group Fd-3m. Thus, it is preferred that the CAAC-OS do not show the peak.

Figure 24B:
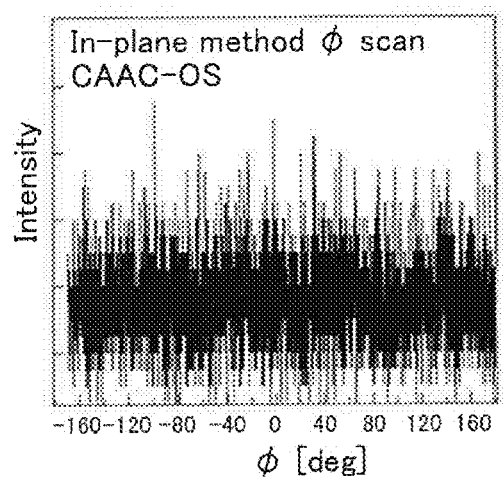
Figure 24C:
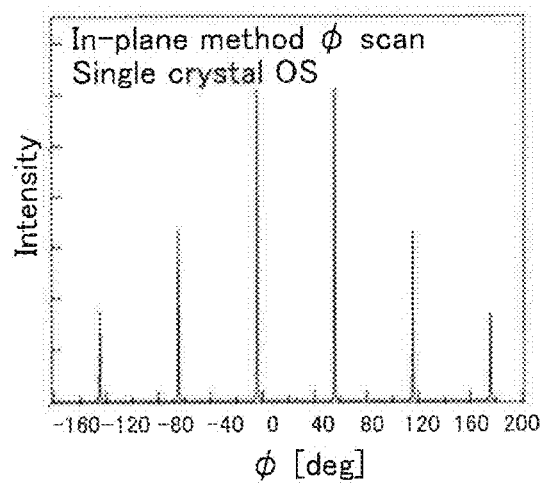
Figure 24D:
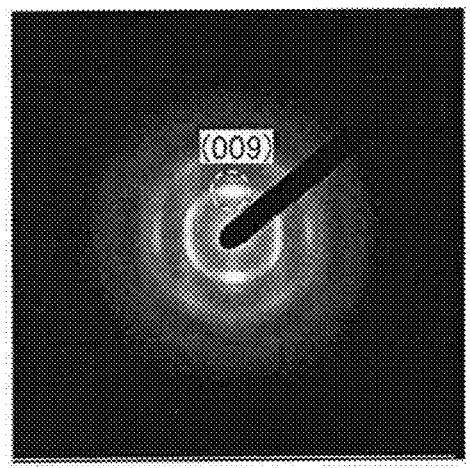

On the other hand, in structural analysis by an in-plane method in which an X-ray is incident on the CAAC-OS in the direction parallel to the formation surface, a peak appears at 2θ of around 56°. This peak is attributed to the (110) plane of the $InGaZnO_4$ crystal. Then, when analysis (ϕ scan) is performed with 2θ fixed at around 56° while the sample is rotated around a normal vector to the sample surface as an axis (ϕ axis), as shown in FIG. 24(B), a peak is not clearly observed. In contrast, in the case where single-crystal $InGaZnO_4$ is subjected to ϕ scan with 2θ fixed at around 56°, as shown in FIG. 24(C), six peaks that are derived from crystal planes equivalent to the (110) plane are observed. Accordingly, the structural analysis using XRD shows that the orientations of the a-axes and b-axes are irregular in the CAAC-OS.

Figure 24E:
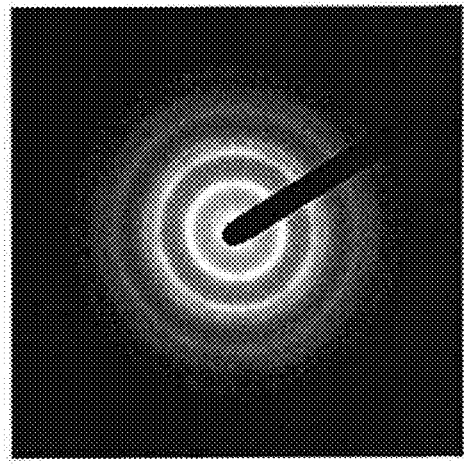

Next, a CAAC-OS analyzed by electron diffraction is described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) shown in FIG. 24(D) may be shown. This diffraction pattern includes spots derived from the (009) plane of the $InGaZnO_4$ crystal. Thus, the electron diffraction also indicates that pellets included in the CAAC-OS have c-axis alignment and that the c-axes are oriented in the direction substantially perpendicular to the formation surface or the top surface. Meanwhile, FIG. 24(E) shows a diffraction pattern obtained in such a manner that an electron beam with a probe diameter of 300 nm is incident on the same sample in the direction perpendicular to the sample surface. In FIG. 24(E), a ring-like diffraction pattern is observed. Thus, the electron diffraction using an electron beam with a probe diameter of 300 nm also indicates that the a-axes and b-axes of the pellets included in the CAAC-OS do not have orientation. Note that the first ring in FIG. 24(E) is considered to be derived from the (010) plane, the (100) plane, and the like of the $InGaZnO_4$ crystal. Furthermore, the second ring in FIG. 24(E) is considered to be derived from the (110) plane and the like.

Furthermore, in a combined analysis image (also referred to as a high-resolution TEM image) of a bright-field image and a diffraction pattern of a CAAC-OS, which is observed using a transmission electron microscope (TEM: Transmission Electron Microscope), a plurality of pellets can be observed. However, even in the high-resolution TEM image, a boundary between pellets, that is, a crystal grain boundary (also referred to as a grain boundary) cannot be clearly observed in some cases. Thus, it can be said that in the CAAC-OS, a reduction in electron mobility due to the crystal grain boundary is less likely to occur.

Figure 25A:
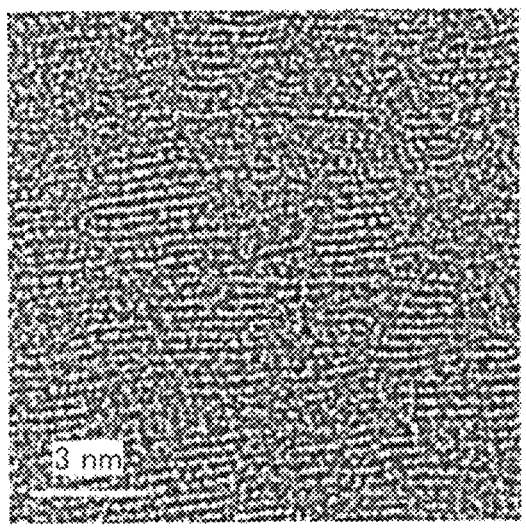
FIGS. 25A-25E are cross-sectional TEM images and plan-view TEM images of a CAAC-OS and an image obtained through image analysis thereof.

FIG. 25(A) shows a high-resolution TEM image of a cross section of the CAAC-OS that is observed from the direction substantially parallel to the sample surface. For observation of the high-resolution TEM image, a spherical aberration corrector (Spherical Aberration Corrector) function was used. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 25(A) shows pellets in which metal atoms are arranged in a layered manner. It is found that the size of a pellet is greater than or equal to 1 nm or greater than or equal to 3 nm. Thus, the pellet can also be referred to as a nanocrystal (nc: nanocrystal). Furthermore, the CAAC-OS can also be referred to as an oxide semiconductor including CANC (C-Axis Aligned nanocrystals). A pellet reflects unevenness of a formation surface or a top surface of the CAAC-OS film and is parallel to the formation surface or the top surface of the CAAC-OS.

Figure 25B:
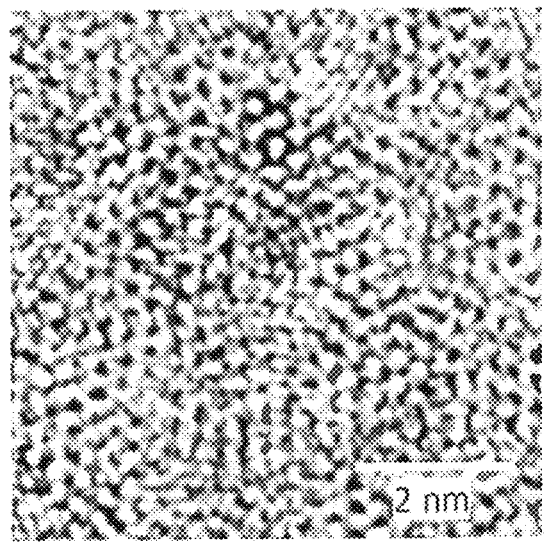
Figure 25C:
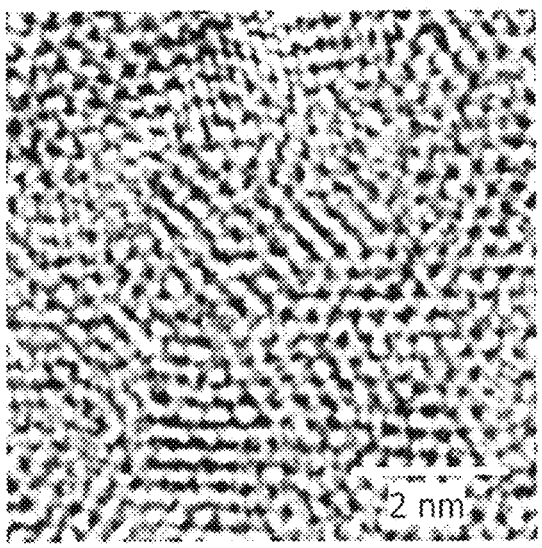
Figure 25D:
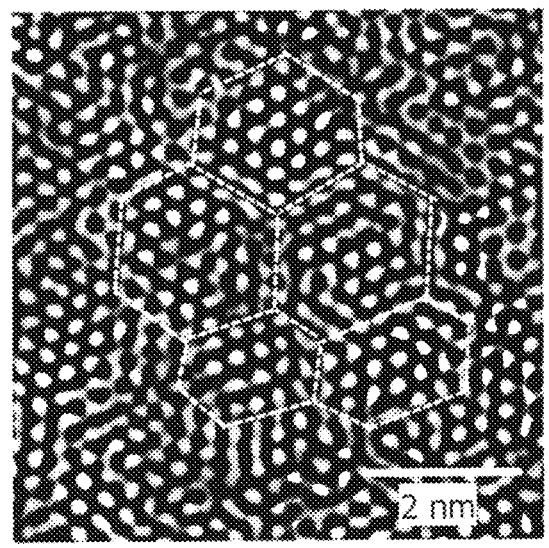
Figure 25E:
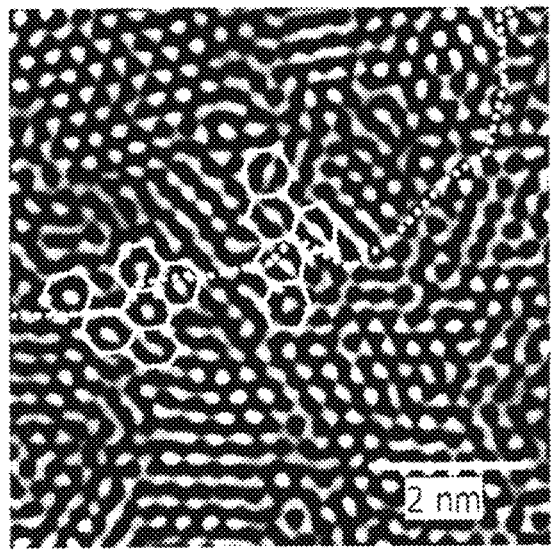

Furthermore, FIG. 25(B) and FIG. 25(C) show Cs-corrected high-resolution TEM images of a plane of the CAAC-OS observed from the direction substantially perpendicular to the sample surface. FIG. 25(D) and FIG. 25(E) are images obtained by image processing of FIG. 25(B) and FIG. 25(C). The method of image processing is described below. First, FIG. 25(B) is subjected to fast Fourier transform (FFT: Fast Fourier Transform) treatment to obtain an FFT image. Then, mask processing is performed such that a range of from 2.8 $nm^{-1}$ to 5.0 $nm^{-1}$ from the origin in the obtained FFT image remains. Next, the FFT image subjected to the mask processing is subjected to inverse fast Fourier transform (IFFT: Inverse Fast Fourier Transform) treatment to obtain a processed image. The image obtained in this manner is referred to as an FFT filtering image. The FFT filtering image is a Cs-corrected high-resolution TEM image from which a periodic component is extracted, and shows a lattice arrangement.

In FIG. 25(D), a portion where the lattice arrangement is broken is shown by dashed lines. A region surrounded by dashed lines is to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 25(E), a dotted line denotes a portion between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, a plurality of pellets (nanocrystals) are connected in the a-b plane direction, and the crystal structure has distortion. For this reason, the CAAC-OS can also be referred to as a CAA crystal (c-axis-aligned a-b-plane-anchored crystal).

The CAAC-OS is an oxide semiconductor with high crystallinity. Entry of impurities, formation of defects, or the like might decrease the crystallinity of an oxide semiconductor, which means that the CAAC-OS is an oxide semiconductor having few impurities and defects (e.g., oxygen vacancies).

Note that an impurity is an element other than the main components of an oxide semiconductor, such as hydrogen, carbon, silicon, or a transition metal element. For example, an element having stronger bonding force to oxygen than a metal element constituting part of an oxide semiconductor, such as silicon, extracts oxygen from the oxide semiconductor, which results in a disordered atomic arrangement and reduced crystallinity of the oxide semiconductor. Furthermore, a heavy metal such as iron or nickel, argon, carbon dioxide, or the like has a large atomic radius (or molecular radius), and thus disturbs the atomic arrangement and decreases the crystallinity of the oxide semiconductor.

<<nc-OS>>

Next, an nc-OS is described.

The case where an nc-OS is analyzed by XRD is described. For example, when the structure of an nc-OS is analyzed by an out-of-plane method, a peak indicating orientation does not appear. That is, a crystal of an nc-OS does not have orientation.

Figure 26A:
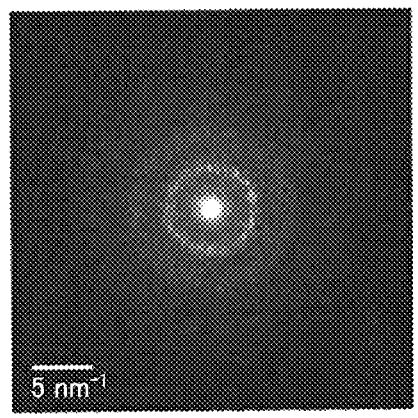
FIGS. 26A-26D are diagrams showing an electron diffraction pattern and cross-sectional TEM images of an nc-OS.
Figure 26B:
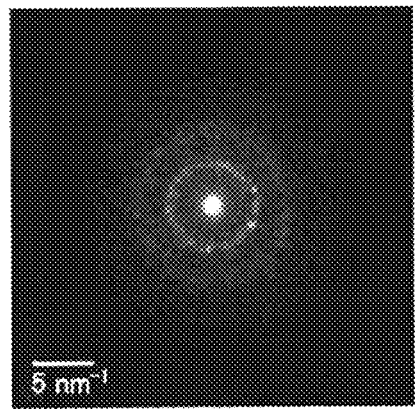

Furthermore, for example, when an electron beam with a probe diameter of 50 nm is incident on a 34-nm-thick region of a thinned nc-OS including an InGaZnO$_4$ crystal in the direction parallel to the formation surface, a ring-like diffraction pattern (nanobeam electron diffraction pattern) shown in FIG. 26(A) is observed. Furthermore, FIG. 26(B) shows a diffraction pattern (nanobeam electron diffraction pattern) obtained when an electron beam with a probe diameter of 1 nm is incident on the same sample. In FIG. 26(B), a plurality of spots are observed in a ring-like region. Thus, ordering in an nc-OS is not observed when an electron beam with a probe diameter of 50 nm is incident on the nc-OS but ordering is observed when an electron beam with a probe diameter of 1 nm is incident on the nc-OS.

Figure 26C:
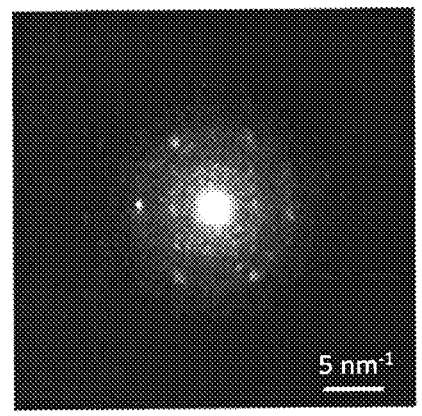

Furthermore, when an electron beam with a probe diameter of 1 nm is incident on a region with a thickness less than 10 nm, an electron diffraction pattern in which spots are arranged in an approximately regular hexagonal shape as shown in FIG. 26(C) is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 26D:
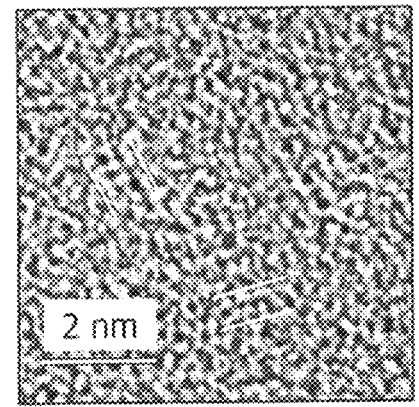

FIG. 26(D) shows a Cs-corrected high-resolution TEM image of a cross section of an nc-OS observed from the direction substantially parallel to the formation surface. In the high-resolution TEM image, the nc-OS includes a region where a crystal part is observed, such as the part indicated by auxiliary lines, and a region where a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm may be referred to as a microcrystalline oxide semiconductor (micro crystalline oxide semiconductor). In a high-resolution TEM image of the nc-OS, for example, a crystal grain boundary is not clearly observed in some cases. Note that there is a possibility that the origin of the nanocrystal is the same as that of a pellet in a CAAC-OS. Thus, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Note that since there is no regularity of crystal orientation between the pellets (nanocrystals), the nc-OS can also be referred to as an oxide semiconductor including RANC (Random Aligned nanocrystals) or an oxide semiconductor including NANC (Non-Aligned nanocrystals).

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<<a-Like OS>>

An a-like OS has a structure between that of an nc-OS and that of an amorphous oxide semiconductor.

Figure 27A:
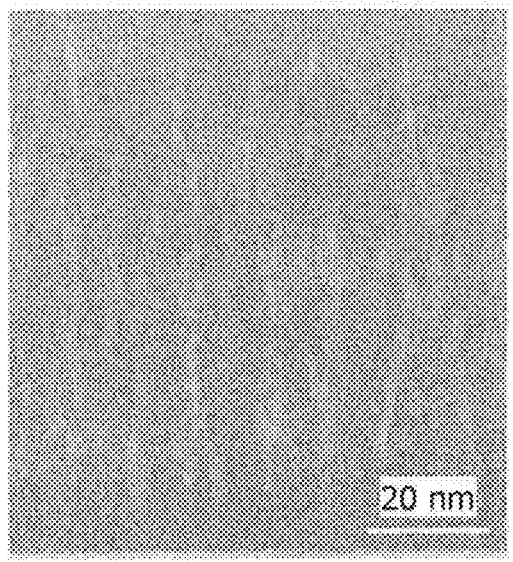
FIGS. 27A and 27B are cross-sectional TEM images of an a-like OS.
Figure 27B:
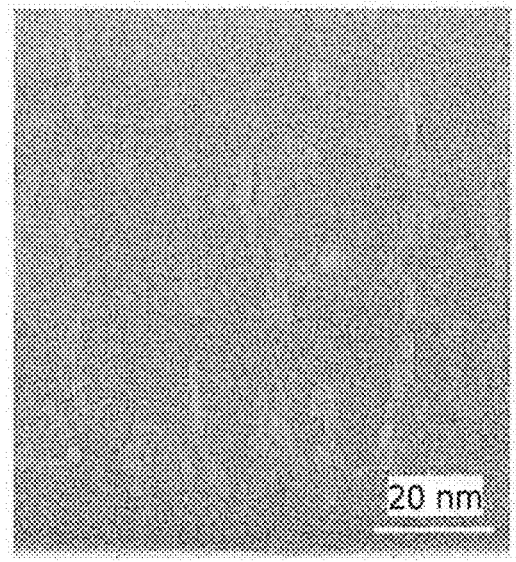

FIG. 27 shows high-resolution cross-sectional TEM images of an a-like OS. Here, FIG. 27(A) is the high-resolution cross-sectional TEM image of the a-like OS that is taken at the start of the electron irradiation. FIG. 27(B) is the high-resolution cross-sectional TEM image of the a-like OS that is taken after the irradiation with electrons (e$^-$) at 4.3×10$^8$ e$^-$/nm$^2$. FIG. 27(A) and FIG. 27(B) show that striped bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction in a layered manner. The distance between the adjacent layers is equivalent to the lattice spacing on the (009) plane (also referred to as d value), and the value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Note that each of the lattice fringes corresponds to the a-b plane of the InGaZnO$_4$ crystal.

Figure 28:
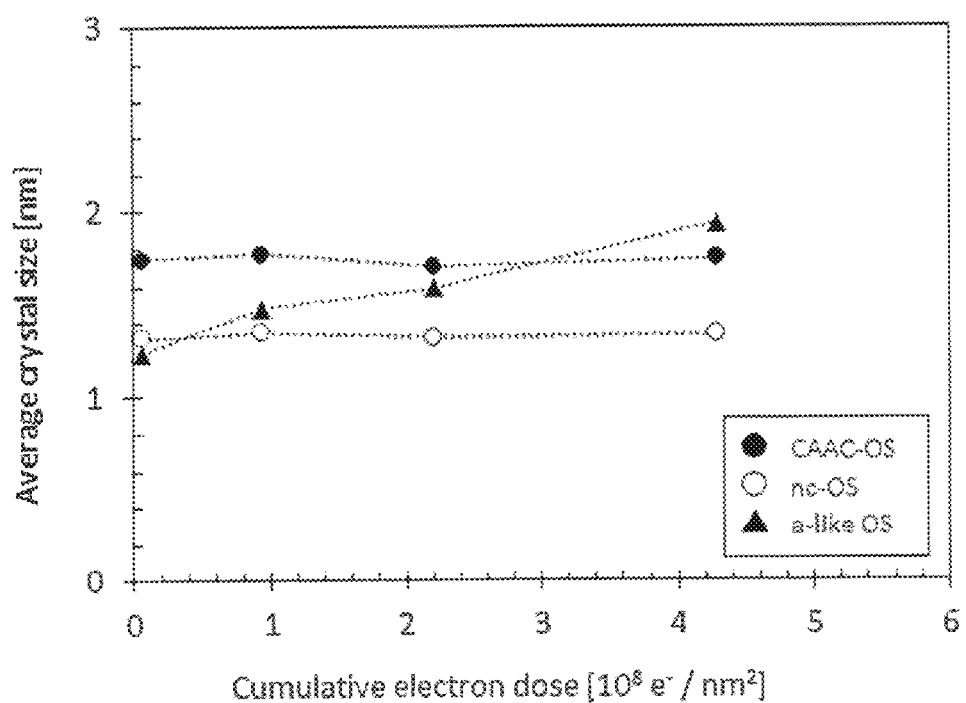
FIG. 28 is a diagram showing a change of a crystal part of an In—Ga—Zn oxide by electron irradiation.

FIG. 28 is an example of investigating the average size of crystal parts (at 22 points to 30 points) in each sample. Note that the length of the lattice fringe is regarded as the crystal part size. FIG. 28 indicates that the crystal part size in the a-like OS increases in accordance with the cumulative electron dose in obtaining TEM images, for example. As shown in FIG. 28, a crystal part with a size of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part sizes in the nc-OS and the CAAC-OS show few changes from the start of electron irradiation to a cumulative electron dose of $4.2 \times 10^8$ e$^-$/nm$^2$. As shown in FIG. 28, the crystal part sizes in the nc-OS and the CAAC-OS are approximately 1.3 nm and approximately 1.8 nm, respectively, regardless of the cumulative electron dose. Note that for the electron beam irradiation and TEM observation, a Hitachi transmission electron microscope H-9000NAR was used. The conditions of the electron beam irradiation were as follows: the accelerating voltage was 300 kV; the current density was $6.7 \times 10^5$ e$^-$/(nm$^2$·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. This implies that the a-like OS has an unstable structure compared with the nc-OS and the CAAC-OS.

Furthermore, the a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. Furthermore, the density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in an oxide semiconductor in which In:Ga:Zn is 1:1:1 [atomic ratio], the density of single-crystal InGaZnO$_4$ with a rhombohedral crystal structure is 6.357 g/cm$^3$. Accordingly, in the oxide semiconductor in which In:Ga:Zn is 1:1:1 [atomic ratio], the density of the a-like OS is higher than or equal to 5.0 g/cm$^3$ and lower than 5.9 g/cm$^3$, for example. Furthermore, in the oxide semiconductor in which In:Ga:Zn is 1:1:1 [atomic ratio], the density of the nc-OS and that of the CAAC-OS are each higher than or equal to 5.9 g/cm$^3$ and lower than 6.3 g/cm$^3$, for example.

Note that in the case where single crystals with the same composition do not exist, single crystals with different compositions are combined at an appropriate ratio, whereby a density corresponding to that of a single crystal with the desired composition can be estimated. The density corresponding to that of the single crystal with the desired composition is estimated using a weighted average with respect to the combination ratio of the single crystals with different compositions. Note that it is preferable to combine as few kinds of single crystals as possible to estimate the density.

As described above, oxide semiconductors have various structures and various properties. Note that an oxide semiconductor may be a laminated film including two or more kinds of an amorphous oxide semiconductor, an a-like OS, an nc-OS, and a CAAC-OS, for example.

<2-5. Carrier Density of Oxide Semiconductor>

Next, the carrier density of an oxide semiconductor is described below.

Factors affecting the carrier density of an oxide semiconductor include oxygen vacancies ($V_O$) in the oxide semiconductor, impurities in the oxide semiconductor, and the like.

As the number of oxygen vacancies in the oxide semiconductor increases, the density of defect states increases when hydrogen is bonded to the oxygen vacancies (this state is also referred to as $V_O$H). Alternatively, the density of defect states also increases with an increase in the number of impurities in the oxide semiconductor. Hence, the carrier density of an oxide semiconductor can be controlled by controlling the density of defect states in the oxide semiconductor.

Here, a transistor using the oxide semiconductor in a channel region is considered.

The carrier density of the oxide semiconductor is preferably reduced in the case where suppression of the negative shift of the threshold voltage of the transistor or reduction in the off-state current of the transistor is intended. In the case where the carrier density of the oxide semiconductor is reduced, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, more preferably lower than $1 \times 10^{10}$ cm$^{-3}$ and is higher than or equal to $1 \times 10^{-9}$ cm$^{-3}$.

By contrast, the carrier density of the oxide semiconductor is preferably increased in the case where improvement in the on-state current of the transistor or improvement in the field-effect mobility of the transistor is intended. In the case where the carrier density of the oxide semiconductor is increased, the impurity concentration or the density of defect states in the oxide semiconductor is slightly increased. Alternatively, the bandgap of the oxide semiconductor is narrowed. For example, an oxide semiconductor that has a slightly high impurity concentration or a slightly high density of defect states in the range where an on/off ratio is obtained in the Id-Vg characteristics of the transistor can be regarded as substantially intrinsic. Furthermore, an oxide semiconductor that has a high electron affinity and thus has a narrow bandgap to increase the density of thermally excited electrons (carriers) can be regarded as substantially intrinsic. Note that when an oxide semiconductor with higher electron affinity is used, the transistor has lower threshold voltage.

The oxide semiconductor with an increased carrier density has somewhat n-type conductivity; thus, it can be referred to as a "Slightly-n" oxide semiconductor.

The carrier density of a substantially intrinsic oxide semiconductor is preferably higher than or equal to $1\times10^5$ cm$^3$ and lower than $1\times10^{18}$ cm$^3$, more preferably higher than or equal to $1\times10^7$ cm$^3$ and lower than or equal to $1\times10^{17}$ cm$^3$, still more preferably higher than or equal to $1\times10^9$ cm$^3$ and lower than or equal to $5\times10^{16}$ cm$^3$, yet more preferably higher than or equal to $1\times10^{10}$ cm$^3$ and lower than or equal to $1\times10^{16}$ cm$^3$, and yet still preferably higher than or equal to $1\times10^{11}$ cm$^3$ and lower than or equal to $1\times10^{15}$ cm$^{-3}$.

Note that the structure described in this embodiment can be used in combination with the structures described in the other embodiments or the other examples, as appropriate.

Embodiment 3

In this embodiment, an example of a display device that includes the transistor described in the above embodiments is described below using FIG. 29 to FIG. 35.

Figure 29:
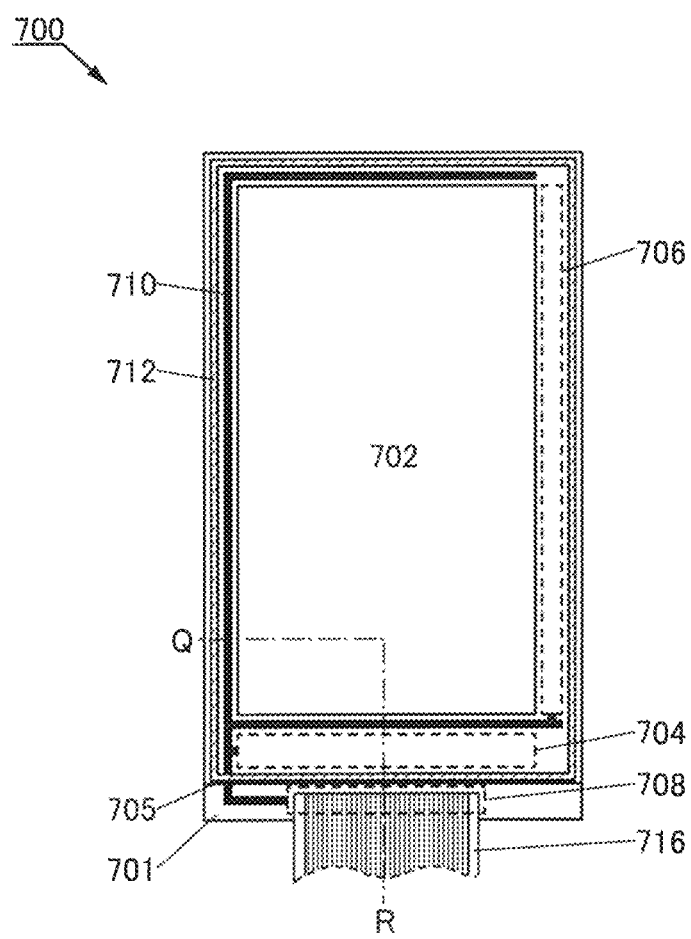
FIG. 29 is a top view illustrating one embodiment of a display device.

FIG. 29 is a top view illustrating an example of a display device. A display device 700 in FIG. 29 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Note that although not illustrated in FIG. 29, a display element is provided between the first substrate 701 and the second substrate 705.

Furthermore, in the display device 700, an FPC terminal portion 708 (FPC: Flexible printed circuit) that is electrically connected to the pixel portion 702, the source driver circuit portion 704, the gate driver circuit portion 706, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

Furthermore, a plurality of gate driver circuit portions 706 may be provided in the display device 700. Furthermore, an example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately formed driver circuit board, and a COG (Chip On Glass) method, a wire bonding method, or the like can be used.

Furthermore, the pixel portion 702, the source driver circuit portion 704, and the gate driver circuit portion 706 included in the display device 700 include a plurality of transistors, and the transistor that is a semiconductor device of one embodiment of the present invention can be used.

Furthermore, the display device 700 can include a variety of elements. Examples of the elements include electroluminescent (EL) element (e.g., an EL element containing an organic material and an inorganic material, an organic EL element, an inorganic EL element, or an LED), a light-emitting transistor element (a transistor that emits light depending on current), an electron emitter, a liquid crystal element, an electronic ink element, an electrophoretic element, an electrowetting element, a plasma display (PDP), an MEMS (micro electro mechanical systems) display (e.g., a grating light valve (GLV), a digital micromirror device (DMD), a digital micro shutter (DMS) element, or an interferometric modulation (IMOD) element), a piezoelectric ceramic display, and the like.

Furthermore, an example of a display device using an EL element is an EL display. Examples of a display device using an electron emitter include a field emission display (FED) and an SED-type flat panel display (SED: Surface-conduction Electron-emitter Display). Examples of a display device using a liquid crystal element include a liquid crystal display (a transmissive liquid crystal display, a transflective liquid crystal display, a reflective liquid crystal display, a direct-view liquid crystal display, or a projection liquid crystal display). Examples of a display device including an electronic ink element or an electrophoretic element include electronic paper. Note that in the case where a transflective liquid crystal display or a reflective liquid crystal display is obtained, some or all of pixel electrodes function as reflective electrodes. For example, some or all of pixel electrodes contain aluminum, silver, or the like. Furthermore, in this case, a memory circuit such as an SRAM can be provided under the reflective electrodes. Thus, the power consumption can be further reduced.

Note that as a display system of the display device 700, a progressive system, an interlace system, or the like can be employed. Furthermore, color elements controlled in pixels at the time of color display are not limited to three colors of RGB (R, G, and B represent red, green, and blue, respectively). For example, four pixels of an R pixel, a G pixel, a B pixel, and a W (white) pixel may be used. Alternatively, a color element may be composed of two colors of R, G, and B as in PenTile layout, and the two colors may differ among color elements. Alternatively, one or more of yellow, cyan, magenta, and the like may be added to RGB. Note that the size of a display region may differ between dots of color elements. Note that the disclosed invention is not limited to a color display device and can also be used for a monochrome display device.

Furthermore, a coloring layer (also referred to as a color filter) may be used so that a display device performs full-color display using white light emission (W) for a backlight (e.g., an organic EL element, an inorganic EL element, an LED, or a fluorescent lamp). For the coloring layer, for example, red (R), green (G), blue (B), yellow (Y), and the like can be used in appropriate combination. With the use of the coloring layer, high color reproducibility can be obtained compared with the case without the coloring layer. Here, by providing a region with a coloring layer and a region without a coloring layer, white light in the region without the coloring layer may be directly utilized for display. By partly providing the region without the coloring layer, a decrease in the luminance of a bright image due to the coloring layer can be inhibited, and approximately 20% to 30% of power consumption can be reduced in some cases. Note that in the case where full-color display is performed using a self-luminous element such as an organic EL element or an inorganic EL element, elements may emit light of their respective colors R, G, B, Y, and W. By using a self-luminous element, power consumption may be further reduced compared with the case of using a coloring layer.

Furthermore, as a coloring system, the following may be used: the above-described system (color filter system) in which part of white light emission is converted into red, green, and blue through color filters; a system (three-color system) in which red light emission, green light emission, and blue light emission are used; and a system (color conversion system or quantum dot system) in which part of blue light emission is converted into red or green.

Figure 30:
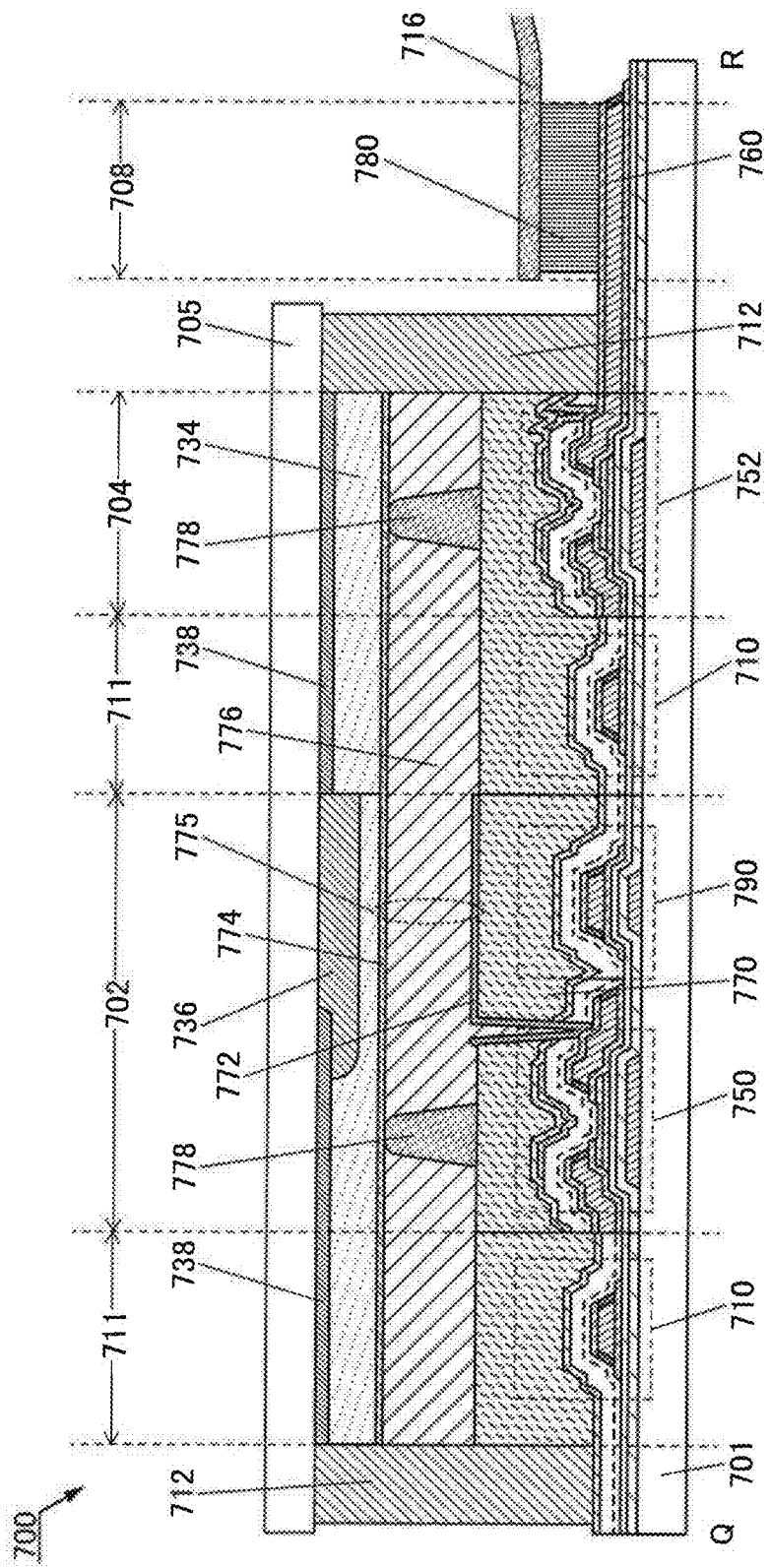
FIG. 30 is a cross-sectional view illustrating one embodiment of a display device.
Figure 32:
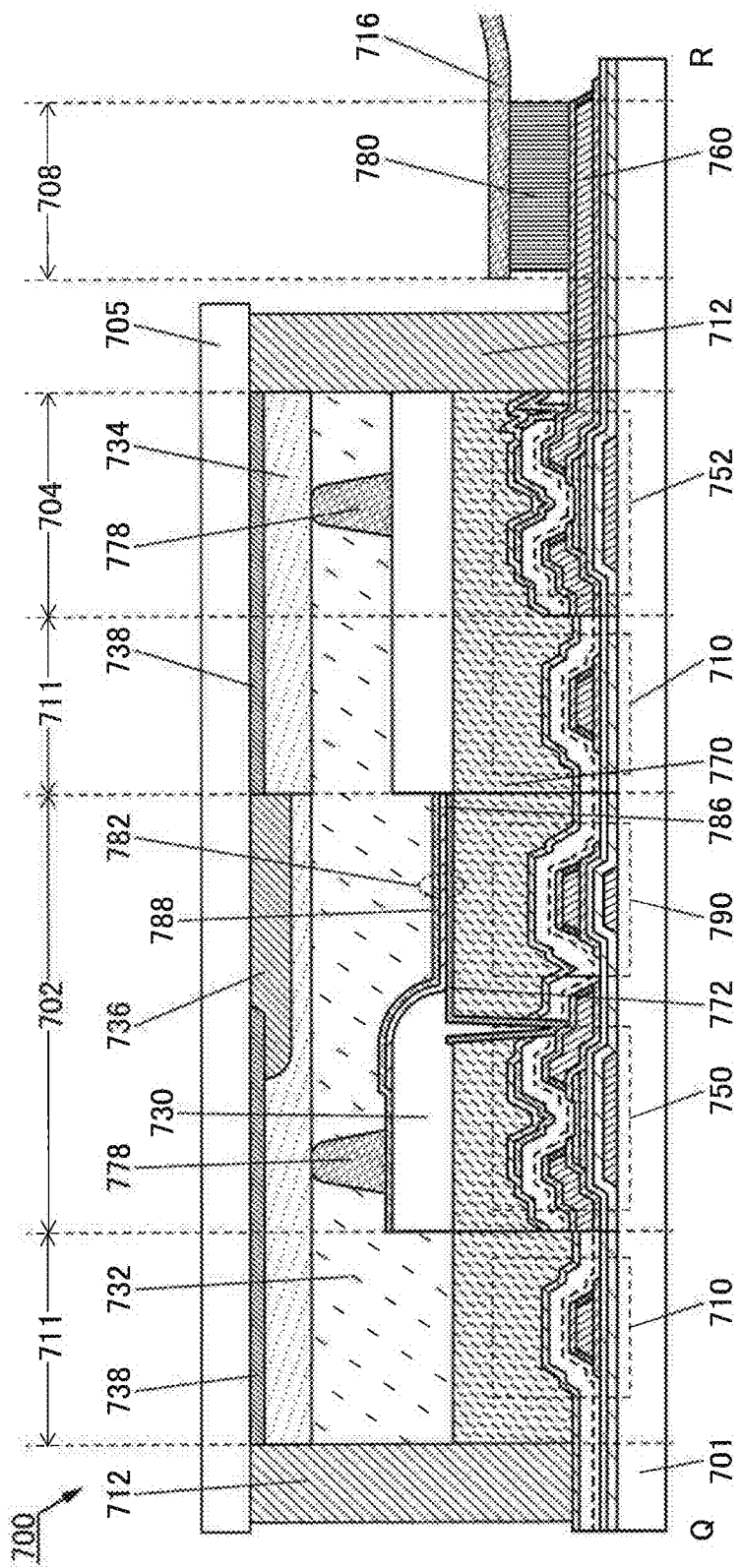
FIG. 32 is a cross-sectional view illustrating one embodiment of a display device.

In this embodiment, structures using a liquid crystal element and an EL element as display elements are described using FIG. 30 and FIG. 32. Note that FIG. 30 is a cross-sectional view taken along dashed-dotted line Q-R in FIG. 29 and is the structure using a liquid crystal element as a display element. Furthermore, FIG. 32 is a cross-sectional view taken along dashed-dotted line Q-R in FIG. 29 and is the structure using an EL element as a display element.

Common portions between FIG. 30 and FIG. 32 are described first, and then, different portions are described below.

<3-1. Description of Common Portions in Display Devices>

The display device 700 in FIG. 30 and FIG. 32 includes a lead wiring portion 711, the pixel portion 702, the source driver circuit portion 704, and the FPC terminal portion 708. Furthermore, the lead wiring portion 711 includes the signal line 710. Furthermore, the pixel portion 702 includes a transistor 750 and a capacitor 790. Furthermore, the source driver circuit portion 704 includes a transistor 752.

The transistor 750 and the transistor 752 each have a structure similar to that of the transistor 100 described above. Note that the transistor 750 and the transistor 752 may have the structures of the other transistors described in the above embodiments.

The transistor used in this embodiment includes an oxide semiconductor film that is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, when such a transistor capable of high-speed operation is used in a liquid crystal display device, a switching transistor in a pixel portion and a driver transistor used in a driver circuit portion can be formed over the same substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode formed through a step of processing the same conductive film as a conductive film functioning as a first gate electrode of the transistor 750 and an upper electrode formed through a step of processing the same conductive film as a conductive film functioning as a source electrode and a drain electrode of the transistor 750. Furthermore, between the lower electrode and the upper electrode, an insulating film formed through a step of forming the same insulating film as an insulating film functioning as a first gate insulating film of the transistor 750 is provided. That is, the capacitor 790 has a layered structure in which an insulating film functioning as a dielectric film is positioned between the pair of electrodes.

Furthermore, in FIG. 30 and FIG. 32, a planarization insulating film 770 is provided over the transistor 750, the transistor 752, and the capacitor 790.

For the planarization insulating film 770, a heat-resistant organic material such as a polyimide resin, an acrylic resin, a polyimide amide resin, a benzocyclobutene resin, a polyamide resin, or an epoxy resin can be used. Note that the planarization insulating film 770 may be formed by stacking a plurality of insulating films formed using these materials. Furthermore, a structure without the planarization insulating film 770 may be employed.

Furthermore, although FIG. 30 and FIG. 32 illustrate an example in which the transistor 750 included in the pixel portion 702 and the transistor 752 included in the source driver circuit portion 704 have the same structure, there is no limitation thereto. For example, different transistors may be used for the pixel portion 702 and the source driver circuit portion 704. Specifically, a structure in which a staggered transistor is used in the pixel portion 702 and the inverted staggered transistor described in Embodiment 1 is used in the source driver circuit portion 704, a structure in which the inverted staggered transistor described in Embodiment 1 is used in the pixel portion 702 and a staggered transistor is used in the source driver circuit portion 704, and the like are given. Note that the source driver circuit portion 704 can be replaced by a gate driver circuit portion.

Furthermore, the signal line 710 is formed through the same process as the conductive films functioning as source electrodes and drain electrodes of the transistors 750 and 752. In the case where a material containing a copper element is used for the signal line 710, for example, signal delay or the like due to wiring resistance is less likely to occur, which enables display on a large screen.

Furthermore, the FPC terminal portion 708 includes a connecting electrode 760, an anisotropic conductive film 780, and the FPC 716. Note that the connecting electrode 760 is formed through the same process as the conductive films functioning as the source electrodes and the drain electrodes of the transistors 750 and 752. Furthermore, the connecting electrode 760 is electrically connected to a terminal included in the FPC 716 through the anisotropic conductive film 780.

Furthermore, for example, a glass substrate can be used as the first substrate 701 and the second substrate 705. Furthermore, as each of the first substrate 701 and the second substrate 705, a flexible substrate may be used. Examples of the flexible substrate include a plastic substrate.

Furthermore, a structure body 778 is provided between the first substrate 701 and the second substrate 705. The structure body 778 is a columnar spacer obtained by selective etching of an insulating film and is provided to control the distance (cell gap) between the first substrate 701 and the second substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Using Liquid Crystal Element>

The display device 700 in FIG. 30 includes a liquid crystal element 775. The liquid crystal element 775 includes a conductive film 772, a conductive film 774, and a liquid crystal layer 776. The conductive film 774 is provided on the second substrate 705 side and has a function of a counter electrode. The display device 700 in FIG. 30 can display an image in such a manner that transmission or non-transmission of light is controlled by the alignment state in the liquid crystal layer 776 that is changed depending on the voltage applied to the conductive film 772 and the conductive film 774.

Furthermore, the conductive film 772 is electrically connected to the conductive film functioning as the source electrode and the drain electrode of the transistor 750. The conductive film 772 is formed over the planarization insulating film 770 and functions as a pixel electrode, that is, one electrode of the display element. Furthermore, the conductive film 772 has a function of a reflective electrode. The display device 700 in FIG. 30 is what is called a reflective color liquid crystal display device that performs display by utilizing external light that is reflected by the conductive film 772 and then passes through the coloring film 736.

A conductive film that transmits visible light or a conductive film that reflects visible light can be used as the conductive film 772. For example, a material containing one kind selected from indium (In), zinc (Zn), and tin (Sn) is preferably used for the conductive film that transmits visible light. For example, a material containing aluminum or silver is preferably used for the conductive film that reflects visible light. In this embodiment, a conductive film that reflects visible light is used as the conductive film 772.

Figure 31:
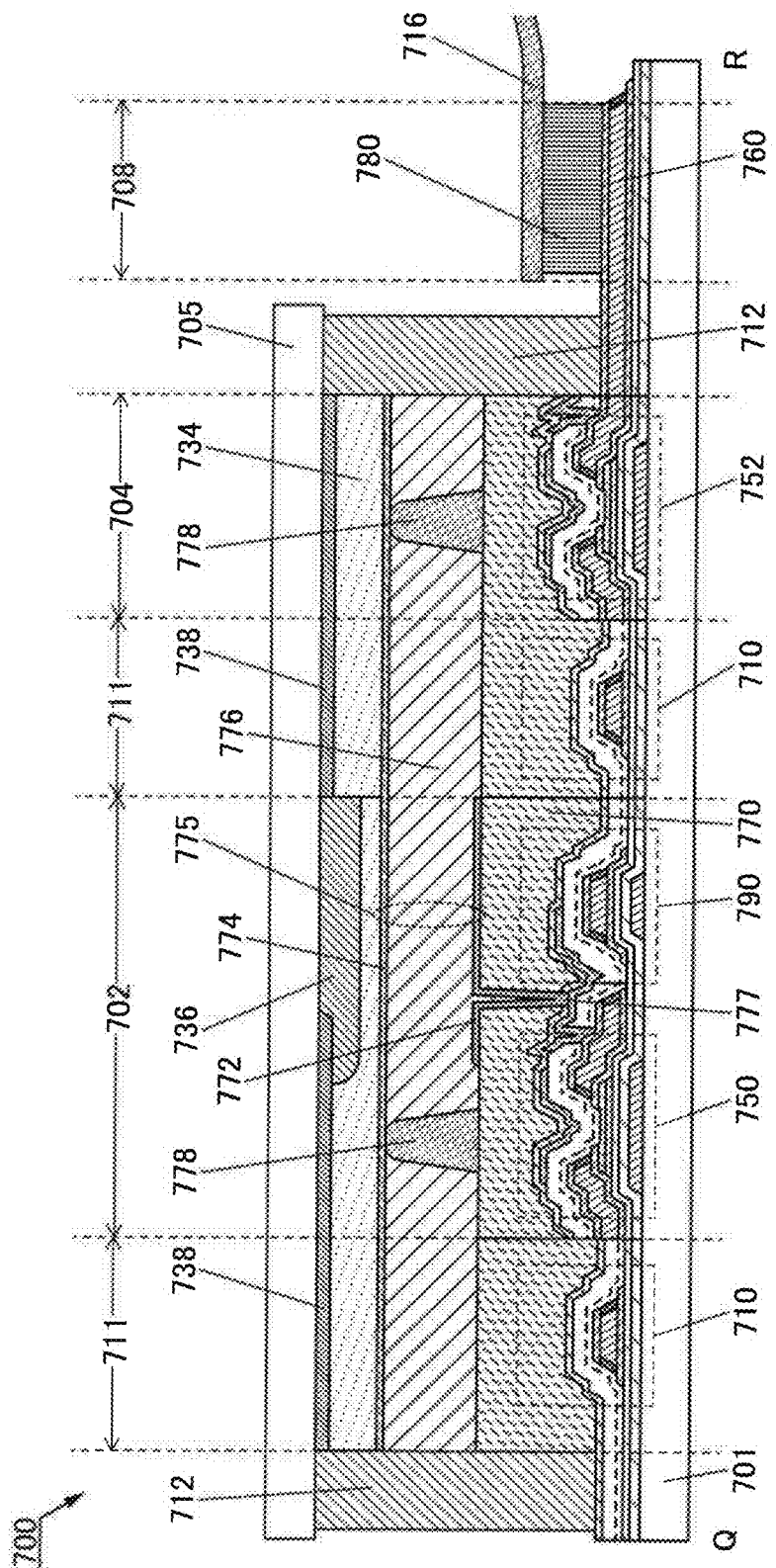
FIG. 31 is a cross-sectional view illustrating one embodiment of a display device.

Note that although FIG. 30 illustrates an example in which the conductive film 772 is connected to the conductive film functioning as the drain electrode of the transistor 750, there is no limitation thereto. For example, as illustrated in FIG. 31, a structure in which the conductive film 772 is electrically connected to the conductive film functioning as the drain electrode of the transistor 750 through a conductive film 777 functioning as a connecting electrode may be employed. Note that the conductive film 777 is formed through a step of processing the same conductive film as a conductive film functioning as a second gate electrode of the transistor 750 and thus can be formed without an increase in the number of manufacturing steps.

Furthermore, the display device 700 in FIG. 30 is a reflective color liquid crystal display device but is not limited thereto; for example, the display device 700 may be a transmissive color liquid crystal display device using a conductive film that transmits visible light as the conductive film 772. Alternatively, the display device 700 may be what is called a transflective color liquid crystal display device in which a reflective color liquid crystal display device and a transmissive color liquid crystal display device are combined.

Figure 33:
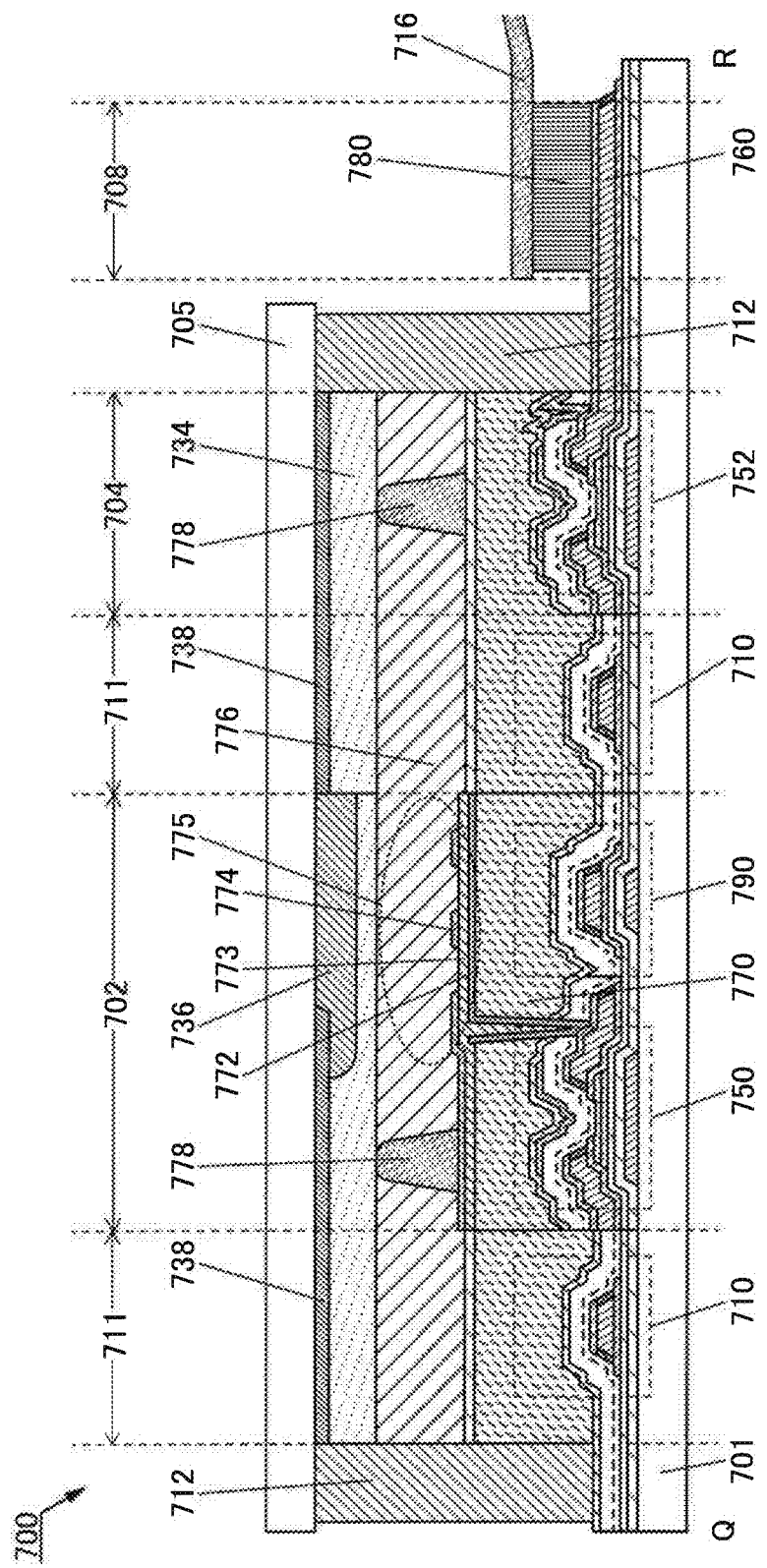
FIG. 33 is a cross-sectional view illustrating one embodiment of a display device.

Here, FIG. 33 illustrates an example of a transmissive color liquid crystal display device. FIG. 33 is a cross-sectional view taken along dashed-dotted line Q-R in FIG. 29 and illustrates a structure in which a liquid crystal element is used as the display element. Furthermore, the display device 700 illustrated in FIG. 33 is an example of a structure in which a horizontal electric field mode (e.g., an FFS mode) is used as a driving mode of the liquid crystal element. In the case of the structure illustrated in FIG. 33, an insulating film 773 is provided over the conductive film 772 functioning as a pixel electrode, and the conductive film 774 is provided over the insulating film 773. In such a case, the conductive film 774 has a function of a common electrode (also referred to as a common electrode), and an electric field generated between the conductive film 772 and the conductive film 774 through the insulating film 773 can control the alignment state in the liquid crystal layer 776.

Furthermore, although not illustrated in FIG. 30 and FIG. 33, one or both of the conductive film 772 and the conductive film 774 may be provided with an alignment film on a side in contact with the liquid crystal layer 776. Furthermore, although not illustrated in FIG. 30 and FIG. 33, an optical member (optical substrate) or the like, such as a polarizing member, a retardation member, or an anti-reflection member, may be provided as appropriate. For example, circular polarization by a polarizing substrate and a retardation substrate may be used. In addition, a backlight, a sidelight, or the like may be used as a light source.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

Furthermore, in the case where a horizontal electric field mode is employed, liquid crystal exhibiting a blue phase for which an alignment film is unnecessary may be used. The blue phase is one of liquid crystal phases, which is generated just before a cholesteric phase changes into an isotropic phase when the temperature of cholesteric liquid crystal is increased. Since the blue phase appears only in a narrow temperature range, a liquid crystal composition in which a chiral material is mixed to account for several weight % or more is used for the liquid crystal layer in order to improve the temperature range. The liquid crystal composition containing liquid crystal exhibiting a blue phase and a chiral material has a short response time and optical isotropy, which makes the alignment process unneeded. Furthermore, an alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

Furthermore, in the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Furthermore, a normally black liquid crystal display device such as a transmissive liquid crystal display device employing a vertical alignment (VA) mode may be used. There are some examples of a vertical alignment mode; for example, an MVA (Multi-Domain Vertical Alignment)

mode, a PVA (Patterned Vertical Alignment) mode, or an ASV mode can be employed.

<3-3. Display Device Using Light-Emitting Element>

The display device 700 illustrated in FIG. 32 includes a light-emitting element 782. The light-emitting element 782 includes the conductive film 772, an EL layer 786, and a conductive film 788. The display device 700 illustrated in FIG. 32 can display an image when the EL layer 786 of the light-emitting element 782 emits light. Note that the EL layer 786 contains an organic compound or an inorganic compound such as a quantum dot.

Materials that can be used for an organic compound include a fluorescent material, a phosphorescent material, and the like. Furthermore, materials that can be used for a quantum dot include a colloidal quantum dot material, an alloyed quantum dot material, a core-shell quantum dot material, a core quantum dot material, and the like. Furthermore, a material including element groups of Group 12 and Group 16, Group 13 and Group 15, or Group 14 and Group 16 may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

Furthermore, in the display device 700 in FIG. 32, an insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Note that although the top-emission structure is described as an example in this embodiment, the structure is not limited thereto. For example, a bottom-emission structure in which light is emitted to the conductive film 772 side or a dual-emission structure in which light is emitted to both the conductive film 772 and the conductive film 788 may also be employed.

Furthermore, the coloring film 736 is provided to overlap with the light-emitting element 782, and the light-blocking film 738 is provided in the lead wiring portion 711 and the source driver circuit portion 704 to overlap with the insulating film 730. Furthermore, the coloring film 736 and the light-blocking film 738 are covered with the insulating film 734. Furthermore, a space between the light-emitting element 782 and the insulating film 734 is filled with a sealing film 732. Note that the structure of the display device 700 is not limited to the example in FIG. 32, in which the coloring film 736 is provided. For example, a structure without the coloring film 736 may be employed in the case where the EL layer 786 is formed by separate coloring.

<3-4. Structure Example of Display Device Provided with Input/Output Device>

Furthermore, an input/output device may be provided in the display device 700 illustrated in FIG. 32 and FIG. 33. Examples of the input/output device include a touch panel.

Figure 34:
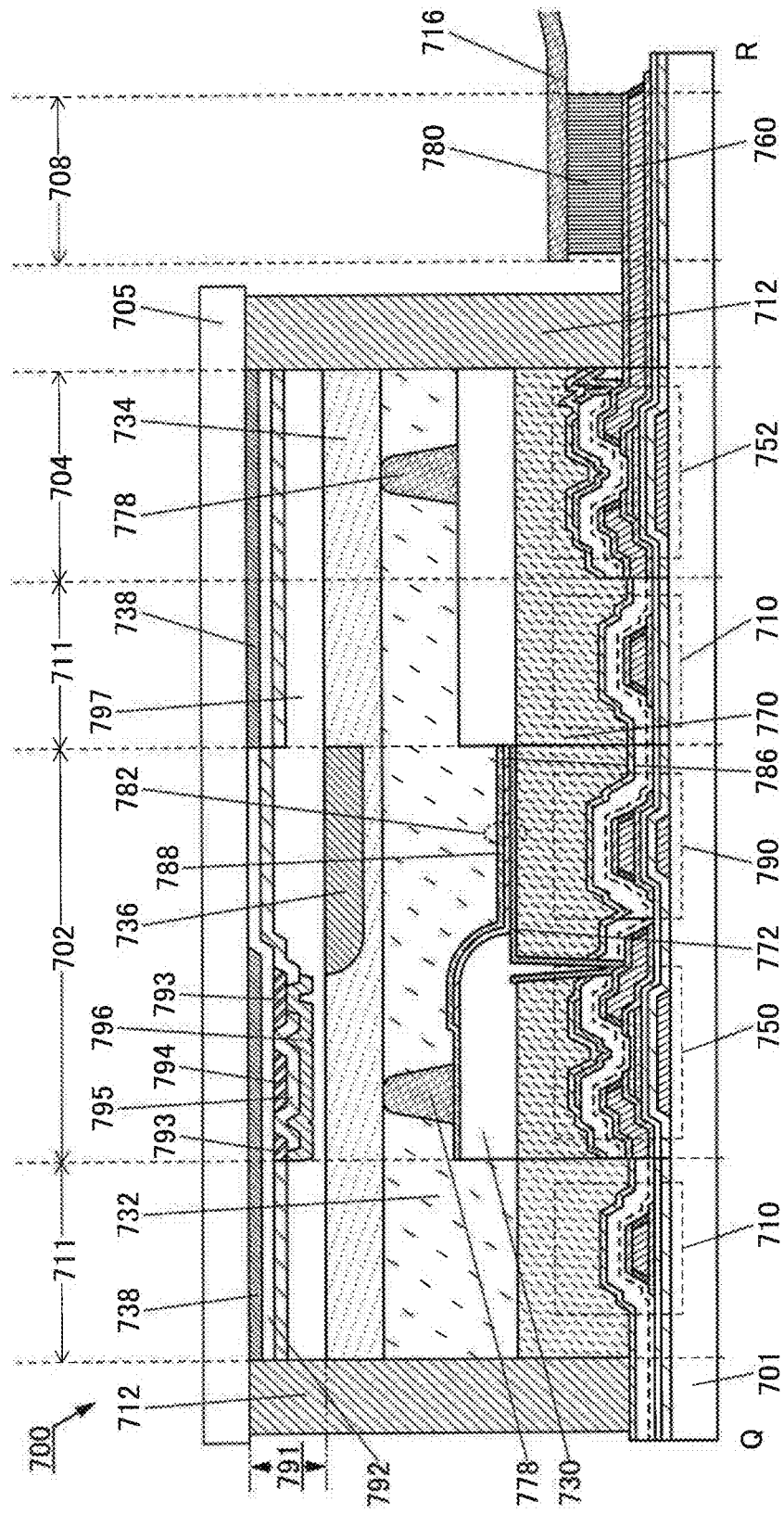
FIG. 34 is a cross-sectional view illustrating one embodiment of a display device.
Figure 35:
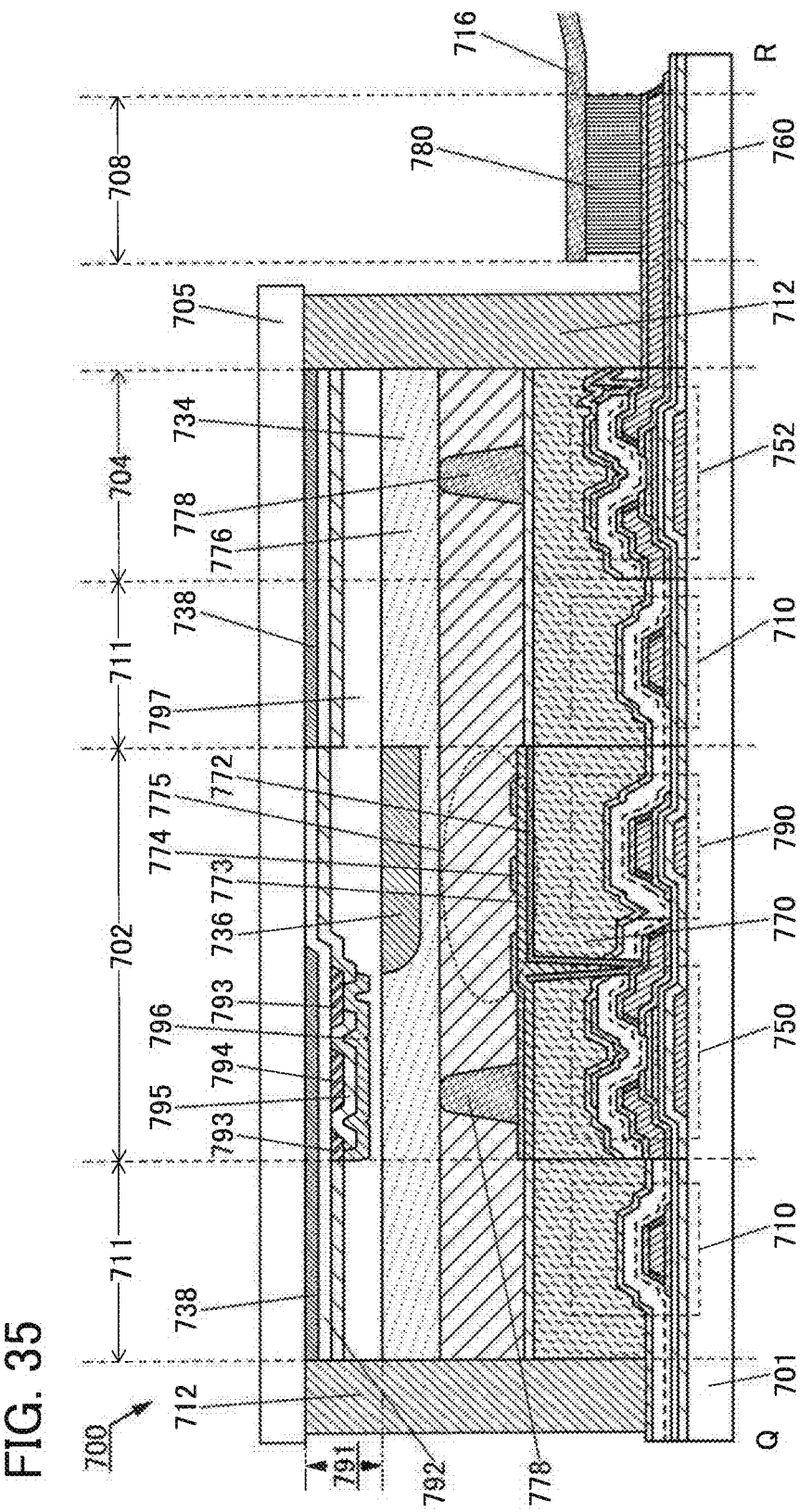
FIG. 35 is a cross-sectional view illustrating one embodiment of a display device.

FIG. 34 and FIG. 35 illustrate structures in which the touch panel 791 is provided in the display device 700 in FIG. 32 and FIG. 33.

FIG. 34 is a cross-sectional view of the structure in which the touch panel 791 is provided in the display device 700 illustrated in FIG. 32, and FIG. 35 is a cross-sectional view of the structure in which the touch panel 791 is provided in the display device 700 illustrated in FIG. 33.

First, the touch panel 791 illustrated in FIG. 34 and FIG. 35 is described below.

The touch panel 791 illustrated in FIG. 34 and FIG. 35 is what is called an in-cell touch panel provided between the substrate 705 and the coloring film 736. The touch panel 791 is formed on the substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object to be sensed, such as a finger or a stylus, approaches, for example.

Furthermore, a portion where the electrode 793 intersects with the electrode 794 is clearly illustrated above the transistor 750 illustrated in FIG. 34 and FIG. 35. The electrode 796 is electrically connected to the two electrodes 793 between which the electrode 794 is positioned, through openings provided in the insulating film 795. Note that a structure in which a region where the electrode 796 is provided is provided in the pixel portion 702 is illustrated in FIG. 34 and FIG. 35 as an example; however, there is no limitation thereto; for example, the region may be formed in the source driver circuit portion 704.

The electrode 793 and the electrode 794 are provided in a region overlapping with the light-blocking film 738. Furthermore, as illustrated in FIG. 34, it is preferable that the electrode 793 be provided not to overlap with the light-emitting element 782. Furthermore, as illustrated in FIG. 35, it is preferable that the electrode 793 be provided not to overlap with the liquid crystal element 775. In other words, the electrode 793 has an opening in a region overlapping with the light-emitting element 782 and the liquid crystal element 775. That is, the electrode 793 has a mesh shape. With such a structure, a structure in which the electrode 793 does not block light emitted from the light-emitting element 782 can be obtained. Alternatively, a structure in which the electrode 793 does not block light transmitted through the liquid crystal element 775 can be obtained. Thus, since a reduction in luminance caused by providing the touch panel 791 is extremely small, a display device with high visibility and reduced power consumption can be obtained. Note that the electrode 794 can have a similar structure.

Furthermore, since the electrode 793 and the electrode 794 do not overlap with the light-emitting element 782, a metal material having low visible light transmittance can be used for the electrode 793 and the electrode 794. Alternatively, since the electrode 793 and the electrode 794 do not overlap with the liquid crystal element 775, a metal material having low visible light transmittance can be used for the electrode 793 and the electrode 794.

Thus, the resistance of the electrode 793 and the electrode 794 can be reduced compared with an electrode using an oxide material having high visible light transmittance, whereby the sensitivity of the sensor of the touch panel can be increased.

For example, a conductive nanowire may be used for the electrodes 793, 794, and 796. The nanowire has a mean diameter of greater than or equal to 1 nm and less than or equal to 100 nm, preferably greater than or equal to 5 nm and less than or equal to 50 nm, more preferably greater than or equal to 5 nm and less than or equal to 25 nm. Furthermore, as the nanowire, a carbon nanotube or a metal nanowire such as an Ag nanowire, a Cu nanowire, or an Al nanowire is used. For example, in the case where an Ag nanowire is used for any one of or all of electrodes 793, 794, and 796, the visible light transmittance can be greater than or equal to 89% and the sheet resistance can be greater than or equal to 40 Ω/square and less than or equal to 100 Ω/square.

Furthermore, although the structure of the in-cell touch panel is illustrated in FIG. 34 and FIG. 35, there is no limitation thereto. For example, what is called an on-cell touch panel that is formed over the display device 700, or what is called an out-cell touch panel that is attached to the display device 700 may be used.

In this manner, the display device of one embodiment of the present invention can be used in combination with various types of touch panels.

Note that the structures described in this embodiment can be used in combination with the structures described in the other embodiments, as appropriate.

Embodiment 4

In this embodiment, a display device including a semiconductor device of one embodiment of the present invention is described using FIG. 36.
<4. Circuit Configuration of Display Device>

A display device illustrated in FIG. 36(A) includes a region including pixels of display elements (hereinafter, referred to as a pixel portion 502), a circuit portion that is provided outside the pixel portion 502 and includes a circuit for driving the pixels (hereinafter, referred to as a driver circuit portion 504), circuits having a function of protecting elements (hereinafter, referred to as protection circuits 506), and a terminal portion 507. Note that the protection circuits 506 are not necessarily provided.

Part or the whole of the driver circuit portion 504 is desirably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or TAB (Tape Automated Bonding).

The pixel portion 502 includes a plurality of circuits for driving display elements arranged in X rows (X is a natural number of 2 or more) and Y columns (Y is a natural number of 2 or more) (hereinafter, referred to as pixel circuits 501), and the driver circuit portion 504 includes driver circuits such as a circuit for outputting a signal (scan signal) to select a pixel (hereinafter, referred to as a gate driver 504*a*) and a circuit for supplying a signal (data signal) to drive a display element in a pixel (hereinafter, referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter, referred to as scan lines GL_1 to GL_X). Note that a plurality of gate drivers 504*a* may be provided so that the scan lines GL_1 to GL_X are separately controlled by the plurality of gate drivers 504*a*. Alternatively, the gate driver 504*a* has a function of supplying an initialization signal. Note that without being limited thereto, the gate driver 504*a* can supply another signal.

The source driver 504*b* includes a shift register or the like. The source driver 504*b* receives a signal (image signal) from which a data signal is generated, as well as a signal for driving the shift register, through the terminal portion 507. The source driver 504*b* has a function of generating a data signal to be written to the pixel circuit 501 from the image signal. In addition, the source driver 504*b* has a function of controlling output of a data signal in response to a pulse signal produced by input of a start pulse, a clock signal, or the like. Furthermore, the source driver 504*b* has a function of controlling the potentials of wirings supplied with data signals (hereinafter, referred to as data lines DL_1 to DL_Y). Alternatively, the source driver 504*b* has a function of supplying an initialization signal. Without being limited thereto, the source driver 504*b* can supply another signal.

The source driver 504*b* is formed using a plurality of analog switches, for example. The source driver 504*b* can output, as data signals, signals obtained by time-dividing the image signal by sequentially turning on the plurality of analog switches. Furthermore, the source driver 504*b* may be formed using a shift register or the like.

A pulse signal and a data signal are input to each of the plurality of pixel circuits 501 through one of the plurality of scan lines GL supplied with scan signals and one of the plurality of data lines DL supplied with data signals, respectively. Furthermore. Writing and holding of the data of the data signal to and in each of the plurality of pixel circuits 501 are controlled by the gate driver 504*a*. For example, to the pixel circuit 501 in the m-th row and the n-th column, a pulse signal is input from the gate driver 504*a* through the scan line GL_m (m is a natural number of X or less), and a data signal is input from the source driver 504*b* through the data line DL_n (n is a natural number of Y or less) in accordance with the potential of the scan line GL_m.

Figure 36A:
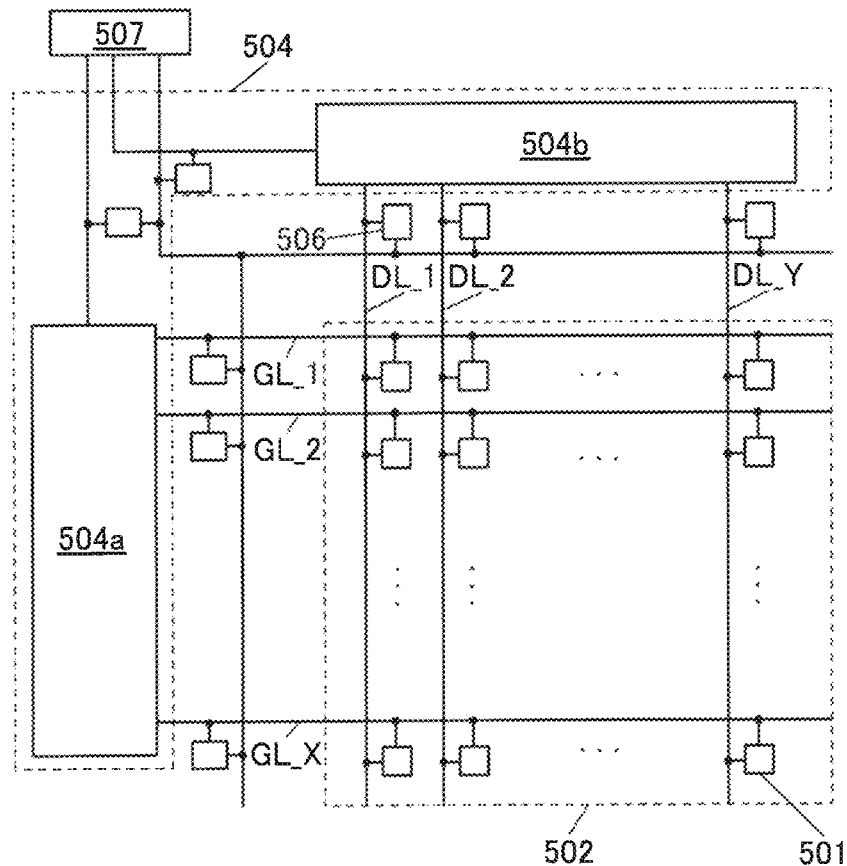
FIGS. 36A-36C are a block diagram and a circuit diagram illustrating a display device.

The protection circuit 506 in FIG. 36(A) is connected to, for example, the scan line GL that is a wiring between the gate driver 504*a* and the pixel circuit 501. Alternatively, the protection circuit 506 is connected to the data line DL that is a wiring between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 refers to a portion having terminals for inputting power, control signals, and image signals from external circuits to the display device.

The protection circuit 506 is a circuit that electrically connects a wiring, which is connected thereto, to another wiring when a potential out of a certain range is supplied to the wiring.

As illustrated in FIG. 36(A), the protection circuits 506 provided for the pixel portion 502 and the driver circuit portion 504 can improve the resistance of the display device to overcurrent generated by ESD (Electro Static Discharge: Electrostatic discharge) or the like. Note that the configuration of the protection circuits 506 is not limited thereto; for example, a configuration in which the protection circuit 506 is connected to the gate driver 504*a*, or a configuration in which the protection circuit 506 is connected to the source driver 504*b* can be employed. Alternatively, a configuration in which the protection circuit 506 is connected to the terminal portion 507 can be employed.

Furthermore, FIG. 36(A) illustrates an example in which the driver circuit portion 504 is formed using the gate driver 504*a* and the source driver 504*b*; however, the configuration is not limited thereto. For example, a configuration in which only the gate driver 504*a* is formed and a separately prepared substrate over which a source driver circuit is formed (e.g., a driver circuit board formed using a single-crystal semiconductor film or a polycrystalline semiconductor film) is mounted may be employed.

Figure 36B:
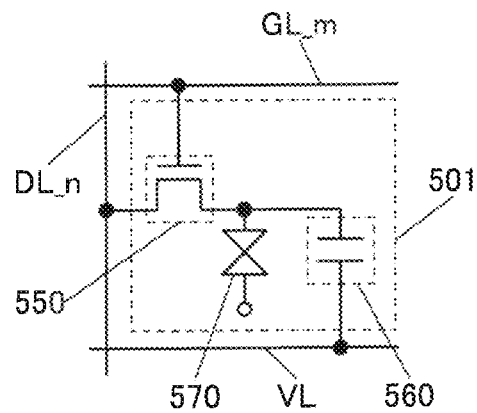

Furthermore, the plurality of pixel circuits 501 in FIG. 36(A) can have the configuration illustrated in FIG. 36(B), for example.

The pixel circuit 501 in FIG. 36(B) includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. Note that a common potential (a common potential) may be supplied to the one of the pair of electrodes of the liquid crystal element 570 included in each of the plurality of pixel circuits 501. Furthermore, the potential supplied to the one of the pair of electrodes of the liquid crystal element 570 in the pixel circuit 501 may differ between rows.

As a driving method of the display device including the liquid crystal element 570, the following can be used: a TN mode, an STN mode, a VA mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, and a TBA (Transverse Bend Alignment) mode. Furthermore, other driving methods of the display device include an ECB (Electrically Controlled Birefringence) mode, a PDLC (Polymer Dispersed Liquid Crystal) mode, a PNLC (Polymer Network Liquid Crystal) mode, and a guest-host mode. Note that without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. Furthermore, a gate electrode of the transistor 550 is electrically connected to the scan line GL_m. The transistor 550 has a function of controlling whether data of a data signal is written.

One of a pair of electrodes of the capacitor 560 is electrically connected to a wiring through which a potential is supplied (hereinafter, a potential supply line VL), and the other is electrically connected to the other of the pair of electrodes of the liquid crystal element 570. Note that the potential of the potential supply line VL is appropriately set in accordance with the specifications of the pixel circuit 501. The capacitor 560 has a function of a storage capacitor for storing written data.

For example, in the display device including the pixel circuits 501 in FIG. 36(B), the gate driver 504a in FIG. 36(A) sequentially selects the pixel circuits 501 row by row to turn on the transistors 550, and data of data signals is written.

When the transistor 550 is turned off, the pixel circuit 501 to which the data has been written is brought into a holding state. This operation is sequentially performed row by row; thus, an image can be displayed.

Figure 36C:
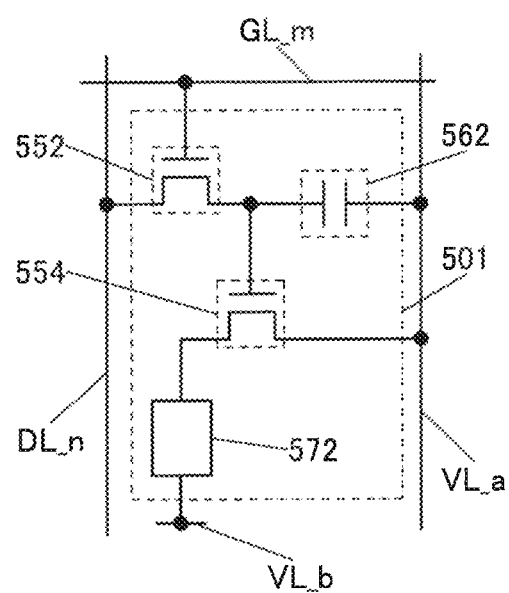

Alternatively, the plurality of pixel circuits 501 in FIG. 36(A) can have the configuration illustrated in FIG. 36(C), for example.

Furthermore, the pixel circuit 501 in FIG. 36(C) includes transistors 552 and 554, a capacitor 562, and a light-emitting element 572. The transistor described in the above embodiment can be used as any one or both of the transistor 552 and the transistor 554.

One of a source electrode and a drain electrode of the transistor 552 is electrically connected to a wiring through which a data signal is supplied (hereinafter, referred to as a signal line DL_n). Furthermore, a gate electrode of the transistor 552 is electrically connected to a wiring through which a gate signal is supplied (hereinafter, referred to as the scan line GL_m).

The transistor 552 has a function of controlling whether data of a data signal is written.

One of a pair of electrodes of the capacitor 562 is electrically connected to a wiring through which a potential is supplied (hereinafter, referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and an inorganic EL element comprising an inorganic material may be used.

Note that a high power supply potential VDD is supplied to one of the potential supply line VL_a and the potential supply line VL_b, and a low power supply potential VSS is supplied to the other.

In the display device including the pixel circuits 501 in FIG. 36(C), the gate driver 504a in FIG. 36(A) sequentially selects the pixel circuits 501 row by row to turn on the transistors 552, and data of data signals is written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal, and the light-emitting element 572 emits light with a luminance corresponding to the amount of flowing current. This operation is sequentially performed row by row; thus, an image can be displayed.

Note that the structures described in this embodiment can be used in combination with the structures described in the other embodiments, as appropriate.

Embodiment 5

In this embodiment, circuit configuration examples in which the transistors described in the above embodiments can be used are described with reference to FIG. 37 to FIG. 40.

Note that in the following description in this embodiment, the transistor including an oxide semiconductor described in the above embodiment is referred to as an OS transistor.

<5. Configuration Example of Inverter Circuit>

Figure 37A:
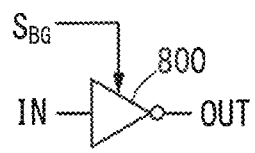
FIGS. 37A-37C are a circuit diagram and a timing chart for explaining one embodiment of the present invention.

FIG. 37(A) is a circuit diagram of an inverter that can be used for a shift register, a buffer, or the like included in the driver circuit. An inverter 800 outputs a signal whose logic is inverted from that of a signal of an input terminal IN to an output terminal OUT. The inverter 800 includes a plurality of OS transistors. A signal $S_{BG}$ is a signal that can switch electrical characteristics of the OS transistors.

Figure 37B:
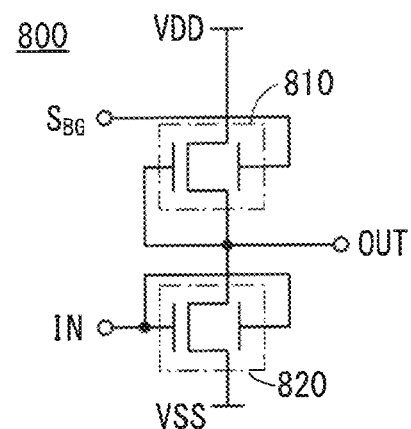

FIG. 37(B) is an example of the inverter 800. The inverter 800 includes an OS transistor 810 and an OS transistor 820. The inverter 800 can be formed using only n-channel transistors and thus can be formed at lower cost than an inverter (a CMOS inverter) formed using a CMOS (Complementary Metal Oxide Semiconductor).

Note that the inverter 800 including the OS transistors can be provided over a CMOS including Si transistors. Since the inverter 800 can be provided to overlap with the CMOS circuit, no additional area is required for the inverter 800, and thus, an increase in the circuit area can be suppressed.

The OS transistors 810 and 820 include a first gate functioning as a front gate, a second gate functioning as a back gate, a first terminal functioning as one of a source and a drain, and a second terminal functioning as the other of the source and the drain.

The first gate of the OS transistor 810 is connected to the second terminal of the OS transistor 810. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 37C:
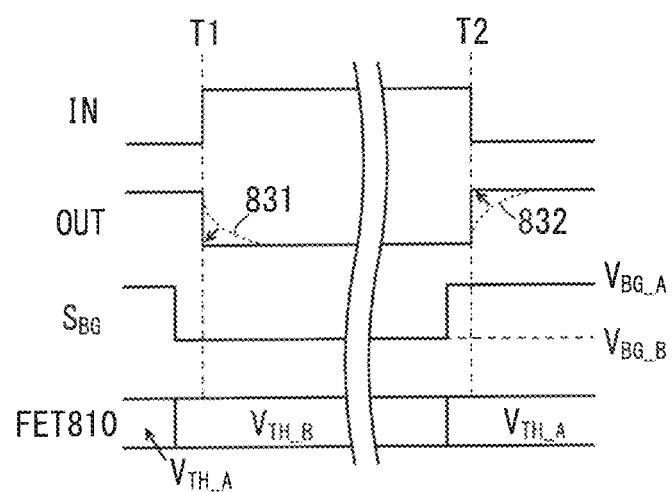

FIG. 37(C) is a timing chart for explaining the operation of the inverter 800. The timing chart in FIG. 37(C) shows changes in a signal waveform of the input terminal IN, a signal waveform of the output terminal OUT, a signal waveform of the signal $S_{BG}$, and the threshold voltage of the OS transistor 810.

The signal $S_{BG}$ is supplied to the second gate of the OS transistor 810, so that the threshold voltage of the OS transistor 810 can be controlled.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. Furthermore, the threshold voltage of the OS transistor 810 can be shifted in the positive direction to be a threshold voltage $V_{TH\_B}$ when the voltage $V_{BG\_B}$ is applied to the second gate.

Figure 38A:
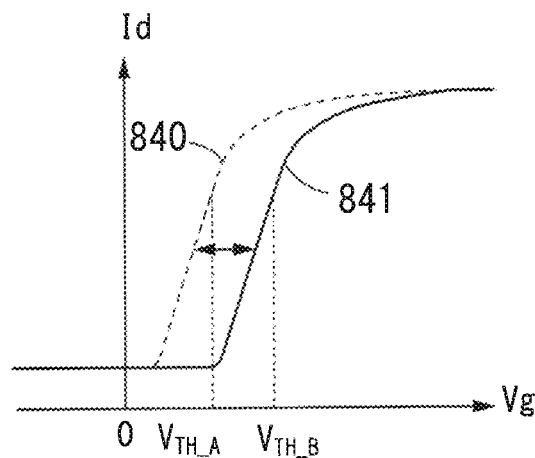
FIG. 38A is a graph and FIGS. 38B and 38C are circuit diagrams for explaining one embodiment of the present invention.

To visualize the above description, FIG. 38(A) shows an $I_d$-$V_g$ curve, which is one of the electrical characteristics of a transistor.

With a high voltage such as the voltage $V_{BG\_A}$ as the voltage of the second gate, the electrical characteristics of the OS transistor 810 can be shifted to match a curve shown by a dashed line 840 in FIG. 38(A). Furthermore, with a low voltage such as the voltage $V_{BG\_B}$ as the voltage of the second gate, the electrical characteristics of the OS transistor 810 can be shifted to match a curve shown by a solid line 841 in FIG. 38(A). As shown in FIG. 38(A), switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 38B:
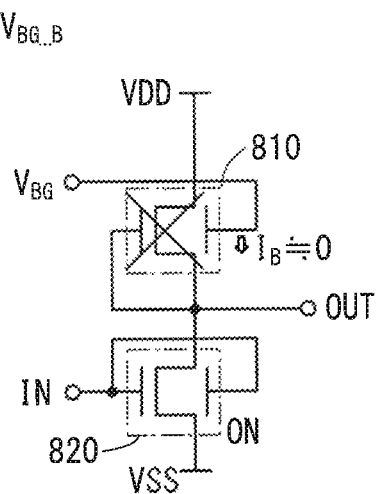

The shift of the threshold voltage in the positive direction toward the threshold voltage $V_{TH\_B}$ can make current less likely to flow in the OS transistor 810. FIG. 38(B) visualizes this state.

As illustrated in FIG. 38(B), a current $I_B$ that flows in the OS transistor 810 can be extremely low. Thus, when a signal supplied to the input terminal IN is at a high level and the OS transistor 820 is in an on state (ON), the voltage of the output terminal OUT can be sharply decreased.

Since a state in which current is less likely to flow in the OS transistor 810 as illustrated in FIG. 38(B) can be obtained, a change in a signal waveform 831 of the output terminal in the timing chart in FIG. 37(C) can be made steep. Shoot-through current flowing between the wiring that supplies the voltage VDD and the wiring that supplies the voltage VSS can be low, leading to low-power operation.

Figure 38C:
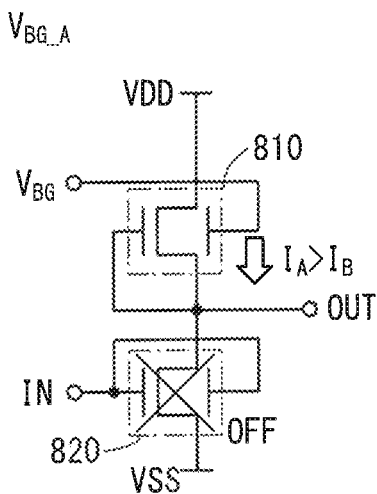

Furthermore, the shift of the threshold voltage in the negative direction toward the threshold voltage $V_{TH\_A}$ can make current flow easily in the OS transistor 810. FIG. 38(C) visualizes this state. As illustrated in FIG. 38(C), a current $I_A$ flowing at this time can be higher than at least the current $I_B$. Thus, when a signal supplied to the input terminal IN is at a low level and the OS transistor 820 is in an off state (OFF), the voltage of the output terminal OUT can be sharply increased. Since a state in which current is likely to flow in the OS transistor 810 as illustrated in FIG. 38(C) can be obtained, a change in a signal waveform 832 of the output terminal in the timing chart in FIG. 37(C) can be made steep.

Note that the threshold voltage of the OS transistor 810 is preferably controlled by the signal $S_{BG}$ before the state of the OS transistor 820 is switched, i.e., before time T1 or T2. For example, as shown in FIG. 37(C), it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as shown in FIG. 37(C), it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 39A:
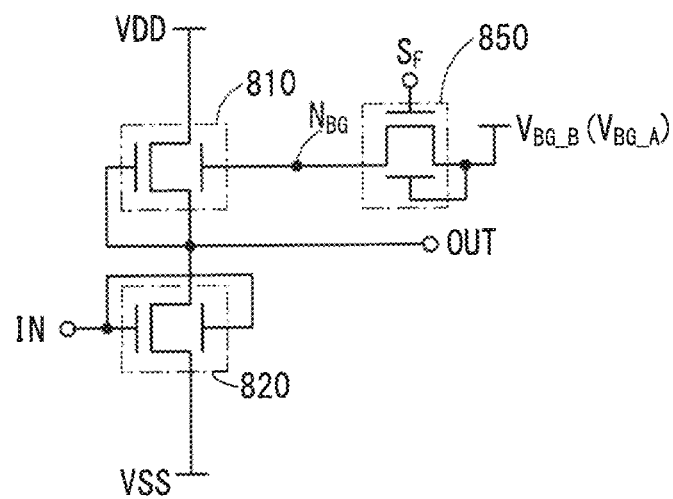
FIGS. 39A and 39B are a circuit diagram and a timing chart for explaining one embodiment of the present invention.

Note that although the timing chart in FIG. 37(C) shows the configuration in which the signal $S_{BG}$ is switched in accordance with the signal supplied to the input terminal IN, a different configuration may be employed. For example, a configuration in which voltage for controlling the threshold voltage is held by the second gate of the OS transistor 810 in a floating state may be employed. FIG. 39(A) illustrates a circuit configuration example that can achieve the configuration.

In FIG. 39(A), an OS transistor 850 is additionally included in the circuit configuration illustrated in FIG. 37(B). A first terminal of the OS transistor 850 is connected to the second gate of the OS transistor 810. Furthermore, a second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 39B:
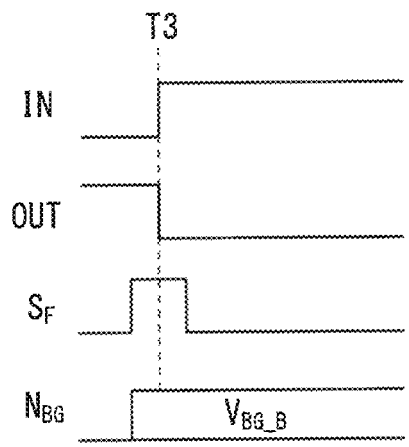

The operation in FIG. 39(A) is described with reference to a timing chart in FIG. 39(B).

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the threshold voltage $V_{BG\_B}$ that has been held by the node $N_{BG}$ can be held while the OS transistor 850 remains off. Thus, the number of times the voltage $V_{BG\_B}$ is supplied to the second gate of the OS transistor 850 can be reduced and accordingly, the power consumption for rewriting the voltage $V_{BG\_B}$ can be reduced.

Figure 40A:
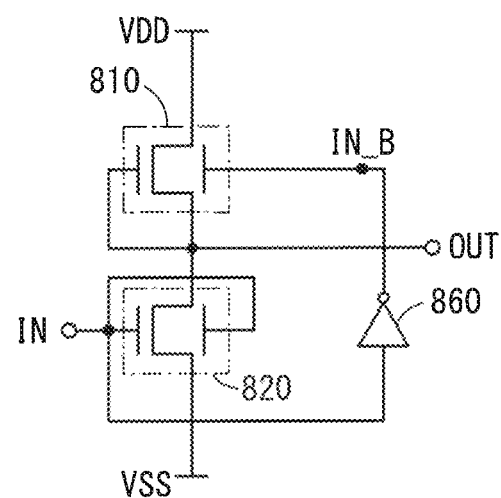
FIGS. 40A and 40B are a circuit diagram and a timing chart for explaining one embodiment of the present invention.

Note that although in the circuit configurations in FIG. 37(B) and FIG. 39(A), the voltage is supplied to the second gate of the OS transistor 810 by control from the outside, a different configuration may be employed. For example, a configuration in which voltage for controlling the threshold voltage is generated on the basis of the signal supplied to the input terminal IN and is supplied to the second gate of the OS transistor 810 may be employed. FIG. 40(A) illustrates a circuit configuration example that can achieve the configuration.

In FIG. 40(A), a CMOS inverter 860 is provided between the input terminal IN and the second gate of the OS transistor 810 in the circuit configuration illustrated in FIG. 37(B). An input terminal of the CMOS inverter 860 is connected to the input terminal IN. An output terminal of the CMOS inverter 860 is connected to the second gate of the OS transistor 810.

Figure 40B:
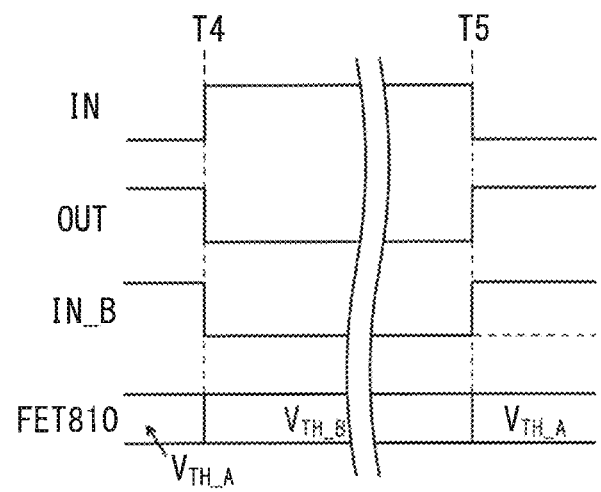

The operation in FIG. 40(A) is described using a timing chart in FIG. 40(B). The timing chart in FIG. 40(B) shows changes in a signal waveform of the input terminal IN, a signal waveform of the output terminal OUT, an output waveform IN_B of the CMOS inverter 860, and the threshold voltage of the OS transistor 810.

The output waveform IN_B that is a signal whose logic is inverted from that of the signal supplied to the input terminal IN can be a signal that controls the threshold voltage of the OS transistor 810. Thus, the threshold voltage of the OS transistor 810 can be controlled as described in FIG. 38(A) to FIG. 38(C). For example, the signal supplied to the input terminal IN is at a high level and the OS transistor 820 is turned on at time T4 in FIG. 40(B). At this time, the output waveform IN_B is at a low level. Accordingly, current can be made less likely to flow in the OS transistor 810; thus, an increase in the voltage of the output terminal OUT can be sharply decreased.

Moreover, the signal supplied to the input terminal IN is at a low level and the OS transistor 820 is turned off at time T5 in FIG. 40(B). At this time, the output waveform IN_B is at a high level. Accordingly, current can easily flow in the OS transistor 810; thus, the voltage of the output terminal OUT can be sharply increased.

As described above, in the configuration of this embodiment, the voltage of the back gate in the inverter including the OS transistor is switched in accordance with the logic of the signal of the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

Note that the structures described in this embodiment can be used in combination with the structures described in the other embodiments, as appropriate.

Embodiment 6

In this embodiment, examples of a semiconductor device in which the transistor including an oxide semiconductor (OS transistor) described in the above embodiments is used in a plurality of circuits are described using FIG. 41 to FIG. 44.

<6. Circuit Configuration example of Semiconductor Device>

Figure 41A:
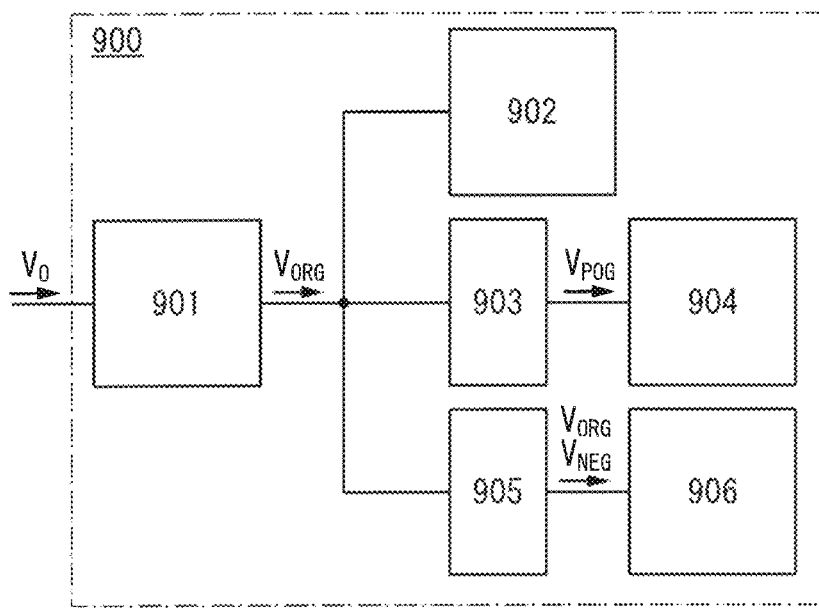
FIG. 41A is a block diagram.

FIG. 41(A) is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). Furthermore, for example, the power supply voltage of the circuit 904 is a voltage applied on the basis of a voltage $V_{POG}$ and the voltage $V_{SS}$ ($V_{POG}>V_{ORG}$). Furthermore, for example, the power supply voltages of the circuit 906 are voltages applied on the basis of the voltage $V_{ORG}$ and a voltage $V_{NEG}$ ($V_{ORG}>V_{SS}>V_{NEG}$). Note that when the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 41B:
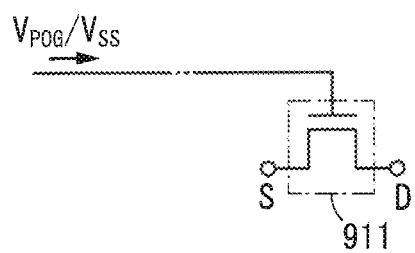
FIGS. 41B and 41D are circuit diagrams.
Figure 41C:
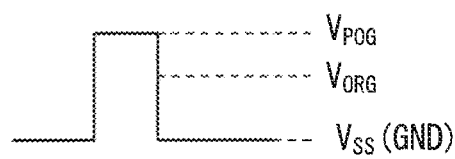
FIGS. 41C and 41E are waveform diagram for explaining one embodiment of the present invention.

FIG. 41(B) is an example of the circuit 904 that operates with the voltage $V_{POG}$ and FIG. 41(C) is an example of a waveform of a signal for operating the circuit 904.

In FIG. 41(B), a transistor 911 is illustrated. A signal supplied to a gate of the transistor 911 is generated on the basis of, for example, the voltage $V_{POG}$ and the voltage $V_{SS}$. The signal is the voltage $V_{POG}$ to turn on the transistor 911 and is the voltage $V_{SS}$ to turn off the transistor 911. As illustrated in FIG. 41(C), the voltage $V_{POG}$ is higher than the voltage $V_{ORG}$. Thus, an operation for bringing a source (S)

and a drain (D) of the transistor 911 into a conduction state can be performed more reliably. As a result, the circuit 904 can be a circuit with reduced frequency of malfunction.

Figure 41D:
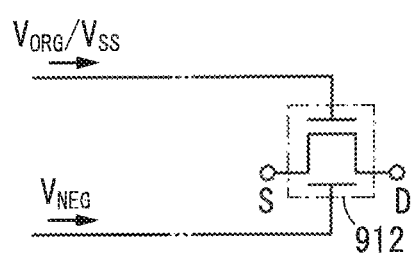
Figure 41E:
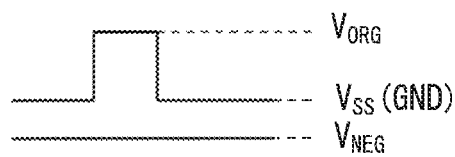

FIG. 41(D) illustrates an example of the circuit 906 that operates with the voltage $V_{NEG}$ and FIG. 41(E) illustrates an example of a waveform of a signal for operating the circuit 906.

FIG. 41(D) illustrates a transistor 912 having a back gate. A signal supplied to a gate of the transistor 912 is generated on the basis of, for example, the voltage $V_{ORG}$ and the voltage $V_{SS}$. The signal is the voltage $V_{ORG}$ to turn on the transistor 911 and is the voltage $V_{SS}$ to turn off the transistor 911. Furthermore, a voltage applied to the back gate of the transistor 912 is generated on the basis of the voltage $V_{NEG}$. As illustrated in FIG. 41(E), the voltage $V_{NEG}$ is lower than the voltage $V_{SS}$ (GND). Thus, the threshold voltage of the transistor 912 can be controlled to shift in the positive direction. Thus, the transistor 912 can be more reliably turned off and a current flowing between a source (S) and a drain (D) can be reduced. As a result, the frequency of malfunction of the circuit 906 can be reduced and power consumption thereof can be reduced.

Note that the voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the signal may be supplied to the back gate of the transistor 912.

Figure 42A:
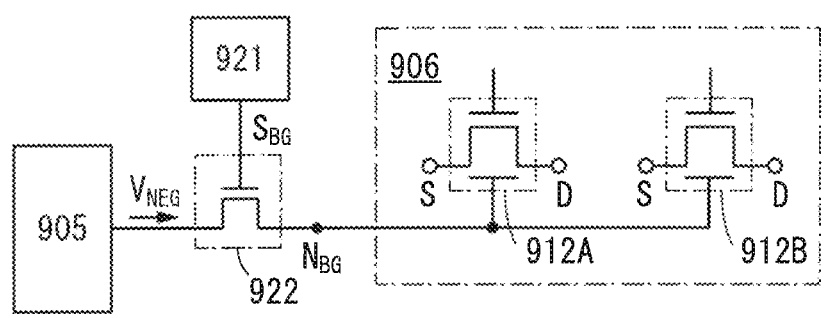
FIGS. 42A and 42B are a circuit diagram and a timing chart for explaining one embodiment of the present invention.

Furthermore, FIGS. 42(A) and (B) illustrate a modification example of FIGS. 41(D) and (E).

In a circuit diagram illustrated in FIG. 42(A), a transistor 922 whose conduction state can be controlled by a control circuit 921 is shown between the voltage generation circuit 905 and the circuit 906. The transistor 922 is an n-channel OS transistor. The control signal $S_{BG}$ output from the control circuit 921 is a signal for controlling the conduction state of the transistor 922. Furthermore, transistors 912A and 912B included in the circuit 906 are OS transistors like the transistor 922.

Figure 42B:
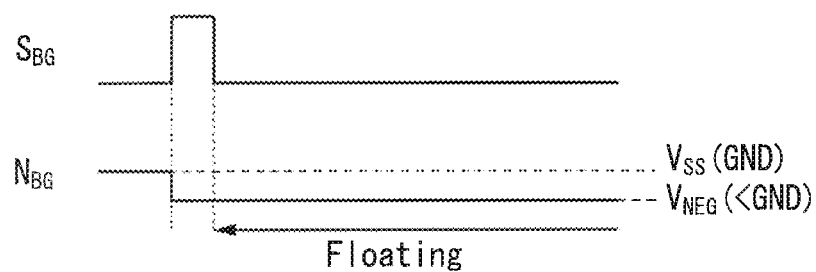

A timing chart in FIG. 42(B) shows changes in the potential of the control signal $S_{BG}$ and the potential of a node $N_{BG}$ that indicates the states of potentials of back gates of the transistors 912A and 912B. When the control signal $S_{BG}$ is at a high level, the transistor 922 is turned on and the voltage of the node $N_{BG}$ becomes $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ that has been supplied can be held.

Figure 43A:
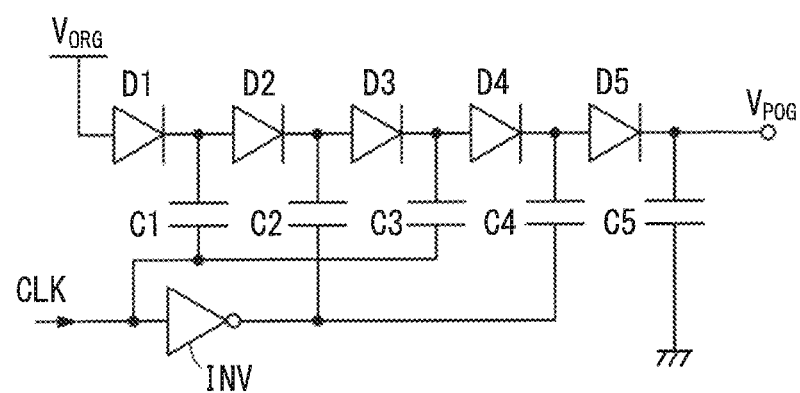
FIGS. 43A and 43B are circuit diagrams for explaining one embodiment of the present invention.

Furthermore, FIG. 43(A) illustrates an example of a circuit configuration that can be used for the above-described voltage generation circuit 903. The voltage generation circuit 903 illustrated in FIG. 43(A) is a five-stage charge pump including diodes D1 to D5, capacitors C1 to C5, and an inverter INV. A clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by the clock signal CLK, can be obtained. Note that the forward voltage of the diodes D1 to D5 is 0 V. Furthermore, the number of stages of the charge pump can be changed to obtain a desired voltage $V_{POG}$.

Figure 43B:
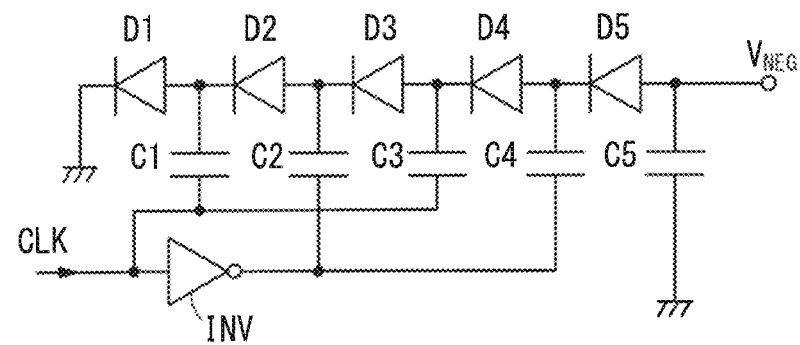

Furthermore, FIG. 43(B) illustrates an example of a circuit configuration that can be used for the above-described voltage generation circuit 905. The voltage generation circuit 905 illustrated in FIG. 43(B) is a four-stage charge pump including the diodes D1 to D5, the capacitors C1 to C5, and the inverter INV. The clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{NEG}$, which has been reduced from the ground voltage, i.e., the voltage $V_{SS}$ to a negative voltage having a negatively quadrupled value of the voltage $V_{ORG}$ by the clock signal CLK, can be obtained. Note that the forward voltage of the diodes D1 to D5 is 0 V. Furthermore, the number of stages of the charge pump can be changed to obtain a desired voltage $V_{NEG}$.

Figure 44A:
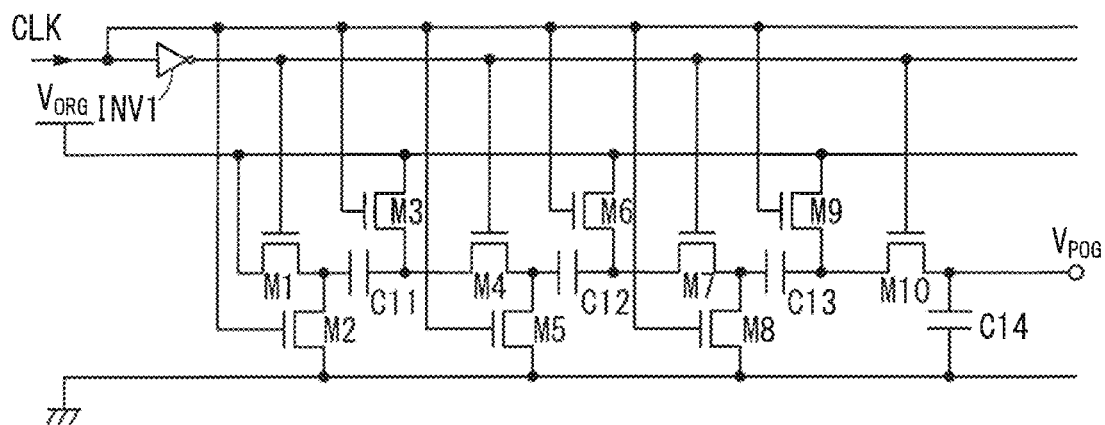
FIGS. 44A-44C are circuit diagrams for explaining one embodiment of the present invention.
Figure 44B:
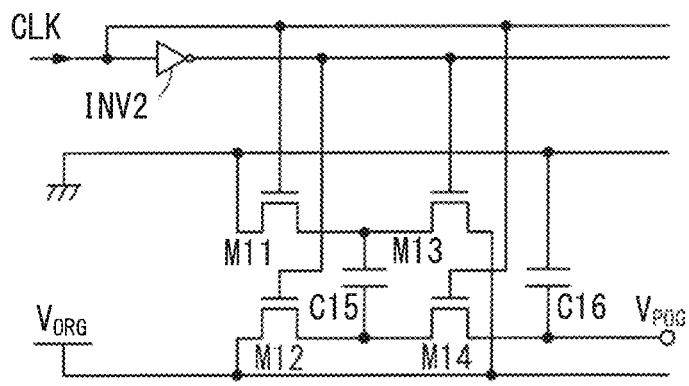
Figure 44C:
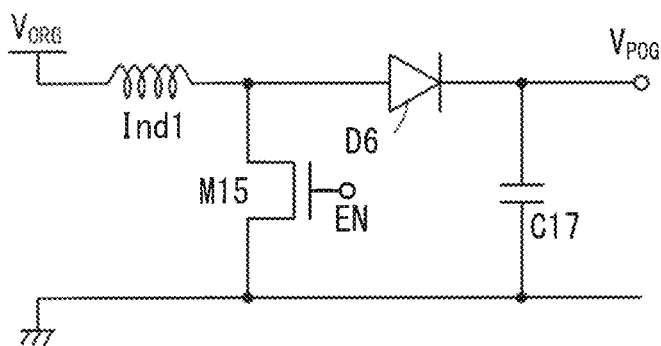

Note that the circuit configuration of the voltage generation circuit 903 is not limited to the configuration in the circuit diagram illustrated in FIG. 43(A). For example, modification examples of the voltage generation circuit 903 are illustrated in FIG. 44(A) to FIG. 44(C). Note that modification examples of the voltage generation circuit 903 can be obtained by changing voltages supplied to wirings or arrangement of elements in voltage generation circuits 903A to 903C illustrated in FIG. 44(A) to FIG. 44(C).

The voltage generation circuit 903A illustrated in FIG. 44(A) includes transistors M1 to M10, capacitors C11 to C14, and an inverter INV1. The clock signal CLK is supplied to gates of the transistors M1 to M10 directly or through the inverter INV1. By the clock signal CLK, the voltage $V_{POG}$, which has been increased to a positive voltage having a positively quadrupled value of the voltage $V_{ORG}$, can be obtained. Note that the number of stages can be changed to obtain a desired voltage $V_{POG}$. In the voltage generation circuit 903A in FIG. 44(A), off-state current of the transistors M1 to M10 can be small when the transistors are OS transistors, and leakage of charge held in the capacitors C11 to C14 can be suppressed. Accordingly, the voltage $V_{ORG}$ can be efficiently increased to the voltage $V_{POG}$.

Furthermore, the voltage generation circuit 903B illustrated in FIG. 44(B) includes transistors M11 to M14, capacitors C15 and C16, and an inverter INV2. The clock signal CLK is supplied to gates of the transistors M11 to M14 directly or through the inverter INV2. By the clock signal CLK, the voltage $V_{POG}$, which has been increased to a positive voltage having a positively doubled value of the voltage $V_{ORG}$, can be obtained. In the voltage generation circuit 903B in FIG. 44(B), off-state current of the transistors M11 to M14 can be small when the transistors are OS transistors, and leakage of charge held in the capacitors C15 and C16 can be suppressed. Accordingly, the voltage $V_{ORG}$ can be efficiently increased to the voltage $V_{POG}$.

The voltage generation circuit 903C illustrated in FIG. 44(C) includes an inductor Ind1, a transistor M15, a diode D6, and a capacitor C17. The conduction state of the transistor M15 is controlled by a control signal EN. Owing to the control signal EN, the voltage $V_{POG}$ increased from the voltage $V_{ORG}$ can be obtained. Since the voltage generation circuit 903C in FIG. 44(C) increases the voltage using the inductor Ind1, the voltage can be increased with high changing efficiency.

As described above, in the structures of this embodiment, a voltage required for circuits included in a semiconductor device can be internally generated. Thus, in the semiconductor device, the number of power supply voltages supplied from the outside can be reduced.

Note that the structures and the like described in this embodiment can be used in combination with the structures described in the other embodiments, as appropriate.

Embodiment 7

In this embodiment, a display module and electronic devices which include a semiconductor device of one embodiment of the present invention are described using FIG. 45 to FIG. 48.

<7-1. Display Module>

Figure 45:
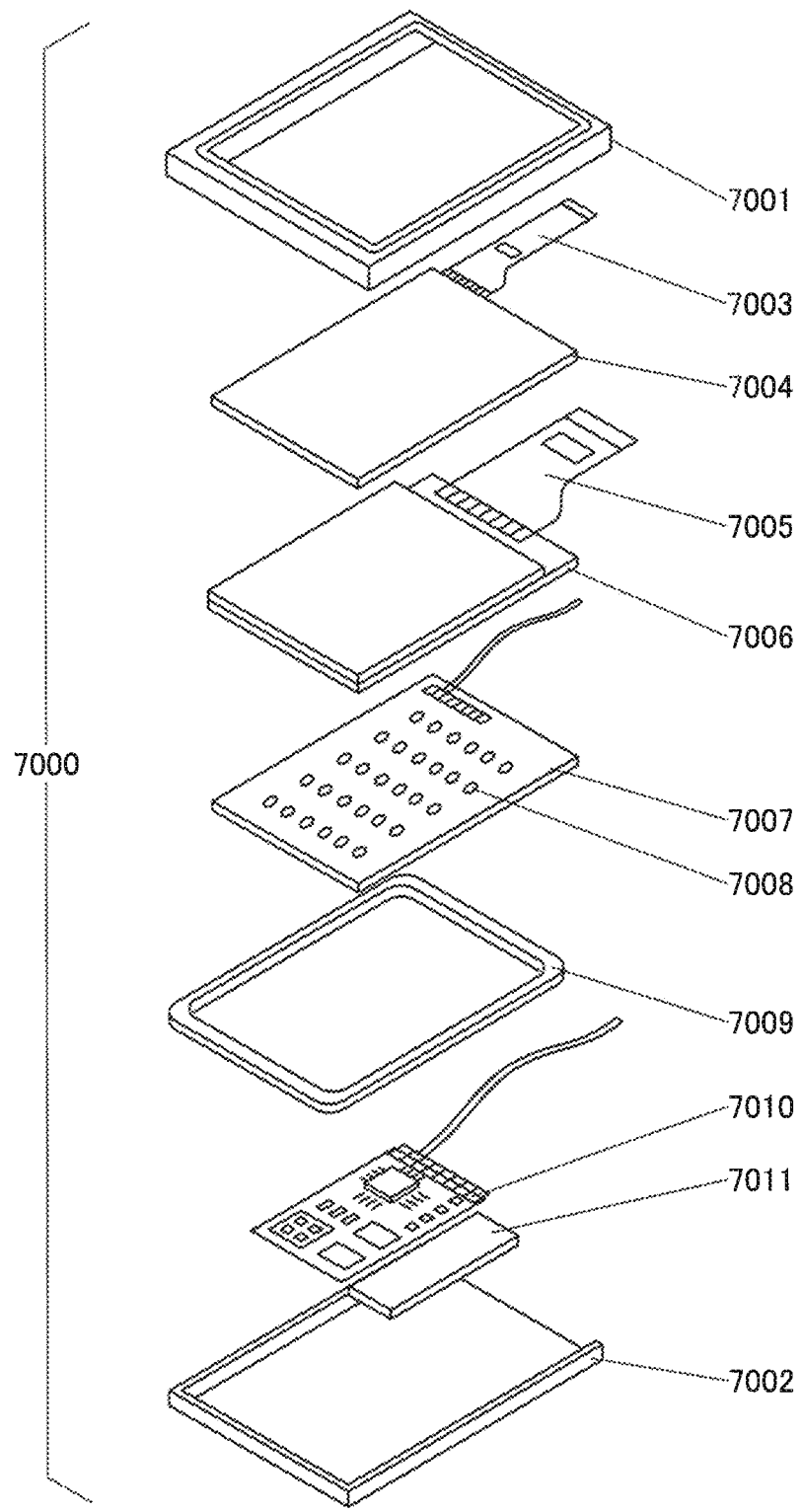
FIG. 45 is a diagram illustrating a display module.

A display module 7000 illustrated in FIG. 45 includes a touch panel 7004 connected to an FPC 7003, a display panel 7006 connected to an FPC 7005, a backlight 7007, a frame 7009, a printed board 7010, and a battery 7011, between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

As the touch panel 7004, a resistive or capacitive touch panel can be used with it overlapping with the display panel 7006. Furthermore, a counter substrate (sealing substrate) of the display panel 7006 can have a touch panel function. Furthermore, a photosensor may be provided in each pixel of the display panel 7006 to obtain an optical touch panel.

The backlight 7007 includes a light source 7008. Note that the structure in which the light source 7008 is provided over the backlight 7007 is illustrated as an example in FIG. 45; however, there is no limitation thereto. For example, a structure in which the light source 7008 is provided at an end portion of the backlight 7007 and a light diffusion plate is further used may be employed. Note that the backlight 7007 need not be provided in the case where a self-luminous light-emitting element such as an organic EL element is used or in the case of a reflective panel or the like.

The frame 7009 has a function of protecting the display panel 7006 and a function of an electromagnetic shield for blocking electromagnetic waves generated by the operation of the printed board 7010. The frame 7009 may also have a function of a radiator plate.

The printed board 7010 includes a power supply circuit and a signal processing circuit for outputting a video signal and a clock signal. A power source for supplying power to the power supply circuit may be an external commercial power source or a power source using the battery 7011 provided separately. The battery 7011 can be omitted in the case where a commercial power source is used.

Furthermore, the display module 7000 may be additionally provided with a member such as a polarizing plate, a retardation plate, or a prism sheet.

<7-2. Electronic Device 1>

Next, FIG. 46(A) to FIG. 46(E) illustrate examples of electronic devices.

Figure 46A:
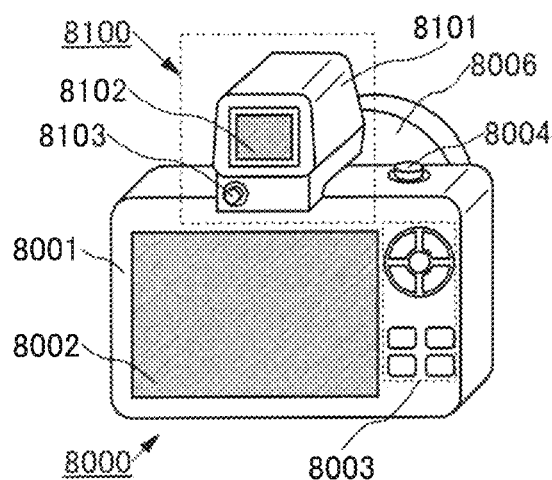
FIGS. 46A-46E are diagrams illustrating an electronic device.

FIG. 46(A) is an external view of a camera 8000 to which a finder 8100 is attached.

The camera 8000 includes a housing 8001, a display portion 8002, operation buttons 8003, a shutter button 8004, and the like. Furthermore, an detachable lens 8006 is attached to the camera 8000.

Although the lens 8006 of the camera 8000 here is detachable from the housing 8001 for replacement, the lens 8006 may be included in the housing.

Images can be taken with the camera 8000 at the press of the shutter button 8004. In addition, the display portion 8002 has a function of a touch panel; thus, images can be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like.

The housing 8101 includes a mount for engagement with the mount of the camera 8000 so that the finder 8100 can be attached to the camera 8000. Furthermore, the mount includes an electrode, and an image or the like received from the camera 8000 through the electrode can be displayed on the display portion 8102.

The button 8103 has a function of a power button. The on/off of display of the display portion 8102 can be switched with the button 8103.

A display device of one embodiment of the present invention can be used in the display portion 8002 of the camera 8000 and the display portion 8102 of the finder 8100.

Note that although the camera 8000 and the finder 8100 are separate and detachable electronic devices in FIG. 46(A), the housing 8001 of the camera 8000 may include a finder having a display device.

Figure 46B:
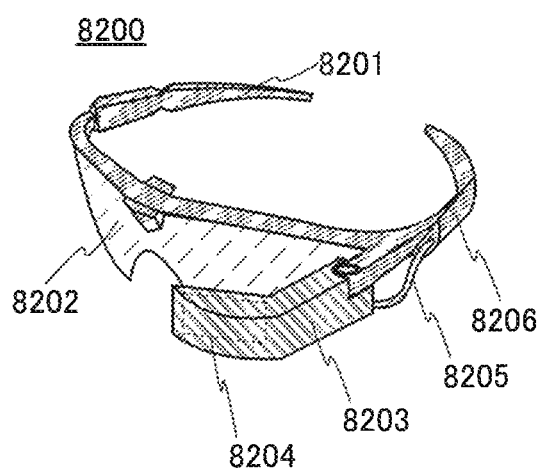

FIG. 46(B) is an external view of a head-mounted display 8200.

The head-mounted display 8200 includes a mounting portion 8201, a lens 8202, a main body 8203, a display portion 8204, a cable 8205, and the like. Furthermore, the mounting portion 8201 includes a battery 8206.

Power is supplied from the battery 8206 to the main body 8203 through the cable 8205. The main body 8203 includes a wireless receiver or the like and can display received video data, such as image data, on the display portion 8204. Furthermore, the movement of the eyeball and the eyelid of a user is captured by a camera provided in the main body 8203 and then coordinates of the points the user looks at are calculated using the captured data to utilize the eyepoint of the user as an input means.

Furthermore, a plurality of electrodes to be in contact with the user may be provided in the mounting portion 8201. The main body 8203 may have a function of sensing current flowing through the electrodes with the movement of the user's eyeball to determine the points the user looks at. Furthermore, the main body may have a function of sensing current flowing through the electrodes to monitor the user's pulse. Furthermore, the mounting portion 8201 may include sensors, such as a temperature sensor, a pressure sensor, and an acceleration sensor and a function of displaying the user's biological information on the display portion 8204 may be provided. Furthermore, the movement of the user's head or the like may be sensed to change an image displayed on the display portion 8204 in synchronization with the movement.

The display device of one embodiment of the present invention can be used in the display portion 8204.

Figure 46C:
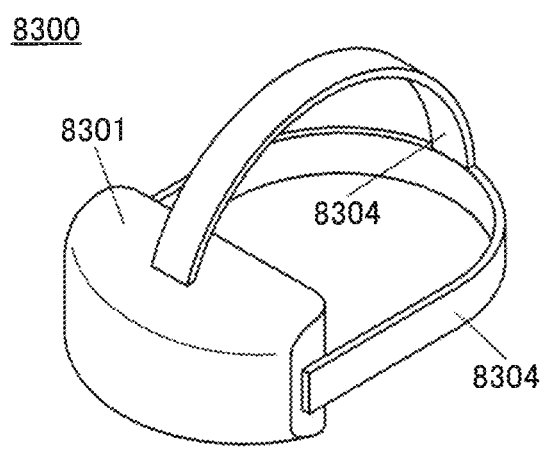
Figure 46D:
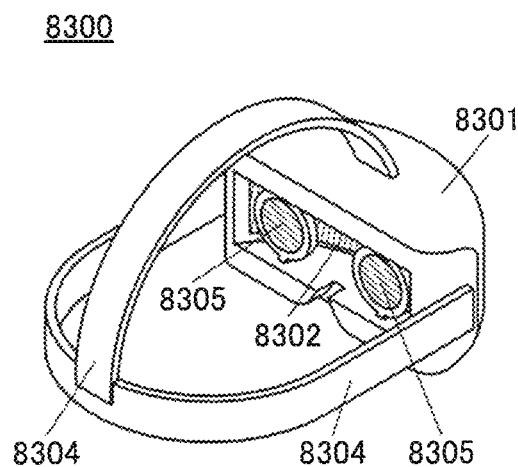

FIGS. 46(C), (D), and (E) are external views of a head-mounted display 8300. The head-mounted display 8300 includes a housing 8301, a display portion 8302, fixing bands 8304, and a pair of lenses 8305.

A user can see display on the display portion 8302 through the lenses 8305. Note that it is suitable that the display portion 8302 be curved. When the display portion 8302 is provided with it curved, a user can feel high realistic sensation.

Figure 46E:
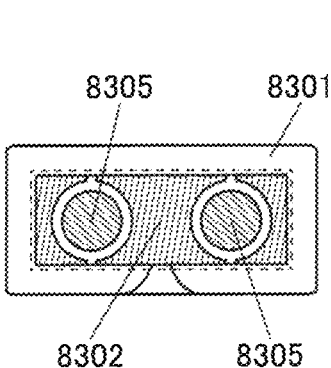

Note that the display device of one embodiment of the present invention can be used in the display portion 8302. The display device including the semiconductor device of one embodiment of the present invention has an extremely high resolution; thus, even when an image is magnified using the lenses 8305 as illustrated in FIG. 46(E), the user does not perceive pixels, and thus a more realistic image can be displayed.

<7-3. Electronic Device 2>

Next, FIG. 47(A) to FIG. 47(G) illustrate examples of electronic devices that are different from the electronic devices illustrated in FIG. 46(A) to FIG. 46(E).

The electronic devices illustrated in FIG. 47(A) to FIG. 47(G) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIG. 47(A) to FIG. 47(G) have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, a function of reading out a program or data stored in a recording medium and displaying it on the display portion, and the like. Note that functions of the electronic devices in FIG. 47(A) to FIG. 47(G) are not limited thereto, and the electronic devices can have a variety of functions. Furthermore, although not illustrated in FIG. 47(A) to FIG. 47(G), the electronic devices may have a plurality of display portions. Furthermore, the electronic devices may be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The details of the electronic devices in FIG. 47(A) to FIG. 47(G) are described below.

Figure 47A:
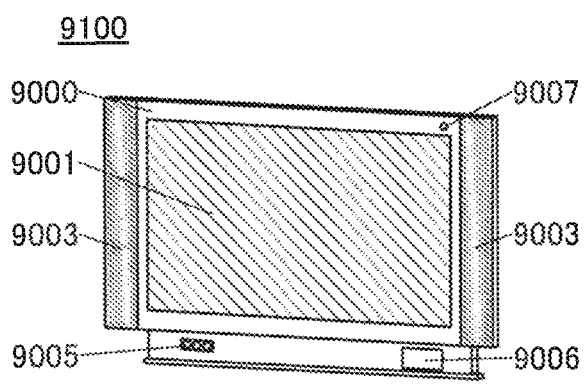
FIGS. 47A-47G are diagrams illustrating an electronic device.

FIG. 47(A) is a perspective view illustrating a television device 9100. The television device 9100 can include the display portion 9001 having a large screen size of, for example, 50 inches or more, or 100 inches or more.

Figure 47D:
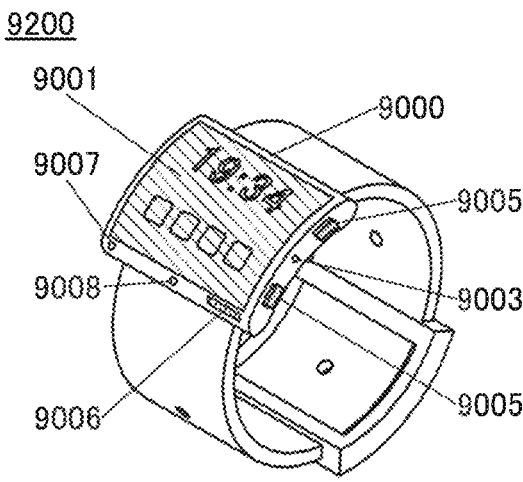
Figure 47B:
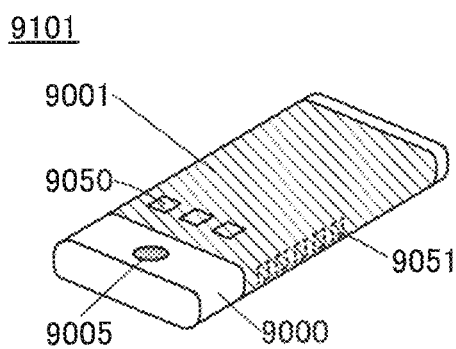

FIG. 47(B) is a perspective view illustrating a portable information terminal 9101. The portable information terminal 9101 has, for example, one or more functions selected from a telephone set, a notebook, and an information browsing system. Specifically, the portable information terminal can be used as a smartphone. Note that the portable information terminal 9101 may include a speaker 9003, a connection terminal 9006, a sensor 9007, or the like. Furthermore, the portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Note that examples of the information 9051 include display indicating reception of an e-mail, SNS (social networking service), a telephone call, or the like, the title of an e-mail, SNS, or the like, the sender of an e-mail, SNS, or the like, date, time, remaining battery, and reception strength of an antenna. Alternatively, in place of the information 9051, the operation buttons 9050 or the like may be displayed on the position where the information 9051 is displayed.

Figure 47E:
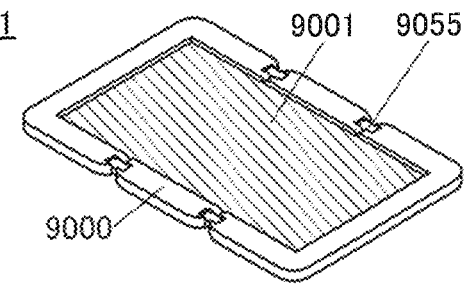
Figure 47C:
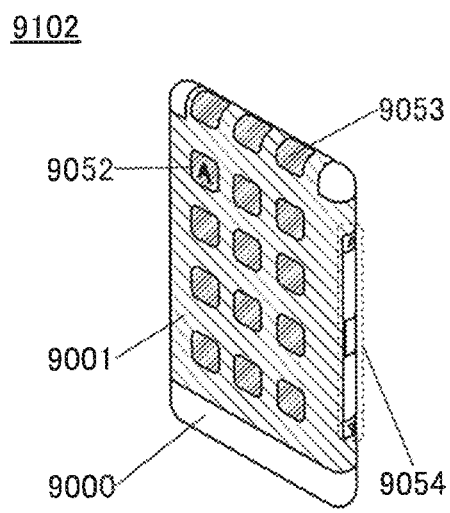

FIG. 47(C) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user of the portable information terminal 9102 can see the display (here, the information 9053) on the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 47(D) is a perspective view illustrating a watch-type portable information terminal 9200. The portable information terminal 9200 is capable of executing a variety of applications such as a mobile phone, e-mailing, viewing and editing texts, music reproduction, Internet communication, and a computer game. Furthermore, the display surface of the display portion 9001 is curved, and display can be performed on the curved display surface. Furthermore, the portable information terminal 9200 can employ near field communication conformable to a communication standard. For example, hands-free calling can be achieved by mutual communication with a headset capable of wireless communication. Moreover, the portable information terminal 9200 includes the connection terminal 9006 and can perform direct data communication with another information terminal via a connector. Furthermore, charging through the connection terminal 9006 is possible. Note that the charging operation may be performed by wireless power feeding without using the connection terminal 9006.

Figure 47F:
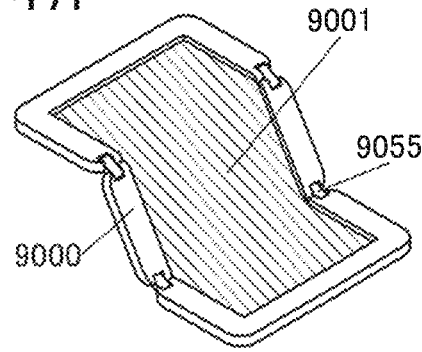
Figure 47G:
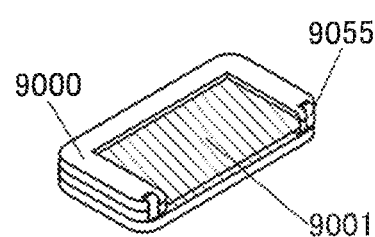

FIGS. 47(E), (F), and (G) are perspective views illustrating a foldable portable information terminal 9201. Furthermore, FIG. 47(E) is the perspective view of the portable information terminal 9201 that is opened, FIG. 47(F) is the perspective view of the portable information terminal 9201 that is shifted from one of the opened state and the folded state to the other, and FIG. 47(G) is the perspective view of the portable information terminal 9201 that is folded. The portable information terminal 9201 is highly portable when folded, and is highly browsable when opened owing to a seamless large display region. The display portion 9001 of the portable information terminal 9201 is supported by three housings 9000 joined by hinges 9055. By being folded at the hinges 9055 between the two housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 48A:
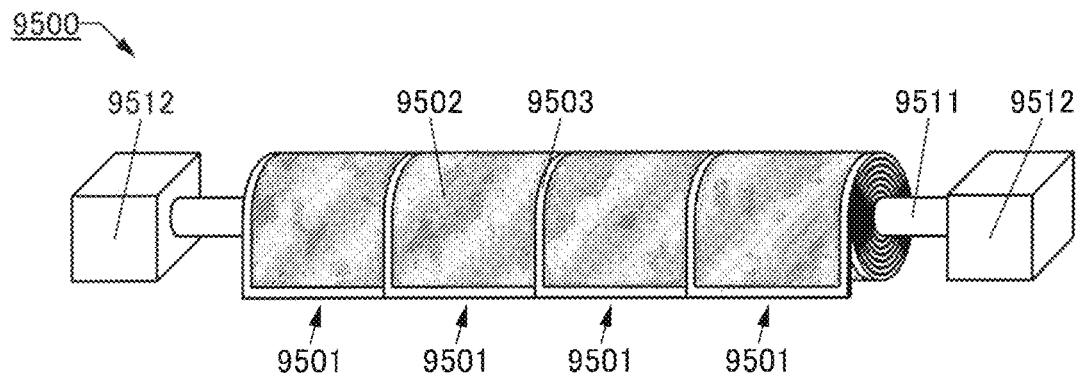
FIGS. 48A and 48B are perspective views illustrating a display device.
Figure 48B:
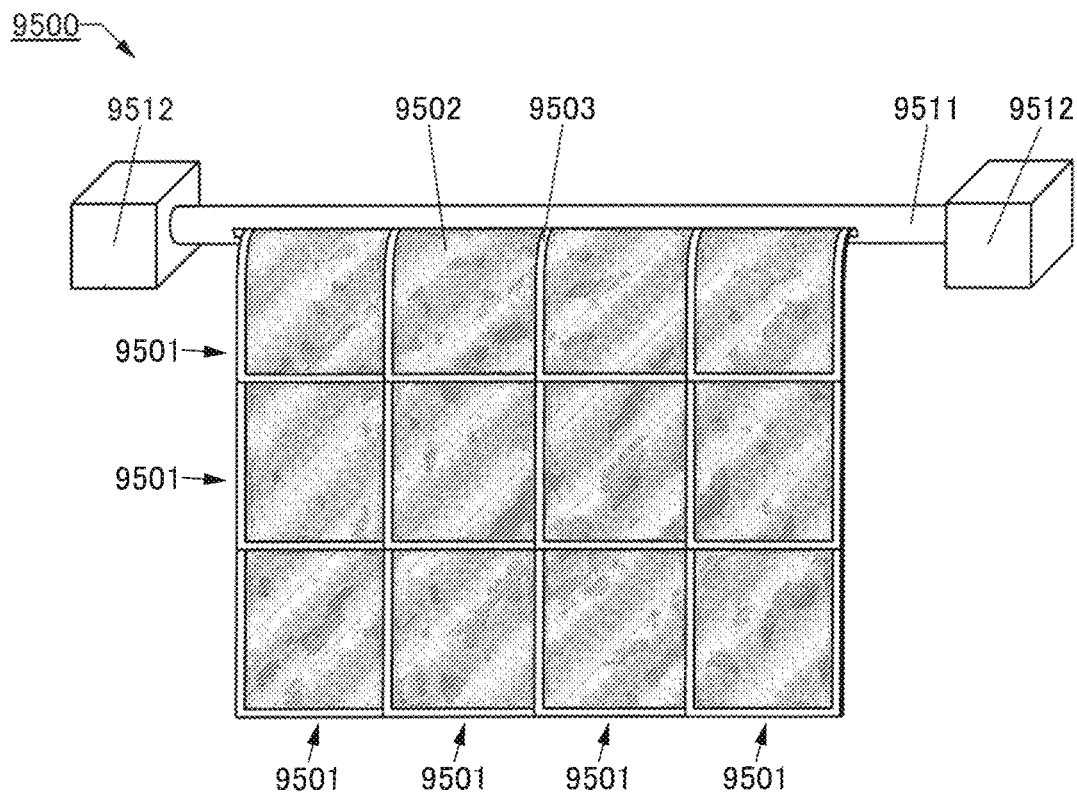

FIGS. 48(A) and (B) are perspective views of a display device including a plurality of display panels. Note that FIG. 48(A) is the perspective view of the plurality of display panels that are wound, and FIG. 48(B) is the perspective view of the plurality of display panels that are unwound.

A display device 9500 illustrated in FIGS. 48(A) and (B) includes a plurality of display panels 9501, an axis portion 9511, and a bearing 9512. Furthermore, the plurality of display panels 9501 include a display region 9502 and a light-transmitting region 9503.

Furthermore, the plurality of display panels 9501 are flexible. Furthermore, two adjacent display panels 9501 are provided to partly overlap with each other. For example, the light-transmitting regions 9503 of the two adjacent display panels 9501 can overlap with each other. A display device having a large screen can be obtained with the plurality of display panels 9501. Furthermore, the display device is highly versatile because the display panels 9501 can be wound depending on its use.

Furthermore, although the display regions 9502 of the adjacent display panels 9501 are separated from each other in FIGS. 48(A) and (B), without limitation thereto, the display regions 9502 of the adjacent display panels 9501 may overlap with each other without any space so that a continuous display region 9502 is obtained, for example.

The electronic devices described in this embodiment are characterized by having a display portion for displaying some sort of information. Note that the semiconductor device of one embodiment of the present invention can also be used for an electronic device that does not have a display portion.

Note that the structures described in this embodiment can be used in combination with the structures described in the other embodiments, as appropriate.

Embodiment 8

Figure 49A:
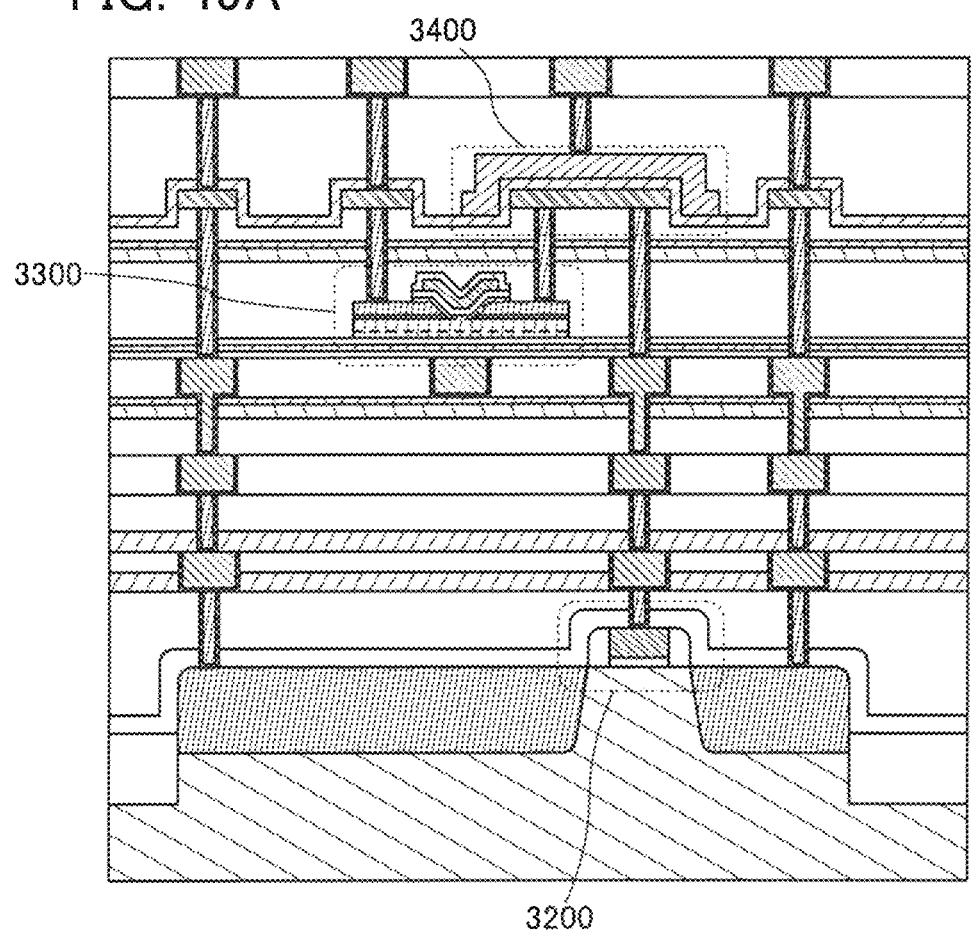
FIG. 49A is a cross-sectional view and FIGS. 49B and 49C are circuit diagrams illustrating a structure of a semiconductor device relating to one embodiment of the present invention.
Figure 49B:
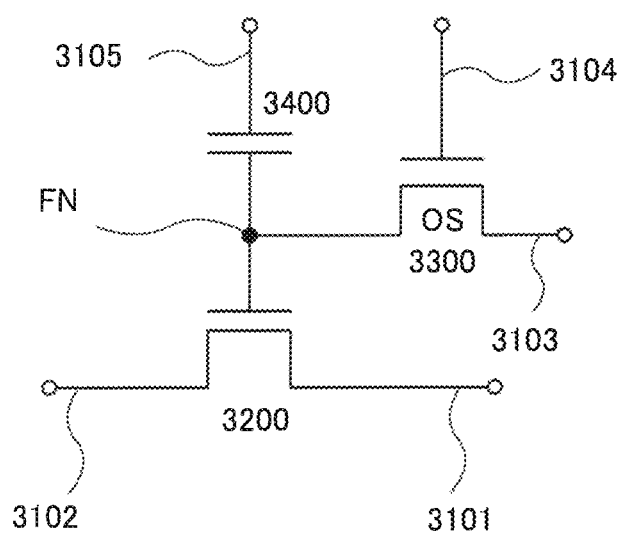
Figure 49C:
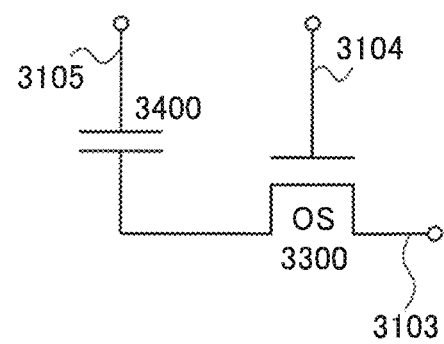
Figure 50:
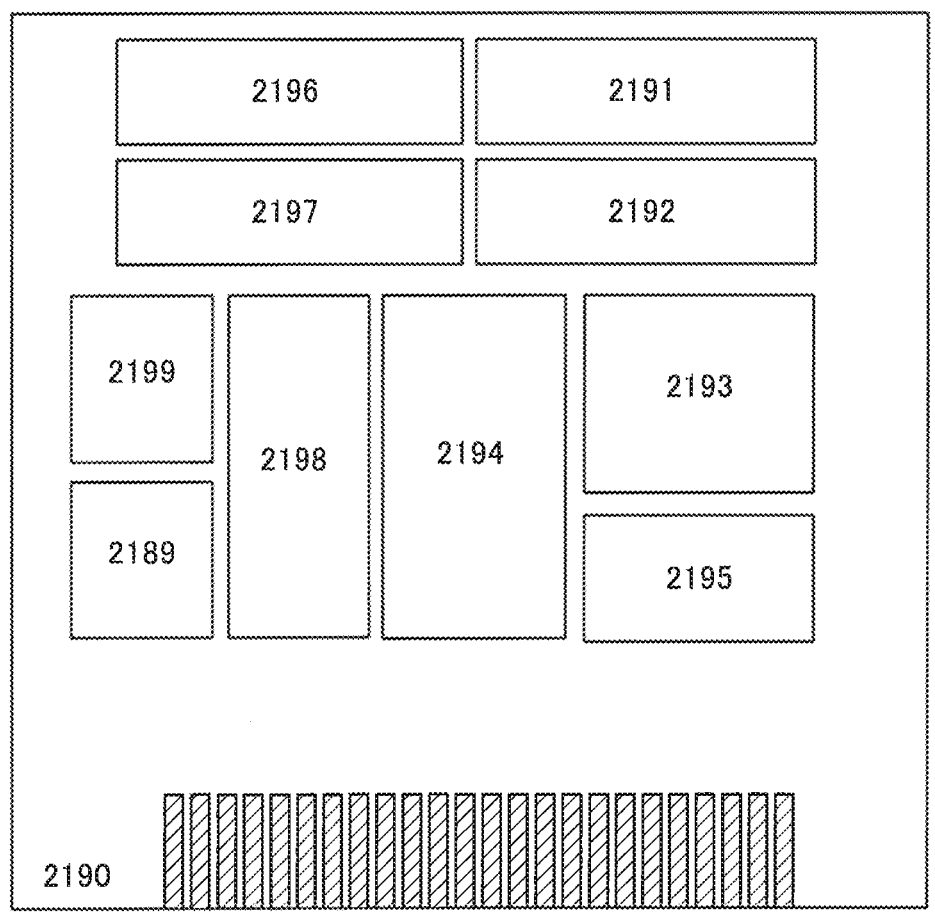
FIG. 50 is a block diagram illustrating a structure of a CPU relating to one embodiment of the present invention.
Figure 51:
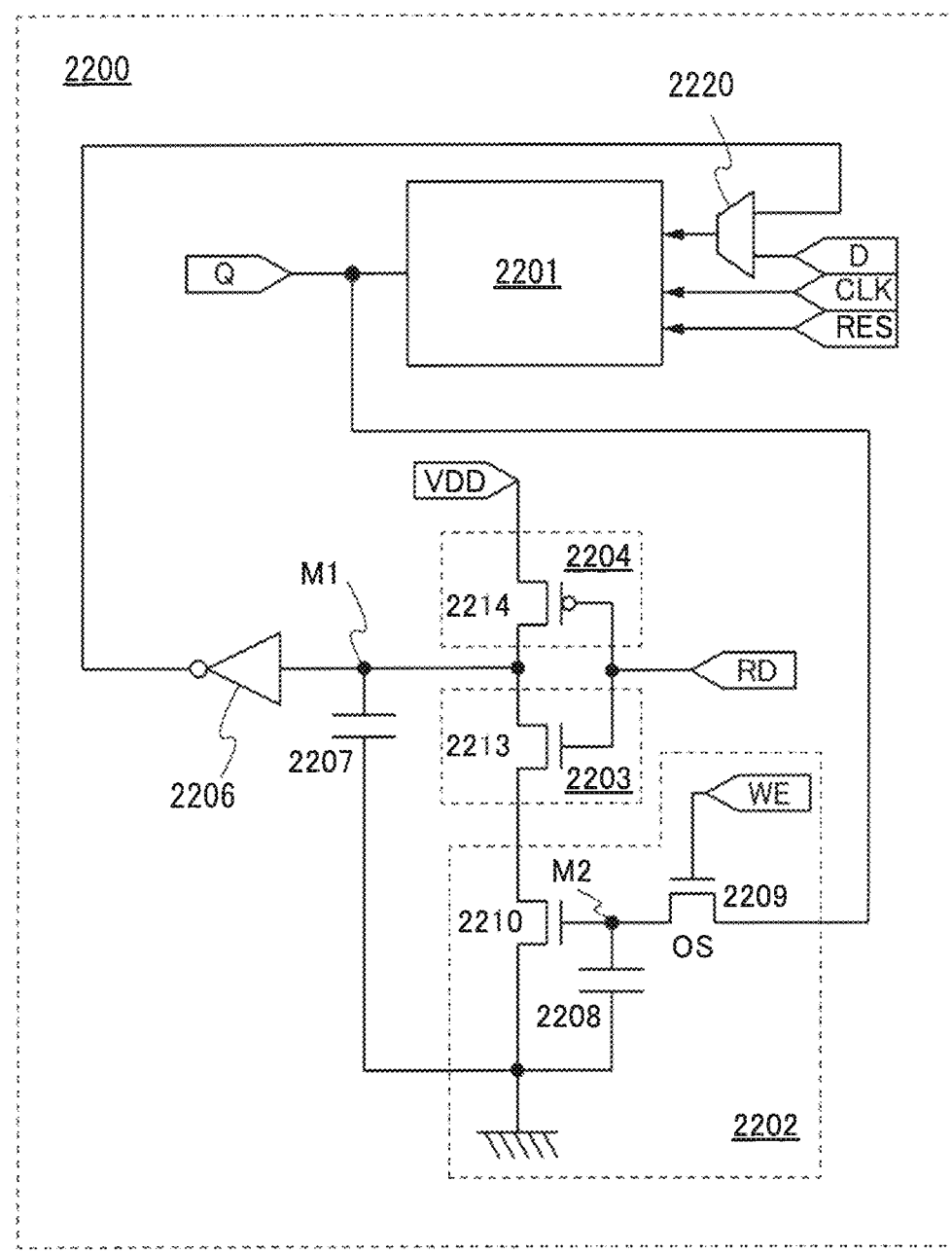
FIG. 51 is a circuit diagram illustrating a structure of a memory element of one embodiment of the present invention.

In this embodiment, a semiconductor device (memory device) that can retain stored contents even when not powered and that has an unlimited number of times of writing, and a CPU including the semiconductor device are described using FIG. 49 to FIG. 51. The CPU described in this embodiment can be used for the electronic device described in the above embodiment, for example.

<8-1. Memory Device>

An example of a semiconductor device (memory device) which can retain stored contents even when not powered and which has an unlimited number of times of writing is shown in FIG. 49. Note that FIG. 49(B) is a circuit diagram of FIG. 49(A).

The semiconductor device illustrated in FIGS. 49(A) and (B) includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (silicon (including strained silicon), germanium, silicon germanium, silicon carbide, gallium arsenide, aluminum gallium arsenide, indium phosphide, gallium nitride, an organic semiconductor, and the like), and the second semiconductor material can be an oxide semiconductor. A transistor using a material other than an oxide semiconductor, such as single crystal silicon, can operate at high speed easily. On the other hand, a transistor using an oxide semiconductor has a low off-state current.

The transistor 3300 is a transistor in which a channel is formed in a semiconductor layer including an oxide semiconductor. Since the off-state current of the transistor 3300 is small, the use of the transistor 3300 enables stored contents to be retained for a long period. In other words, power consumption can be sufficiently reduced because a semiconductor memory device in which refresh operation is unnecessary or the frequency of refresh operation is extremely low can be provided.

In FIG. 49(B), a first wiring 3101 is electrically connected to a source electrode of the transistor 3200, and a second wiring 3102 is electrically connected to a drain electrode of the transistor 3200. A third wiring 3103 is electrically connected to one of a source electrode and a drain electrode of the transistor 3300, and a fourth wiring 3104 is electrically connected to a gate electrode of the transistor 3300. A gate electrode of the transistor 3200 and the other of the source electrode and the drain electrode of the transistor 3300 are electrically connected to one electrode of the capacitor 3400, and a fifth wiring 3105 is electrically connected to the other electrode of the capacitor 3400.

A characteristic of the semiconductor device in FIG. 49(A) that the potential of the gate electrode of the transistor 3200 can be retained is taken advantage of, whereby writing, retaining, and reading of data can be performed as follows.

Writing and retaining of data are described. First, the potential of the fourth wiring 3104 is set to a potential at which the transistor 3300 is turned on, so that the transistor 3300 is turned on. Accordingly, the potential of the third wiring 3103 is supplied to the gate electrode of the transistor 3200 and the capacitor 3400. That is, a predetermined charge is supplied to the gate of the transistor 3200 (writing). Here, one of charges providing two different potential levels (hereinafter referred to as a Low-level charge and a High-level charge) is supplied. After that, the potential of the fourth wiring 3104 is set to a potential at which the transistor 3300 is turned off, so that the transistor 3300 is turned off. Thus, the charge supplied to the gate of the transistor 3200 is held (retaining).

Since the off-state current of the transistor 3300 is extremely small, the charge of the gate of the transistor 3200 is retained for a long time.

Next, reading of data is described. An appropriate potential (a reading potential) is supplied to the fifth wiring 3105 while a predetermined potential (a constant potential) is supplied to the first wiring 3101, whereby the potential of the second wiring 3102 varies depending on the amount of charge retained in the gate of the transistor 3200. This is because in the case where the transistor 3200 is an n-channel type, an apparent threshold voltage $Vth\_H$ when the High-level charge is given to the gate electrode of the transistor 3200 is lower than an apparent threshold voltage $Vth\_L$ when the Low-level charge is given to the gate electrode of the transistor 3200. Here, an apparent threshold voltage refers to the potential of the fifth wiring 3105 which is needed to turn "on" the transistor 3200. Thus, the potential of the fifth wiring 3105 is set to a potential $V0$ which is between $Vth\_H$ and $Vth\_L$, whereby charge supplied to the gate of the transistor 3200 can be determined. For example, in the case where the High-level charge is supplied in writing and the potential of the fifth wiring 3105 is $V0$ ($>Vth\_H$), the transistor 3200 is turned "on". In the case where the Low-level charge is supplied, even when the potential of the fifth wiring 3105 is $V0$ ($<Vth\_L$), the transistor 3200 remains "off". Thus, the retained data can be read by determining the potential of the second wiring 3102.

The semiconductor device illustrated in FIG. 49(C) is different from that in FIG. 49(A) in that the transistor 3200 is not provided. Also in this case, writing and retaining operation of data can be performed in a manner similar to that described above.

Next, reading of data of the semiconductor device illustrated in FIG. 49(C) is described. When the transistor 3300 is turned on, the third wiring 3103 which is in a floating state and the capacitor 3400 are electrically connected to each other, and the charge is redistributed between the third wiring 3103 and the capacitor 3400. As a result, the potential of the third wiring 3103 is changed. The amount of change in the potential of the third wiring 3103 varies depending on the potential of the one electrode of the capacitor 3400 (or the charge accumulated in the capacitor 3400).

For example, the potential of the third wiring 3103 after the charge redistribution is (CB×VB0+C×V)/(CB+C), where V is the potential of the one electrode of the capacitor 3400, C is the capacitance of the capacitor 3400, CB is the capacitance component of the third wiring 3103, and VB0 is the potential of the third wiring 3103 before the charge redistribution. Thus, it can be found that, assuming that the memory cell can be in two states in which the potential of the one electrode of the capacitor 3400 is V1 and V0 (V1>V0), the potential of a bit line BL in the case of retaining the potential V1 (=(CB×VB0+C×V1)/(CB+C)) is higher than the potential of the bit line BL in the case of retaining the potential V0 (=(CB×VB0+C×V0)/(CB+C)).

Then, by comparing the potential of the third wiring 3103 with a predetermined potential, data can be read.

In this case, a transistor using the first semiconductor material may be used for a driver circuit for driving a memory cell, and a transistor using the second semiconductor material as the transistor 3300 may be stacked over the driver circuit.

When using a transistor which uses an oxide semiconductor in a channel formation region and has an extremely small off-state current, the semiconductor device described in this embodiment can retain stored contents for an extremely long time. In other words, refresh operation becomes unnecessary or the frequency of the refresh operation can be extremely low, which leads to a sufficient reduction in power consumption. Moreover, stored contents can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused at all. That is, the semiconductor device described in this embodiment does not have a limit on the number of times data can be rewritten, which is a problem of a conventional nonvolatile memory, and the reliability thereof is drastically improved. Furthermore, data is written depending on the on/off state of the transistor, whereby high-speed operation can be easily achieved.

Note that the above memory device can also be applied to an LSI such as a DSP (Digital Signal Processor), a custom LSI, or a PLD (Programmable Logic Device), and RF-ID (Radio Frequency Identification), in addition to a CPU (Central Processing Unit), for example.

<8-2. CPU>

A CPU including the above memory device is described below.

FIG. 50 is a block diagram illustrating a configuration example of the CPU including the above memory device.

The CPU illustrated in FIG. 50 includes, over a substrate 2190, an ALU 2191 (ALU: Arithmetic logic unit, arithmetic circuit), an ALU controller 2192, an instruction decoder 2193, an interrupt controller 2194, a timing controller 2195, a register 2196, a register controller 2197, a bus interface 2198 (Bus I/F), a rewritable ROM 2199, and a ROM interface 2189 (ROM I/F). A semiconductor substrate, an SOI substrate, a glass substrate, or the like is used as the substrate 2190. The ROM 2199 and the ROM interface 2189 may be provided over a separate chip. Needless to say, the CPU in FIG. 50 is just an example in which the configuration is simplified, and an actual CPU may have a variety of configurations depending on the application. For example, the CPU may have the following configuration: a configuration including the CPU illustrated in FIG. 50 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 2198 is input to the instruction decoder 2193 and decoded therein, and then, input to the ALU controller 2192, the interrupt controller 2194, the register controller 2197, and the timing controller 2195.

The ALU controller 2192, the interrupt controller 2194, the register controller 2197, and the timing controller 2195 conduct various controls on the basis of the decoded instruction. Specifically, the ALU controller 2192 generates signals for controlling the operation of the ALU 2191. While the CPU is executing a program, the interrupt controller 2194 processes an interrupt request from an external input/output device or a peripheral circuit, depending on its priority or a mask state. The register controller 2197 generates an address of the register 2196, and reads/writes data from/to the register 2196 depending on the state of the CPU.

The timing controller 2195 generates signals for controlling operation timings of the ALU 2191, the ALU controller 2192, the instruction decoder 2193, the interrupt controller 2194, and the register controller 2197. For example, the timing controller 2195 includes an internal clock generation portion for generating an internal clock signal on the basis of a reference clock signal, and supplies the internal clock signal to the above circuits.

In the CPU illustrated in FIG. 50, a memory device is provided in the register 2196.

In the CPU illustrated in FIG. 50, the register controller 2197 selects retaining operation in the register 2196 in accordance with an instruction from the ALU 2191. That is, the register controller 2197 selects whether data is retained by a flip-flop or by a capacitor in the memory device included in the register 2196. When data retaining by the flip-flop is selected, a power supply voltage is supplied to the memory device in the register 2196. When data retaining by the capacitor is selected, the data is rewritten in the capacitor, and supply of the power supply voltage to the memory device in the register 2196 can be stopped.

FIG. 51 is an example of a circuit diagram of a memory element that can be used for the register 2196. A memory element 2200 includes a circuit 2201 in which stored data is volatile when power supply is stopped, a circuit 2202 in which stored data is nonvolatile even when power supply is stopped, a switch 2203, a switch 2204, a logic element 2206, a capacitor 2207, and a circuit 2220 having a selecting function. The circuit 2202 includes a capacitor 2208, a transistor 2209, and a transistor 2210. Note that the memory element 2200 may further include another element such as a diode, a resistor, or an inductor, as needed.

Here, the above-described memory device can be used as the circuit 2202. When supply of a power supply voltage to the memory element 2200 is stopped, a ground potential (0 V) or a potential at which the transistor 2209 in the circuit 2202 is turned off continues to be input to a gate of the transistor 2209. For example, the gate of the transistor 2209 is grounded through a load such as a resistor.

Shown is an example in which the switch 2203 is formed using a transistor 2213 having one conductivity type (e.g., an n-channel type) and the switch 2204 is formed using a transistor 2214 having a conductivity type opposite to the one conductivity type (e.g., a p-channel type). Here, a first terminal of the switch 2203 corresponds to one of a source and a drain of the transistor 2213, a second terminal of the switch 2203 corresponds to the other of the source and the drain of the transistor 2213, and conduction or non-conduction between the first terminal and the second terminal of the switch 2203 (i.e., the on/off state of the transistor 2213) is selected by a control signal RD input to a gate of the transistor 2213. A first terminal of the switch 2204 corresponds to one of a source and a drain of the transistor 2214, a second terminal of the switch 2204 corresponds to the other of the source and the drain of the transistor 2214, and conduction or non-conduction between the first terminal and the second terminal of the switch 2204 (i.e., the on/off state of the transistor 2214) is selected by the control signal RD input to a gate of the transistor 2214.

One of a source and a drain of the transistor 2209 is electrically connected to one of a pair of electrodes of the capacitor 2208 and a gate of the transistor 2210. Here, the connection portion is referred to as a node M2. One of a source and a drain of the transistor 2210 is electrically connected to a wiring that can supply a low power supply potential (e.g., a GND line), and the other is electrically connected to the first terminal of the switch 2203 (the one of the source and the drain of the transistor 2213). The second terminal of the switch 2203 (the other of the source and the drain of the transistor 2213) is electrically connected to the first terminal of the switch 2204 (the one of the source and the drain of the transistor 2214). The second terminal of the switch 2204 (the other of the source and the drain of the transistor 2214) is electrically connected to a wiring that can supply a power supply potential VDD. The second terminal of the switch 2203 (the other of the source and the drain of the transistor 2213), the first terminal of the switch 2204 (the one of the source and the drain of the transistor 2214), an input terminal of the logic element 2206, and one of a pair of electrodes of the capacitor 2207 are electrically connected to each other. Here, the connection portion is referred to as a node M1. A constant potential can be input to the other of the pair of electrodes of the capacitor 2207. For example, a low power supply potential (e.g., GND) or a high power supply potential (e.g., VDD) can be input to the other of the pair of electrodes of the capacitor 2207. The other of the pair of electrodes of the capacitor 2207 is electrically connected to the wiring that can supply a low power supply potential (e.g., a GND line). A constant potential can be input to the other of the pair of electrodes of the capacitor 2208. For example, a low power supply potential (e.g., GND) or a high power supply potential (e.g., VDD) can be input to the other of the pair of electrodes of the capacitor 2208. The other of the pair of electrodes of the capacitor 2208 is electrically connected to the wiring that can supply a low power supply potential (e.g., a GND line).

Note that the capacitor 2207 and the capacitor 2208 can be omitted when the parasitic capacitance of the transistor or the wiring, or the like is actively utilized.

A control signal WE is input to a first gate (a first gate electrode) of the transistor 2209. As for the switches 2203 and 2204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 2201 is input to the other of the source and the drain of the transistor 2209. FIG. 51 illustrates an example in which a signal output from the circuit 2201 is input to the other of the source and the drain of the transistor 2209. A signal output from the second terminal of the switch 2203 (the other of the source and the drain of the transistor 2213) becomes an inverted signal obtained in such a manner that the logic value of the signal is inverted by the logic element 2206, and the inverted signal is input to the circuit 2201 through the circuit 2220.

Note that FIG. 51 shows the example where a signal output from the second terminal of the switch 2203 (the other of the source and the drain of the transistor 2213) is input to the circuit 2201 through the logic element 2206 and the circuit 2220; however, there is no limitation thereto. The signal output from the second terminal of the switch 2203 (the other of the source and the drain of the transistor 2213) may be input to the circuit 2201 without its logic value being inverted. For example, in the case where the circuit 2201 includes a node in which a signal obtained by inversion of the logic value of a signal input from the input terminal is retained, the signal output from the second terminal of the switch 2203 (the other of the source and the drain of the transistor 2213) can be input to the node.

In FIG. 51, the transistors used in the memory element 2200 except for the transistor 2209 can be a transistor in which a channel is formed in a layer formed using a semiconductor other than an oxide semiconductor or in the substrate 2190. For example, the transistor can be a transistor whose channel is formed in a silicon layer or a silicon substrate. A transistor in which a channel is formed in an oxide semiconductor film can be used for all the transistors used in the memory element 2200. Alternatively, in the memory element 2200, a transistor in which a channel is formed in an oxide semiconductor film can be included besides the transistor 2209, and a transistor in which a channel is formed in a layer formed using a semiconductor other than an oxide semiconductor or the substrate 2190 can be used for the rest of the transistors.

As the circuit 2201 in FIG. 51, for example, a flip-flop can be used. As the logic element 2206, for example, an inverter, a clocked inverter, or the like can be used.

In a period during which the memory element 2200 is not supplied with the power supply voltage, the semiconductor device described in this embodiment can retain data stored in the circuit 2201 with the use of the capacitor 2208 that is provided in the circuit 2202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 2209, a signal is retained in the capacitor 2208 for a long time also in a period during which the power supply voltage is not supplied to the memory element 2200. The memory element 2200 can accordingly retain the stored contents (data) also in a period during which the supply of the power supply voltage is stopped.

Since the memory element is characterized by performing pre-charge operation by providing the switches 2203 and 2204, the time required for the circuit 2201 to retain original data again after the supply of the power supply voltage is restarted can be shortened.

In the circuit 2202, a signal retained by the capacitor 2208 is input to the gate of the transistor 2210. Thus, after supply of the power supply voltage to the memory element 2200 is restarted, the signal retained by the capacitor 2208 can be converted into the one corresponding to the state (the on state or the off state) of the transistor 2210 to be read from the circuit 2202. Consequently, an original signal can be accurately read even when a potential corresponding to the signal retained by the capacitor 2208 changes to some degree.

By using the above-described memory element 2200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the state before the power supply is stopped. Thus, the power supply can be stopped even for a short time in the whole processor or one or a plurality of logic circuits included in the processor, resulting in lower power consumption.

Note that the example where the memory element 2200 is used in a CPU is described in this embodiment; however, the memory element 2200 can also be applied to an LSI such as a DSP (Digital Signal Processor), a custom LSI, or a PLD (Programmable Logic Device), and RF-ID (Radio Frequency Identification).

At least part of this embodiment can be implemented in combination with the other embodiment in this specification, as appropriate.

Embodiment 9

In this embodiment, an imaging device that can use the semiconductor device of one embodiment of the present invention is described using FIG. 52 and FIG. 53.

Figure 52A:
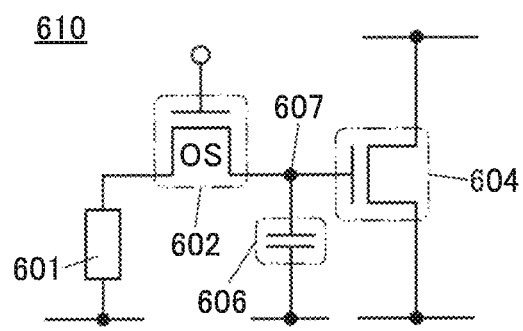
FIGS. 52A-52C are circuit diagrams illustrating an example of an imaging device.
Figure 52B:
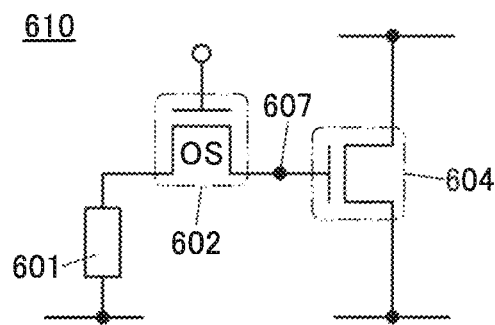
Figure 52C:
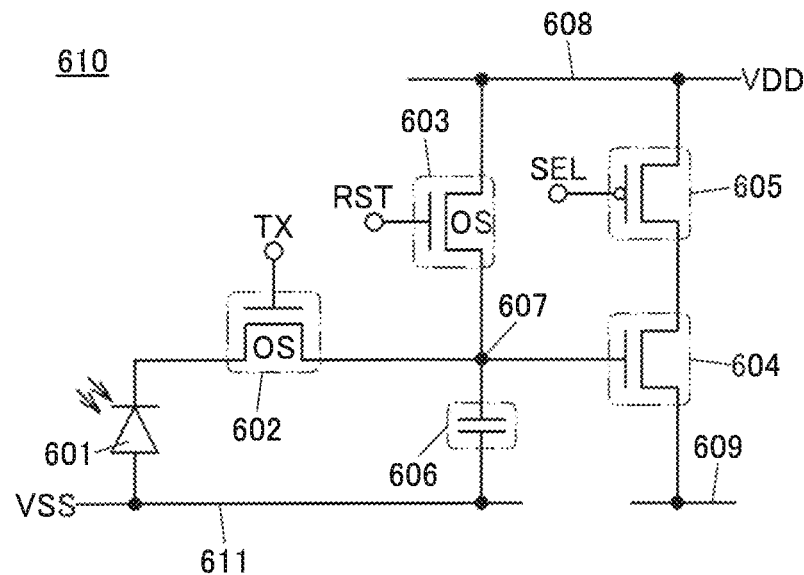

FIGS. 52(A) to 52(C) illustrate circuit configuration examples of an imaging device.
<9. Imaging Device>
An imaging device 610 including the circuit illustrated in FIG. 52(A) includes a photoelectric conversion element 601, a transistor 602, a transistor 604, and a capacitor 606. One of a source and a drain of the transistor 602 is electrically connected to the photoelectric conversion element 601, and the other of the source and the drain of the transistor 602 is electrically connected to a gate of the transistor 604 through a node 607 (a charge accumulation portion).

An OS transistor is preferably used as the transistor 602. Since the off-state current of the OS transistor can be extremely low, the capacitor 606 can be small. Alternatively, the capacitor 606 can be omitted as illustrated in FIG. 52(B). Furthermore, when an OS transistor is used as the transistor 602, the potential of the node 607 is less likely to be changed. Thus, an imaging device which is less likely to be affected by noise can be provided.

For example, the transistor shown as an example in the above embodiment, or the like can be used as the transistor 602. Note that an OS transistor may be used as the transistor 604.

A diode element in which a pn junction or a pin junction is formed in a silicon substrate can be used as the photoelectric conversion element 601. Alternatively, a pin diode element using an amorphous silicon film, a microcrystalline silicon film, or the like may be used. Alternatively, a diode-connected transistor may be used. Further alternatively, a variable resistor or the like utilizing a photoelectric effect may be formed using silicon, germanium, selenium, or the like.

The photoelectric conversion element may be formed using a material capable of generating charges by absorbing radiation. Examples of the material capable of generating charges by absorbing radiation include lead iodide, mercury iodide, gallium arsenide, CdTe, and CdZn.

The imaging device 610 including the circuit in FIG. 52(C) is illustrated in which a photodiode is used as the photoelectric conversion element 601. The imaging device 610 illustrated in FIG. 52(C) includes the photoelectric conversion element 601, the transistor 602, a transistor 603, the transistor 604, a transistor 605, and the capacitor 606. One of the source and the drain of the transistor 602 is electrically connected to a cathode of the photoelectric conversion element 601, and the other is electrically connected to the node 607. An anode of the photoelectric conversion element 601 is electrically connected to a wiring 611. One of a source and a drain of the transistor 603 is electrically connected to the node 607, and the other is electrically connected to a wiring 608. The gate of the transistor 604 is electrically connected to the node 607, one of a source and a drain of the transistor 604 is electrically connected to a wiring 609, and the other is electrically connected to one of a source and a drain of the transistor 605. The other of the source and the drain of the transistor 605 is electrically connected to the wiring 608. One electrode of the capacitor 606 is electrically connected to the node 607, and the other electrode is electrically connected to the wiring 611.

The transistor 602 can function as a transfer transistor. A gate of the transistor 602 is supplied with a transfer signal TX. The transistor 603 can function as a reset transistor. A gate of the transistor 603 is supplied with a reset signal RST. The transistor 604 can function as an amplifier transistor. The transistor 605 can function as a selection transistor. A gate of the transistor 605 is supplied with a selection signal SEL. Moreover, VDD is supplied to the wiring 608 and VSS is supplied to the wiring 611.

Next, operations of the imaging device 610 including the circuit illustrated in FIG. 52(C) are described. First, the transistor 603 is turned on so that VDD is supplied to the node 607 (reset operation). Then, the transistor 603 is turned off so that VDD is retained at the node 607. Next, the transistor 602 is turned on so that the potential of the node 607 is changed in accordance with the amount of light received by the photoelectric conversion element 601 (accumulation operation). After that, the transistor 602 is turned off so that the potential of the node 607 is retained. Next, the transistor 605 is turned on so that a potential corresponding to the potential of the node 607 is output from the wiring 609 (selection operation). Measuring the potential of the wiring 609 can determine the amount of light received by the photoelectric conversion element 601.

An OS transistor is preferably used for the transistors 602 and 603. Since the off-state current of the OS transistor can be extremely low as described above, the capacitor 606 can be small. Alternatively, the capacitor 606 can be omitted. Furthermore, when an OS transistors are used as the transistors 602 and 603, the potential of the node 607 is less likely to be changed. Thus, an imaging device which is less likely to be affected by noise can be provided.

A high-resolution imaging device can be obtained when the imaging devices 610 including any of the circuits illustrated in FIGS. 52(A) to 52(C) are arranged in a matrix.

For example, when the imaging devices 610 are arranged in a 1920×1080 matrix, an imaging device can be obtained which can take an image with what is called full high definition (also referred to as "2K resolution", "2K1K", "2K", and the like). For example, when the imaging devices 610 are arranged in a 4096×2160 matrix, an imaging device can be obtained which can take an image with what is called ultra-high definition (also referred to as "4K resolution", "4K2K", "4K", and the like). For example, when the imaging devices 610 are arranged in a 8192×4320 matrix, an imaging device can be obtained which can take an image with what is called super high definition (also referred to as "8K resolution", "8K4K", "8K", and the like). Using a larger number of display elements, an imaging device can be obtained which can take an image with 16K or 32K resolution.

Figure 53A:
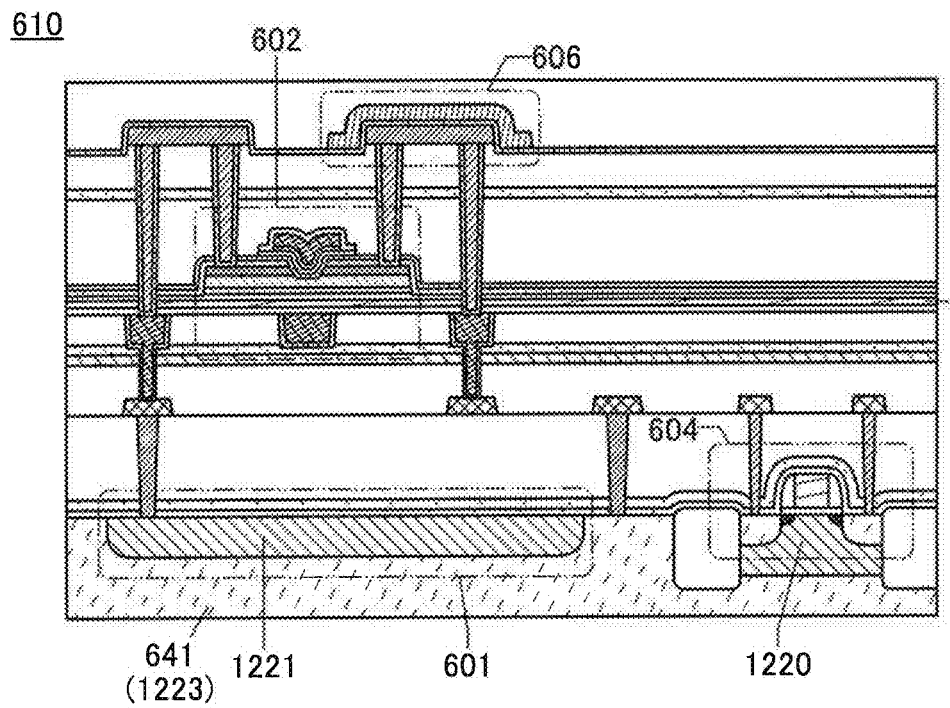
FIGS. 53A and 53B are diagrams illustrating a structure example of an imaging device.

FIGS. 53(A) and (B) illustrate a structure example of the imaging device 610 using the above-described transistors. FIGS. 53(A) and (B) are cross-sectional views of the imaging device 610.

In the imaging device 610 illustrated in FIG. 53(A), an n-type semiconductor is used for a substrate 641. A p-type semiconductor 1221 of the photoelectric conversion element 601 is provided in the substrate 641. A portion of the substrate 641 functions as an n-type semiconductor 1223 of the photoelectric conversion element 601.

The transistor 604 is provided on the substrate 641. The transistor 604 can function as an n-channel transistor. A well 1220 of a p-type semiconductor is provided in a portion of the substrate 641. The well 1220 can be provided by a method similar to that for forming the p-type semiconductor 1221. The well 1220 and the p-type semiconductor 1221 can be formed at the same time.

Figure 53B:
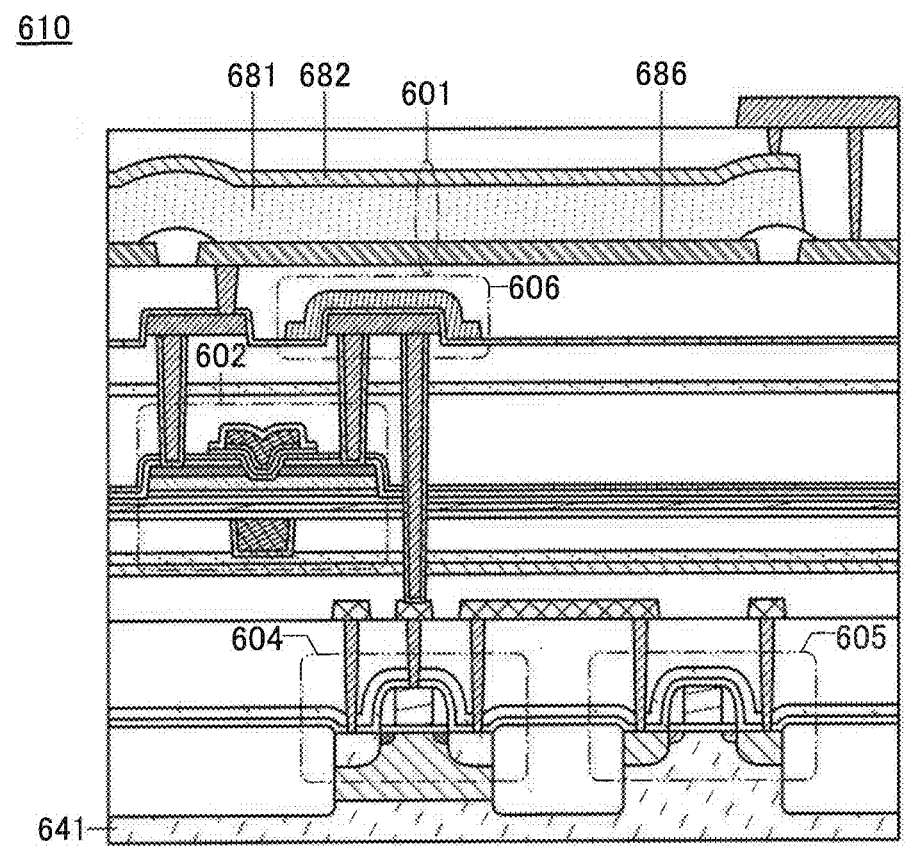

In the imaging device 610 illustrated in FIG. 53(B), the transistor 604 and the transistor 605 are provided on the substrate 641. The transistor 604 can function as an n-channel transistor. The transistor 605 can function as a p-channel transistor.

In the imaging device 610 illustrated in FIG. 53(B), the photoelectric conversion element 601 is provided over the substrate 641.

The photoelectric conversion element 601 illustrated in FIG. 53(B) includes a photoelectric conversion layer 681 between an electrode 686 formed with a metal material or the like and a light-transmitting conductive layer 682. FIG. 53(B) illustrates the mode using a selenium-based material for the photoelectric conversion layer 681. The photoelectric conversion element 601 using a selenium-based material has a characteristic of high external quantum efficiency with respect to visible light. With the photoelectric conversion element, a highly sensitive sensor in which the amplification of electrons with respect to the amount of incident light is large owing to an avalanche phenomenon can be obtained. Furthermore, the selenium-based material has a high light-absorption coefficient, which leads to an advantage that the photoelectric conversion layer 681 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has characteristics of higher spectral sensitivity and light-absorption coefficient for visible light than amorphous selenium.

Although the photoelectric conversion layer 681 is illustrated as a single layer, gallium oxide, cerium oxide, or the like as a hole injection blocking layer may be provided on the light reception side of the selenium-based material, and nickel oxide, antimony sulfide, or the like as an electron injection blocking layer may be provided on the electrode 686 side.

Furthermore, the photoelectric conversion layer 681 may be a layer including a compound of copper, indium, and selenium (CIS). Alternatively, the photoelectric conversion layer 681 may be a layer including a compound of copper, indium, gallium, and selenium (CIGS). With CIS and CIGS, a photoelectric conversion element that can utilize an avalanche phenomenon as in the case of using a single layer of selenium can be formed.

Furthermore, CIS and CIGS are p-type semiconductors, and cadmium sulfide, zinc sulfide, or the like, which is an n-type semiconductor, may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than a Si transistor, the application of a relatively high voltage to the photoelectric conversion element is easy. Thus, by combination of the OS transistor having high drain withstand voltage and a photoelectric conversion element using the selenium-based material for the photoelectric conversion layer, a highly sensitive and highly reliable imaging device can be obtained.

For the light-transmitting conductive layer 682, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 682 is not limited to a single layer, and may be a stacked layer of different films.

Alternatively, a pin diode element or the like using an amorphous silicon film, a microcrystalline silicon film, or the like may be used as the photoelectric conversion element 601. In the photodiode, an n-type semiconductor layer, an i-type semiconductor layer, and a p-type semiconductor layer are stacked in this order. Amorphous silicon is preferably used for the i-type semiconductor layer. For the p-type semiconductor layer and the n-type semiconductor layer, amorphous silicon, microcrystalline silicon, or the like that includes a dopant imparting the corresponding conductivity type can be used. A photodiode in which a photoelectric conversion layer is formed using amorphous silicon has high sensitivity in a visible light wavelength region, and therefore can easily sense weak visible light.

Note that a pn or pin diode element is preferably provided such that the p-type semiconductor layer serves as a light-receiving surface. When the p-type semiconductor layer serves as a light-receiving surface, the output current of the photoelectric conversion element 601 can be increased.

The photoelectric conversion element 601 formed using the selenium-based material, amorphous silicon, or the like can be formed through general semiconductor manufacturing processes such as a deposition process, a lithography process, and an etching process This embodiment can be implemented in combination with the structures described in the other embodiments and the like, as appropriate.

Example 1

In this example, samples including conductive films that can be used for the semiconductor device of one embodiment of the present invention were fabricated and the cross-sectional shapes of the samples were observed with a scanning transmission electron microscope (Scanning Transmission Electron Microscope: STEM). In addition, XPS (X-ray photoelectron spectroscopy) analysis of the samples was performed.

<Sample Fabrication>

For Sample A1, 35-nm-thick tantalum nitride and 200-nm-thick copper were deposited in this order on a glass substrate with a size of 720 mm×600 mm with a sputtering apparatus.

For Sample A2, 35-nm-thick tantalum nitride and 200-nm-thick copper were deposited in this order on a glass substrate with a size of 720 mm×600 mm with a sputtering apparatus. Then, the copper surface was silicified. The conditions of the silicification treatment are as follows. Plasma was discharged in an atmosphere containing an ammonia gas with a PECVD apparatus so that an oxide film formed on the copper surface was removed first. Then, a silane gas was introduced into a PECVD apparatus, and the copper surface was exposed to the silane gas to form copper silicide. Note that the substrate temperature during removal of the oxide film on the copper surface was 350° C. The substrate temperature during formation of copper silicide was 220° C., and a silane gas at a flow rate of 300 sccm and a nitrogen gas at a flow rate of 500 sccm were used.

<Cross-Sectional Observation>

Figure 54A:
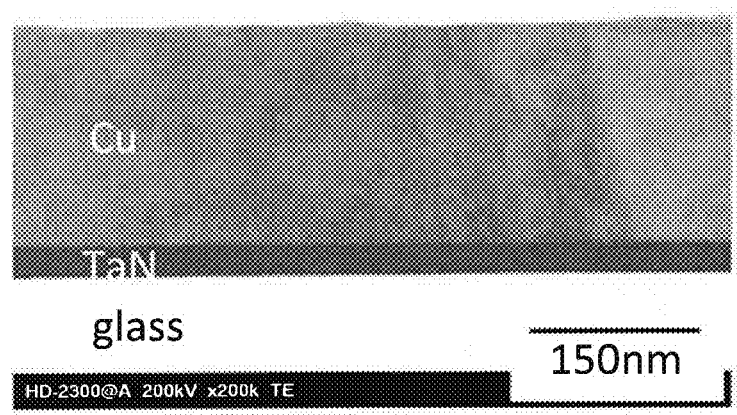
FIGS. 54A and 54B are diagrams illustrating a STEM photograph of a sample that relates to an example.
Figure 54B:
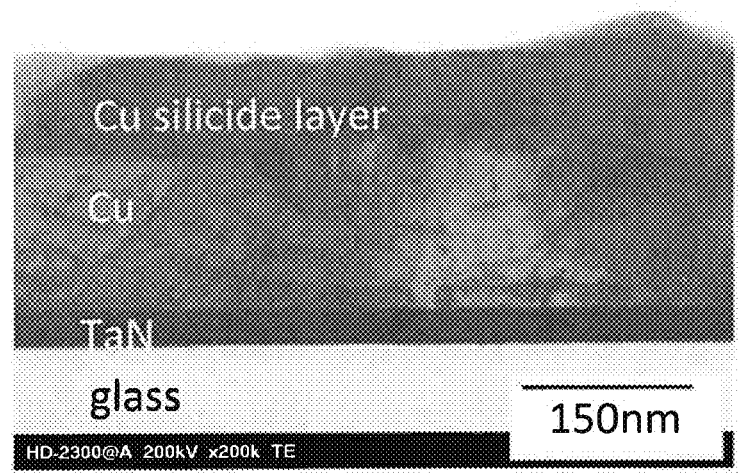

The cross-sectional shapes of the fabricated Samples A1 and A2 were observed with a STEM. FIG. 54(A) is a cross-sectional STEM photograph of Sample A1, and FIG. 54(B) is a cross-sectional STEM photographs of Sample A2.

The cross-sectional STEM photographs of FIGS. 54(A) and (B) show that a film different from copper (copper silicide layer) was formed on the outermost surface of a film in Sample A2.

<XPS Analysis>

Then, XPS analysis of the surface of Sample A2 was performed. Table 1 shows the composition found by XPS. Note that the detection depth of the surface in XPS is approximately 5 nm.

TABLE 1

|  | Cu | O | C | Si | N |
|---|---|---|---|---|---|
| Composition (atomic %) | 24.1 | 37.6 | 18.2 | 11.3 | 8.8 |

Copper and silicon were detected in the surface of Sample A2, and the ratio of silicon to copper (Si/Cu) was 0.47.

Figure 55:
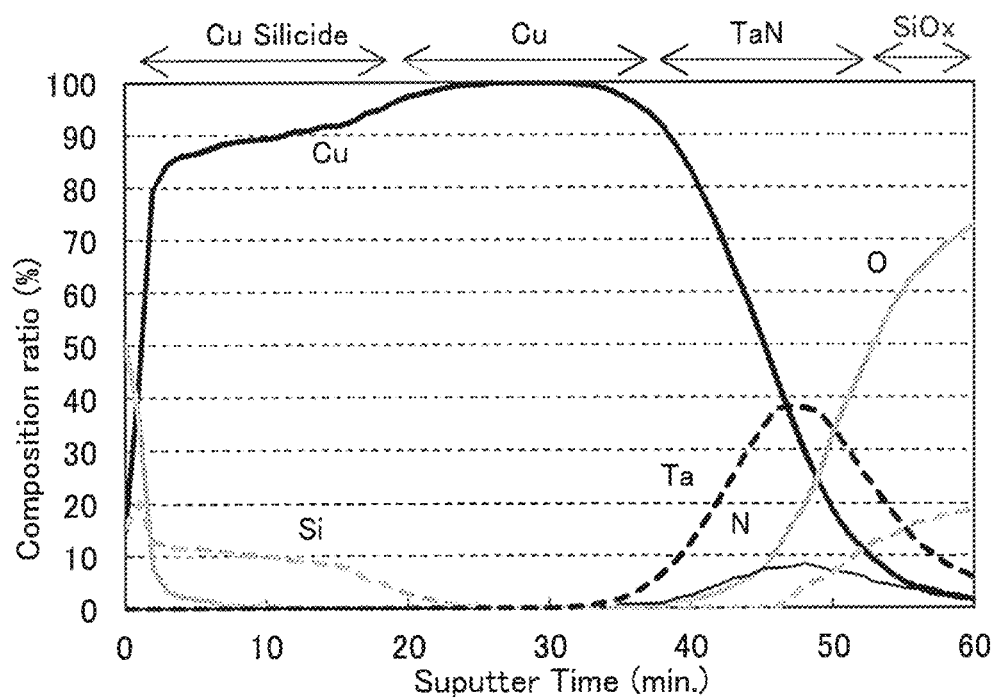
FIG. 55 is a diagram illustrating XPS analysis results of a sample that relate to an example.

Next, FIG. 55 shows results obtained by performing XPS analysis in the depth direction of Sample A2. FIG. 55 shows a profile of copper (Cu), silicon (Si), tantalum (Ta), oxygen (O), and nitrogen (N) in the depth direction from the film surface of Sample A2 to a glass substrate.

As shown in FIG. 55, copper (Cu) and silicon (Si) were detected in the vicinity of the film surface.

Figure 56A:
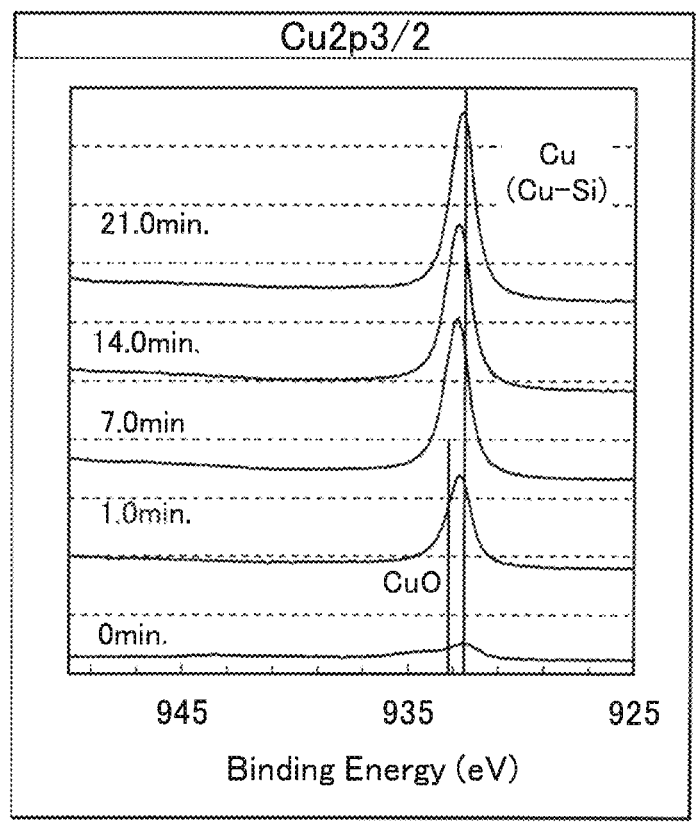
FIGS. 56A and 56B are diagrams illustrating XPS analysis results of a sample that relate to an example.

Next, FIGS. 56(A) and (B) show the spectrum of $Cu2p_{3/2}$ and the spectrum of Si2p obtained by XPS analysis in the depth direction of Sample A2, respectively. Note that the horizontal axis represents binding energy (Binding Energy).

Figure 56B:
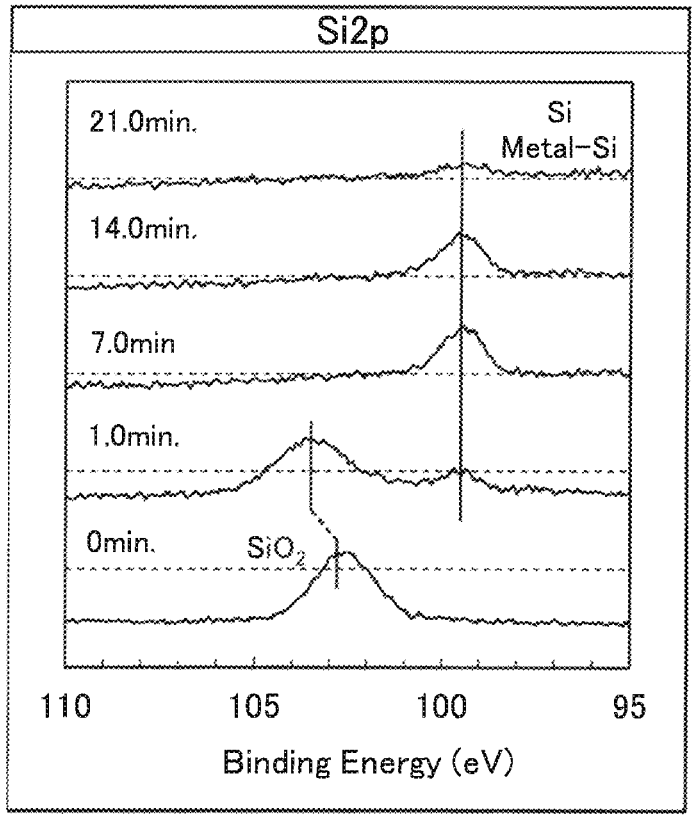

In FIG. 56(A), peaks in the range from 931 eV to 934 eV are attributed to a Cu—Si group. In FIG. 56(B), peaks in the range from 98 eV to 100 eV are attributed to a metal-Si group.

Based on the above, it was confirmed that copper silicide (copper silicide) having a bond of Cu and Si was formed on the film surface in Sample A2.

The structures described above in this example can be used in combination with the other embodiment or example, as appropriate.

Example 2

In this example, transistors of one embodiment of the present invention were formed and the electrical characteristics were evaluated.

Samples B1 and B2 corresponding to the transistor 100L illustrated in FIGS. 10(A) and (B) were fabricated as transistors for electrical characteristics evaluation. Note that Sample B1 is a transistor of one embodiment of the present invention, and Sample B2 is a transistor for comparison.

The transistor 100L includes the conductive film 104 functioning as a gate electrode over the substrate 102, the insulating films 106 and 107 functioning as a first gate insulating film over the substrate 102 and the conductive film 104, the oxide semiconductor film 108 over the insulating film 107, the conductive film 112a electrically connected to the oxide semiconductor film 108 and functioning as a source electrode, the conductive film 112b electrically connected to the oxide semiconductor film 108 and functioning as a drain electrode, the insulating films 114 and 116 functioning as a second gate insulating film over the oxide semiconductor film 108 and the conductive films 112a and 112b, the insulating film 118 functioning as a protective insulating film over the insulating film 116, and 120b functioning as a second gate electrode over the insulating film 118. The oxide semiconductor film 108 includes the oxide semiconductor films 108b and 108c.

The conductive film 112a includes the conductive films 112a_1, 112a_2, and 112a_3, and the conductive film 112b includes the conductive film 112b_1, 112b_2, and 112b_3. The conductive film 112a_2 includes the region 112a_2b in contact with the insulating film 114 at the end portion, and the conductive film 112b_2 includes the region 112b_2b in contact with the insulating film 114 at the end portion.

<Method for Forming Transistor>

Next, methods for forming transistors corresponding to Samples B1 and B2 are described. Note that Embodiment 1 can be referred to for the methods for forming the transistors.

<<Fabrication of Sample B1>>

The conductive film 104 was formed over the substrate 102. As the substrate 102, a glass substrate was used. For the conductive film 104, a 10-nm-thick titanium film, a 100-nm-thick copper film, and a 50-nm-thick tantalum nitride film were formed in this order with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 15-nm-thick silicon oxynitride film was formed with a PECVD apparatus.

Then, the oxide semiconductor film 108 was formed over the insulating film 107.

As the oxide semiconductor film 108, an In—Ga—Zn oxide (also referred to as IGZO) was used. A 10-nm-thick IGZO film was formed as the oxide semiconductor film 108b of the oxide semiconductor film 108 with a sputtering apparatus. Note that the IGZO film was formed under the conditions where the substrate temperature was 170° C., the argon gas and the oxygen gas were introduced into a chamber such that the flow rate ratio of the oxygen gas to the argon gas and the oxygen gas was 30%, the pressure was 0.2 Pa, and an AC power of 1500 W was supplied to a metal oxide sputtering target (In:Ga:Zn=4:2:4.1 [atomic ratio]). Then, a 20-nm-thick IGZO film was formed as the oxide semiconductor film 108c with a sputtering apparatus. Note that the IGZO film was formed under the conditions where the substrate temperature was 170° C., the argon gas and the oxygen gas were introduced into a chamber such that the flow rate ratio of the oxygen gas to the argon gas and the oxygen gas was 50%, the pressure was 0.2 Pa, and an AC power of 500 W was supplied to a metal oxide sputtering target (In:Ga:Zn=1:1:1.2 [atomic ratio]). After formation of the oxide semiconductor film 108, heat treatment was performed at 350° C. for 1 hour.

Next, a conductive film to be the conductive films 112a and 112b was formed over the insulating film 107 and the oxide semiconductor film 108. For the conductive film, a 50-nm-thick tungsten film, a 200-nm-thick copper film, and a 5-nm-thick tungsten film were successively formed in a vacuum with a sputtering apparatus. Then, a resist mask was formed over the conductive film, and a desired region of the 5-nm-thick tungsten film and the 200-nm-thick copper film was etched. After the removal of the resist mask, silicide treatment of the exposed copper surface was performed. Then, the copper surface was silicified. The conditions of the silicification treatment are as follows. Plasma was discharged in an atmosphere containing an ammonia gas with a PECVD apparatus so that an oxide film formed on the copper surface was removed first. Then, a silane gas was introduced into a PECVD apparatus, and the copper surface was exposed to the silane gas to form copper silicide. Note that the substrate temperature during removal of the oxide film on the copper surface was 350° C. The substrate temperature during formation of copper silicide was 220° C., and a silane gas at a flow rate of 300 sccm and a nitrogen gas at a flow rate of 500 sccm were used. Then, a resist mask was formed over the conductive film subjected to silicide treatment and a desired region of the 50-nm-thick tungsten film was etched, so that the conductive films 112a and 112b were formed. Note that the resist mask was removed after the formation of the conductive films 112a and 112b.

Next, an aqueous phosphoric acid solution (an aqueous solution obtained by diluting an aqueous solution with a phosphoric acid concentration of 85% with pure water by 100 times) was applied from above the insulating film 107, the oxide semiconductor film 108, and the conductive films 112a and 112b, so that part of the surface of the oxide semiconductor film 108 which is not covered with the conductive films 112a and 112b was removed.

After that, the insulating films 114 and 116 were formed over the insulating film 107, the oxide semiconductor film 108, and the conductive films 112a and 112b. As the insulating film 114, a 40-nm-thick silicon oxynitride film was formed with a PECVD apparatus. As the insulating film 116, a 400-nm-thick silicon oxynitride film was formed with a PECVD apparatus. Note that the insulating films 114 and 116 were formed successively in a vacuum with a PECVD apparatus.

The insulating film 114 was formed under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was formed under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Next, heat treatment was performed at 300° C. under an atmosphere containing nitrogen for 1 hour.

Then, the insulating film 118 was formed over the insulating film 116. As the insulating film 118, a 100-nm-thick silicon nitride film was formed with a PECVD apparatus. The insulating film 118 was formed under the conditions where the substrate temperature was 220° C., a silane gas at a flow rate of 50 sccm, a nitrogen gas at a flow rate of 5000 sccm, and an ammonia gas at a flow rate of 100 sccm were introduced into a chamber, the pressure was 100 Pa, and an RF power of 1000 W was supplied between parallel-plate electrodes provided in a PECVD apparatus.

Then, as a conductive film, a 100-nm-thick ITSO film was formed over the insulating film 118 with a sputtering apparatus. The formation conditions of the ITSO film were as follows: the substrate temperature was room temperature, an argon gas at a flow rate of 72 sccm and an oxygen gas at a flow rate of 5 sccm were introduced into a chamber, and the pressure was 0.15 Pa. Note that the composition of the metal oxide target used for the ITSO film was $In_2O_3$:$SnO_2$:$SiO_2$=85:10:5 [weight %].

In the above process, the transistor corresponding to Sample B1 was formed.

<<Fabrication of Sample B2>>

The conductive film 104 was formed over the substrate 102. As the substrate 102, a glass substrate was used. As the conductive film 104, a 100-nm-thick tungsten film was formed with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 50-nm-thick silicon oxynitride film was formed with a PECVD apparatus.

Then, the oxide semiconductor film 108 was formed over the insulating film 107.

A 20-nm-thick IGZO film was formed as the oxide semiconductor film 108b of the oxide semiconductor film 108 with a sputtering apparatus. Note that the IGZO film was formed under the conditions where the substrate temperature was 170° C., the argon gas and the oxygen gas were introduced into a chamber such that the flow rate ratio of the oxygen gas to the argon gas and the oxygen gas was 30%, the pressure was 0.2 Pa, and an AC power of 1500 W was supplied to a metal oxide sputtering target (In:Ga:Zn=4:2:4.1 [atomic ratio]). Then, a 30-nm-thick IGZO film was formed as the oxide semiconductor film 108c with a sputtering apparatus. Note that the IGZO film was formed under the conditions where the substrate temperature was 170° C., the argon gas and the oxygen gas were introduced into a chamber such that the flow rate ratio of the oxygen gas to the argon gas and the oxygen gas was 50%, the pressure was 0.2 Pa, and an AC power of 500 W was supplied to a metal oxide sputtering target (In:Ga:Zn=1:1:1.2 [atomic ratio]). After formation of the oxide semiconductor film 108, heat treatment was performed at 350° C. for 1 hour.

Next, a conductive film was formed over the insulating film 107 and the oxide semiconductor film 108, a resist mask was formed over the conductive film, and a desired region was etched to form the conductive films 112a and 112b. For the conductive films 112a and 112b, a 50-nm-thick tungsten film and a 200-nm-thick copper film were successively formed in a vacuum with a sputtering apparatus. Note that the resist mask was removed after the formation of the conductive films 112a and 112b.

Then, the insulating film 114 and the insulating film 116 were formed over the insulating film 107, the oxide semiconductor film 108, and the conductive films 112a and 112b. As the insulating film 114, a 40-nm-thick silicon oxynitride film was formed with a PECVD apparatus. As the insulating film 116, a 400-nm-thick silicon oxynitride film was formed with a PECVD apparatus. Note that the insulating films 114 and 116 were formed successively in a vacuum with a PECVD apparatus.

The insulating film 114 was formed under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was formed under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Next, heat treatment was performed at 300° C. under an atmosphere containing nitrogen for 1 hour.

Then, the insulating film 118 was formed over the insulating film 116. As the insulating film 118, a 100-nm-thick silicon nitride film was formed with a PECVD apparatus. The insulating film 118 was formed under the conditions where the substrate temperature was 220° C., a silane gas at a flow rate of 50 sccm, a nitrogen gas at a flow rate of 5000 sccm, and an ammonia gas at a flow rate of 100 sccm were introduced into a chamber, the pressure was 100 Pa, and an RF power of 1000 W was supplied between parallel-plate electrodes provided in a PECVD apparatus.

Then, as a conductive film, a 100-nm-thick ITSO film was formed over the insulating film 118 with a sputtering apparatus. The formation conditions of the ITSO film were as follows: the substrate temperature was room temperature, an argon gas at a flow rate of 72 sccm and an oxygen gas at a flow rate of 5 sccm were introduced into a chamber, and the pressure was 0.15 Pa. Note that the composition of the metal oxide target used for the ITSO film was $In_2O_3$:$SnO_2$:$SiO_2$=85:10:5 [weight %].

In the above process, the transistor corresponding to Sample B2 was formed.

Note that the transistors with the following three kinds of sizes were formed: a channel length of 2 μm and a channel width of 50 μm; a channel length of 3 μm and a channel width of 50 μm; and a channel length of 6 μm and a channel width of 50 μm. In the following, Sample B1 with a channel length of 2 μm is referred to as Sample B1-1, Sample B1 with a channel length of 3 μm is referred to as Sample B1-2, and Sample B1 with a channel length of 6 μm is referred to as Sample B1-3. The same applies to Sample B2.

<Evaluation of Electrical Characteristics of Transistors>

Figure 57A:
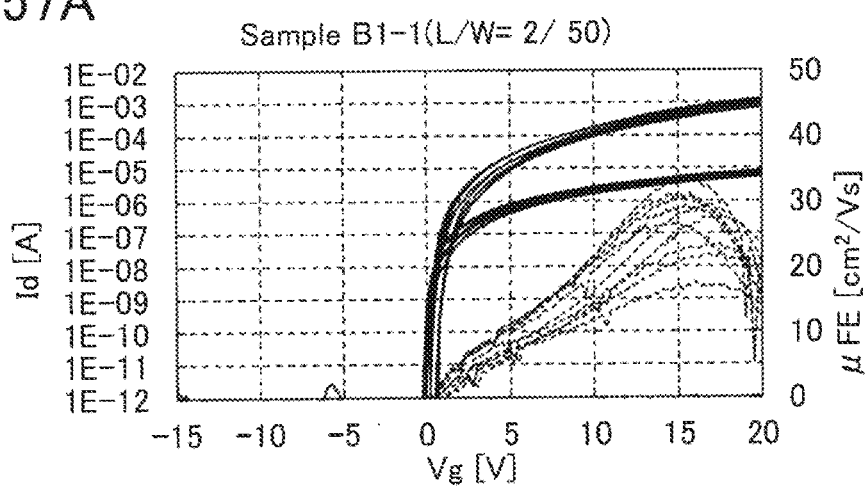
FIGS. 57A-57C are Id-Vg characteristics of a transistor that relate to an example.
Figure 57B:
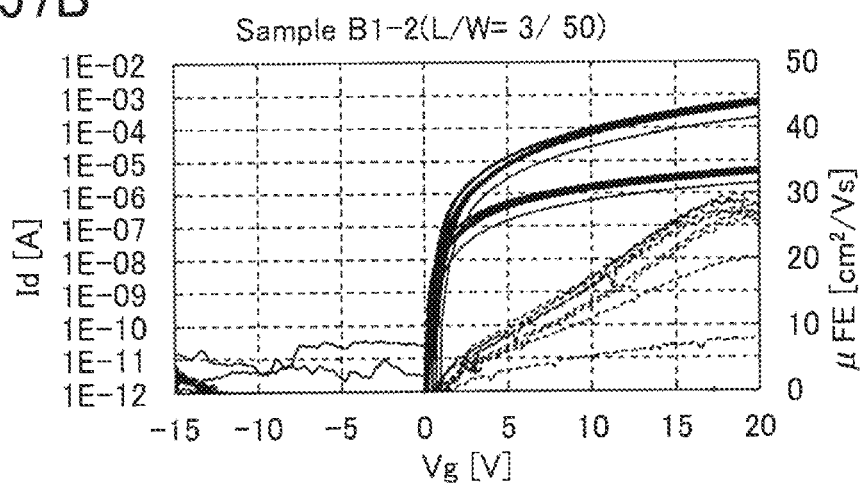
Figure 57C:
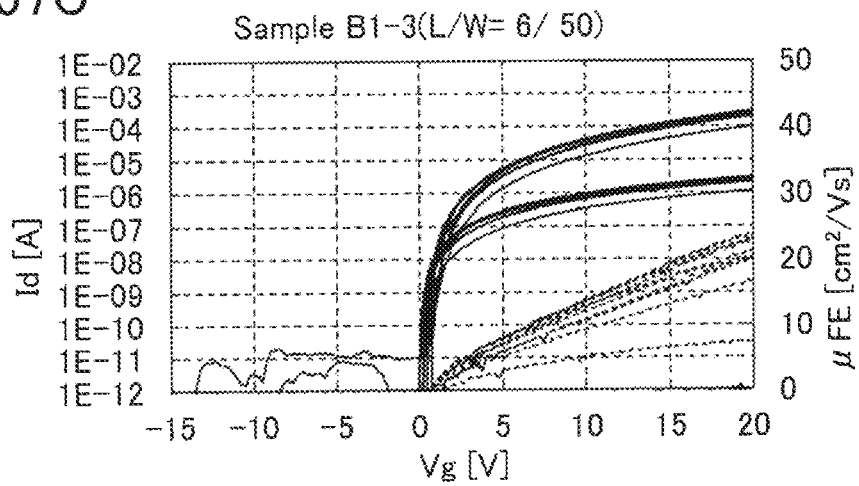
Figure 58A:
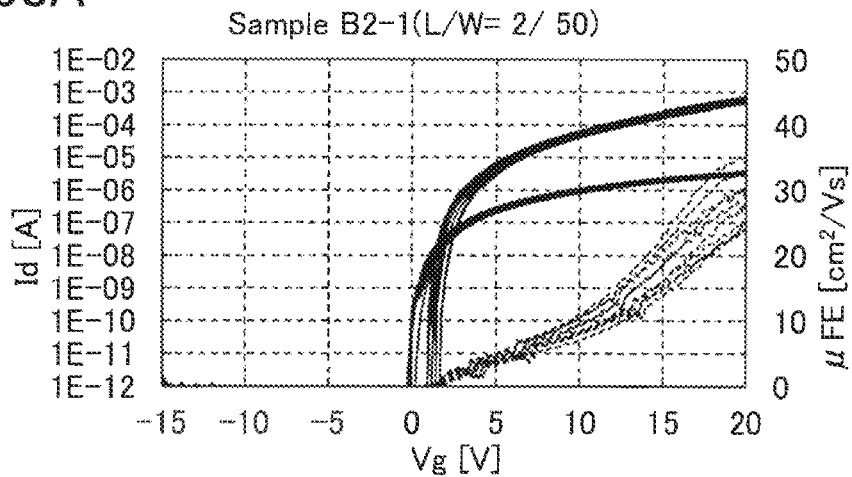
FIGS. 58A-58C are Id-Vg characteristics of a transistor that relate to an example.
Figure 58B:
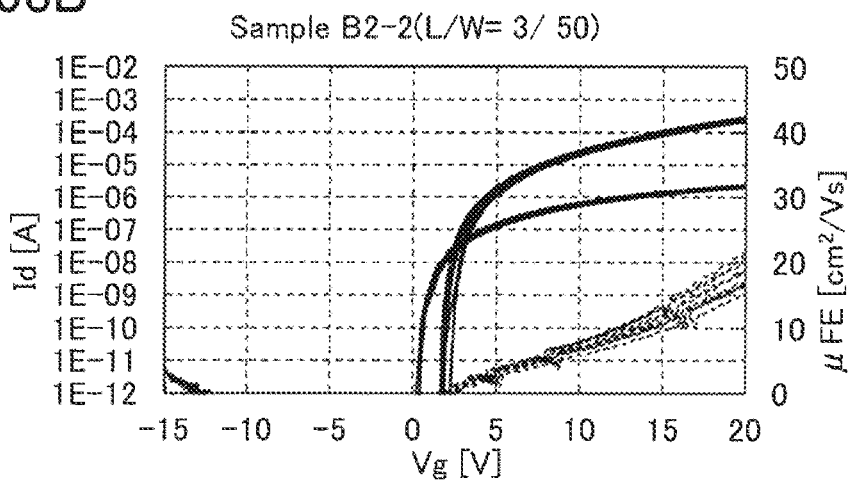
Figure 58C:
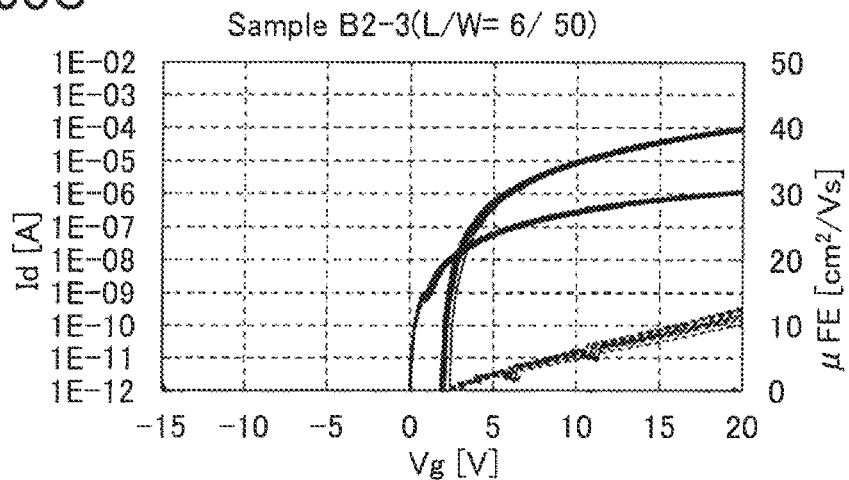

The electrical characteristics of the fabricated transistors corresponding to Samples B1 and B2 were evaluated. The electrical characteristics of the transistors were drain current (Id)-gate voltage (Vg) characteristics and field-effect mobility (μFE) obtained from the Id-Vg characteristics. FIG. 57 and FIG. 58 show the electrical characteristics of the transistors of Samples B1 and B2. FIG. 57(A) and FIG. 58(A) show the characteristics of the transistor with a channel length 2 μm and a channel width of 50 μm, FIG. 57(B) and FIG. 58(B) show the characteristics of the transistor with a channel length of 3 μm and a channel width of 50 μm, and FIG. 57(C) to FIG. 58(C) show the characteristics of the transistor with a channel length of 6 μm and a channel width of 50 μm.

In FIG. 57 and FIG. 58, the voltage (Vd) between the source electrode and the drain electrode was set to 0.1 V and 20 V, and Vg was applied from −15 V to 20 V in 0.25 V steps. In FIG. 57 and FIG. 58, the first vertical axis represents the drain current (Id), the second vertical axis represents the field-effect mobility (μFE) when Vd=20 V, and the horizontal axis represents the gate voltage (Vg). Data of 10 transistors are superimposed on each other. All the transistors exhibit little variation and normally-off characteristics.

As shown in FIG. 57 and FIG. 58, the following results were obtained: the threshold voltages of Sample B2 were different between when Vd was 0.1 V and when Vd was 20 V; and the transistor of Sample B1 had higher field-effect mobility (μFE) than that of Sample B2. This indicated that when the end portions of a source electrode and a drain electrode that contain copper of a transistor are subjected to silicide treatment, the transistor having excellent electrical characteristics can be provided.

The structure described above in this example can be used in combination with the other embodiment or example, as appropriate.

Example 3

In this example, samples including conductive films that can be used for the semiconductor device of one embodiment of the present invention were fabricated and the cross-sectional shapes of the samples were observed with a scanning transmission electron microscope (Scanning Transmission Electron Microscope: STEM). In addition, XPS (X-ray photoelectron spectroscopy) analysis of the samples was performed.

<Sample Fabrication>

For Sample C1, a 100-nm-thick silicon oxynitride (SiON) film was formed over a glass substrate with a size of 720 mm×600 mm with a PECVD apparatus. Then, a conductive film was formed over the silicon oxynitride film, a resist mask was formed over the conductive film, and a desired region was etched. For the conductive film, a 5-nm-thick tungsten (W) film, a 200-nm-thick copper (Cu) film, and a 5-nm-thick tungsten (W) film were successively formed in a vacuum with a sputtering apparatus. Note that the resist mask was removed after the formation of the conductive film.

For Sample C2, a 100-nm-thick silicon oxynitride (SiON) film was formed over a glass substrate with a size of 720 mm×600 mm with a PECVD apparatus. Next, a 50-nm-thick IGZO film was formed as an oxide semiconductor film over the silicon oxynitride film with a sputtering apparatus. Then, a conductive film was formed over the oxide semiconductor film, a resist mask was formed over the conductive film, and a desired region was etched. For the conductive film, a 5-nm-thick tungsten film, a 200-nm-thick copper film, and a 5-nm-thick tungsten film were successively formed in a vacuum with a sputtering apparatus. The resist mask was removed after the formation of the conductive film. Then, the copper surface was silicified. The conditions of the silicification treatment are as follows. Plasma was discharged in an atmosphere containing an ammonia gas with a PECVD apparatus so that an oxide film formed on the copper surface was removed first. Then, a silane gas was introduced into a PECVD apparatus, and the copper surface was exposed to the silane gas to form copper silicide. Note that the substrate temperature during removal of the oxide film on the copper surface was 350° C. The substrate temperature during formation of copper silicide was 350° C., and a silane gas at a flow rate of 10 sccm and a nitrogen gas at a flow rate of 1000 sccm were used.

<Cross-Sectional Observation and EDX Analysis Results>

Figure 59A:
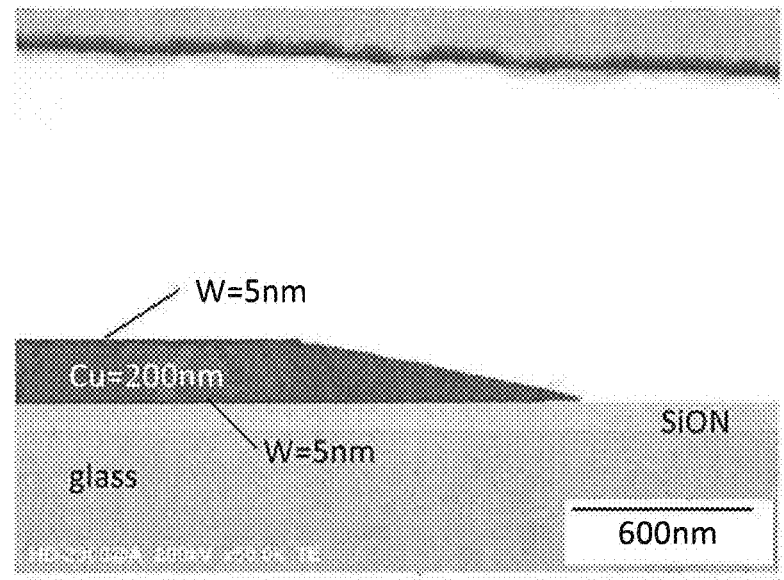
FIGS. 59A and 59B are diagrams illustrating a STEM photograph of a sample that relates to an example.

The cross-sectional shapes of the fabricated Samples C1 and C2 were observed with a STEM. FIG. 59(A) is a cross-sectional STEM photograph of Sample C1, and FIG. 59(B) is a cross-sectional STEM photograph of Sample C2.

Figure 59B:
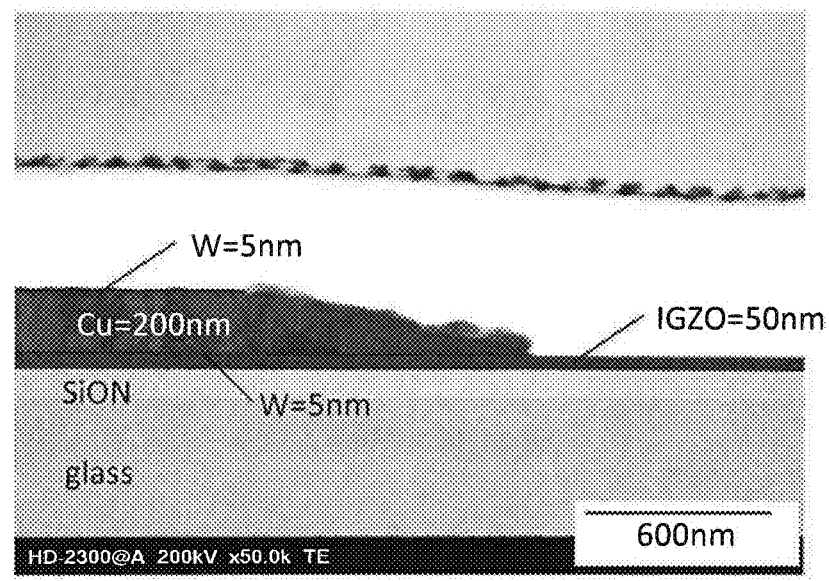

The cross-sectional STEM photograph of FIG. 59(B) shows that a layer different from copper (copper silicide layer) was formed at the end portion of the conductive film of Sample C2.

Elemental analysis was performed using EDX (Energy Dispersive X-ray Spectoroscopy, energy dispersive X-ray analysis method) of the end portion of the conductive film of Sample C2. The EDX analysis results are shown in FIG. 60.

Figure 60:
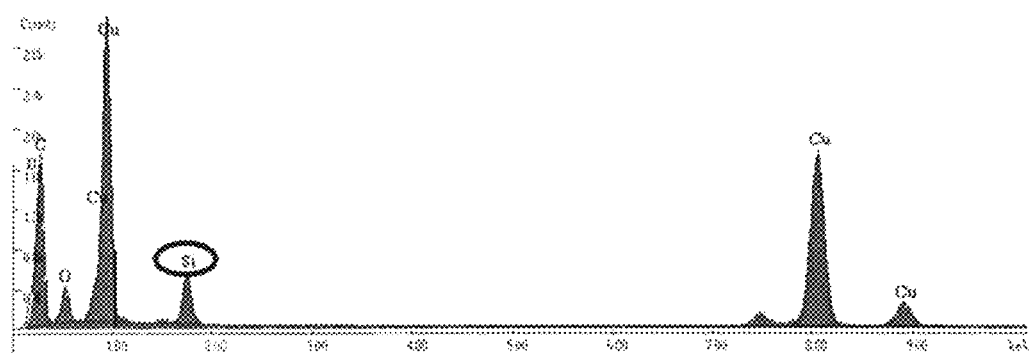
FIG. 60 is a diagram illustrating EDX analysis results of a sample that relate to an example.

As shown in FIG. 60, copper (Cu) and silicon (Si) were detected from the end portion of the conductive film of Sample C2. That is, it was confirmed that copper silicide containing Cu and Si was formed at the end portion of the conductive film of Sample C2.

The structures described above in this example can be used in combination with the other embodiment or example, as appropriate.

REFERENCE NUMERALS

I1 insulator
I2 insulator
S1 oxide semiconductor
S2 oxide semiconductor
S3 oxide semiconductor
100 transistor
100A transistor
100B transistor
100C transistor
100D transistor
100E transistor
100F transistor
100G transistor
100H transistor
100J transistor
100K transistor
100L transistor
100M transistor
100N transistor
100P transistor
100Q transistor
102 substrate
104 conductive film
106 insulating film
107 insulating film
108 oxide semiconductor film
108a oxide semiconductor film
108b oxide semiconductor film
108c oxide semiconductor film
112 conductive film
112_1 conductive film
112_2 conductive film
112_3 conductive film
112a conductive film
112a_1 conductive film
112a_2 conductive film
112a_2a region
112a_2b region
112a_3 conductive film
112b conductive film
112b_1 conductive film
112b_2 conductive film
112b_2a region
112b_2b region
112b_3 conductive film
112c conductive film
112c_1 conductive film
112c_2 conductive film
112c_2a region
112c_2b region
112c_3 conductive film
114 insulating film
116 insulating film
118 insulating film
120a conductive film
120b conductive film
141a mask
141b mask
142a mask
142b mask
151 opening
151a opening
151b opening
152a opening
152b opening
152c opening
152d opening
191 target
192 plasma
193 target
194 plasma
195 plasma
501 pixel circuit
502 pixel portion
504 driver circuit portion
504a gate driver
504b source driver
506 protection circuit
507 terminal portion
550 transistor
552 transistor
554 transistor
560 capacitor
562 capacitor
570 liquid crystal element
572 light-emitting element
601 photoelectric conversion element
602 transistor
603 transistor
604 transistor
605 transistor
606 capacitor
607 node
608 wiring
609 wiring
610 imaging device
611 wiring
641 substrate
681 photoelectric conversion layer
682 light-transmitting conductive layer
686 electrode
700 display device
701 substrate
702 pixel portion
704 source driver circuit portion
705 substrate 706 gate driver circuit portion
708 FPC terminal portion
710 signal line
711 wiring portion
712 sealant
716 FPC
730 insulating film
732 sealing film
734 insulating film
736 coloring film
738 light blocking film
750 transistor
752 transistor
760 connecting electrode
770 planarization insulating film
772 conductive film
773 insulating film
774 conductive film
775 liquid crystal element
776 liquid crystal layer
777 conductive film
778 structure body
780 anisotropic conductive film
782 light-emitting element
786 EL layer
788 conductive film
790 capacitor
791 touch panel
792 insulating film
793 electrode
794 electrode
795 insulating film
796 electrode
797 insulating film
800 inverter
810 OStransistor
820 OStransistor
831 signal waveform
832 signal waveform
840 dashed line
841 solid line
850 OS transistor
860 CMOS inverter
900 semiconductor device
901 power supply circuit
902 circuit
903 voltage generation circuit
903A voltage generation circuit
903B voltage generation circuit
903C voltage generation circuit
904 circuit
905 voltage generation circuit
906 circuit
911 transistor
912 transistor
912A transistor
912B transistor
921 control circuit
922 transistor
1220 well
1221 p-type semiconductor
1223 n-type semiconductor
2189 ROM interface
2190 substrate
2191 ALU
2192 ALU controller
2193 instruction decoder
2194 interrupt controller
2195 timing controller
2196 register
2197 register controller
2198 bus interface
2199 ROM
2200 memory element
2201 circuit
2202 circuit
2203 switch
2204 switch
2206 logic element
2207 capacitor
2208 capacitor
2209 transistor
2210 transistor
2213 transistor
2214 transistor
2220 circuit
3101 wiring
3102 wiring
3103 wiring
3104 wiring
3105 wiring
3200 transistor
3300 transistor
3400 capacitor
7000 display module
7001 upper cover
7002 lower cover
7003 FPC
7004 touch panel
7005 FPC
7006 display panel
7007 backlight
7008 light source
7009 frame
7010 printed board
7011 battery
8000 camera
8001 housing
8002 display portion
8003 operation button
8004 shutter button
8006 lens
8100 finder
8101 housing
8102 display portion
8103 button
8200 head-mounted display
8201 mounting portion
8202 lens
8203 main body
8204 display portion
8205 cable
8206 battery
8300 head-mounted display
8301 housing
8302 display portion
8304 fixing instrument
8305 lens
9000 housing
9001 display portion
9003 speaker
9005 operation key
9006 connection terminal
9007 sensor 9008 microphone
9050 operation button
9051 information
9052 information
9053 information
9054 information
9055 hinge
9100 television device
9101 portable information terminal
9102 portable information terminal
9200 portable information terminal
9201 portable information terminal
9500 display device
9501 display panel
9502 display region
9503 region
9511 axis portion
9512 bearing

The invention claimed is:

1. A semiconductor device comprising:
a transistor comprising:
 a gate electrode;
 a first insulating film over the gate electrode;
 an oxide semiconductor film comprising a region which overlaps with the gate electrode with the first insulating film therebetween;
 a source electrode electrically connected to the oxide semiconductor film;
 a drain electrode electrically connected to the oxide semiconductor film; and
 a second insulating film over the oxide semiconductor film, the source electrode, and the drain electrode,
wherein the source electrode and the drain electrode each comprise a first conductive film, a second conductive film over and in contact with the first conductive film, and a third conductive film over and in contact with the second conductive film,
wherein the second conductive film includes copper,
wherein an end portion of the second conductive film comprises a region including copper and silicon,
wherein the first conductive film includes a region located outward from the end portion of the second conductive film, and
wherein the end portion of the second conductive film and an end portion of the third conductive film are substantially aligned with each other.

2. The semiconductor device according to claim 1, wherein the end portion of the second conductive film comprises a region in contact with the second insulating film.

3. The semiconductor device according to claim 1, wherein the first conductive film and the third conductive film include at least one of titanium, tungsten, tantalum, and molybdenum.

4. The semiconductor device according to claim 1, wherein the first conductive film and the third conductive film include an oxide including at least one of In and Zn.

5. The semiconductor device according to claim 1,
wherein the oxide semiconductor film includes In, Zn, and M, and
wherein M represents Al, Ga, Y, or Sn.

6. The semiconductor device according to claim 5,
wherein the oxide semiconductor film comprises a crystal part, and
wherein the crystal part has c-axis alignment.

7. A display device comprising:
the semiconductor device according to claim 1; and
a display element.

8. A display module comprising:
the display device according to claim 7; and
a touch sensor.

9. An electronic device comprising:
the semiconductor device according to claim 1; and
at least one of an operation key and a battery.

10. A semiconductor device comprising:
a transistor comprising:
 a gate electrode;
 a first insulating film over the gate electrode;
 an oxide semiconductor film comprising a region which overlaps with the gate electrode with the first insulating film therebetween;
 a source electrode electrically connected to the oxide semiconductor film;
 a drain electrode electrically connected to the oxide semiconductor film; and
 a second insulating film over the oxide semiconductor film, the source electrode, and the drain electrode,
wherein the source electrode and the drain electrode each comprise a first conductive film, a second conductive film over and in contact with the first conductive film, and a third conductive film over and in contact with the second conductive film,
wherein the second conductive film includes copper,
wherein an end portion of the second conductive film comprises a region including nitrogen, copper, and silicon.

11. The semiconductor device according to claim 10, wherein the end portion of the second conductive film comprises a region in contact with the second insulating film.

12. The semiconductor device according to claim 10, wherein the first conductive film and the third conductive film include at least one of titanium, tungsten, tantalum, and molybdenum.

13. The semiconductor device according to claim 10, wherein the first conductive film and the third conductive film include an oxide including at least one of In and Zn.

14. The semiconductor device according to claim 10,
wherein the oxide semiconductor film contains In, Zn, and M, and
wherein M represents Al, Ga, Y, or Sn.

15. The semiconductor device according to claim 14,
wherein the oxide semiconductor film comprises a crystal part, and
wherein the crystal part has c-axis alignment.

16. A display device comprising:
the semiconductor device according to claim 10; and
a display element.

17. A display module comprising:
the display device according to claim 16; and
a touch sensor.

18. An electronic device comprising:
the semiconductor device according to claim 10; and
at least one of an operation key and a battery.

* * * * *